US010326555B2

(12) United States Patent
Li et al.

(10) Patent No.: US 10,326,555 B2
(45) Date of Patent: Jun. 18, 2019

(54) POLAR CODING METHOD, APPARATUS, AND DEVICE

(71) Applicant: HUAWEI TECHNOLOGIES CO., LTD., Shenzhen, Guangdong (CN)

(72) Inventors: Rong Li, Hangzhou (CN); Gongzheng Zhang, Hangzhou (CN); Ying Chen, Hangzhou (CN); Xiaocheng Liu, Hangzhou (CN); Jun Wang, Hangzhou (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/110,873

(22) Filed: Aug. 23, 2018

(65) Prior Publication Data

US 2018/0367250 A1 Dec. 20, 2018

Related U.S. Application Data

(63) Continuation of application No. PCT/CN2017/091675, filed on Jul. 4, 2017.

(30) Foreign Application Priority Data

Aug. 11, 2016 (CN) .......................... 2016 1 0664987

(51) Int. Cl.
*H03M 13/00* (2006.01)
*H04L 1/00* (2006.01)
*H03M 13/13* (2006.01)

(52) U.S. Cl.
CPC .......... *H04L 1/0058* (2013.01); *H03M 13/13* (2013.01); *H03M 13/618* (2013.01);
(Continued)

(58) Field of Classification Search
None
See application file for complete search history.

(56) References Cited

U.S. PATENT DOCUMENTS 6,105,158 A * 8/2000 Chen ..................... H03M 13/09 714/755
6,507,927 B1 * 1/2003 Kalliojarvi ........ H03M 13/4138 714/795

(Continued)

FOREIGN PATENT DOCUMENTS

CN 101447851 A 6/2009
CN 102118231 A 7/2011

(Continued)

OTHER PUBLICATIONS

Wang Runxin et al: "A Novel Puncturing Scheme for Polar Codes", IEEE Communications Letters, IEEE Service Center, Piscataway, NJ, US, vol. 18, No. 12, Dec. 2014, total 4 pages.

(Continued)

*Primary Examiner* — Mujtaba M Chaudry
(74) *Attorney, Agent, or Firm* — Huawei Technologies Co., Ltd.

(57) ABSTRACT

Embodiments of this application disclose a polar coding method, apparatus, and device, so as to reduce storage overheads of a system. A sequence for polar coding is obtained based on a length M of a target polar code, wherein the sequence comprises L sequence numbers, ordering of the L sequence numbers in the sequence is the same as ordering of the L sequence numbers in a maximum mother code sequence, wherein the maximum mother code sequence is obtained by sorting N sequence numbers of N polarized channels in ascending order or descending order of reliability metrics, wherein L and N are integer power of 2, M is smaller than or equal to L, L is smaller than or equal to N.

11 Claims, 3 Drawing Sheets

(52) U.S. Cl.
CPC ..... *H03M 13/635* (2013.01); *H03M 13/6588* (2013.01); *H04L 1/00* (2013.01)

(56) References Cited

U.S. PATENT DOCUMENTS

| | | | | |
|---|---|---|---|---|
| 2005/0091568 | A1* | 4/2005 | Levy | H03M 13/2948 714/755 |
| 2011/0044399 | A1* | 2/2011 | Dowling | H04L 25/03286 375/286 |
| 2012/0054576 | A1* | 3/2012 | Gross | H03M 13/1117 714/752 |
| 2014/0208183 | A1 | 7/2014 | Mahdavifar et al. | |
| 2015/0194987 | A1 | 7/2015 | Li et al. | |
| 2015/0333769 | A1* | 11/2015 | Jeong | H03M 13/6362 714/790 |
| 2015/0358113 | A1* | 12/2015 | Callard | H04W 28/04 714/776 |
| 2016/0013810 | A1 | 1/2016 | Gross et al. | |
| 2016/0182187 | A1 | 6/2016 | Kim et al. | |
| 2016/0218743 | A1 | 7/2016 | Li et al. | |
| 2016/0285479 | A1* | 9/2016 | El-Khamy | H03M 13/6368 |
| 2016/0308643 | A1 | 10/2016 | Li et al. | |
| 2017/0047947 | A1* | 2/2017 | Hong | H03M 13/2906 |
| 2019/0089380 | A1 | 3/2019 | Shen et al. | |

FOREIGN PATENT DOCUMENTS

| | | | |
|---|---|---|---|
| CN | 102122966 | A | 7/2011 |
| CN | 103023618 | A | 4/2013 |
| CN | 103414540 | A | 11/2013 |
| CN | 103684477 | A | 3/2014 |
| CN | 103825669 | A | 5/2014 |
| CN | 104124979 | A | 10/2014 |
| CN | 104158550 | A | 11/2014 |
| CN | 105075163 | A | 11/2015 |
| CN | 105099622 | A | 11/2015 |
| EP | 3054599 | A1 | 8/2016 |
| WO | 2015096021 | A1 | 7/2015 |

OTHER PUBLICATIONS

Niu Kai et al:"Polar codes:Primary concepts and practical decoding algorithms", IEEE Communications Magazine, IEEE Service Center, Piscataway, US, vol. 52, No. 7, Jul. 2014, total 12 pages.

Huawei, HiSilicon,"Polar code design and rate matching", 3GPP TSG RAN WG1 Meeting #86 R1-167209, Gothenburg, Sweden, Aug. 22-26, 2016, total 5 pages.

* cited by examiner

| N=16 | 0 | 1 | 2 | 4 | 8 | 3 | 5 | 6 | 9 | 10 | 12 | 7 | 11 | 13 | 14 | 15 |

| L=8 | 0 | 1 | 2 | 4 | 3 | 5 | 6 | 7 |

| L=4 | 0 | 1 | 2 | 3 |

| | 0 | 1 | 2 | 4 | 8 | 3 | 5 | 6 | 9 | 10 | 12 | 7 | 11 | 13 | 14 | 15 |
| | 000 | 001 | 010 | 100 | 101 | 011 | 100 | 100 | 101 | 101 | 110 | 100 | 101 | 110 | 110 | 110 |
| | | | | 0+4 | 0+8 | 3 | 1+4 | 2+4 | 1+8 | 2+8 | 0+12 | 3+4 | 3+8 | 1+12 | 2+12 | 3+12 |

| 0 | 1 | 2 | 4 | 8 | 3 | 5 | 6 | 9 | 10 | 12 | 7 | 11 | 13 | 14 | 15 |
| 0000 | 0001 | 0010 | 0100 | 1000 | 0011 | 0101 | 0110 | 1001 | 1010 | 1100 | 0111 | 1011 | 1101 | 1110 | 1111 |

| | 0 | 1 | 2 | 4 | 8 | 3 | 5 | 6 | 9 | 10 | 12 | 7 | 11 | 13 | 14 | 15 |
| | 0000 | 0001 | 0010 | 0100 | 1000 | 0011 | 0101 | 0110 | 1000 | 1000 | 1000 | 0111 | 1000 | 1000 | 1000 | 1000 |
| | | | | | 0+8 | | | | 1+8 | 2+8 | 4+8 | | 3+8 | 5+8 | 6+8 | 7+8 |

POLAR CODING METHOD, APPARATUS, AND DEVICE

CROSS-REFERENCE TO RELATED APPLICATIONS

This application is a continuation of International Application No. PCT/CN2017/091675, filed on Jul. 4, 2017, which claims priority to Chinese Patent Application No. 201610664987.6, filed on Aug. 11, 2016. The disclosures of the aforementioned applications are hereby incorporated by reference in their entireties.

TECHNICAL FIELD

This application relates to the field of channel coding, and more specifically, to a polar coding method, apparatus, and device.

BACKGROUND

In a communications system, channel coding is usually used to improve data transmission reliability and ensure communication quality. It has been theoretically proved that polar (Polar) codes are a coding scheme that can achieve a Shannon capacity with easy coding and decoding methods. A polar code is a linear block code. A generator matrix of the polar code is $G_N$, and a coding process of the polar code is $x_1^N=u_1^N \cdot G_N \cdot u_1^N=(u_1, u_2, \ldots, u_N)$ is a binary row vector, $G_N=F_2^{\otimes(log_2(N))}$, and a code length $N=2^2$, where n is a positive integer.

$$F_2=\begin{bmatrix}1 & 0\\ 1 & 1\end{bmatrix},$$

and $F_2^{\otimes(log_2(N))}$ is a Kronecker product of $F_2$ and is defined as $F_2^{\otimes(log_2(N))}=F\otimes F_2^{\otimes(log_2(N)-1)}$.

In a polar code coding process, one portion of bits in $u_1^N$ are used to carry information and are referred to as information bits. A set of sequence numbers of the information bits is denoted by A. The other portion of bits are set to fixed values that are pre-agreed by a receive end and a transmit end and are referred to as frozen bits. A set of sequence numbers of the frozen bits is represented by a complementary set Ac of A. In general, these frozen bits are set to 0s. Actually, a frozen bit sequence may be randomly set provided that the receive end and the transmit end have a pre-agreement. Therefore, a polar code coded bit sequence may be obtained in the following method: $x_1^N=u_A \cdot G_N(A)$. Herein, $u_A$ is a set of the information bits in $u_1^N$ and is a K-length row vector, meaning $|A|=K$. $|\cdot|=K$ represents a quantity of elements in the set; to be specific, K represents a quantity of elements in the set A. $G_N$ (A) is a sub-matrix obtained by using rows, corresponding to indexes in the set A, in the matrix $G_N$. $G_N$ (A) is a K×N matrix. When a CRC-aided improved SC decoding algorithm is used, polar codes can obtain better FER performance than LDPC and Turbo codes.

A key of polar code coding lies in determining a code length M and the information bit set A. In existing polar code coding solutions, the information bit set A cannot be determined through simple calculation. Therefore, the information bit set A is generally determined by offline calculation and storage. To be specific, an encoder and a decoder pre-store a relationship table of correspondences between a plurality of mother code sequences and code lengths and/or bit rates. During polar code coding, a corresponding mother code sequence is selected based on a required bit rate and/or code length.

A large quantity of mother code sequences need to be stored to support all combinations of code lengths and bit rates required by a system. Therefore, storage overheads of the system are extremely high.

SUMMARY

This application provides a polar coding method, apparatus, and device, so as to reduce storage overheads of a system.

According to a first aspect, this application provides a polar coding method. The method includes: obtaining reliability metrics of N polarized channels, where $N=2^n$, and n and N are positive integers; obtaining a maximum mother code sequence by sort sequence numbers of the N polarized channels in ascending order or descending order of the metrics, where the maximum mother code sequence is characterized in that, if a first sequence whose code length is Z is read from the maximum mother code sequence, ordering, in the first sequence, of Z sequence numbers included in the first sequence is the same as ordering, in the maximum mother code sequence, of the Z sequence numbers, where $Z=2^z$, $z\leq n$, and z is a positive integer; and storing the maximum mother code sequence.

It should be understood that the maximum mother code sequence is a sequence in a maximum length that can be supported by the system, and the length of the maximum mother code sequence $N=2^n$, where n is a positive integer. The first sequence is a sequence that is read from the maximum mother code sequence and that is in any code length (with a maximum length N).

In the prior art, a system needs to store one sequence for each mother code length In addition, under a same mother code length, different bit rates correspond to different sequences; therefore, the system needs to store sequences corresponding to all combinations of code lengths and bit rates. With such a storage method, storage overheads of a hardware system are extremely high.

In embodiments of this application, only the maximum mother code sequence that can be supported by the system is stored (in other words, only one sequence is stored). During polar code coding, a mother code sequence in a required length is read from the maximum mother code sequence, and then rate matching and coding are performed based on a polar code puncturing method. A quantity of mother code sequences that need to be stored by the system is less than that in the prior art, so that storage overheads of the system can be reduced.

In a possible implementation, the method further includes: determining a second sequence from the maximum mother code sequence based on a code length M of a target polar code, where the second sequence is used as a mother code sequence when coding into the target polar code is performed, the second sequence includes L sequence numbers, and ordering, in the second sequence, of the L sequence numbers is the same as ordering, in the maximum mother code sequence, of the L sequence numbers, where $M\leq L\leq N$, and M and L are positive integers.

It should be understood that the second sequence is meant for a polar code that needs to be obtained (that is, the target polar code). For the given code length M of the target polar code, a sequence that is used as a mother code sequence when coding into the target polar code is performed and that is read from the maximum mother code sequence is the second sequence.

It should be further understood that $L=2^b$, b≤n, and b is a positive integer.

In a possible implementation, the determining a second sequence from the maximum mother code sequence based on a code length M of a target polar code includes: determining a mother code length L of the target polar code based on the code length M of the target polar code; and obtaining the second sequence by successively reading, from the maximum mother code sequence, sequence numbers that are less than L.

It should be noted that, in the embodiments of this application, sequence numbers of the polarized channels start with 0, and therefore a sequence number range of the N polarized channels is from 0 to N−1.

It can be understood that the foregoing first sequence is in general a sequence read from the maximum mother code sequence. Herein, the second sequence is a sequence that is read from the maximum mother code sequence and that is used as the mother code of the target polar code when the code length of the target polar code is M.

In other words, during polar coding, the mother code sequence in the required length (that is, the second sequence) is first read from the maximum mother code sequence, and then polar coding is performed on to-be-coded bits by using the second sequence.

In a possible implementation, the determining a mother code length L of the target polar code based on the code length M of the target polar code includes: determining L=M when $M=2^m$; and $L=2^{\lceil \log_2 M \rceil}$ when $M \neq 2^m$, where m is a positive integer, and the symbol ⌈ ⌉ represents rounding up.

In a possible implementation, the storing the maximum mother code sequence includes: calculating, based on the length of the maximum mother code sequence and a preset rule, a quantity S of bits that need to be used to represent a sequence number in the maximum mother code sequence; calculating a maximum sequence length Q that is represented by (S−1) bits; determining a sequence obtained by successively sorting sequence numbers that are less than Q and that are in the maximum mother code sequence, as a base sequence; grouping sequence numbers that are greater than or equal to Q and that are in the maximum mother code sequence into $$\left(\frac{N-Q}{Q}\right)$$

offset sequences, where a quantity of sequence numbers included in each offset sequence is the same as a quantity of sequence numbers included in the base sequence, and an $i^{th}$ sequence number in each offset sequence corresponds to an $i^{th}$ sequence number in the base sequence, where 0≤i≤Q−1, and i is a nonnegative integer; storing, by using S bits, each sequence number that belongs to the base sequence and that is in the maximum mother code sequence, where the S bits include a first bit and a plurality of second bits, the first bit is used to indicate that a sequence number stored at a current location belongs to the base sequence, and the plurality of second bits are used to indicate a value of the sequence number stored at the current location; and storing, by using S bits, each sequence number that belongs to an offset sequence and that is in the maximum mother code sequence, where the S bits include a third bit and a plurality of fourth bits, the third bit is used to indicate that a sequence number stored at a current location belongs to an offset sequence, the plurality of fourth bits are used to indicate an offset multiplier of the sequence number stored at the current location with respect to a sequence number stored at a corresponding location in the base sequence, the offset multiplier is a result of dividing a difference between the sequence number stored at the current location and the sequence number stored at the corresponding location in the base sequence by a length of the base sequence, and the first bit is different from the third bit.

It should be noted that, in the embodiments of this application, when the quantity S of bits that need to be used to store the sequence number in the maximum mother code sequence is determined, the quantity S is calculated based on the length N of the maximum mother code sequence and the preset rule. In the embodiments of this application, the preset rule may be understood as an equation $N=2^{2S-2}$ pre-configured by the system. N is the length of the maximum mother code sequence, S is the quantity of bits used to represent each sequence number in the maximum mother code sequence. Based on the foregoing equation, for a maximum mother code sequence in any length, a quantity of bits that need to be used for storage using the compressed storage method provided in the embodiments of this application can be calculated.

Therefore, on the basis that the storage overheads of the system can be reduced because the system needs to store only one maximum mother code sequence, using the compressed storage method provided in the embodiments of this application to store the maximum mother code sequence can reduce the quantity of bits that are used to represent each sequence number in the maximum mother code sequence, so that storage overheads of the system can be further reduced.

In a possible implementation, the obtaining reliability metrics of N polarized channels includes:

obtaining the reliability metrics of the N polarized channels based on the following equation:

$$W_i = \sum_{j=0}^{n-1} B_j * 2^{\frac{1}{4} \cdot j},$$

where 0≤i≤N−1, $N=2^n$, n is a positive integer, $i=B_{n-1} B_{n-2} \ldots B_0$, $B_{n-1} B_{n-2} \ldots B_0$ is a binary representation of i, $B_{n-1}$ is the most significant bit, $B_0$ is the least significant bit, $B_j \in \{0,1\}$, and $W_i$ is used to represent a reliability of an $i^{th}$ polarized channel.

It should be understood that a polarization weight may be used as a parameter for measuring a reliability of a polarized channel. Therefore, in the embodiments of this application, when the reliabilities of the polarized channels are calculated, the foregoing formula may be optionally used to calculate polarization weights of the N polarized channels. A larger polarization weight of a polarized channel represents a higher reliability of the polarized channel.

In a possible implementation, the obtaining reliability metrics of N polarized channels includes:

obtaining error probabilities of the N polarized channels by using density evolution or Gaussian approximation. A lower error probability of a polarized channel represents a higher reliability of the polarized channel. The polarized channels are sorted based on the error probabilities, and in an sorted sequence, order of a sequence number of a polarized channel that fails to present the characteristic that the maximum mother code sequence in the embodiments of this application is supposed to have, is adjusted, so as to obtain the maximum mother code sequence in the embodiments of this application.

In a possible implementation, the method further includes: using the second sequence as a mother code sequence of the target polar code, and obtaining the target polar code according to a shortening method.

It should be noted that, shortening herein is one of polar code puncturing schemes.

According to a second aspect, this application provides a polar coding apparatus, configured to perform the method in any one of the first aspect or the possible implementations of the first aspect. Specifically, the apparatus includes units configured to perform the method in any one of the first aspect or the possible implementations of the first aspect.

According to a third aspect, this application provides a polar coding device. Specifically, the device includes: a memory, a processor, and a network interface. The memory, the processor, and the network interface may be connected to each other by using a bus system. The memory is configured to store an instruction, the processor is configured to execute the instruction stored in the memory, and when the instruction is executed, the processor performs, by using the network interface, the method in any one of the first aspect or the possible implementations of the first aspect.

According to a fourth aspect, this application provides a computer readable medium, configured to store a computer program. The computer program includes an instruction for performing the method in any one of the first aspect or the possible implementations of the first aspect.

According to a fifth aspect, this application provides a chip (or a chip system), including a memory and a processor. The memory is configured to store a computer program, the processor is configured to call the computer program from the memory and run the computer program, to enable a communications device provided with the chip to perform the method in any one of the first aspect or the possible implementations of the first aspect.

It should be understood that the communications device herein may be the apparatus described in any one of the second aspect or the possible implementation of the second aspect.

According to a sixth aspect, this application provides a polar coding method. The method includes: obtaining a maximum mother code sequence, where the maximum mother code sequence is characterized in that, if a first sequence whose code length is Z is read from the maximum mother code sequence, ordering, in the first sequence, of Z sequence numbers included in the first sequence is the same as ordering, in the maximum mother code sequence, of the Z sequence numbers, where $Z=2^z$, $z \le n$, and z is a positive integer; and performing polar coding by using the maximum mother code sequence.

In a possible implementation, the performing polar coding by using the maximum mother code sequence includes: determining a second sequence from the maximum mother code sequence based on a code length M of a target polar code, where the second sequence is used as a mother code sequence when coding into the target polar code is performed, the second sequence includes L sequence numbers, and ordering, in the second sequence, of the L sequence numbers is the same as ordering, in the maximum mother code sequence, of the L sequence numbers, where $M \le L \le N$, and M and L are positive integers; and performing polar coding on to-be-coded bits based on the second sequence.

In a possible implementation, the method further includes: obtaining reliability metrics of N polarized channels based on the following equation:

$$W_i = \sum_{j=0}^{n-1} B_j * 2^{\frac{1}{4} \cdot j},$$

where $0 \le i \le N-1$, $N=2^n$, n is a positive integer, $i=B_{n-1} B_{n-2} \ldots B_0$, $B_{n-1} B_{n-2} \ldots B_0$ is a binary representation of i, $B_{n-1}$ is the most significant bit, $B_0$ is the least significant bit, $B_j \in \{0,1\}$, $W_i$ is used to represent a reliability of an $i^{th}$ polarized channel, and N equals a length of the maximum mother code sequence; and determining the maximum mother code sequence based on the reliability metrics of the N polarized channels.

In the embodiments of this application, the system stores only the maximum mother code sequence that can be supported (in other words, one sequence is stored), and during polar code coding, the mother code sequence in the required length is then read from the maximum mother code sequence, so that the storage overheads of the system can be reduced.

DESCRIPTION OF EMBODIMENTS

The following describes the technical solutions of embodiments in this application with reference to accompanying drawings.

The embodiments of this application may be applied to various communications systems, such as a Global System for Mobile Communications (Global System for Mobile Communications, GSM) system, a Code Division Multiple Access (Code Division Multiple Access, CDMA) system, a Wideband Code Division Multiple Access (Wideband Code Division Multiple Access, WCDMA) system, a General Packet Radio Service (General Packet Radio Service, GPRS) system, a Long Term Evolution (Long Term Evolution, LTE) system, an LTE frequency division duplex (Frequency Division Duplex, FDD) system, an LTE time division duplex (Time Division Duplex, TDD) system, and a Universal Mobile Telecommunications System (Universal Mobile Telecommunications System, UMTS). Any information or data coded by a base station or a terminal in the foregoing systems by using a conventional Turbo code or low density parity check code (Low Density Parity Check Code, LDPC) may be coded by using a polar code in the embodiments.

The base station may be a device configured to communicate with a terminal device. For example, the base station may be a base station (Base Transceiver Station, BTS) in a GSM or CDMA system, or may be a base station (NodeB, NB) in a WCDMA system, or may be an evolved NodeB (Evolved Node B, eNB or eNodeB) in an LTE system. Alternatively, the base station may be a relay node, an access point, an in-vehicle device, a wearable device, a network side device on a future 5G network, or the like. The base station may alternatively be a terminal that functions as a base station in device-to-device (device-to-device D2D) communication.

The terminal may communicate with one or more core networks by using a radio access network (Radio Access Network, RAN). The terminal may be user equipment (User Equipment, UE), an access terminal, a subscriber unit, a subscriber station, a mobile station, a mobile console, a remote station, a remote terminal, a mobile device, a user terminal, a wireless communications device, a user agent, a user apparatus, or the like. The access terminal may be a cellular phone, a cordless phone, a Session Initiation Protocol (Session Initiation Protocol, SIP) phone, a wireless local loop (Wireless Local Loop, WLL) station, a personal digital assistant (Personal Digital Assistant, PDA), a handheld device or computing device having a wireless communications function or another processing device connected to a wireless modem, an in-vehicle device, a wearable device, a terminal device on a future 5G network, or the like.

For ease of understanding, the following describes a polar coding method 100 in an embodiment of this application in detail with reference to FIG. 1 to FIG. 5.

Figure 1:
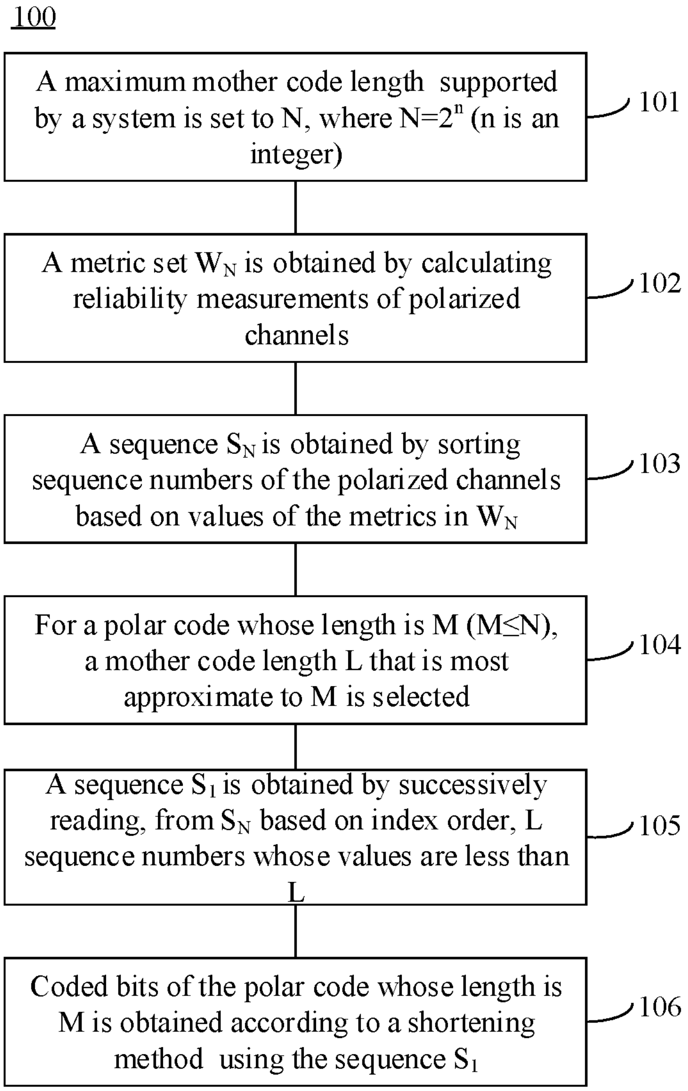
FIG. 1 is a schematic flowchart of a polar coding method 100 according to an embodiment of this application.

FIG. 1 is a schematic flowchart of the polar coding method 100 in this embodiment of this application. As shown in FIG. 1, the method 100 mainly includes steps 101 to 106.

101. A maximum mother code length supported by a system is set to N.

It can be understood that a mother code length of a polar code is limited to 2 to the power of n (n is a positive integer.). Therefore, a maximum mother code sequence length set by the system is $N=2^n$, where n is a positive integer. For example, N=16, 128, 256, 65536, or the like.

102. A metric set $W_N$ is obtained by calculating reliability metrics of polarized channels.

It should be understood that, during polar code coding, a mother code length is consistent with a quantity of the polarized channels. To be specific, if the maximum mother code length supported by the system is N, correspondingly, there are N polarized channels.

Specifically, when the reliability metrics of the polarized channels are calculated, a prior-art method such as density evolution, Gaussian approximation, or linear fitting may be used. A specific calculation process may be the same as that in the prior art. For brevity, details are not described herein.

Optionally, when the reliabilities of the polarized channels are calculated, a parameter such as an error probability, a channel capacity, or a polarization weight may be used as a parameter for measuring the reliabilities of the polarized channels, or another parameter that can measure the polarized channels may be used. This is not particularly limited in this embodiment of this application.

Optionally, when the polarization weight is used as the parameter for measuring the reliabilities of the polarized channels, the reliabilities of the polarized channels may be calculated based on the following equation:

$$W_i = \sum_{j=0}^{n-1} B_j * 2^{\frac{1}{4} \cdot j},$$

where $0 \le i \le N-1$, $N=2^n$, n is a positive integer, $i=B_{n-1} B_{n-2} \ldots B_0$, $B_{n-1} B_{n-2} \ldots B_0$ is a binary representation of i, $B_{n-1}$ is the most significant bit, $B_0$ is the least significant bit, $B_j \in \{0,1\}$, and $W_i$ is used to represent a reliability of an $i^{th}$ polarized channel.

There are N polarized channels, and therefore N metrics are obtained by calculating the reliabilities of the polarized channels. In other words, a metric set (which, for ease of description, is denoted by the set $W_N$ in the following description) is obtained.

103. A maximum mother code sequence $S_N$ is obtained by sorting sequence numbers of the polarized channels based on values of the metrics in $W_N$.

Specifically, the N polarized channels are in one-to-one correspondence with the N metrics, and each metric is used to represent a reliability of a corresponding polarized channel. The reliabilities of the N polarized channels are sorted based on values of the N metrics in the set $W_N$, and a sorting result is recorded by using the sequence numbers of the polarized channels, to obtain the sequence $S_N$. In other words, the sequence $S_N$ includes N sequence numbers, and ordering of the N sequence numbers indicates ordering of the reliabilities of the N polarized channels.

It can be understood that the sorting in step 103 is performed depending on a parameter selected for measuring the reliabilities of the polarized channels in step 102. It can be learned from the description in step 102 that, in step 103, the ordering of the polarized channels may be optionally determined based on the polarization weight, the error probability, the channel capacity, or another parameter that can measure the reliabilities of the polarized channels. This is not limited in this embodiment of this application.

It should be noted that, the sequence numbers of the polarized channels may be sorted in ascending order or descending order. This is not particularly limited in this embodiment of this application.

In this embodiment of this application, the maximum mother code sequence is stored in a coding device. Afterwards, when performing polar coding, the coding device may first obtain the maximum mother code sequence, and then perform polar coding by using the maximum mother code sequence. Specifically, the coding device first reads, from the maximum mother code sequence, a mother code sequence in a required length, then determines an information bit index set (which is also referred to as an information bit sequence number set) based on the read mother code sequence, and finally performs polar coding on to-be-coded bits by using the information bit index set.

104. For a polar code whose length is M ($M \le N$), a mother code length L that is most approximate to M is selected.

Specifically, two cases are differentiated when a mother code sequence of the polar code whose length is M is determined.

Case 1

$M=2^m$, where m is a positive integer.

The length of the polar code is the $m^{th}$ power of 2. For example, M=4 or 8. In this case, a value of the mother code length L of the polar code is M.

Case 2

$M \neq 2^m$, where m and M are positive integers.

The length of the polar code is not a value of the $m^{th}$ power of 2. For example, M=5, 7, 11, or the like. In this case, a value of the mother code length L of the polar code may be calculated based on a formula $L=2^{\lceil \log_2 M \rceil}$. The symbol $\lceil\ \rceil$ represents rounding up.

For example, when M=5, the value of L is $L=2^{\lceil \log_2 5 \rceil}=8$. For another example, when M=9, the value of L is $L=2^{\lceil \log_2 9 \rceil}=2^4=16$.

105. A sequence $S_1$ is obtained by successively reading, from the sequence $S_N$ based on index order, L sequence numbers that are less than L.

It should be understood that, when L<N, the sequence $S_1$ (an example of the first sequence) is a sub-sequence of the sequence $S_N$. When L=N, the sequence $S_1$ is the sequence $S_N$.

In step 104, if polar coding needs to be performed to obtain the polar code whose length is M, the mother code length is L. In step 105, the sequence $S_1$ that is used as the mother code of the polar code is read from the sequence $S_N$. Specifically, when the sequence $S_1$ is read, sequence numbers that are less than L need to be successively read based on index order of the sequence $S_N$.

Figure 2:
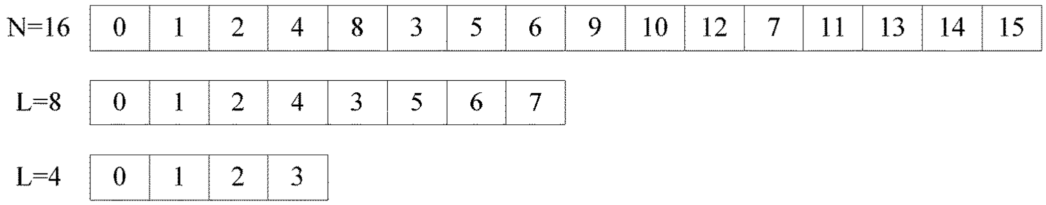
FIG. 2 is a schematic diagram of reading a sequence in any code length from a maximum mother code sequence according to an embodiment of this application.

With reference to FIG. 2, the following describes, by using an example, how the mother code sequence $S_1$ of the polar code is read.

FIG. 2 is a schematic diagram of reading a sequence in any code length from the maximum mother code sequence according to this embodiment of this application. As shown in FIG. 2, first, it is assumed that the maximum mother code length supported by the system is N=16. Correspondingly, there should be 16 sequence numbers stored in the sequence $S_N$, and ordering of the 16 sequence numbers corresponds to ordering of reliabilities of 16 polarized channels. It is assumed that a sequence $S_N$ obtained by sorting the reliabilities of the 16 polarized channels in ascending order is {0, 1, 2, 4, 8, 3, 5, 6, 9, 10, 12, 7, 11, 13, 14, 15}. For example, L=8. A sequence $S_1$ obtained by successively reading, from the sequence $S_N$, sequence numbers that are less than L (that is, less than 8) is {0, 1, 2, 4, 3, 5, 6, 7}. For another example, L=4. A sequence $S_1$ obtained by successively reading, from the sequence $S_N$, sequence numbers that are less than L (that is, less than 4) is {0, 1, 2, 3}.

106. Coded bits of the polar code whose length is M is obtained according to a shortening method using the sequence $S_1$.

Specifically, the sequence $S_1$ is used as the mother code sequence, and the polar code whose code length is M (that is, a target polar code) may be obtained according to the shortening (English name: Shorten, one of polar code puncturing schemes) method.

It can be learned from the foregoing process that, in this embodiment of this application, the system needs to store only one sequence (that is, the maximum mother code sequence that can be supported by the system). During implementation, the mother code sequence in the required length is read from the maximum mother code sequence based on the mother code length required by the polar code, so that storage overheads of the system can be reduced.

A specific maximum mother code sequence (denoted by a sequence #A in the following description) when N=65536 is as follows.

The sequence #A={0 1 2 4 8 16 3 32 5 6 9 64 10 17 12 18 128 33 20 34 7 24 36 65 11 256 66 40 13 19 68 14 129 48 21 72 130 35 22 25 512 132 37 80 26 38 257 67 136 41 28 258 96 69 42 15 144 49 260 70 44 73 131 50 23 1024 264 74 160 513 133 52 81 27 76 514 134 39 272 82 137 56 29 516 259 192 97 138 84 43 30 145 288 98 261 71 520 140 45 88 146 51 262 100 1025 46 265 75 2048 161 528 148 53 320 1026 266 104 77 162 515 135 54 273 83 152 57 1028 268 78 544 164 517 274 193 112 139 85 58 31 1032 518 384 289 194 99 276 168 86 521 141 60 89 147 290 576 263 196 101 522 142 1040 47 280 90 2049 176 529 149 292 102 321 1027 524 267 200 105 2050 92 163 530 150 55 4096 322 1056 153 296 1029 106 269 79 640 545 2052 165 532 275 208 113 154 324 59 1030 270 108 546 1033 166 519 385 304 195 114 2056 277 169 87 536 156 61 1088 328 1034 548 386 291 224 577 278 197 170 116 523 143 1041 62 281 91 2064 177 1036 768 578 388 293 198 103 552 336 172 1042 525 282 201 120 2051 93 178 531 151 294 580 4097 323 1152 1057 526 392 297 202 1044 107 284 2080 94 641 560 2053 180 533 4098 209 352 1058 155 325 298 1031 584 271 204 109 642 547 2054 1048 167 534 400 305 210 115 2057 4100 184 326 537 1060 157 300 1089 110 329 8192 1035 644 549 387 2112 306 225 592 2058 279 212 171 117 538 158 1280 63 1090 4104 330 1064 2065 550 416 1037 769 226 579 389 308 199 648 118 553 2060 337 173 1043 540 283 216 121 1092 2066 332 179 1038 770 608 390 295 228 581 4112 554 338 1153 174 1072 527 393 312 203 1045 122 2176 285 2081 95 656 561 2068 181 1096 772 582 4099 448 353 1154 1059 556 394 340 299 232 1046 585 286 205 2082 124 643 562 2055 1049 182 535 401 4128 211 354 2072 1536 4101 185 327 1156 776 1061 586 396 301 206 1104 111 672 344 8193 2084 1050 645 564 402 2113 307 240 593 2059 4102 213 186 356 539 1062 159 1281 302 1091 588 4105 331 1160 8194 1065 646 2304 551 417 2114 1052 784 227 594 404 2088 309 214 649 119 568 2061 4160 188 1282 541 1120 4106 217 360 1093 1066 2067 333 8196 418 1039 771 704 609 391 2116 310 229 650 596 4113 555 2062 339 1168 175 1073 542 408 313 218 1284 123 1094 2177 4108 2096 334 657 1068 800 2069 610 420 1097 773 230 583 4114 449 8200 368 1155 652 1074 557 395 2120 341 314 233 1047 600 2178 287 220 2083 125 658 16384 563 2070 1288 183 1098 774 4224 612 4129 450 355 1184 2073 1537 4116 558 424 342 1157 777 234 1076 587 397 316 207 2560 1105 126 673 2180 345 8208 2085 1051 660 565 403 2128 4130 241 1100 832 2074 1538 4103 452 187 357 1158 778 1063 616 398 1296 303 236 1106 589 4120 674 346 1161 8195 2086 1080 647 2305 566 432 2115 1053 785 242 2184 595 405 2089 4132 215 664 358 569 2076 1540 4161 189 1283 1216 780 1121 590 4107 456 361 1162 8224 1108 1067 676 2306 348 8197 419 2144 1054 786 705 624 406 2117 2090 311 244 651 597 4352 570 2063 4162 1169 190 1312 543 409 1122 4136 219 1285 362 1095 2192 1544 4109 2097 335 1164 8198 896 1069 801 706 2308 611 421 2118 1112 788 231 680 598 4115 464 8201 2092 369 1170 653 1075 572 410 2121 4164 315 248 1286 601 1124 2179 4110 221 2098 364 659 16385 1070 802 2071 1289 8256 422 1099 775 708 4225 613 4144 451 3072 8202 370 1185 654 2312 1552 4117 559 425 2122 343 1172 792 235 1077 602 412 2208 317 222 2561 1344 127 688 16386 2181 4168 8209 2100 1290 661 1128 804 4226 2129 614 4131 480 1101 833 1186 2075 1539 4118 453 8204 426 372 1159 779 712 1078 617 399 2124 1297 318 237 2562 1107 604 4121 675 2182 347 1176 8210 2087 1081 662 2320 16388 567 433 2130 1292 4608 243 1102 2185 834 4228 2104 1568 4133 454 665 359 1188 808 2077 1541 4176 618 428 1298 1217 781 238 1136 591 4122 457 8320 376 1163 8225 2564 1109 1082 677 2307 2240 349 8212 434 2145 1055 787 720 2186 625 407 2132 2091 4134 245 666 16392 836 4353 571 2078 1542 4163 1408 191 1313 1218 782 4232 1123 620 4137 458 1300 363 1192 8226 1110 2193 1545 4124 678 2336 350 1165 8199 897 2146 1084 816 707 2309

626 436 2119 2568 1113 789 246 681 2188 599 4354 465 8216 2093 4192 1171 668 1314 573 411 2136 1600 4165 4138 249 1287 1220 840 1125 2194 1546 4111 460 2099 365 1166 8228 898 16400 1071 803 736 2310 1304 8257 423 2148 1114 790 709 4240 682 628 4145 466 3073 8203 2094 371 1200 655 2313 1553 4356 574 440 2123 4166 1173 793 250 1316 32768 603 413 1126 2209 4140 223 2576 1345 366 689 16387 2196 1548 4169 8448 2101 1291 1224 8258 900 1129 805 710 4227 2368 615 4146 481 3074 8232 1116 848 1187 684 2314 1554 4119 468 8205 427 2152 373 1174 794 713 1079 632 414 2125 5120 2210 319 252 2563 1346 605 4360 690 16416 2183 4170 1177 8211 2102 1320 663 2321 16389 1130 806 4256 2131 1293 8260 4609 482 1103 2200 835 1664 4229 2105 1569 4148 455 3076 8206 904 374 1189 809 714 2316 1556 4177 619 429 2126 1299 1232 796 239 2592 1137 606 4123 472 8321 2212 377 1178 8240 2565 1348 1083 692 2322 16390 2241 4172 8213 435 2160 1294 4610 721 1132 2187 864 4230 2133 2106 1570 4135 484 667 16393 837 4368 1190 810 2079 1543 4178 1409 8264 430 1328 1219 783 716 4233 1138 621 4152 459 3080 8322 1301 378 1193 8227 2566 1111 2432 1560 4125 679 2337 2242 351 1180 8214 912 2147 1085 817 722 2324 16448 2216 627 437 2134 2569 1352 4612 247 696 16394 2189 838 4355 4288 8217 2108 1572 4193 1410 669 1315 1248 812 4234 2137 1601 4180 622 4139 488 1302 1221 841 1194 8704 1140 2195 1547 4126 461 8324 2338 380 1167 8229 899 2624 16401 1086 818 737 2311 2244 1305 8272 438 2149 2570 1115 791 724 4241 683 2190 629 4384 467 3088 8218 2095 4194 1201 670 2328 16396 1792 4357 575 441 2138 1602 4167 1412 4616 251 1317 1222 32769 842 4236 1127 2224 1576 4141 462 2577 1360 367 1196 8230 928 16402 2197 1549 4184 8449 738 2340 1306 1225 8259 901 2150 1144 820 711 4242 2369 8328 630 4147 496 3075 8233 2572 1117 849 1202 685 2315 2248 1555 4358 469 8220 442 2153 4196 1175 795 728 1318 32770 633 415 2140 1604 5121 2211 4142 253 2578 1347 16512 844 4361 691 16417 2198 1550 4171 1416 8450 2103 1321 1226 8288 902 6144 16404 1131 807 740 4257 2370 1308 8261 4624 483 3104 8234 1118 2201 850 1665 4244 686 2344 1584 4149 470 3077 8207 905 2154 375 1204 824 715 2317 1557 4416 634 444 2127 5122 2688 1233 797 254 2593 1376 32772 607 4362 473 8336 16418 2213 4200 1179 8241 2580 1349 1322 693 2323 16391 2256 1608 4173 8452 4258 2161 1295 1228 8262 4611 960 1133 2202 865 1666 4231 2372 2107 1571 4150 485 3078 8236 906 16408 852 4369 1191 811 744 2318 1558 4179 1424 8265 431 2156 1329 1234 798 717 4248 2594 1139 636 4153 474 3081 8323 5124 2214 379 1208 8242 2567 1350 2433 1561 4364 694 2352 16420 2243 4174 1181 8215 913 2162 1324 4640 32776 723 2325 16449 1134 2217 866 4260 2135 2584 1353 9216 4613 486 697 16395 2204 839 4370 1668 4289 8456 2109 1573 4208 1411 3136 8266 908 1330 1249 813 718 4235 2376 1616 4181 623 4154 489 3082 8352 1303 1236 856 1195 8705 2596 1141 2434 1562 4127 476 8325 2339 2272 381 1182 8244 914 2625 16640 1087 819 752 2326 16450 2245 5128 2218 8273 439 2164 2571 1354 4614 725 4480 698 16424 2191 868 4385 4290 3089 8219 2110 1574 4195 1440 671 2329 16397 1793 4372 1250 814 4264 2139 1603 4182 1413 8268 4617 490 1332 1223 32784 843 1672 4237 8706 1142 2225 1577 4156 463 3084 8326 2816 1361 382 1197 8231 929 2626 16403 2436 1564 4185 8464 739 2341 2246 1307 1240 8274 916 2151 2600 1145 821 726 4243 2384 16452 8329 2220 631 4386 497 3090 8248 2573 1356 4672 1203 700 2330 16398 2249 1794 4359 4292 8221 443 2168 1632 4197 1414 4618 729 1319 1252 32771 872 4238 2141 1605 5136 2226 1578 4143 492 2579 1362 16513 845 4376 1198 8708 930 16432 2199 1551 4186 1417 8451 8384 2342 1336 1227 8289 903 2628 6145 16405 1146 822 741 4272 2371 3200 8330 1309 8276 4625 498 3105 8235 2574 1119 2440 851 1680 4245 687 2345 2250 1585 4388 471 3092 8222 920 2155 4198 1205 825 730 2332 16456 1796 4417 32800 635 445 2142 1606 5123 2689 1472 4620 255 2608 1377 16514 32773 846 4363 4296 8337 16419 2228 1580 4201 1418 8480 2581 1364 1323 1256 8290 932 6146 16406 2257 1609 4188 8453 742 4259 2400 1310 1229 8263 4626 961 3106 8712 1148 2203 880 1667 4246 2373 8332 2346 1586 4151 500 3079 8237 907 2632 16409 853 1206 826 745 2319 2252 1559 4418 1425 8280 446 2157 5152 2690 1235 799 732 4249 2595 1378 32774 637 4392 475 3096 8338 16896 5125 2215 4202 1209 8243 2582 1351 2448 16516 1800 4365 695 2353 16421 2258 1610 4175 1420 8454 4736 2163 1325 1230 8292 4641 32777 962 6148 16464 1135 2232 867 1696 4261 2374 2585 1368 9217 4628 487 3108 8238 936 16410 2205 854 4371 1669 4304 8457 746 2348 1588 4209 1426 3137 8267 909 2158 1331 1264 828 719 4250 2377 10240 1617 4420 638 4155 504 3083 8353 5126 2692 1237 857 1210 8720 2597 1380 2435 32832 1563 4366 477 8340 2354 16422 2273 4204 1183 8245 915 2640 16641 1326 4642 32778 753 2327 16451 2260 1612 5129 2219 8512 4262 2165 2586 1355 16520 9218 4615 964 4481 699 16425 2206 869 4400 1670 4291 3328 8458 2111 1575 4210 1441 3138 8296 910 6152 16412 1808 4373 1251 815 748 4265 2378 1618 4183 1428 8269 4632 491 3112 8354 1333 1238 32785 858 1673 4252 8707 2598 1143 2464 1592 4157 478 3085 8327 2817 5184 2274 383 1212 8246 944 2627 16642 2437 1565 4424 8465 754 2356 16480 2247 5130 2696 1241 8275 917 2166 2601 1384 4644 32780 727 4482 2385 16453 8344 16426 2221 870 4387 4320 3091 8249 2588 1357 9220 4673 1442 701 2331 16399 2264 1795 4374 1728 4293 8460 4266 2169 1633 4212 1415 3140 8270 4619 968 1334 1253 32786 873 1674 4239 8736 2380 1620 5137 2227 1579 4158 493 3086 8356 2818 1363 16528 860 4377 1199 8709 931 2656 16433 2438 1566 4187 1432 8466 8385 2343 2276 1337 1242 8304 918 2629 6160 16644 2602 1147 823 756 4273 2386 16454 3201 8331 5132 2222 8277 4864 499 3120 8250 2575 1358 2441 4674 1681 4484 702 2360 16428 2251 1824 4389 4294 3093 8223 921 2170 1634 4199 1444 4648 32896 731 2333 16457 1797 4432 1254 32801 874 4268 2143 1607 5138 2704 1473 9224 4621 494 2609 1392 16515 32788 847 4378 1676 4297 8710 8576 16434 2229 1581 4216 1419 8481 3144 8386 2820 1365 1338 1257 8291 933 2630 6147 16407 2496 1624 4189 8468 743 4274 2401 3202 8360 1311 1244 8278 4627 976 3107 8713 2604 1149 2442 881 1682 4247 2388 17408 8333 2347 2280 1587 4390 501 3094 8252 922 2633 16648 4676 1207 827 760 2334 16458 2253 1798 4419 5248 32802 8281 447 2172 1636 5153 2691 1474 4622 733 4488 2610 1379 16544 32775 876 4393 4298 3097 8339 16897 5140 2230 1582 4203 1448 8482 2583 1366 2449 16517 1801 4380 1258 8768 934 6176 16436 2259 1611 4190 1421 8455 8388 4737 2402 1340 1231 8293 4656 32792 963 3584 6149 8714 16465 1150 2233 882 1697 4276 2375 3204 8334 2824 1369 9232 4629 502 3109 8239 937 2634 16411 2444 855 1684 4305 8472 747 2349 2254 1589 4448 1427 3152 8282 924 2159 5154 2720 1265 829 734 4251 2392 16460 10241 1856 4421 32804 639 4394 505 3098 8368 16898 5127 2693 1476 4680 1211 8721 2612 1381 2450 16518 32833 1802 4367 4300 8341 2355 16423 2288 1640 4205 1422 8484 4738 2641 16656 1327 1260 8294 4643 32779 992 6150 16466 2261 1613 5144 2234 8513 1698 4263 2404 2587 1370 16521 9219 4630 965 4496 3110 8716 938 16440 2207 884 4401 1671 4306 3329 8459 8392 2350 1590 4211 1456 3139 8297 911 2636 6153 16413 1809 1266 830 749 4280 2379 3208 10242 1619 4422 1429

8284 4633 506 3113 8355 5156 2694 1239 33024 859 1688 4253 8722 2599 1382 2465 32834 1593 4396 479 3100 8342 2832 16900 5185 2275 4206 1213 8247 945 2642 16643 2452 16576 1804 4425 12288 32808 755 2357 16481 2262 1614 5131 2697 1480 8514 4740 2167 2616 1385 16522 9248 4645 32781 966 4483 6208 16468 8345 16427 2236 871 4402 1700 4321 3330 8488 2589 1372 9221 4688 1443 3168 8298 940 6154 16414 2265 1810 4375 1729 4308 8461 750 4267 2408 1648 4213 1430 3141 8271 4634 969 3114 8832 1335 1268 32787 888 1675 4254 8737 2381 10244 1621 5376 2466 1594 4159 508 3087 8357 2819 5186 2752 16529 861 1214 8724 946 2657 16672 2439 32836 1567 4426 1433 8467 8400 2358 16482 2277 5160 2698 1243 8305 919 2644 6161 16645 2603 1386 4646 32782 757 4512 2387 16455 3216 8346 16904 5133 2223 8516 4865 4322 3121 8251 2590 1359 2456 16524 9222 4675 1920 4485 703 2361 16429 2266 1825 4404 1730 4295 3332 8462 4744 2171 1635 4214 1445 3142 8300 4649 32897 970 6156 16472 1812 4433 1255 32816 875 1704 4269 8738 2382 1622 5139 2705 1488 9225 4636 495 3116 8358 2848 1393 16530 32789 862 4379 1677 4312 8711 8577 2658 16435 2468 1596 4217 1434 8496 3145 8387 2821 5188 2278 1339 1272 8306 948 2631 6162 16646 2497 10248 1625 4428 8469 758 4275 2416 16484 3203 8361 5134 2700 1245 8279 4866 977 3122 8728 2605 1388 2443 4704 32840 1683 4486 2389 17409 8348 2362 16430 2281 1826 4391 4324 3095 8253 923 2648 16649 9280 4677 1446 4650 32898 761 2335 16459 2268 1799 4434 1732 5249 32803 8520 4270 2173 1637 5168 2706 1475 18432 9226 4623 972 4489 2611 1394 16545 32790 877 4408 1678 4299 8740 3336 8578 16912 5141 2231 1583 4218 1449 8483 3146 8416 2822 1367 6272 16532 1816 4381 1259 8769 935 2660 6177 16437 2498 1626 4191 1436 8470 8389 4752 2403 3232 8362 1341 1246 8308 4657 32793 978 3585 6164 8715 16704 2606 1151 2472 883 1712 4277 2390 17410 3205 8335 2825 5192 2282 9233 4868 503 3124 8254 952 2635 16650 2445 4678 1685 4544 8473 762 2364 16488 2255 1828 4449 5250 33280 3153 8283 925 2174 1638 5155 2721 1504 4652 32900 735 4490 2393 16461 10256 1857 4436 16546 32805 878 4395 4328 3099 8369 16899 5142 2708 1477 9228 4681 1450 8960 2613 1396 2451 16519 32848 1803 4382 1736 4301 8770 8580 6178 16438 2289 1641 4220 1423 8485 3148 8390 4739 2880 16657 1342 1261 8295 4658 32794 993 3586 6151 8744 16467 2500 1628 5145 2235 8528 1699 4278 2405 3206 8364 2826 1371 16536 9234 4631 980 4497 3111 8717 939 2664 16441 2446 885 1686 4307 3344 8474 17412 8393 2351 2284 1591 4450 1457 3154 8312 926 2637 6168 16652 5632 2722 1267 831 764 4281 2394 16462 3209 10243 1858 4423 5252 32806 8285 4872 507 3128 8370 16928 5157 2695 1478 33025 4682 1689 4492 8723 2614 1383 2480 16548 32835 1832 4397 4302 3101 8343 2833 16901 5200 2290 1642 4207 1452 8486 4768 32904 2643 16658 2453 16577 1805 4440 1262 8772 12289 32809 994 6180 16496 2263 1615 5146 2712 1481 8515 9344 4741 2406 2617 1400 16523 9249 4660 32796 967 4498 3588 6209 8718 16469 8584 16442 2237 886 4403 1701 4336 3331 8489 3264 8394 2828 1373 9236 4689 1458 3169 8299 941 2638 6155 16415 2504 1811 1744 4309 8476 751 4282 2409 3210 10272 1649 4452 1431 3156 8286 4635 984 3115 8833 5158 2724 1269 33026 889 1690 4255 8752 2396 17416 10245 1860 5377 2467 32864 1595 4398 509 3102 8372 2834 16902 5187 2753 16768 4684 1215 8725 947 2672 16673 2454 16578 32837 1806 4427 5256 12290 32810 8401 2359 16483 2292 1644 5161 2699 1482 8544 4742 2645 6400 16660 2618 1387 16552 9250 4647 32783 996 4513 6210 16470 3217 8347 16905 5148 2238 8517 4880 1702 4323 3360 8490 2591 1374 2457 16525 9223

4690 1921 4500 3170 8776 942 6184 16444 2267 1840 4405 1731 4310 3333 8463 8396 4745 2410 1650 4215 1460 3143 8301 4664 32912 971 3592 6157 8834 16473 1813 1270 32817 890 1705 4284 8739 2383 3212 10246 1623 5378 2944 1489 9240 4637 510 3117 8359 2849 5216 2754 16531 33028 863 1692 4313 8726 8592 2659 16674 2469 32838 1597 4456 1435 8497 3160 8402 2836 16960 5189 2279 5162 2728 1273 8307 949 2646 6163 16647 2512 16580 10249 1864 4429 12292 32812 759 4514 2417 16485 3218 8376 16906 5135 2701 1484 8518 4867 4800 3123 8729 2620 1389 2458 16526 9252 4705 32841 1922 4487 6212 17424 8349 2363 16431 2296 1827 4406 1760 4325 3334 8492 4746 2649 16664 9281 4692 1447 3172 8302 4651 32899 1000 6158 16474 2269 1814 4435 1733 5264 32818 8521 1706 4271 2412 1652 5169 2707 1490 18433 9227 4638 973 4504 3118 8836 2850 1395 16560 32791 892 4409 1679 4314 8741 3337 8579 10304 16913 5380 2470 1598 4219 1464 8498 3147 8417 2823 5190 2756 6273 16533 1817 1274 8784 950 2661 6192 16676 2499 33792 10250 1627 4430 1437 8471 8404 4753 2418 16486 3233 8363 5164 2702 1247 8309 4896 33032 979 3600 6165 8730 16705 2607 1390 2473 4706 32842 1713 4516 2391 17411 3220 8350 2840 16908 5193 2283 9472 4869 4326 3125 8255 953 2650 16651 2460 16584 9282 4679 1924 4545 12296 32928 763 2365 16489 2270 1829 4464 1734 5251 33281 3392 8522 4748 2175 1639 5170 2736 1505 18434 9256 4653 32901 974 4491 6216 16476 10257 1872 4437 16547 32820 879 4410 1708 4329 8742 3338 8608 16914 5143 2709 1492 9229 4696 1451 8961 3176 8418 2852 1397 6274 16534 32849 1818 4383 1737 4316 8771 8581 2662 6179 16439 2528 1656 4221 1438 8500 3149 8391 4754 2881 20480 3234 8840 1343 1276 8310 4659 32795 1008 3587 6166 8745 16706 2501 10252 1629 5384 2474 8529 1714 4279 2420 17440 3207 8365 2827 5194 2760 16537 9235 4870 981 3126 8732 954 2665 16680 2447 4708 32844 1687 4546 3345 8475 17413 8408 2366 16490 2285 1830 4451 5280 33282 3155 8313 927 2652 6169 16653 9284 5633 2723 1506 4654 32902 765 4520 2395 16463 3224 10258 1859 4438 17024 5253 32807 8524 4873 4330 3129 8371 16929 5172 2710 1479 33040 18436 9230 4683 1928 4493 8962 2615 1398 2481 16549 32850 1833 4412 1738 4303 8800 3340 8582 6656 16916 5201 2291 1643 4222 1453 8487 3150 8420 4769 32905 2882 16659 6276 16592 1820 4441 1263 8773 12304 32824 995 3616 6181 8746 16497 2502 1630 5147 2713 1496 8530 9345 4756 2407 3236 8366 2856 1401 16538 9264 4661 32797 982 4499 3589 6224 8719 16708 8585 2666 16443 2476 887 1716 4337 3346 8504 17414 3265 8395 2829 5196 2286 9237 4928 1459 3184 8314 956 2639 6170 16654 2505 5634 10368 1745 4548 8477 766 4283 2424 16492 3211 10273 1888 4453 5254 33284 3157 8287 4874 985 3130 8848 16930 5159 2725 1508 33027 4712 32960 1691 4494 8753 2397 17417 10260 1861 5392 2482 16550 32865 1834 4399 4332 3103 8373 2835 16903 5202 2768 16769 9288 4685 1454 8964 4770 32906 2673 16688 2455 16579 32852 1807 4442 1740 5257 8774 12291 32811 8640 6182 16498 2293 1645 5176 2714 1483 8545 18440 9346 4743 2884 6401 16661 2619 1402 16553 9251 4662 32798 997 4528 3590 6211 8748 16471 3456 8586 16920 5149 2239 8532 4881 1703 4338 3361 8491 3266 8424 2830 1375 6280 16540 9238 4691 1936 4501 3171 8777 943 2668 6185 16445 2506 1841 1746 4311 3348 8478 17472 8397 4760 2411 3240 10274 1651 4454 1461 3158 8316 4665 32913 986 3593 6172 8835 16712 5636 2726 1271 33056 891 1720 4285 8754 2398 17418 3213 10247 1862 5379 2945 5312 32866 9241 4876 511 3132 8374 2864 16932 5217 2755 16770 33029 4686 1693 4552 8727 8593 2674 16675 2484 16608

32839 1836 4457 5258 12320 33288 3161 8403 2837 16961 5204 2294 1646 5163 2729 1512 8546 4772 32908 2647 6402 16662 2513 16581 10264 1865 4444 16554 9728 12293 32813 998 4515 6240 16500 3219 8377 16907 5150 2716 1485 8519 4882 9348 4801 3362 8968 2621 1404 2459 16527 9253 4720 32856 1923 4502 3648 6213 8778 17425 8588 6186 16446 2297 1842 4407 1761 4340 3335 8493 3268 8398 4747 2888 16665 9296 4693 1462 3173 8303 4666 32914 1001 3594 6159 8864 16475 2508 1815 1748 5265 32819 8536 1707 4286 2413 3214 10276 1653 5408 2946 1491 18448 9242 4639 988 4505 3119 8837 2851 5218 2784 16561 33030 893 1694 4315 8756 3352 8594 17420 10305 17152 5381 2471 32868 1599 4458 1465 8499 3162 8432 2838 16962 5191 2757 6288 16772 5640 2730 1275 8785 951 2676 6193 16677 2514 16582 33793 10251 1866 4431 5260 12294 32814 8405 4992 2419 16487 3248 8378 16936 5165 2703 1486 8548 4897 33033 4802 3601 6404 8731 16720 2622 1391 2488 16556 9254 4707 32843 1952 4517 6214 17426 3221 8351 2841 16909 5208 2298 9473 4884 1762 4327 3364 8494 4776 34816 2651 16666 2461 16585 9283 4694 1925 4560 3174 8780 12297 32929 1002 6188 16504 2271 1844 4465 1735 5266 33296 3393 8523 9352 4749 2414 1654 5171 2737 1520 18435 9257 4668 32916 975 4506 3596 6217 8838 16477 10496 1873 16562 32821 894 4411 1709 4344 8743 3339 8609 3272 10306 16915 5382 2948 1493 9244 4697 1466 8976 3177 8419 2853 5220 2758 6275 16535 33088 1819 1752 4317 8786 8596 2663 6194 16678 2529 33794 10280 1657 4460 1439 8501 3164 8406 4755 2896 16964 20481 3235 8841 5166 2732 1277 8311 4898 33034 1009 3602 6167 8760 16707 2516 17536 10253 1868 5385 2475 12352 32872 1715 4518 2421 17441 3222 8380 2842 16910 5195 2761 16776 9474 4871 4804 3127 8733 955 2680 16681 2462 16586 9312 4709 32845 1926 4547 7168 12298 17428 32930 8409 2367 16491 2300 1831 4466 1764 5281 33283 3394 8552 4750 2653 6408 16668 9285 5648 2738 1507 18464 9258 4655 32903 1004 4521 6218 16478 3225 10259 1874 4439 17025 5268 32822 8525 4888 1710 4331 3368 8610 16944 5173 2711 1494 33041 18437 9231 4698 1929 4508 8963 3178 8896 2854 1399 6304 16564 32851 1848 4413 1739 4318 8801 3341 8583 10308 6657 16917 5440 2530 1658 4223 1468 8502 3151 8421 4784 32920 2883 20482 3712 6277 8842 16593 1821 1278 8788 12305 32825 1010 3617 6196 8747 16736 2503 33796 10254 1631 5386 2952 1497 8531 9360 4757 2422 17442 3237 8367 2857 5224 2762 16539 9265 4900 33036 983 3604 6225 8734 16709 8600 2667 16682 2477 4710 32846 1717 4576 3347 8505 17415 3280 8410 2844 16968 5197 2287 9476 4929 5282 33312 3185 8315 957 2654 6171 16655 2520 16588 9286 5635 10369 1984 4549 12300 32932 767 4522 2425 16493 3226 10288 1889 4468 17026 5255 33285 3396 8526 4875 4808 3131 8849 16931 5174 2740 1509 33042 18438 9260 4713 32961 1930 4495 8992 6220 17432 10261 1876 5393 2483 16551 32880 1835 4414 1768 4333 8802 3342 8612 6658 16918 5203 2769 16784 9289 4700 1455 8965 3180 8422 4771 32907 2912 16689 6278 16594 32853 1822 4443 1741 5272 8775 12306 32826 8641 3618 6183 16499 2532 1660 5177 2715 1498 8560 18441 9347 4758 2885 6416 20484 3238 8844 2858 1403 16568 9266 4663 32799 1012 4529 3591 6226 8749 16710 3457 8587 10312 16921 5388 2478 8533 1718 4339 3376 8506 17444 3267 8425 2831 5198 2764 6281 16541 9239 4930 1937 3186 8792 958 2669 6200 16684 2507 5664 33800 10370 1747 4550 3349 8479 17473 8412 4761 2426 16494 3241 10275 1890 4455 5284 33286 3159 8317 4904 33152 987 3608 6173 8850 16713 24576 5637 2727 1510 33057 4714 32962 1721 4524 8755 2399 17419 3228 10262 1863 5394 2960 17028 5313 32867 9480

4877 4334 3133 8375 2865 16933 5232 2770 16771 33044 18496 9290 4687 1932 4553 8966 12416 32936 2675 16690 2485 16609 32854 1837 4472 1742 5259 8804 12321 33289 3400 8642 6660 16976 5205 2295 1647 5178 2744 1513 8547 18442 9376 4773 32909 2886 6403 16663 6336 16596 10265 1880 4445 16555 9729 12308 32828 999 4530 3620 6241 8750 16501 3458 8616 16922 5151 2717 1500 8534 4883 9349 4816 3363 8969 3296 8426 2860 1405 6282 16542 9268 4721 32857 1938 4503 3649 6228 8779 17664 8589 2670 6187 16447 2536 1843 1776 4341 3350 8508 17474 3269 8399 4762 2889 20488 3242 10752 9297 4932 1463 3188 8318 4667 32915 1016 3595 6174 8865 16714 2509 5638 10372 1749 5504 33058 8537 1722 4287 2428 17448 3215 10277 1892 5409 2947 5314 33344 18449 9243 4878 989 3134 8852 2866 16934 5219 2785 16800 33031 4716 32964 1695 4554 8757 3353 8595 17421 10320 17153 5396 2486 16610 32869 1838 4459 5288 12322 33290 3163 8433 2839 16963 5206 2772 6289 16773 9292 5641 2731 1514 9024 4774 32910 2677 6432 16692 2515 16583 33808 10266 1867 4446 17032 5261 9730 12295 32815 8644 4993 6242 16502 3249 8379 16937 5180 2718 1487 8549 4912 33048 18444 9350 4803 3840 6405 8970 16721 2623 1406 2489 16557 9255 4722 32858 1953 4532 3650 6215 8808 17427 3460 8590 6664 16924 5209 2299 9488 4885 1763 4342 3365 8495 3270 8428 4777 34817 2890 16667 6284 16600 9298 4695 1940 4561 3175 8781 12312 32944 1003 3624 6189 8866 16505 2510 1845 1750 5267 33297 3408 8538 17476 9353 4764 2415 3244 10278 1655 5410 2976 1521 18450 9272 4669 32917 990 4507 3597 6232 8839 16716 10497 5696 2786 16563 33060 895 1724 4345 8758 3354 8624 17422 3273 10307 17154 5383 2949 5316 32870 9245 4936 1467 8977 3192 8434 2868 16992 5221 2759 6290 16774 33089 5642 10376 1753 4556 8787 8597 2678 6195 16679 2544 16612 33795 10281 1896 4461 5262 12324 33292 3165 8407 4994 2897 16965 20496 3250 8856 16938 5167 2733 1516 8550 4899 33035 4832 32968 3603 6406 8761 16722 2517 17537 10268 1869 5400 2490 16558 9732 12353 32873 1954 4519 6244 17456 3223 8381 2843 16911 5210 2776 16777 9475 4886 9408 4805 3366 8972 4778 34818 2681 16696 2463 16587 9313 4724 32860 1927 4562 3652 7169 8782 12299 17429 32931 8648 6190 16506 2301 1846 4467 1765 5296 33298 3395 8553 18560 9354 4751 2892 6409 16669 9300 5649 2739 1522 18465 9259 4670 32918 1005 4536 3598 6219 8868 16479 3464 10498 1875 17040 5269 32823 8540 4889 1711 4346 3369 8611 3274 10336 16945 5412 2950 1495 36864 18452 9246 4699 1944 4509 8978 3179 8897 2855 5222 2788 6305 16565 33090 1849 1754 4319 8816 3356 8598 17480 10309 6672 17156 5441 2531 33824 10282 1659 4462 1469 8503 3166 8436 4785 32921 2898 16966 20483 3713 6292 8843 16832 5644 2734 1279 8789 12544 33064 1011 3632 6197 8762 16737 2518 17538 33797 10255 1870 5387 2953 5320 12354 32874 9361 4996 2423 17443 3252 8382 2872 16940 5225 2763 16778 9504 4901 33037 4806 3605 6464 8735 16724 8601 2682 16683 2492 16616 9314 4711 32847 1956 4577 7170 12328 17430 33408 3281 8411 2845 16969 5212 2302 9477 4944 1766 5283 33313 3424 8554 4780 34820 2655 6410 16670 2521 16589 9287 5650 10384 1985 4564 18466 9736 12301 32933 1006 4523 6248 16508 3227 10289 1904 4469 17027 5270 33300 3397 8527 4890 9356 4809 3370 9088 16946 5175 2741 1524 33043 18439 9261 4728 32976 1931 4510 8993 3656 6221 8898 17433 10500 1877 6306 16566 32881 1850 4415 1769 4348 8803 3343 8613 3276 10310 6659 16919 5442 3008 16785 9304 4701 1470 8980 3181 8423 4786 32922 2913 20512 3714 6279 8872 16595 33092 1823 1756 5273 8790 12307 32827 8656 3619 6198 16738 2533 33798 10284 1661 5416 2954 1499

8561 18456 9362 4759 2900 6417 17920 20485 3239 8845 2859 5226 2792 16569 9267 4902 33038 1013 3606 6227 8764 16711 3472 8602 17540 10313 17160 5389 2479 12356 32876 1719 4578 3377 8507 17445 3282 8440 2846 16970 5199 2765 6296 16780 9478 4931 5760 33314 3187 8793 959 2684 6201 16685 2522 16590 9316 5665 33801 10371 1986 4551 7172 12302 17488 32934 8413 5000 2427 16495 3256 10290 1891 4470 17056 5285 33287 3398 8556 4905 33153 4810 3609 6412 8851 16728 24577 5652 2742 1511 33072 18468 9262 4715 32963 1960 4525 8994 6222 17434 3229 10263 1878 5395 2961 17029 5328 32882 9481 4892 1770 4335 3372 8614 6688 16948 34824 5233 2771 16786 33045 18497 9291 4702 1933 4568 8967 3182 8900 12417 32937 2914 16691 6308 16624 32855 1852 4473 1743 5274 8805 12336 33304 3401 8643 11264 6661 16977 5444 2534 1662 5179 2745 1528 8562 18443 9377 4788 32924 2887 6418 20486 3716 6337 8846 16597 10504 1881 16570 9744 12309 32829 1014 4531 3621 6256 8751 16740 3459 8617 33856 10314 16923 5390 2956 1501 8535 9364 4817 3378 8984 17446 3297 8427 2861 5228 2766 6283 16543 9269 4960 33096 1939 3664 6229 8794 17665 8604 2671 6202 16686 2537 5666 33802 10400 1777 4580 3351 8509 17475 3284 8414 4763 2904 16972 20489 3243 10753 9536 4933 5286 33316 3189 8319 4906 33154 1017 3610 6175 8880 16715 2524 17544 24578 5639 10373 1988 5505 33059 12360 32992 1723 4526 2429 17449 3230 10292 1893 5424 2962 17030 5315 33345 18688 9482 4879 4812 3135 8853 2867 16935 5234 2800 16801 33046 18498 9320 4717 32965 1934 4555 8996 7176 12418 17436 32938 10321 17168 5397 2487 16611 32884 1839 4474 1772 5289 8806 12323 33291 3402 8672 6662 16978 5207 2773 6528 16788 9293 5656 2746 1515 9025 18472 9378 4775 32911 2916 6433 16693 6338 16598 33809 10267 1882 4447 17033 5276 9731 12310 32830 8645 5008 3622 6243 16503 3488 8618 16952 5181 2719 1502 8564 4913 33049 18445 9351 4818 3841 6420 8971 20544 3298 8904 2862 1407 6312 16572 9270 4723 32859 1968 4533 3651 6230 8809 17666 3461 8591 10316 6665 16925 5448 2538 9489 1778 4343 3380 8510 17504 3271 8429 4792 34832 2891 20490 3720 6285 10754 16601 9299 4934 1941 3190 8796 12313 32945 1018 3625 6204 8867 16744 2511 5668 33804 10374 1751 5506 33536 3409 8539 17477 9368 4765 2430 17450 3245 10279 1894 5411 2977 5344 33346 18451 9273 4908 33156 991 3612 6233 8854 16717 10512 24580 5697 2787 16802 33061 4718 32966 1725 4584 8759 3355 8625 17423 3288 10322 17155 5398 2964 17088 5317 32871 9484 4937 5290 12800 33320 3193 8435 2869 16993 5236 2774 6291 16775 33104 18500 9294 5643 10377 1992 4557 9026 12420 32940 2679 6434 16694 2545 16613 33810 10296 1897 4476 17034 5263 9760 12325 33293 3404 8646 4995 6720 16980 20497 3251 8857 16939 5182 2748 1517 8551 4914 33050 18446 9380 4833 32969 3842 6407 9000 16723 6340 17552 10269 1884 5401 2491 16559 9733 12368 32888 1955 4534 3680 6245 8810 17457 3462 8620 6666 16926 5211 2777 16792 9490 4887 9409 4820 3367 8973 3300 8430 4779 34819 2920 16697 6286 16602 9328 4725 32861 1942 4563 3653 7184 8783 12314 17668 32946 8649 3626 6191 16507 2540 1847 1780 5297 33299 3410 8568 17478 18561 9355 4766 2893 6424 20492 3246 10756 9301 5888 2978 1523 18480 9274 4671 32919 1020 4537 3599 6234 8869 16718 3465 10499 5698 10432 17041 5508 33062 8541 1726 4347 3384 8626 17452 3275 10337 17184 5413 2951 5318 33348 36865 18453 9247 4938 1945 8979 3194 8912 2870 16994 5223 2789 6320 16804 33091 5672 33920 10378 1755 4558 8817 3357 8599 17481 10324 6673 17157 5456 2546 16614 33825 10283 1898 4463 5292 12326 33294 3167 8437 5024 33160 2899 16967 20498

3728 6293 8858 16833 24584 5645 2735 1518 9028 12545 33065 4834 32970 3633 6436 8763 16752 2519 17539 33812 10270 1871 5402 2968 17036 5321 9734 12355 32875 9600 4997 6246 17458 3253 8383 2873 16941 5240 2778 16779 9505 4916 33052 18504 9410 4807 3844 6465 8974 16725 12424 34848 2683 16698 2493 16617 9315 4726 32862 1957 4592 3654 7171 8812 12329 17431 33409 3520 8650 6668 16984 5213 2303 9492 4945 1767 5298 33328 3425 8555 18562 9384 4781 34821 2894 6411 16671 6344 16604 9302 5651 10385 2000 4565 18467 9737 12316 32948 1007 4538 3628 6249 8870 16509 3466 10528 1905 17042 5271 33301 3412 8542 4891 9357 4824 3371 9089 3304 10338 16947 5414 2980 1525 36866 18454 9276 4729 32977 1946 4511 9008 3657 6236 8899 17672 10501 5700 2790 6307 16567 33120 1851 1784 4349 8818 3358 8628 17482 3277 10311 6674 17158 5443 3009 20608 33826 10760 9305 4940 1471 8981 3196 8438 4787 32923 2928 16996 20513 3715 6294 8873 16834 33093 5646 10380 1757 5512 8791 12546 33066 8657 3634 6199 16739 2548 17568 33799 10285 1900 5417 2955 5322 12384 33352 18457 9363 4998 2901 17921 20500 3254 8860 2874 16942 5227 2793 16808 9506 4903 33039 4836 32972 3607 6466 8765 16726 3473 8603 17541 10328 17161 5404 2494 16618 9792 12357 32877 1958 4579 7200 12330 17460 33410 3283 8441 2847 16971 5214 2780 6297 16781 9479 4946 9412 5761 33315 3426 9032 4782 34822 2685 6440 16700 2523 16591 9317 5680 33816 10386 1987 4566 18944 7173 9738 12303 17489 32935 8652 5001 6250 16510 3257 10291 1906 4471 17057 5300 33302 3399 8557 4920 33168 18564 9358 4811 3848 6413 9090 16729 24592 5653 2743 1526 33073 18469 9263 4730 32978 1961 4540 8995 3658 6223 8928 17435 3468 10502 1879 6784 17044 5329 32883 9496 4893 1771 4350 3373 8615 3278 10340 6689 16949 34825 5472 3010 16787 36868 18512 9306 4703 1948 4569 8982 3183 8901 12432 32952 2915 20514 3744 6309 8874 16625 33094 1853 1758 5275 8820 12337 33305 3416 8658 17484 11265 6676 17216 5445 2535 33828 10286 1663 5418 2984 1529 8563 18458 9392 4789 32925 2902 6419 17922 20487 3717 6352 8847 16836 10505 5704 2794 16571 9745 12548 33068 1015 3636 6257 8766 16741 3474 8632 17542 33857 10315 17162 5391 2957 5324 12358 32878 9365 5056 3379 8985 17447 3312 8442 2876 17000 5229 2767 6298 16782 9508 4961 33097 5762 40960 3665 6468 8795 17680 8605 2686 6203 16687 2552 16620 9318 5667 33803 10401 2016 4581 7174 12332 17490 33412 3285 8415 5002 2905 16973 20504 3258 10768 9537 4948 17058 5287 33317 3428 8558 4907 33155 4840 34880 3611 6414 8881 16730 2525 17545 24579 5654 10388 1989 5520 33074 18470 9740 12361 32993 1962 4527 6252 17464 3231 10293 1908 5425 2963 17031 5330 33360 18689 9483 4894 9416 4813 3374 9092 6690 16950 34826 5235 2801 16816 33047 18499 9321 4732 32980 1935 4570 8997 3660 7177 8902 12419 17437 32939 10560 17169 6310 16626 32885 1854 4475 1773 5304 8807 12338 33306 3403 8673 18568 11266 6663 16979 5446 3012 6529 16789 9308 5657 2747 1530 9040 18473 9379 4790 32926 2917 6448 20516 3718 6339 8876 16599 34048 10506 1883 17048 5277 9746 12311 32831 8660 5009 3623 6258 16742 3489 8619 33858 10344 16953 5420 2958 1503 8565 36872 18460 9366 4819 3856 6421 8986 17924 20545 3299 8905 2863 5230 2796 6313 16573 9271 4962 33098 1969 3666 6231 8824 17667 3476 8606 17600 10317 6680 17164 5449 2539 13312 33832 10402 1779 4582 3381 8511 17505 3286 8444 4793 34833 2906 16974 20491 3721 6300 10755 16840 9538 4935 5764 33318 3191 8797 12552 33184 1019 3640 6205 8882 16745 2526 17546 24608 5669 33805 10375 1990 5507 33537 7232 12362 17492 32994 9369

5004 2431 17451 3260 10294 1895 5426 2992 17060 5345 33347 18690 9512 4909 33157 4814 3613 6472 8855 16732 10513 24581 5712 2802 16803 33076 18528 9322 4719 32967 1964 4585 8998 7178 12448 17438 33416 3289 10323 17170 5399 2965 17089 5332 32886 9485 4952 1774 5291 12801 33321 3432 8674 6692 17008 34828 5237 2775 6530 16790 33105 18501 9295 5658 10392 1993 4572 9027 18474 9856 12421 32941 2918 6435 16695 6368 16628 33811 10297 1912 4477 17035 5278 9761 12340 33308 3405 8647 5010 11268 6721 16981 20736 3490 9096 16954 5183 2749 1532 8566 4915 33051 18447 9381 4848 32984 3843 6422 9001 20546 3776 6341 8906 17553 10508 1885 6314 16574 9748 12369 32889 1970 4535 3681 6260 8811 17696 3463 8621 33860 10318 6667 16927 5450 3016 16793 9491 9424 4821 3382 8988 17506 3301 8431 4794 34834 2921 20520 3722 6287 10784 16603 9329 4964 33100 1943 3668 7185 8798 12315 17669 32947 8664 3627 6206 16746 2541 5670 33806 10404 1781 5536 33538 3411 8569 17479 18576 9370 4767 2908 6425 17928 20493 3247 10757 9540 5889 2979 5346 33376 18481 9275 4910 33158 1021 3614 6235 8884 16719 3480 10514 17548 24582 5699 10433 17280 5509 33063 12364 32996 1727 4586 3385 8627 17453 3290 10352 17185 5428 2966 17090 5319 33349 36880 18692 9486 4939 5768 12802 33322 3195 8913 2871 16995 5238 2804 6321 16805 33106 18502 9324 5673 33921 10379 1994 4559 9056 7180 12422 17496 32942 10325 6912 17172 5457 2547 16615 33840 10298 1899 4478 17064 5293 9762 12327 33295 3406 8676 5025 33161 6722 16982 20499 3729 6532 8859 16848 24585 5660 2750 1519 9029 12560 33080 18476 9382 4835 32971 3872 6437 9002 16753 6342 17554 33813 10271 1886 5403 2969 17037 5336 9735 12370 32890 9601 5012 3682 6247 17459 3492 8622 6696 16956 34944 5241 2779 16794 9520 4917 33053 18505 9411 4822 3845 6480 8975 20548 3302 8908 12425 34849 2922 16699 6316 16632 9330 4727 32863 1972 4593 3655 7186 8813 12344 17670 33424 3521 8651 11272 6669 16985 5452 2542 9493 1782 5299 33329 3440 8570 17508 18563 9385 4796 34836 2895 6426 20494 3724 6345 10758 16605 9303 5890 10624 2001 18482 9752 12317 32949 1022 4539 3629 6264 8871 16748 3467 10529 5728 33864 10434 17043 5510 33540 3413 8543 9372 4825 3386 9104 17454 3305 10339 17186 5415 2981 5348 33350 36867 18455 9277 4968 33216 1947 9009 3672 6237 8914 17673 10516 24640 5701 2791 6322 16806 33121 5674 33922 10408 1785 4588 8819 3359 8629 17483 3292 10326 6675 17159 5458 3024 17092 20609 33827 10761 9544 4941 5294 12804 33324 3197 8439 5026 33162 2929 16997 20528 3730 6295 8888 16835 33108 19456 24586 5647 10381 1996 5513 9030 12547 33067 12480 33000 3635 6438 16754 2549 17569 33814 10300 1901 5432 2970 17038 5323 9764 12385 33353 18696 9602 4999 6724 17936 20501 3255 8861 2875 16943 5242 2808 16809 9507 4918 33054 18506 9440 4837 32973 3846 6467 9004 16727 7296 12426 17556 34850 10329 17176 5405 2495 16619 9793 12372 32892 1959 4594 3684 7201 8814 12331 17461 33411 3522 8680 6670 16986 5215 2781 6536 16796 9494 4947 9413 5776 33330 3427 9033 18592 9386 4783 34823 2924 6441 16701 6346 16606 9332 5681 33817 10387 2002 4567 18945 7188 9739 12318 17728 32950 8653 5016 3630 6251 16511 3496 10530 1907 17072 5301 33303 3414 8572 4921 33169 18565 9359 4826 3849 6428 9091 20552 3306 10816 24593 5892 2982 1527 36896 18484 9278 4731 32979 1976 4541 9010 3659 6238 8929 17674 3469 10503 5702 10436 6785 17045 5568 33122 9497 1786 4351 3388 8630 17512 3279 10341 6704 17188 34840 5473 3011 20610 34304 36869 10762 18513 9307 4942 1949 8983 3198 8916 12433 32953 2930 16998 20515 3745 6324 8875

16864 33095 5676 33924 10382 1759 5514 8821 12576 33544 3417 8659 17485 11280 6677 17217 5460 2550 17570 33829 10287 1902 5419 2985 5352 12386 33354 18459 9393 5028 33164 2903 17923 20502 3732 6353 8862 16837 10520 24588 5705 2795 16810 9984 12549 33069 4838 32974 3637 6496 8767 16756 3475 8633 17543 33872 10330 17163 5406 2972 17096 5325 9794 12359 32879 9604 5057 7202 12808 17462 33440 3313 8443 2877 17001 5244 2782 6299 16783 9509 4976 33112 18508 9414 5763 40961 3904 6469 9034 17681 12428 34852 2687 6442 16702 2553 16621 9319 5682 33818 10416 2017 4596 18946 7175 9768 12333 17491 33413 3524 8654 5003 6728 16988 20505 3259 10769 9552 4949 17059 5302 33332 3429 8559 4922 33170 18566 9388 4841 34881 3850 6415 9120 16731 6348 17560 24594 5655 10389 2004 5521 33075 18471 9741 12376 33008 1963 4542 3688 6253 8930 17465 3470 10532 1909 6786 17046 5331 33361 18704 9498 4895 9417 4828 3375 9093 3308 10342 6691 16951 34827 5474 3040 16817 36870 18514 9336 4733 32981 1950 4571 9012 3661 7192 8903 12434 17676 32954 10561 20992 3746 6311 16627 33124 1855 1788 5305 8822 12339 33307 3418 8688 17486 18569 11267 6678 17218 5447 3013 6544 20612 33830 10764 9309 5896 2986 1531 9041 18488 9394 4791 32927 2932 6449 17952 20517 3719 6354 8877 16838 34049 10507 5706 10440 17049 5516 9747 12550 33070 8661 3638 6259 16743 3504 8634 17572 33859 10345 17192 5421 2959 5326 12388 33356 36873 18461 9367 5058 3857 8987 17925 20560 3314 8920 2878 17002 5231 2797 6328 16812 9510 4963 33099 5792 33928 40962 3667 6470 8825 17682 3477 8607 17601 10332 6681 17165 5464 2554 16622 9796 13313 33833 10403 2018 4583 7204 12334 17520 33414 3287 8445 5032 35072 2907 16975 20506 3736 6301 10770 16841 9539 4950 24704 5765 33319 3430 9036 12553 33185 4842 34882 3641 6444 8883 16760 2527 17547 24609 5684 33820 10390 1991 5522 33552 18948 7233 9742 12363 17493 32995 9608 5005 6254 17466 3261 10295 1910 5427 2993 17061 5360 33362 18691 9513 4924 33172 18624 9418 4815 3852 6473 9094 16733 14336 24596 34856 5713 2803 16818 33077 18529 9323 4734 32982 1965 4600 8999 3662 7179 8932 12449 17439 33417 3528 10562 17171 6788 17104 5333 32887 9500 4953 1775 5306 12816 33336 3433 8675 18570 11296 6693 17009 34829 5476 3014 6531 16791 36928 18516 9310 5659 10393 2008 4573 9042 18475 9857 12436 32956 2919 6450 20518 3748 6369 8878 16629 34050 10536 1913 17050 5279 9776 12341 33309 3420 8662 5011 11269 6736 17220 20737 3491 9097 33888 10346 16955 5422 2988 1533 8567 36874 18462 9396 4849 32985 3858 6423 9016 17926 20547 3777 6356 8907 17792 10509 5708 2798 6315 16575 9749 12608 33128 1971 3696 6261 8826 17697 3478 8636 17602 33861 10319 6682 17166 5451 3017 20616 13314 33834 10880 9425 5060 3383 8989 17507 3316 8446 4795 34835 2936 17004 20521 3723 6302 10785 16842 9568 4965 33101 5766 40964 3669 7424 8799 12554 17684 33186 8665 3642 6207 16747 2556 17576 24610 5671 33807 10405 2020 5537 33539 7234 12392 17494 33472 18577 9371 5006 2909 17929 20508 3262 10772 9541 5904 2994 17062 5347 33377 18720 9514 4911 33159 4844 34884 3615 6474 8885 16734 3481 10515 17549 24583 5714 10448 17281 5524 33078 18530 9800 12365 32997 1966 4587 7208 12450 17468 33418 3291 10353 17200 5429 2967 17091 5334 33364 36881 18693 9487 4954 9420 5769 12803 33323 3434 9152 6694 17010 34830 5239 2805 6560 16820 33107 18503 9325 5688 33936 10394 1995 4574 9057 18952 7181 9858 12423 17497 32943 10564 6913 17173 6370 16630 33841 10299 1914 4479 17065 5308 9763 12342 33310 3407 8677 5040

33176 18572 11270 6723 16983 20738 3968 6533 9098 16849 24600 5661 2751 1534 9044 12561 33081 18477 9383 4850 32986 3873 6452 9003 20576 3778 6343 8936 17555 34052 10510 1887 6792 17052 5337 9750 12371 32891 9616 5013 3683 6262 17698 3493 8623 33862 10348 6697 16957 34945 5480 3018 16795 9521 36876 18520 9426 4823 3860 6481 8990 17984 20549 3303 8909 12440 34864 2923 20522 3752 6317 10786 16633 9331 4966 33102 1973 3670 7187 8828 12345 17671 33425 3536 8666 17604 11273 6684 17224 5453 2543 13316 33836 10406 1783 5538 33568 3441 8571 17509 18578 9400 4797 34837 2910 6427 17930 20495 3725 6360 10759 16844 9542 5891 10625 5824 33378 18483 9753 12556 33188 1023 3644 6265 8886 16749 3482 10544 17550 24612 5729 33865 10435 17282 5511 33541 7236 12366 32998 9373 5064 3387 9105 17455 3320 10354 17187 5430 2996 17120 5349 33351 36882 18694 9516 4969 33217 5770 12832 40968 3673 6476 8915 17688 10517 24641 5716 2806 6323 16807 33136 18532 9326 5675 33923 10409 2024 4589 9058 7182 12452 17498 33420 3293 10327 6914 17174 5459 3025 17093 20624 33842 10776 9545 4956 17066 5295 12805 33325 3436 8678 5027 33163 6752 17012 34888 20529 3731 6534 8889 16850 33109 19457 24587 5662 10396 1997 5528 9031 12562 33082 18478 9860 12481 33001 3874 6439 16755 6372 17584 33815 10301 1916 5433 2971 17039 5338 9765 12400 33368 18697 9603 5014 11328 6725 17937 20740 3494 9100 6698 16958 34946 5243 2809 16824 9522 4919 33055 18507 9441 4852 32988 3847 6482 9005 20550 3780 7297 8910 12427 17557 34851 10568 17177 6318 16634 9808 12373 32893 1974 4595 3685 7216 8815 12346 17700 33426 3523 8681 49152 11274 6671 16987 5454 3020 6537 16797 9495 9428 5777 33331 3442 9048 17510 18593 9387 4798 34838 2925 6456 20524 3726 6347 10788 16607 9333 5920 34056 10626 2003 18960 7189 9754 12319 17729 32951 8668 5017 3631 6266 16750 3497 10531 5730 33866 10464 17073 5540 33542 3415 8573 36992 18580 9374 4827 3864 6429 9106 17932 20553 3307 10817 24832 5893 2983 5350 33380 36897 18485 9279 4970 33218 1977 9011 3674 6239 8944 17675 3484 10518 17608 24642 5703 10437 6800 17284 5569 33123 13320 33952 10410 1787 4590 3389 8631 17513 3294 10356 6705 17189 34841 5488 3026 17094 20611 34305 36884 10763 18752 9546 4943 5772 12806 33326 3199 8917 12672 33192 2931 16999 20530 3760 6325 8890 16865 33110 19458 24616 5677 33925 10383 1998 5515 9060 12577 33545 7240 12482 17500 33002 11281 6916 17232 5461 2551 17571 33844 10302 1903 5434 3000 17068 5353 9766 12387 33355 18698 9632 5029 33165 6726 17938 20503 3733 6592 8863 16852 10521 24589 5720 2810 16811 9985 12564 33084 18536 9442 4839 32975 3876 6497 9006 16757 7298 12456 17558 35328 33873 10331 17178 5407 2973 17097 5340 9795 12374 32894 9605 5072 3686 7203 12809 17463 33441 3552 8682 6700 17016 34948 5245 2783 6538 16798 9524 4977 33113 18509 9415 5778 40976 3905 6484 9035 21504 18594 9864 12429 34853 2926 6443 16703 6376 16636 9334 5683 33819 10417 2032 4597 18947 7190 9769 12348 17730 33428 3525 8655 5018 11276 6729 16989 20744 3498 11008 9553 17074 5303 33333 3444 8574 4923 33171 18567 9389 4856 34896 3851 6430 9121 20554 3784 6349 10818 17561 24595 5894 10628 2005 36898 18486 9756 12377 33009 1978 4543 3689 6268 8931 17704 3471 10533 5732 33868 10438 6787 17047 5570 33600 18705 9499 9432 4829 3390 9108 17514 3309 10343 6706 17190 34842 5475 3041 20640 34306 36871 10792 18515 9337 4972 33220 1951 9013 3676 7193 8918 12435 17677 32955 10576 24644 20993 3747 6326 16866 33125 5678 33926

10412 1789 5544 8823 12578 33546 3419 8689 17487 18584 11282 6679 17219 5462 3028 6545 18048 20613 33831 10765 9548 5897 2987 5354 12864 33384 18489 9395 5030 33166 2933 17953 20532 3734 6355 8892 16839 34064 10522 19460 24590 5707 10441 17288 5517 9986 12551 33071 12484 33004 3639 6498 16758 3505 8635 17573 33874 10360 17193 5436 2974 17098 5327 9824 12389 33357 36888 18700 9606 5059 7680 12810 17940 20561 33442 3315 8921 2879 17003 5246 2812 6329 16813 9511 4978 33114 18510 9444 5793 33929 40963 3906 6471 9064 17683 7300 12430 17616 34854 10333 6920 17180 5465 2555 16623 9797 13328 33848 10418 2019 4598 18976 7205 9770 12335 17521 33415 3526 8684 5033 35073 6730 16990 20507 3737 6540 10771 16856 9554 4951 24705 5780 33334 3431 9037 12568 33200 18596 9390 4843 34883 3880 6445 9122 16761 6350 17562 24624 5685 33821 10391 2006 5523 33553 18949 7248 9743 12378 17732 33010 9609 5020 3690 6255 17467 3500 10534 1911 6816 17076 34952 5361 33363 18706 9528 4925 33173 18625 9419 4830 3853 6488 9095 20556 3310 10820 14337 24597 34857 5952 3042 16819 36900 18544 9338 4735 32983 1980 4601 9014 3663 7194 8933 12464 17678 33432 3529 10563 20994 11392 6789 17105 5572 33126 9501 1790 5307 12817 33337 3448 8690 17516 18571 11297 6708 17248 34844 5477 3015 6546 20614 34308 36929 10766 18517 9311 5898 10632 2009 9043 18490 9872 12437 32957 2934 6451 17954 20519 3749 6384 8879 16868 34051 10537 5736 33984 10442 17051 5518 9777 12580 33548 3421 8663 11284 6737 17221 20752 3506 9112 17574 33889 10347 17194 5423 2989 5356 12390 33358 36875 18463 9397 5088 33224 3859 9017 17927 20562 3792 6357 8922 17793 10524 24648 5709 2799 6330 16814 9988 12609 33129 5794 33930 40992 3697 6500 8827 17712 3479 8637 17603 33876 10334 6683 17167 5466 3032 17100 20617 9798 13315 33835 10881 9664 5061 7206 12812 17522 33444 3317 8447 5034 35074 2937 17005 20536 3738 6303 10800 16843 9569 4980 33116 19464 24706 5767 40965 3908 7425 9038 12555 17685 33187 12488 34912 3643 6446 16762 2557 17577 24611 5686 33822 10420 2021 5552 33554 18950 7235 9772 12393 17495 33473 18816 9610 5007 6732 17944 20509 3263 10773 9556 5905 2995 17063 5362 33392 18721 9515 4926 33174 18626 9448 4845 34885 3854 6475 9124 16735 7304 14338 17564 24598 34858 5715 10449 17296 5525 33079 18531 9801 12380 33012 1967 4602 3692 7209 8934 12451 17469 33419 3530 10592 17201 6790 17106 5335 33365 37120 18708 9502 4955 9421 5784 12818 33338 3435 9153 18600 11298 6695 17011 34831 5478 3044 6561 16821 36930 18518 9340 5689 33937 10395 2010 4575 9072 18953 7196 9859 12438 17736 32958 10565 6928 20996 3750 6371 16631 34080 10538 1915 17080 5309 9778 12343 33311 3422 8692 5041 33177 18573 11271 6738 17222 20739 3969 6548 9099 20672 33890 10824 24601 5900 2990 1535 9045 36904 18492 9398 4851 32987 3888 6453 9018 17956 20577 3779 6358 8937 17794 34053 10511 5710 10444 6793 17053 5576 9751 12610 33130 9617 3698 6263 17699 3508 8638 17632 33863 10349 6712 17196 34960 5481 3019 20618 13344 34312 36877 10882 18521 9427 5062 3861 8991 17985 20564 3318 8924 12441 34865 2938 17006 20523 3753 6332 10787 16872 9570 4967 33103 5796 33932 40966 3671 7426 8829 12584 17686 33664 3537 8667 17605 11288 6685 17225 5468 2558 17578 25088 13317 33837 10407 2022 5539 33569 7264 12394 17524 33474 18579 9401 5036 35076 2911 17931 20510 3740 6361 10774 16845 9543 5906 10640 24708 5825 33379 18722 9992 12557 33189 4846 34886 3645 6504 8887 16764 3483

10545 17551 24613 5744 33880 10450 17283 5526 33556 19008 7237 9802 12367 32999 9612 5065 7210 12928 17470 33448 3321 10355 17202 5431 2997 17121 5364 33366 36883 18695 9517 4984 33232 18628 9422 5771 12833 40969 3912 6477 9154 17689 14340 24656 34860 5717 2807 6562 16822 33137 18533 9327 5690 33938 10424 2025 4604 9059 18954 7183 9888 12453 17499 33421 3532 10566 6915 17175 6848 17108 20625 33843 10777 9560 4957 17067 5310 12820 33340 3437 8679 5042 33178 18574 11300 6753 17013 34889 20768 3970 6535 9128 16851 36932 19472 24602 5663 10397 2012 5529 9046 12563 33083 18479 9861 12496 33016 3875 6454 20578 3808 6373 8938 17585 34054 10540 1917 6794 17054 5339 9780 12401 33369 18712 9618 5015 11329 6740 18176 20741 3495 9101 33892 10350 6699 16959 34947 5482 3048 16825 9523 36878 18522 9456 4853 32989 3862 6483 9020 17986 20551 3781 7312 8911 12442 17796 34866 10569 21000 3754 6319 16635 9809 12612 33132 1975 3700 7217 8830 12347 17701 33427 3538 8696 17606 49153 11275 6686 17226 5455 3021 6552 20620 13318 33838 10884 9429 6016 33570 3443 9049 17511 18608 9402 4799 34839 2940 6457 17960 20525 3727 6362 10789 16846 9572 5921 34057 10627 5826 41024 18961 7428 9755 12558 17744 33190 8669 3646 6267 16751 3512 10546 17580 24614 5731 33867 10465 17312 5541 33543 7238 12396 33476 36993 18581 9375 5066 3865 9107 17933 20568 3322 10832 24833 5908 2998 17122 5351 33381 36912 18724 9518 4971 33219 5800 12834 35840 40970 3675 6478 8945 17690 3485 10519 17609 24643 5718 10452 6801 17285 5584 33138 18534 9804 13321 33953 10411 2026 4591 7212 12454 17528 33422 3295 10357 6944 17204 35080 5489 3027 17095 20626 34320 36885 10778 18753 9547 4958 24712 5773 12807 33327 3438 9156 12673 33193 6754 17014 34890 20531 3761 6564 8891 16880 33111 19459 24617 5692 33940 10398 1999 5530 9061 12592 33560 18956 7241 9862 12483 17501 33003 11520 6917 17233 6374 17586 33845 10303 1918 5435 3001 17069 5368 9767 12402 33370 18699 9633 5044 33180 18632 11330 6727 17939 20742 3972 6593 9102 16853 14344 24604 34976 5721 2811 16826 10000 12565 33085 18537 9443 4854 32990 3877 6512 9007 20580 3782 7299 8940 12457 17559 35329 34112 10570 17179 6796 17112 5341 9810 12375 32895 9620 5073 3687 7218 12824 17702 33456 3553 8683 49154 11304 6701 17017 34949 5484 3022 6539 16799 9525 36936 18524 9430 5779 40977 3920 6485 9050 17988 21505 18595 9865 12444 34868 2927 6458 20526 3756 6377 10790 16637 9335 5922 34058 10656 2033 18962 7191 9784 12349 17731 33429 3540 8670 5019 11277 6744 17228 20745 3499 11009 13376 33896 10466 17075 5542 33572 3445 8575 36994 18582 9404 4857 34897 3866 6431 9136 17934 20555 3785 6364 10819 17800 24834 5895 10629 5828 33382 36899 18487 9757 12616 33248 1979 3704 6269 8946 17705 3486 10548 17610 24672 5733 33869 10439 6802 17286 5571 33601 22528 13322 33954 10888 9433 5068 3391 9109 17515 3324 10358 6707 17191 34843 5490 3056 17124 20641 34307 36886 10793 18754 9576 4973 33221 5774 12836 40972 3677 7432 8919 12674 17692 33194 10577 24645 21008 3762 6327 16867 33140 19488 24618 5679 33927 10413 2028 5545 9062 12579 33547 7242 12512 17502 33480 18585 11283 6918 17234 5463 3029 18049 20628 33846 10780 9549 5912 3002 17070 5355 12865 33385 18728 9634 5031 33167 6756 17968 34892 20533 3735 6594 8893 16854 34065 10523 19461 24591 5722 10456 17289 5532 9987 12566 33086 18538 9920 12485 33005 3878 6499 16759 7328 12458 17588 35330 33875 10361 17208 5437 2975 17099 5342 9825

12404 33372 36889 18701 9607 5074 11332 7681 12811 17941 20800 33443 3554 9160 6702 17018 34950 5247 2813 6568 16828 9526 4979 33115 18511 9445 5808 33944 40978 3907 6486 9065 21506 19072 7301 9866 12431 17617 34855 10572 6921 17181 6378 16638 9812 13329 33849 10419 2034 4599 18977 7220 9771 12350 17760 33430 3527 8685 5048 35088 49156 11278 6731 16991 20746 3976 6541 11010 16857 9555 24720 5781 33335 3446 9052 12569 33201 18597 9391 4858 34898 3881 6460 9123 20584 3786 6351 10848 17563 24625 5924 34060 10630 2007 37376 18964 7249 9758 12379 17733 33011 9624 5021 3691 6270 17706 3501 10535 5734 33870 10468 6817 17077 34953 5600 33602 18707 9529 36996 18640 9434 4831 3868 6489 9110 17992 20557 3311 10821 14352 24836 34872 5953 3043 20642 34336 36901 10794 18545 9339 4974 33222 1981 9015 3678 7195 8948 12465 17679 33433 3544 10578 17612 24646 20995 11393 6804 17344 5573 33127 13324 33956 10414 1791 5546 13056 33576 3449 8691 17517 18586 11312 6709 17249 34845 5492 3030 6547 18050 20615 34309 36944 10767 18756 9550 5899 10633 5832 12866 33386 18491 9873 12676 33196 2935 17955 20534 3764 6385 8894 16869 34066 10552 19462 24620 5737 33985 10443 17290 5519 10016 12581 33549 7244 12486 33006 11285 6976 17236 20753 3507 9113 17575 33904 10362 17195 5438 3004 17128 5357 9826 12391 33359 36890 18702 9636 5089 33225 7682 12840 17942 20563 41088 3793 6596 8923 17808 10525 24649 5724 2814 6331 16815 9989 12624 33144 18540 9446 5795 33931 40993 3936 6501 9066 17713 7302 12460 17618 35332 33877 10335 6922 17182 5467 3033 17101 20632 9799 13330 33850 10896 9665 5076 18978 7207 12813 17523 33445 3556 8686 5035 35075 6760 17020 35008 20537 3739 6542 10801 16858 9584 4981 33117 19465 24707 5782 40980 3909 7440 9039 12570 21508 33202 18598 9868 12489 34913 3882 6447 16763 6380 17592 24626 5687 33823 10421 2036 5553 33555 18951 7250 9773 12408 17734 33488 18817 9611 5022 11336 6733 17945 20748 3502 11012 9557 6818 17078 34954 5363 33393 18736 9530 4927 33175 18627 9449 4860 34900 3855 6490 9125 20558 3788 7305 10822 14339 17565 24599 34859 5954 10688 17297 36902 18546 9816 12381 33013 1982 4603 3693 7224 8935 12466 17708 33434 3531 10593 21024 49160 11394 6791 17107 5574 33604 37121 18709 9503 9436 5785 12819 33339 3450 9168 17518 18601 11299 6710 17250 34846 5479 3045 6576 20644 34310 36931 10796 18519 9341 5928 34176 10634 2011 9073 18968 7197 9874 12439 17737 32959 10580 6929 25600 20997 3751 6386 16870 34081 10539 5738 33986 10472 17081 5548 9779 12582 33550 3423 8693 37000 18588 11286 6739 17223 20754 3984 6549 9114 18052 20673 33891 10825 24840 5901 2991 5358 12868 33388 36905 18493 9399 5090 33226 3889 9019 17957 20592 3794 6359 8952 17795 34068 10526 19520 24650 5711 10445 6808 17292 5577 9990 12611 33131 13440 33960 40994 3699 6502 17714 3509 8639 17633 33878 10364 6713 17197 34961 5496 3034 17102 20619 9828 13345 34313 36892 10883 18760 9666 5063 7684 12814 18000 20565 33446 3319 8925 12680 35104 2939 17007 20538 3768 6333 10802 16873 9571 4982 33118 19466 24736 5797 33933 40967 3910 7427 9068 12585 17687 33665 7360 12490 17620 34914 11289 6924 17240 5469 2559 17579 25089 13332 33852 10422 2023 5554 33584 18980 7265 9774 12395 17525 33475 18818 9640 5037 35077 6734 17946 20511 3741 6600 10775 16860 9558 5907 10641 24709 5840 33394 18723 9993 12572 33204 18656 9450 4847 34887 3884 6505 9126 16765 7306 14368 17566 24628 35336 5745 33881 10451 17298 5527

33557 19009 7252 9803 12382 33014 9613 5080 3694 7211 12929 17471 33449 3560 10594 17203 6820 17136 34956 5365 33367 37122 18710 9532 4985 33233 18629 9423 5786 12848 40984 3913 6492 9155 21512 18602 11776 14341 24657 34861 5956 3046 6563 16823 36960 18548 9342 5691 33939 10425 2040 4605 9074 18955 7198 9889 12468 17738 33436 3533 10567 6930 20998 11396 6849 17109 20864 34082 11016 9561 17082 5311 12821 33341 3452 8694 5043 33179 18575 11301 6768 17252 34904 20769 3971 6550 9129 20674 34368 36933 10826 19473 24603 5902 10636 2013 9047 36906 18494 9876 12497 33017 3890 6455 17958 20579 3809 6388 8939 17824 34055 10541 5740 33988 10446 6795 17055 5578 9781 12640 33608 18713 9619 11344 6741 18177 20756 3510 9116 17634 33893 10351 6714 17198 34962 5483 3049 20648 13346 34314 36879 10912 18523 9457 5092 33228 3863 9021 17987 20566 3796 7313 8926 12443 17797 34867 10584 24652 21001 3755 6334 16874 10048 12613 33133 5798 33934 40996 3701 7456 8831 12586 17716 33666 3539 8697 17607 49168 11290 6687 17227 5470 3036 6553 18056 20621 25090 13319 33839 10885 9668 6017 33571 7266 12872 17526 33504 18609 9403 5038 35078 2941 17961 20540 3742 6363 10804 16847 9573 5936 34072 10642 19468 24710 5827 41025 19200 7429 9994 12559 17745 33191 12492 34916 3647 6506 16766 3513 10547 17581 24615 5746 33882 10480 17313 5556 33558 19010 7239 9832 12397 33477 37008 18820 9614 5067 7688 12930 17948 20569 33450 3323 10833 24848 5909 2999 17123 5366 33396 36913 18725 9519 4986 33234 18630 9452 5801 12835 35841 40971 3914 6479 9184 17691 7308 14342 17624 24658 34862 5719 10453 7040 17300 5585 33139 18535 9805 13336 33968 10426 2027 4606 18984 7213 9890 12455 17529 33423 3534 10596 6945 17205 35081 6850 17110 20627 34321 37124 10779 18768 9562 4959 24713 5788 12822 33342 3439 9157 12688 33208 18604 11302 6755 17015 34891 20770 4000 6565 9130 16881 36934 19474 24632 5693 33941 10399 2014 5531 9076 12593 33561 18957 7256 9863 12498 17740 33018 11521 6932 21056 3810 6375 17587 34084 10542 1919 6824 17084 5369 9782 12403 33371 18714 9648 5045 33181 18633 11331 6742 18178 20743 3973 6608 9103 20676 33894 10828 14345 24605 34977 5960 3050 16827 10001 36908 18552 9458 4855 32991 3892 6513 9022 18016 20581 3783 7314 8941 12472 17798 35344 34113 10571 21002 11400 6797 17113 5580 9811 12614 33134 9621 3702 7219 12825 17703 33457 3568 8698 17636 49155 11305 6716 17256 34964 5485 3023 6554 20622 13348 34316 36937 10886 18525 9431 6018 41216 3921 9051 17989 21520 18610 9880 12445 34869 2942 6459 17962 20527 3757 6392 10791 16876 9574 5923 34059 10657 5856 33992 41026 18963 7430 9785 12588 17746 33668 3541 8671 11292 6745 17229 20760 3514 11024 17582 25092 13377 33897 10467 17314 5543 33573 7268 12398 33478 36995 18583 9405 5096 35136 3867 9137 17935 20570 3800 6365 10834 17801 24835 5910 10644 24768 5829 33383 36914 18726 9996 12617 33249 5802 35842 41000 3705 6508 8947 17720 3487 10549 17611 24673 5748 33884 10454 6803 17287 5586 33616 19012 22529 9806 13323 33955 10889 9672 5069 7214 12932 17530 33452 3325 10359 6946 17206 35082 5491 3057 17125 20656 34322 36887 10808 18755 9577 4988 33236 19584 24714 5775 12837 40973 3916 7433 9158 12675 17693 33195 14400 24660 34920 21009 3763 6566 16882 33141 19489 24619 5694 33942 10428 2029 5560 9063 12594 33562 18958 7243 9892 12513 17503 33481 18824 11522 6919 17235 6852 18064 20629 33847 10781 9564 5913 3003 17071 5370 12880 33400 18729 9635 5046

33182 18634 11360 6757 17969 34893 20772 3974 6595 9132 16855 37888 14346 19476 24606 34978 5723 10457 17304 5533 10002 12567 33087 18539 9921 12500 33020 3879 6514 20582 3812 7329 8942 12459 17589 35331 34114 10600 17209 6798 17114 5343 9840 12405 33373 37128 18716 9622 5075 11333 7696 12826 18180 20801 33458 3555 9161 49184 11306 6703 17019 34951 5486 3052 6569 16829 9527 36938 18526 9460 5809 33945 40979 3922 6487 9080 17990 21507 19073 7316 9867 12446 17856 34870 10573 6936 21004 3758 6379 16639 9813 13568 34088 10658 2035 18992 7221 9786 12351 17761 33431 3542 8700 5049 35089 49157 11279 6746 17230 20747 3977 6556 11011 20680 13378 33898 10944 24721 6020 33574 3447 9053 37024 18612 9406 4859 34899 3896 6461 9138 17964 20585 3787 6366 10849 17802 24864 5925 34061 10631 5830 41028 37377 18965 7488 9759 12618 17748 33250 9625 3706 6271 17707 3516 10550 17640 24674 5735 33871 10469 6832 17316 34968 5601 33603 22530 13352 34432 36997 10890 18641 9435 5070 3869 9111 17993 20572 3326 10836 14353 24837 34873 5968 3058 17126 20643 34337 36916 10795 18784 9578 4975 33223 5804 12838 35844 40974 3679 7434 8949 12704 17694 33672 3545 10579 17613 24647 21010 11408 6805 17345 5588 33142 19490 25096 13325 33957 10415 2030 5547 13057 33577 7272 12514 17532 33482 18587 11313 6948 17264 35084 5493 3031 18051 20630 34324 36945 10782 18757 9551 5914 10648 24716 5833 12867 33387 18730 10112 12677 33197 6758 17970 34894 20535 3765 6624 8895 16884 34067 10553 19463 24621 5752 34000 10458 17291 5534 10017 12596 33564 19016 7245 9922 12487 33007 11524 6977 17237 7330 12936 17590 35360 33905 10363 17210 5439 3005 17129 5372 9827 12406 33374 36891 18703 9637 5104 33240 18636 11334 7683 12841 17943 20802 41089 4032 6597 9162 17809 14348 24664 34980 5725 2815 6570 16830 10004 12625 33145 18541 9447 5810 33946 41008 3937 6516 9067 21536 19074 7303 9896 12461 17619 35333 34116 10574 6923 17183 6856 17116 20633 9814 13331 33851 10897 9680 5077 18979 7222 12828 17762 33460 3557 8687 5050 35090 49158 11308 6761 17021 35009 20776 3978 6543 11040 16859 9585 36940 19480 24722 5783 40981 3924 7441 9054 12571 21509 33203 18599 9869 12504 34928 3883 6462 20586 3816 6381 10850 17593 24627 5926 34062 10660 2037 37378 18966 7251 9788 12409 17735 33489 18832 9626 5023 11337 6748 18184 20749 3503 11013 13380 33900 10470 6819 17079 34955 5602 33632 18737 9531 36998 18642 9464 4861 34901 3870 6491 9140 17994 20559 3789 7320 10823 14354 17804 24838 34874 5955 10689 21120 34338 36903 18547 9817 12620 33252 1983 3708 7225 8950 12467 17709 33435 3546 10608 17614 24676 21025 49161 11395 6806 17346 5575 33605 37136 22532 13326 33958 10892 9437 6024 13058 33578 3451 9169 17519 18616 11314 6711 17251 34847 5494 3060 6577 18080 20645 34311 36946 10797 18758 9580 5929 34177 10635 5834 12896 41032 18969 7436 9875 12678 17752 33198 10581 25601 21012 3766 6387 16871 34096 10554 19492 24622 5739 33987 10473 17320 5549 10018 12583 33551 7246 12516 33484 37001 18589 11287 6978 17238 20755 3985 9115 18053 20688 33906 10840 24841 5916 3006 17130 5359 12869 33389 36920 18732 9638 5091 33227 7712 12842 17972 35848 20593 41090 3795 6598 8953 17810 34069 10527 19521 24651 5726 10460 6809 17293 5592 9991 12626 33146 18542 9924 13441 33961 40995 3938 6503 17715 7332 12462 17648 35334 33879 10365 6952 17212 35200 5497 3035 17103 20634 9829 13360 34328 36893 10898 18761 9667 5078 26624 7685 12815 18001 20804 33447 3558 9164 12681

35105 6762 17022 35010 20539 3769 6572 10803 16888 9586 4983 33119 19467 24737 5812 33948 40982 3911 7442 9069 12600 21510 33680 19076 7361 9870 12491 17621 34915 11528 6925 17241 6382 17594 25104 13333 33853 10423 2038 5555 33585 18981 7280 9775 12410 17764 33490 18819 9641 5052 35092 49216 11338 6735 17947 20750 3980 6601 11014 16861 9559 14464 24724 34984 5841 33395 18738 10008 12573 33205 18657 9451 4862 34902 3885 6520 9127 20588 3790 7307 10852 14369 17567 24629 35337 5984 34120 10690 17299 37380 19024 7253 9818 12383 33015 9628 5081 3695 7226 12944 17710 33464 3561 10595 21026 49162 11424 6821 17137 34957 5604 33606 37123 18711 9533 37056 18644 9438 5787 12849 40985 3928 6493 9170 17996 21513 18603 11777 14356 24896 34876 5957 3047 6578 20646 34340 36961 10798 18549 9343 5930 34178 10664 2041 9075 18970 7199 9904 12469 17739 33437 3548 10582 6931 25602 20999 11397 6864 17348 20865 34083 11017 13384 34016 10474 17083 5550 13060 33580 3453 8695 37002 18590 11316 6769 17253 34905 20784 3986 6551 9144 18054 20675 34369 36948 10827 19712 24842 5903 10637 5836 12870 33390 36907 18495 9877 12736 33256 3891 17959 20594 3824 6389 8954 17825 34070 10556 19522 24680 5741 33989 10447 6810 17294 5579 10020 12641 33609 22536 13442 33962 41472 11345 6980 18192 20757 3511 9117 17635 33908 10366 6715 17199 34963 5498 3064 17132 20649 9830 13347 34315 36894 10913 18762 9696 5093 33229 7686 12844 18002 20567 41092 3797 7552 8927 12682 17812 35106 10585 24653 21016 3770 6335 16875 10049 12628 33148 19496 24738 5799 33935 40997 3940 7457 9070 12587 17717 33667 7362 12520 17622 35392 49169 11291 6926 17242 5471 3037 18057 20636 25091 13334 33854 10900 9669 6032 33586 18982 7267 12873 17527 33505 18848 9642 5039 35079 6764 17976 35012 20541 3743 6602 10805 16862 9588 5937 34073 10643 19469 24711 5842 41040 19201 7444 9995 12574 21568 33206 18658 9928 12493 34917 3886 6507 16767 7336 14370 17596 24630 35338 5747 33883 10481 17328 5557 33559 19011 7254 9833 12412 33492 37009 18821 9615 5082 11340 7689 12931 17949 20808 33451 3562 11072 24849 6822 17138 34958 5367 33397 37152 18740 9534 4987 33235 18631 9453 5816 12850 35856 40986 3915 6494 9185 21514 19080 7309 11778 14343 17625 24659 34863 5958 10692 7041 17301 36962 18550 9820 13337 33969 10427 2042 4607 18985 7228 9891 12470 17768 33438 3535 10597 6960 21028 35096 49164 11398 6851 17111 20866 34560 37125 11018 18769 9563 24728 5789 12823 33343 3454 9172 12689 33209 18605 11303 6770 17254 34906 20771 4001 6580 9131 20704 34370 36935 10856 19475 24633 5932 34180 10638 2015 9077 37384 18972 7257 9878 12499 17741 33019 11536 6933 25604 21057 3811 6390 17826 34085 10543 5742 33990 10476 6825 17085 5608 9783 12642 33610 18715 9649 37004 18648 11346 6743 18179 20758 3988 6609 9118 18112 20677 33895 10829 14360 24844 34992 5961 3051 20650 13824 34344 36909 10914 18553 9459 5094 33230 3893 9023 18017 20596 3798 7315 8956 12473 17799 35345 34128 10586 19524 24654 21003 11401 6812 17352 5581 10050 12615 33135 13444 33964 40998 3703 7458 13064 17718 33696 3569 8699 17637 49170 11320 6717 17257 34965 5500 3038 6555 18058 20623 25120 13349 34317 36952 10887 18764 9670 6019 41217 7744 12874 18004 21521 33506 18611 9881 12684 35108 2943 17963 20542 3772 6393 10806 16877 9575 5938 34074 10672 19470 24740 5857 33993 41027 19202 7431 10024 12589 17747 33669 7364 12494 34918 11293 6984 17244 20761 3515 11025 17583 25093 13392 33912 10482 17315 5558

33588 19040 7269 9834 12399 33479 37010 18822 9644 5097 35137 7690 12960 17950 20571 41096 3801 6604 10835 17816 24850 5911 10645 24769 5844 33398 36915 18727 9997 12632 33264 18660 9454 5803 35843 41001 3944 6509 9186 17721 7310 14372 17626 24688 35340 5749 33885 10455 7042 17302 5587 33617 19013 22544 9807 13338 33970 10904 9673 5084 18986 7215 12933 17531 33453 3564 10598 6947 17207 35083 6880 17140 35016 20657 34323 37126 10809 18770 9592 4989 33237 19585 24715 5790 12852 40988 3917 7448 9159 12690 21516 33210 18606 11780 14401 24661 34921 21248 4002 6567 16883 36964 19504 24634 5695 33943 10429 2044 5561 9078 12595 33563 18959 7258 9893 12528 17742 33496 18825 11523 6934 21058 11456 6853 18065 20868 34086 11020 9565 6826 17086 5371 12881 33401 18744 9650 5047 33183 18635 11361 6772 18208 34908 20773 3975 6610 9133 20678 34372 37889 10830 14347 19477 24607 34979 5962 10696 17305 10003 36910 18554 9936 12501 33021 3894 6515 18018 20583 3813 7344 8943 12474 17828 35346 34115 10601 21032 49280 11402 6799 17115 5582 9841 12644 33612 37129 18717 9623 11348 7697 12827 18181 20816 33459 3570 9176 17638 49185 11307 6718 17258 34966 5487 3053 6584 20652 13350 34318 36939 10916 18527 9461 6048 34184 41218 3923 9081 17991 21522 19088 7317 9882 12447 17857 34871 10588 6937 25608 21005 3759 6394 16878 10052 13569 34089 10659 5858 33994 41056 18993 7460 9787 12590 17776 33670 3543 8701 38912 49172 11294 6747 17231 20762 3992 6557 11026 18060 20681 25094 13379 33899 10945 24960 6021 33575 7270 12876 33508 37025 18613 9407 5098 35138 3897 9139 17965 20600 3802 6367 10864 17803 24865 5940 34076 10646 19528 24770 5831 41029 37392 19204 7489 9998 12619 17749 33251 13448 35872 41002 3707 6510 17722 3517 10551 17641 24675 5750 33886 10484 6833 17317 34969 5616 33618 19014 22531 9836 13353 34433 37012 10891 18880 9674 5071 7692 12934 18008 20573 33454 3327 10837 14592 24852 35112 5969 3059 17127 20658 34352 36917 10810 18785 9579 4990 33238 19586 24744 5805 12839 35845 40975 3918 7435 9188 12705 17695 33673 7368 14402 17628 24662 34922 21011 11409 7044 17360 5589 33143 19491 25097 13340 33972 10430 2031 5562 13072 33592 18988 7273 9894 12515 17533 33483 18826 11552 6949 17265 35085 6854 18066 20631 34325 37184 10783 18772 9566 5915 10649 24717 5848 12882 33402 18731 10113 12692 33212 18664 11362 6759 17971 34895 20774 4004 6625 9134 16885 37890 14376 19478 24636 35456 5753 34001 10459 17306 5535 10032 12597 33565 19017 7260 9923 12502 33022 11525 6992 21060 3814 7331 12937 17591 35361 34144 10602 17211 6828 17144 5373 9842 12407 33375 37130 18718 9652 5105 33241 18637 11335 7698 12856 18182 20803 41104 4033 6612 9163 21632 49186 11784 14349 24665 34981 5964 3054 6571 16831 10005 36968 18556 9462 5811 33947 41009 3952 6517 9082 18020 21537 19075 7318 9897 12476 17858 35348 34117 10575 6938 21006 11404 6857 17117 20872 9815 13570 34090 11136 9681 18994 7223 12829 17763 33461 3572 8702 5051 35091 49159 11309 6776 17260 35024 20777 3979 6558 11041 20682 13408 34376 36941 10946 19481 24723 6022 41220 3925 9055 21524 37026 18614 9884 12505 34929 3898 6463 17966 20587 3817 6396 10851 17832 24866 5927 34063 10661 5860 33996 41030 37379 18967 7490 9789 12648 17750 33728 18833 9627 11352 6749 18185 20764 3518 11028 17642 25152 13381 33901 10471 6834 17318 34970 5603 33633 22560 13354 34434 36999 10920 18643 9465 5100 35140 3871 9141 17995 20574 3804 7321 10838 14355 17805 24839 34875 5970 10704

24772 21121 34339 36918 18786 10056 12621 33253 5806 35846 41004 3709 7464 8951 12706 17724 33674 3547 10609 17615 24677 21040 49176 11410 6807 17347 5590 33620 37137 19968 22533 25098 13327 33959 10893 9676 6025 13059 33579 7274 12992 17534 33512 18617 11315 6950 17266 35086 5495 3061 18081 20660 34326 36947 10812 18759 9581 5944 34192 10650 19588 24718 5835 12897 41033 19208 7437 10114 12679 17753 33199 14404 25616 34924 21013 3767 6626 16886 34097 10555 19493 24623 5754 34002 10488 17321 5564 10019 12598 33566 19018 7247 9952 12517 33485 37016 18828 11526 6979 17239 7808 12938 18068 20689 35362 33907 10841 24856 5917 3007 17131 5374 12884 33404 36921 18733 9639 5106 33242 18638 11364 7713 12843 17973 35849 20832 41091 4034 6599 9192 17811 37892 14350 19536 24666 34982 5727 10461 7048 17308 5593 10006 12627 33147 18543 9925 13456 33976 41010 3939 6518 21538 19104 7333 9898 12463 17649 35335 34118 10604 6953 17213 35201 6858 17118 20635 9844 13361 34329 37132 10899 18776 9682 5079 26625 7700 12830 18240 20805 33462 3559 9165 12696 35120 49188 11310 6763 17023 35011 20778 4008 6573 11042 16889 9587 36942 19482 24752 5813 33949 40983 3926 7443 9084 12601 21511 33681 19077 7376 9871 12506 17860 34930 11529 6940 21064 3818 6383 17595 25105 13572 34092 10662 2039 37408 18996 7281 9790 12411 17765 33491 18834 9656 5053 35093 49217 11339 6750 18186 20751 3981 6616 11015 20684 13382 33902 10948 14465 24725 34985 6080 33634 18739 10009 37028 18672 9466 4863 34903 3900 6521 9142 18024 20589 3791 7322 10853 14384 17806 24868 35352 5985 34121 10691 21122 41984 37381 19025 7492 9819 12622 33254 9629 3710 7227 12945 17711 33465 3576 10610 17644 24678 21027 49163 11425 6836 17376 34972 5605 33607 37138 22534 13356 34436 37057 10894 18645 9439 6026 13088 41224 3929 9171 17997 21528 18618 11792 14357 24897 34877 5972 3062 6579 18082 20647 34341 36976 10799 18788 9582 5931 34179 10665 5864 12898 35904 41034 18971 7438 9905 12708 17754 33676 3549 10583 25603 21014 11412 6865 17349 20880 34098 11032 19494 25100 13385 34017 10475 17322 5551 13061 33581 7276 12518 33486 37003 18591 11317 7008 17268 35144 20785 3987 9145 18055 20690 34384 36949 10842 19713 24843 5918 10652 24776 5837 12871 33391 36922 18734 10116 12737 33257 7714 17974 35850 20595 41120 3825 6628 8955 17840 34071 10557 19523 24681 5756 34004 10462 6811 17295 5594 10021 12656 33624 19020 22537 9926 13443 33963 41473 11584 6981 18193 7334 12940 17650 35364 33909 10367 6954 17214 35202 5499 3065 17133 20664 9831 13362 34330 36895 10928 18763 9697 5108 33244 19592 26626 7687 12845 18003 20806 41093 4036 7553 9166 12683 17813 35107 14408 24668 35040 21017 3771 6574 16890 10064 12629 33149 19497 24739 5814 33950 41012 3941 7472 9071 12602 21540 33682 19078 7363 9900 12521 17623 35393 49408 11530 6927 17243 6860 18072 20637 25106 13335 33855 10901 9684 6033 33587 18983 7282 12888 17766 33520 18849 9643 5054 35094 49218 11368 6765 17977 35013 20780 3982 6603 11044 16863 9589 37896 14466 19484 24726 34986 5843 41041 19216 7445 10010 12575 21569 33207 18659 9929 12508 34932 3887 6522 20590 3820 7337 10854 14371 17597 24631 35339 5986 34122 10720 17329 37382 19026 7255 9848 12413 33493 37248 18836 9630 5083 11341 7704 12946 18188 20809 33466 3563 11073 28672 49192 11426 6823 17139 34959 5606 33636 37153 18741 9535 37058 18646 9468 5817 12851 35857 40987 3930 6495 9200 17998 21515 19081 7324 11779 14358 17864 24898 34878 5959 10693 7056 21124 34342

36963 18551 9821 13576 34208 10666 2043 19000 7229 9906 12471 17769 33439 3550 10612 6961 25632 21029 35097 49165 11399 6866 17350 20867 34561 37140 11019 22592 13386 34018 10952 24729 6028 13062 33582 3455 9173 37032 18620 11318 6771 17255 34907 20786 4016 6581 9146 18084 20705 34371 36950 10857 19714 24872 5933 34181 10639 5838 12900 41036 37385 18973 7496 9879 12738 17756 33258 11537 25605 21072 3826 6391 17827 34100 10558 19552 24682 5743 33991 10477 6840 17324 5609 10022 12643 33611 22538 13472 34440 37005 41474 18649 11347 6982 18194 20759 3989 9119 18113 20692 33910 10844 14361 24845 34993 5976 3066 17134 20651 13825 34345 36924 10915 18792 9698 5095 33231 7716 12846 18032 35852 20597 41094 3799 7554 8957 12712 17814 35584 34129 10587 19525 24655 21018 11416 6813 17353 5596 10051 12630 33150 19498 25216 13445 33965 40999 3942 7459 13065 17719 33697 7392 12522 17652 35394 49171 11321 6956 17272 35204 5501 3039 18059 20638 25121 13364 34332 36953 10902 18765 9671 6034 41232 26628 7745 12875 18005 21760 33507 18850 10120 12685 35109 6766 17978 35014 20543 3773 6632 10807 16892 9590 5939 34075 10673 19471 24741 5872 34008 41042 19203 7446 10025 12604 21570 33684 19136 7365 9930 12495 34919 11532 6985 17245 7338 14848 17598 25108 35368 13393 33913 10483 17330 5559 33589 19041 7284 9835 12414 33494 37011 18823 9645 5112 35152 49220 11342 7691 12961 17951 20810 41097 4040 6605 11074 17817 24851 14468 24784 34988 5845 33399 37154 18742 10012 12633 33265 18661 9455 5818 35858 41016 3945 6524 9187 21544 19082 7311 11808 14373 17627 24689 35341 5988 34124 10694 7043 17303 37440 19028 22545 9822 13339 33971 10905 9688 5085 18987 7230 12948 17770 33468 3565 10599 6962 21030 35098 49166 11428 6881 17141 35017 20896 34562 37127 11048 18771 9593 37060 19600 24730 5791 12853 40989 3932 7449 9174 12691 21517 33211 18607 11781 14416 24900 34936 21249 4003 6582 20706 34400 36965 10858 19505 24635 5934 34182 10668 2045 9079 37386 18974 7259 9908 12529 17743 33497 18840 11538 6935 25606 21059 11457 6868 18304 20869 34087 11021 13388 34020 10478 6827 17087 5610 13120 33640 18745 9651 37006 18650 11376 6773 18209 34909 20788 3990 6611 9148 18114 20679 34373 37904 10831 14362 19716 24846 34994 5963 10697 21128 13826 34346 36911 18555 9937 12740 33260 3895 18019 20598 3828 7345 8958 12475 17829 35347 34130 10616 19526 24684 21033 49281 11403 6814 17354 5583 10080 12645 33613 37144 22540 13446 33966 41476 11349 7936 13066 18196 20817 33698 3571 9177 17639 49200 11322 6719 17259 34967 5502 3068 6585 18088 20653 25122 13351 34319 36954 10917 18766 9700 6049 34185 41219 7746 12904 18006 21523 41152 19089 7556 9883 12686 17872 35110 10589 25609 21020 3774 6395 16879 10053 13584 34104 10674 19500 24742 5859 33995 41057 19232 7461 10026 12591 17777 33671 7366 12524 35396 38913 49173 11295 6986 17246 20763 3993 11027 18061 20696 25095 13394 33914 10960 24961 6036 33590 19042 7271 12877 33509 37040 18852 9646 5099 35139 7720 12962 17980 35968 20601 41098 3803 6606 10865 17818 24880 5941 34077 10647 19529 24771 5846 41044 37393 19205 7504 9999 12634 21572 33266 18662 9932 13449 35873 41003 3946 6511 17723 7340 14374 17656 24690 35342 5751 33887 10485 7072 17332 35208 5617 33619 19015 22546 9837 13368 34448 37013 10906 18881 9675 5086 26632 7693 12935 18009 20812 33455 3566 11076 14593 24853 35113 6882 17142 35018 20659 34353 37156 10811 18800 9594 4991 33239 19587 24745 5820 12854 35860 40990 3919 7450 9189

12720 21518 33688 19084 7369 11782 14403 17629 24663 34923 21250 11648 7045 17361 36966 19506 25112 13341 33973 10431 2046 5563 13073 33593 18989 7288 9895 12530 17772 33498 18827 11553 6964 21088 35100 49224 11458 6855 18067 20870 34564 37185 11022 18773 9567 14472 24732 5849 12883 33403 18746 10128 12693 33213 18665 11363 6774 18210 34910 20775 4005 6640 9135 20708 34374 37891 10860 14377 19479 24637 35457 5992 34240 10698 17307 10033 37388 19032 7261 9938 12503 33023 11540 6993 25664 21061 3815 7346 12952 17830 35376 34145 10603 21034 49282 11432 6829 17145 5612 9843 12646 33614 37131 18719 9653 37064 18652 11350 7699 12857 18183 20818 41105 4048 6613 9178 18116 21633 49187 11785 14364 24904 34996 5965 3055 6586 20654 13828 34348 36969 10918 18557 9463 6050 34186 41248 3953 9083 18021 21552 19090 7319 9912 12477 17859 35349 34132 10590 6939 25610 21007 11405 6872 17356 20873 10054 13571 34091 11137 13504 34024 41058 18995 7462 13068 17778 33700 3573 8703 38914 49174 11324 6777 17261 35025 20792 3994 6559 11056 18062 20683 25124 13409 34377 36956 10947 19720 24962 6023 41221 7748 12878 21525 33510 37027 18615 9885 12744 35168 3899 17967 20602 3832 6397 10866 17833 24867 5942 34078 10676 19530 24800 5861 33997 41031 37394 19206 7491 10028 12649 17751 33729 22656 13450 35874 41480 11353 6988 18200 20765 3519 11029 17643 25153 13396 33916 10486 6835 17319 34971 5618 33648 19044 22561 9838 13355 34435 37014 10921 18882 9704 5101 35141 7694 12964 18010 20575 41100 3805 7560 10839 14594 17820 24854 35114 5971 10705 24773 21136 34354 36919 18787 10057 12636 33268 19616 24746 5807 35847 41005 3948 7465 9190 12707 17725 33675 7370 14432 17630 24692 35400 21041 49177 11411 7046 17362 5591 33621 19969 22548 25099 13342 33974 10908 9677 6040 13074 33594 18990 7275 12993 17535 33513 18856 11554 6951 17267 35087 6884 18096 35020 20661 34327 37186 10813 18774 9596 5945 34193 10651 19589 24719 5850 12912 41048 19209 7452 10115 12694 21576 33214 18666 11840 14405 25617 34925 21252 4006 6627 16887 37920 14378 19508 24638 35458 5755 34003 10489 17336 5565 10034 12599 33567 19019 7262 9953 12532 33500 37017 18829 11527 6994 21062 11460 7809 12939 18069 20928 35363 34146 11080 24857 6830 17146 5375 12885 33405 37160 18748 9654 5107 33243 18639 11365 7728 12858 18212 35864 20833 41106 4035 6614 9193 21634 49664 37893 11786 14351 19537 24667 34983 5966 10700 7049 17309 10007 36970 18558 9940 13457 33977 41011 3954 6519 18022 21539 19105 7348 9899 12478 17888 35350 34119 10605 6968 21036 35216 49284 11406 6859 17119 20874 9845 13600 34568 37133 11138 18777 9683 26640 7701 12831 18241 20820 33463 3574 9180 12697 35121 49189 11311 6778 17262 35026 20779 4009 6588 11043 20712 13410 34378 36943 10976 19483 24753 6052 34188 41222 3927 9085 21526 37504 19092 7377 9886 12507 17861 34931 11544 6941 25612 21065 3819 6398 17834 25344 13573 34093 10663 5862 33998 41060 37409 18997 7520 9791 12650 17780 33730 18835 9657 38916 49232 11354 6751 18187 20766 3996 6617 11030 18120 20685 25154 13383 33903 10949 14480 24964 35000 6081 33635 22562 13832 34464 37029 10922 18673 9467 5102 35142 3901 9143 18025 20604 3806 7323 10868 14385 17807 24869 35353 6000 34136 10706 19532 24774 21123 41985 37396 19264 7493 10058 12623 33255 13452 35876 41006 3711 7466 13184 17726 33704 3577 10611 17645 24679 21042 49178 11440 6837 17377 34973 5620 33622 37139 19970 22535 25128 13357 34437 37072 10895 18884 9678 6027 13089 41225 7752 12994 18012

21529 33514 18619 11793 14596 24912 35116 5973 3063 18083 20662 34356 36977 10814 18789 9583 5946 34194 10680 19590 24748 5865 12899 35905 41035 19210 7439 10144 12709 17755 33677 7372 14406 25618 34926 21015 11413 7104 17364 20881 34099 11033 19495 25101 13400 34032 10490 17323 5566 13076 33596 19048 7277 9954 12519 33487 37018 18830 11556 7009 17269 35145 7810 12968 18070 20691 43008 34385 37188 10843 19728 24858 5919 10653 24777 5852 12886 33406 36923 18735 10117 12752 33272 18668 11366 7715 17975 35851 20834 41121 4064 6629 9194 17841 37894 14380 19538 24696 35460 5757 34005 10463 7050 17310 5595 10036 12657 33625 19021 22552 9927 13458 33978 41488 11585 6996 22016 19106 7335 12941 17651 35365 34148 10606 6955 17215 35203 6888 17148 20665 9846 13363 34331 37134 10929 18778 9712 5109 33245 19593 26627 7702 12860 18242 20807 41108 4037 7568 9167 12698 21636 35122 49190 11788 14409 24669 35041 21256 4010 6575 16891 10065 36972 19512 24754 5815 33951 41013 3956 7473 9086 12603 21541 33683 19079 7378 9901 12536 17862 35408 49409 11531 6942 21066 11464 6861 18073 20876 25107 13574 34094 11140 9685 37410 18998 7283 12889 17767 33521 18864 9658 5055 35095 49219 11369 6780 18216 35028 20781 3983 6618 11045 20686 13412 34380 37897 10950 14467 19485 24727 34987 6082 41280 19217 10011 21584 37030 18674 9944 12509 34933 3902 6523 18026 20591 3821 7352 10855 14386 17836 24870 35354 5987 34123 10721 21152 49288 41986 37383 19027 7494 9849 12652 33732 37249 18837 9631 11356 7705 12947 18189 20824 33467 3578 11088 17646 25156 28673 49193 11427 6838 17378 34974 5607 33637 37168 22564 13358 34438 37059 10924 18647 9469 6056 13090 36096 41226 3931 9201 17999 21530 19096 7325 11794 14359 17865 24899 34879 5974 10708 7057 25728 21125 34343 36978 18790 10060 13577 34209 10667 5866 35906 41064 19001 7468 9907 12710 17784 33678 3551 10613 25633 21044 38920 49180 11414 6867 17351 20882 34576 37141 11034 19972 22593 25102 13387 34019 10953 24968 6029 13063 33583 7278 12996 33516 37033 18621 11319 7010 17270 35146 20787 4017 9147 18085 20720 34386 36951 10872 19715 24873 5948 34196 10654 19648 24778 5839 12901 41037 37400 19212 7497 10118 12739 17757 33259 15360 25620 35880 21073 41122 3827 6630 17842 34101 10559 19553 24683 5758 34006 10492 6841 17325 5624 10023 12658 33626 19022 22539 9956 13473 34441 37020 41475 18888 11586 6983 18195 7812 12942 18128 20693 35366 33911 10845 14600 24860 35232 5977 3067 17135 20666 13840 34360 36925 10930 18793 9699 5110 33246 19594 26656 7717 12847 18033 35853 20836 41095 4038 7555 9196 12713 17815 35585 37952 14410 19540 24670 35042 21019 11417 7052 17368 5597 10066 12631 33151 19499 25217 13460 33980 41014 3943 7474 13080 21542 33712 19108 7393 9902 12523 17653 35395 49410 11560 6957 17273 35205 6862 18074 20639 25136 13365 34333 37192 10903 18780 9686 6035 41233 26629 7760 12890 18244 21761 33522 18851 10121 12700 35124 49248 11370 6767 17979 35015 20782 4012 6633 11046 16893 9591 37898 14496 19486 24756 35464 5873 34009 41043 19218 7447 10040 12605 21571 33685 19137 7380 9931 12510 34934 11533 7000 21068 3822 7339 14849 17599 25109 35369 13632 34152 10722 17331 37412 19056 7285 9850 12415 33495 37250 18838 9660 5113 35153 49221 11343 7706 12976 18190 20811 41112 4041 6620 11075 21640 28674 49194 11904 14469 24785 34989 6084 33638 37155 18743 10013 37088 18676 9470 5819 35859 41017 3960 6525 9202 18028 21545 19083 7326 11809 14388 17866 24928 35356 5989 34125 10695 7058 21126 41988 37441 19029

22784 9823 13578 34210 11144 9689 19002 7231 12949 17771 33469 3580 10614 6963 25634 21031 35099 49167 11429 6896 17380 35032 20897 34563 37142 11049 22594 13416 34496 37061 10954 19601 24731 6030 13092 41228 3933 9175 21532 37034 18622 11796 14417 24901 34937 21264 4018 6583 18086 20707 34401 36980 10859 19744 24874 5935 34183 10669 5868 12902 35908 41038 37387 18975 7498 9909 12768 17758 33736 18841 11539 25607 21074 11472 6869 18305 20884 34102 11036 19554 25160 13389 34021 10479 6842 17326 5611 13121 33641 22568 13474 34442 37007 41504 18651 11377 7012 18224 35148 20789 3991 9149 18115 20694 34388 37905 10846 14363 19717 24847 34995 5978 10712 24780 21129 13827 34347 36926 18794 10176 12741 33261 7718 18034 35854 20599 41124 3829 7584 8959 12714 17844 35586 34131 10617 19527 24685 21048 49296 11418 6815 17355 5598 10081 12660 33628 37145 19976 22541 25218 13447 33967 41477 11588 7937 13067 18197 33699 7394 13000 17654 35424 49201 11323 6958 17274 35206 5503 3069 18089 20668 25123 13366 34334 36955 10932 18767 9701 6064 34200 41234 19596 26630 7747 12905 18007 21762 41153 19328 7557 10122 12687 17873 35111 14412 25624 35044 21021 3775 6634 16894 10068 13585 34105 10675 19501 24743 5874 34010 41072 19233 7476 10027 12606 21600 33686 19138 7367 9960 12525 35397 38928 49412 11534 6987 17247 7816 14850 18076 20697 25110 35370 13395 33915 10961 24976 6037 33591 19043 7286 12892 33524 37041 18853 9647 5114 35154 49222 11372 7721 12963 17981 35969 20840 41099 4042 6607 11104 17819 24881 37900 14470 19544 24786 34990 5847 41045 37632 19220 7505 10014 12635 21573 33267 18663 9933 13464 35888 41018 3947 6526 21546 19112 7341 11810 14375 17657 24691 35343 5990 34126 10724 7073 17333 35209 37442 19030 22547 9852 13369 34449 37252 10907 18896 9690 5087 26633 7708 12950 18248 20813 33470 3567 11077 14608 28676 35128 49196 11430 6883 17143 35019 20898 34592 37157 11050 18801 9595 37062 19602 24760 5821 12855 35861 40991 3934 7451 9204 12721 21519 33689 19085 7384 11783 14418 17868 24902 34938 21251 11649 7060 21184 34402 36967 19507 25113 13580 34212 10670 2047 37416 19004 7289 9910 12531 17773 33499 18842 11568 6965 25636 21089 35101 49225 11459 6870 18306 20871 34565 37200 11023 22596 13390 34022 10956 14473 24733 6088 13122 33642 18747 10129 37036 18680 11378 6775 18211 34911 20790 4020 6641 9150 18144 20709 34375 37906 10861 14392 19718 24876 35472 5993 34241 10699 21130 13856 41992 37389 19033 7500 9939 12742 33262 11541 25665 21076 3830 7347 12953 17831 35377 34160 10618 19556 24686 21035 49283 11433 6844 17384 5613 10082 12647 33615 37146 22542 13476 34444 37065 41478 18653 11351 7938 13096 18198 20819 41344 4049 9179 18117 21648 49202 11800 14365 24905 34997 5980 3070 6587 18090 20655 13829 34349 36984 10919 18796 9702 6051 34187 41249 7776 12906 18036 35912 21553 41154 19091 7558 9913 12716 17874 35588 34133 10591 25611 21022 11420 6873 17357 20888 10055 13586 34106 11152 19502 25220 13505 34025 41059 19234 7463 13069 17779 33701 7396 12526 35398 38915 49175 11325 7016 17276 35264 20793 3995 11057 18063 20698 25125 13424 34392 36957 10962 19721 24963 6038 41236 26688 7749 12879 21764 33511 37042 18854 10124 12745 35169 7722 17982 35970 20603 41128 3833 6636 10867 17848 24882 5943 34079 10677 19531 24801 5876 34012 41046 37395 19207 7506 10029 12664 21574 33744 19140 22657 9934 13451 35875 41481 11592 6989 18201 7342 14852 17658 25168 35372 13397 33917 10487 7074 17334 35210 5619 33649 19045 22576 9839 13370 34450 37015 10936

18883 9705 5116 35156 50176 26634 7695 12965 18011 20814 41101 4044 7561 11078 14595 17821 24855 35115 14528 24788 35048 21137 34355 37158 18802 10072 12637 33269 19617 24747 5822 35862 41020 3949 7480 9191 12722 21548 33690 19086 7371 11812 14433 17631 24693 35401 21280 49416 11650 7047 17363 37444 19984 22549 25114 13343 33975 10909 9692 6041 13075 33595 18991 7290 13008 17774 33528 18857 11555 6966 21090 35102 49226 11488 6885 18097 35021 20900 34566 37187 11052 18775 9597 38016 14474 19604 24734 5851 12913 41049 19224 7453 10130 12695 21577 33215 18667 11841 14420 25856 34940 21253 4007 6642 20710 34404 37921 10862 14379 19509 24639 35459 5994 34242 10728 17337 10035 37390 19034 7263 9968 12533 33501 37256 18844 11542 6995 25666 21063 11461 7824 12954 18308 20929 35378 34147 11081 28680 49312 11434 6831 17147 5614 13124 33644 37161 18749 9655 37066 18654 11380 7729 12859 18213 35865 20848 41107 4050 6615 9208 18118 21635 49665 37908 11787 14366 19776 24906 34998 5967 10701 7064 21132 13830 34350 36971 18559 9941 13696 34216 41250 3955 18023 21554 19120 7349 9914 12479 17889 35351 34134 10620 6969 25640 21037 35217 49285 11407 6874 17358 20875 10084 13601 34569 37148 11139 22600 13506 34026 41536 26641 7940 13070 18256 20821 33702 3575 9181 38944 49204 11326 6779 17263 35027 20794 4024 6589 11058 18092 20713 25126 13411 34379 36958 10977 19722 24992 6053 34189 41223 7750 12908 21527 41156 37505 19093 7616 9887 12746 17876 35170 11545 25613 21080 3834 6399 17835 25345 13588 34108 10678 19560 24802 5863 33999 41061 37424 19236 7521 10030 12651 17781 33731 22658 13480 36352 38917 41482 49233 11355 6990 18202 20767 3997 11031 18121 20700 25155 13398 33918 10964 14481 24965 35001 6096 33650 19046 22563 13833 34465 37044 10923 18912 9706 5103 35143 7724 12966 18040 35972 20605 41102 3807 7562 10869 14624 17822 24884 35592 6001 34137 10707 19533 24775 21138 42000 37397 19265 7508 10059 12638 33270 19618 25224 13453 35877 41007 3950 7467 13185 17727 33705 7400 14434 17660 24694 35402 21043 49179 11441 7076 17392 35212 5621 33623 19971 22550 25129 13372 34452 37073 10910 18885 9679 6042 13104 41240 26636 7753 12995 18013 21768 33515 18858 12032 14597 24913 35117 6886 18098 35022 20663 34357 37216 10815 18804 9598 5947 34195 10681 19591 24749 5880 12914 35920 41050 19211 7454 10145 12724 21578 33692 19144 7373 11842 14407 25619 34927 21254 11652 7105 17365 37922 14856 19510 25116 35488 13401 34033 10491 17338 5567 13077 33597 19049 7292 9955 12534 33502 37019 18831 11557 7024 21092 35160 49228 11462 7811 12969 18071 20930 43009 34624 37189 11082 19729 24859 14476 24792 5853 12887 33407 37162 18750 10132 12753 33273 18669 11367 7730 18214 35866 20835 41136 4065 6644 9195 21664 49666 37895 11816 14381 19539 24697 35461 5996 34244 10702 7051 17311 10037 37448 19036 22553 9942 13459 33979 41489 11600 6997 25668 22017 19107 7350 12956 17890 35380 34149 10607 6970 21038 35218 49286 11436 6889 17149 20904 9847 13602 34570 37135 11168 18779 9713 37068 19608 26642 7703 12861 18243 20822 41109 4052 7569 9182 12699 21637 35123 49191 11789 14424 24908 35056 21257 4011 6590 20714 13888 34408 36973 10978 19513 24755 6054 34190 41252 3957 9087 21556 37506 19094 7379 9916 12537 17863 35409 49424 11546 6943 25614 21067 11465 6876 18312 20877 25346 13575 34095 11141 13508 34028 41062 37411 18999 7522 13128 17782 33760 18865 9659 38918 49234 11384 6781 18217 35029 20796 3998 6619 11060 18122 20687 25184 13413 34381 37912 10951

14482 19724 24966 35002 6083 41281 23040 13834 21585 34466 37031 18675 9945 12748 35172 3903 18027 20606 3836 7353 10870 14387 17837 24871 35355 6002 34138 10736 19534 24804 21153 49289 41987 37398 19266 7495 10088 12653 33733 37264 22660 13454 35878 41484 11357 7944 13186 18204 20825 33706 3579 11089 17647 25157 28688 49208 11442 6839 17379 34975 5622 33652 37169 20000 22565 25130 13359 34439 37074 10925 18886 9708 6057 13091 36097 41227 7754 13024 18014 21531 41160 19097 7564 11795 14598 17880 24914 35118 5975 10709 25729 21140 34358 36979 18791 10061 13592 34224 10682 19620 24750 5867 35907 41065 19240 7469 10146 12711 17785 33679 7374 14436 25648 35404 21045 38921 49181 11415 7106 17366 20883 34577 11035 19973 22608 25103 13402 34034 10968 24969 6044 13078 33598 19050 7279 12997 33517 37048 18860 11558 7011 17271 35147 7840 12970 18100 35976 20721 43010 34387 37190 10873 19730 24888 5949 34197 10655 19649 24779 5854 12916 41052 37401 19213 7512 10119 12754 21580 33274 18670 11844 15361 25621 35881 21312 41123 4066 6631 17843 37924 14382 19568 24698 35462 5759 34007 10493 7080 17340 5625 10038 12659 33627 19023 22554 9957 13488 34456 37021 41490 18889 11587 6998 22018 26752 7813 12943 18129 20932 35367 34150 11084 14601 24861 35233 6890 17150 20667 13841 34361 37164 10931 18808 9714 5111 33247 19595 26657 7732 12862 18272 35868 20837 41110 4039 7570 9197 12728 21638 35600 49668 37953 11790 14411 19541 24671 35043 21258 11656 7053 17369 10067 36974 19514 25232 13461 33981 41015 3958 7475 13081 21543 33713 19109 7408 9903 12538 17892 35410 49411 11561 6972 21096 35220 49344 11466 6863 18075 20878 25137 13604 34572 37193 11142 18781 9687 45056 26644 7761 12891 18245 21776 33523 18866 10136 12701 35125 49249 11371 6782 18218 35030 20783 4013 6648 11047 20716 13414 34382 37899 10980 14497 19487 24757 35465 6112 34248 41282 19219 10041 21586 37508 19152 7381 9946 12511 34935 11548 7001 25672 21069 3823 7354 14864 17838 25348 35384 13633 34153 10723 21154 49290 42016 37413 19057 7524 9851 12654 33734 37251 18839 9661 38976 49236 11358 7707 12977 18191 20826 41113 4056 6621 11090 18124 21641 25158 28675 49195 11905 14484 25024 35004 6085 33639 37170 22566 13836 34468 37089 10926 18677 9471 6058 36098 41256 3961 9203 18029 21560 19098 7327 11824 14389 17867 24929 35357 6004 34140 10710 7059 25730 21127 41989 37456 19268 22785 10062 13579 34211 11145 13512 35936 41066 19003 7470 13188 17786 33708 3581 10615 25635 21046 38922 49182 11444 6897 17381 35033 20912 34578 37143 11064 19974 22595 25132 13417 34497 37076 10955 19840 24970 6031 13093 41229 7756 12998 21533 33518 37035 18623 11797 14656 24916 35176 21265 4019 18087 20722 34416 36981 10874 19745 24875 5950 34198 10684 19650 24808 5869 12903 35909 41039 37402 19214 7499 10148 12769 17759 33737 22664 15362 25622 35882 21075 41600 11473 7108 18320 20885 34103 11037 19555 25161 13404 34036 10494 6843 17327 5626 13136 33656 19052 22569 9958 13475 34443 37022 41505 18890 11616 7013 18225 35149 7814 12972 18130 20695 43012 34389 38144 10847 14602 19732 24862 35234 5979 10713 24781 21144 13842 34362 36927 18795 10177 12756 33276 19624 26658 7719 18035 35855 20838 41125 4068 7585 9198 12715 17845 35587 37954 14440 19542 24700 35520 21049 49297 11419 7054 17370 5599 10096 12661 33629 19977 22556 25219 13462 33982 41492 11589 7952 13082 22020 33714 19110 7395 13001 17655 35425 49440 11562 6959 17275 35207 6892 18104 20669 25138 13367 34335 37194 10933 18782 9716 6065 34201 41235 19597 26631

7762 12920 18246 21763 41168 19329 7572 10123 12702 21696 35126 49250 11848 14413 25625 35045 21260 4014 6635 16895 10069 37928 14498 19516 24758 35466 5875 34011 41073 19248 7477 10042 12607 21601 33687 19139 7382 9961 12540 35412 38929 49413 11535 7002 21070 11468 7817 14851 18077 20936 25111 35371 13634 34154 11200 24977 37414 19058 7287 12893 33525 37280 18868 9662 5115 35155 49223 11373 7736 12978 18220 35984 20841 41114 4043 6622 11105 21642 28704 49672 37901 11906 14471 19545 24787 34991 6086 41284 37633 19221 10015 21588 37090 18678 9948 13465 35889 41019 3962 6527 18030 21547 19113 7356 11811 14390 17896 24930 35358 5991 34127 10725 7088 21156 35224 49292 41990 37443 19031 22786 9853 13608 34688 37253 11146 18897 9691 26648 7709 12951 18249 20828 33471 3582 11092 14609 26112 28677 35129 49197 11431 6898 17382 35034 20899 34593 37172 11051 22624 13418 34498 37063 10984 19603 24761 6060 13094 36100 41230 3935 9205 21534 37512 19100 7385 11798 14419 17869 24903 34939 21266 11664 7061 25732 21185 34403 36982 19746 25352 13581 34213 10671 5870 35910 41068 37417 19005 7528 9911 12770 17788 33738 18843 11569 25637 21104 38924 49240 11474 6871 18307 20886 34580 37201 11038 20032 22597 25162 13391 34023 10957 14488 24972 6089 13123 33643 22570 13952 34472 37037 41506 18681 11379 7014 18226 35150 20791 4021 9151 18145 20724 34390 37907 10876 14393 19719 24877 35473 6008 34256 10714 19652 24782 21131 13857 41993 37404 19272 7501 10178 12743 33263 15364 25680 35884 21077 41126 3831 7586 13192 17846 35616 34161 10619 19557 24687 21050 49298 11448 6845 17385 5628 10083 12662 33630 37147 19978 22543 25248 13477 34445 37080 41479 18892 11590 7939 13097 18199 41345 7872 13002 18132 21649 35426 49203 11801 14604 24920 35236 5981 3071 18091 20670 13844 34364 36985 10934 18797 9703 6066 34202 41264 19598 26660 7777 12907 18037 35913 21792 41155 19330 7559 10152 12717 17875 35589 37956 14414 25626 35046 21023 11421 7112 17372 20889 10070 13587 34107 11153 19503 25221 13520 34040 41074 19235 7478 13084 21602 33716 19168 7397 9962 12527 35399 38930 49414 11564 7017 17277 35265 7818 14880 18078 20699 25140 43016 13425 34393 37196 10963 19736 24978 6039 41237 26689 7764 12894 21765 33526 37043 18855 10125 12760 35184 49252 11374 7723 17983 35971 20842 41129 4072 6637 11106 17849 24883 37902 14500 19546 24816 35468 5877 34013 41047 37634 19222 7507 10044 12665 21575 33745 19141 22672 9935 13466 35890 41496 11593 7004 22024 19114 7343 14853 17659 25169 35373 13636 34156 10726 7075 17335 35211 37472 19060 22577 9854 13371 34451 37254 10937 18898 9720 5117 35157 50177 26635 7710 12980 18250 20815 41116 4045 7576 11079 14610 21644 28678 35130 49198 11908 14529 24789 35049 21376 34594 37159 18803 10073 37092 19632 24762 5823 35863 41021 3964 7481 9206 12723 21549 33691 19087 7386 11813 14448 17870 24932 35416 21281 49417 11651 7062 21186 42048 37445 19985 22788 25115 13582 34214 11148 9693 37418 19006 7291 13009 17775 33529 18872 11570 6967 25638 21091 35103 49227 11489 6900 18336 35036 20901 34567 37202 11053 22598 13420 34500 38017 10958 14475 19605 24735 6090 13152 41288 19225 10131 21592 37038 18682 11856 14421 25857 34941 21268 4022 6643 18146 20711 34405 37936 10863 14394 19748 24878 35474 5995 34243 10729 21160 13858 51200 41994 37391 19035 7502 9969 12772 33740 37257 18845 11543 25667 21078 11476 7825 12955 18309 20944 35379 34162 11096 19558 25164 28681 49313 11435 6846 17386 5615 13125 33645 37176 22572 13478 34446 37067 41508 18655

11381 7968 13098 18228 36104 20849 41346 4051 9209 18119 21650 49680 37909 11802 14367 19777 24907 34999 5982 10716 7065 25736 21133 13831 34351 36986 18798 10180 13697 34217 41251 7778 18038 35914 21555 41184 19121 7588 9915 12718 17904 35590 34135 10621 25641 21052 39040 49300 11422 6875 17359 20890 10085 13616 34584 37149 11154 19980 22601 25222 13507 34027 41537 26880 7941 13071 18257 33703 7398 13004 35428 38945 49205 11327 7018 17278 35266 20795 4025 11059 18093 20728 25127 13426 34394 36959 10992 19723 24993 6068 34204 41238 19656 26690 7751 12909 21766 41157 37520 19332 7617 10126 12747 17877 35171 15368 25628 36000 21081 41130 3835 6638 17850 25360 13589 34109 10679 19561 24803 5878 34014 41076 37425 19237 7536 10031 12666 21604 33746 19142 22659 9964 13481 36353 38932 41483 49472 11594 6991 18203 7820 14854 18136 20701 25170 35374 13399 33919 10965 14720 24980 35240 6097 33651 19047 22578 13848 34480 37045 10938 18913 9707 5118 35158 50178 26664 7725 12967 18041 35973 20844 41103 4046 7563 11108 14625 17823 24885 35593 37960 14530 19548 24790 35050 21139 42001 37636 19280 7509 10074 12639 33271 19619 25225 13468 35892 41022 3951 7482 13200 21550 33720 19116 7401 11814 14435 17661 24695 35403 21282 49418 11680 7077 17393 35213 37446 19986 22551 25144 13373 34453 37312 10911 18900 9694 6043 13105 41241 26637 7768 13010 18252 21769 33530 18859 12033 14612 28736 35132 49256 11490 6887 18099 35023 20902 34596 37217 11054 18805 9599 38018 14504 19606 24764 5881 12915 35921 41051 19226 7455 10160 12725 21579 33693 19145 7388 11843 14422 25858 34942 21255 11653 7120 21188 34406 37923 14857 19511 25117 35489 13640 34272 10730 17339 37420 19064 7293 9970 12535 33503 37258 18846 11572 7025 25696 21093 35161 49229 11463 7826 12984 18310 20931 43024 34625 37204 11083 23552 28682 49314 11912 14477 24793 6092 13126 33646 37163 18751 10133 37096 18684 11382 7731 18215 35867 20850 41137 4080 6645 9210 18148 21665 49667 37910 11817 14396 19778 24936 35476 5997 34245 10703 7066 21134 13860 41996 37449 19037 22792 9943 13698 34218 41728 11601 25669 22032 19122 7351 12957 17891 35381 34164 10622 6971 25642 21039 35219 49287 11437 6904 17388 20905 10086 13603 34571 37150 11169 22602 13536 34504 37069 41538 19609 26643 7942 13100 18258 20823 41348 4053 9183 21652 38946 49206 11804 14425 24909 35057 21272 4026 6591 18094 20715 13889 34409 36988 10979 19752 24994 6055 34191 41253 7780 12910 35916 21557 41158 37507 19095 7618 9917 12776 17878 35648 49425 11547 25615 21082 11480 6877 18313 20892 25347 13590 34110 11156 19562 25280 13509 34029 41063 37426 19238 7523 13129 17783 33761 22688 13482 36354 38919 41512 49235 11385 7020 18232 35268 20797 3999 11061 18123 20702 25185 13428 34396 37913 10966 14483 19725 24967 35003 6098 41296 26692 23041 13835 21824 34467 37046 18914 10184 12749 35173 7726 18042 35974 20607 41132 3837 7592 10871 14626 17852 24886 35594 6003 34139 10737 19535 24805 21168 49304 42002 37399 19267 7510 10089 12668 33748 37265 20096 22661 25226 13455 35879 41485 11596 7945 13187 18205 33707 7402 14912 17662 25172 35432 28689 49209 11443 7078 17394 35214 5623 33653 20001 22580 25131 13374 34454 37075 10940 18887 9709 6072 13106 36112 41242 50180 26638 7755 13025 18015 21770 41161 19336 7565 12034 14599 17881 24915 35119 14532 25744 35052 21141 34359 37218 18806 10076 13593 34225 10683 19621 24751 5882 35922 41080 19241 7484 10147 12726 21608 33694 19146 7375 11872 14437 25649 35405 21284 38936 49420 11654 7107 17367 38400 14858 19988 22609 25118 35490 13403 34035 10969 24984 6045 13079 33599 19051 7294 13012 33532 37049 18861 11559 7026 21094 35162 49230 11492 7841 12971 18101 35977 20960 43011 34626 37191 11112 19731 24889 38020 14478 19664 24794 5855 12917 41053 37640 19228 7513 10134 12755 21581 33275 18671 11845 15376 25860 35896 21313 41138 4067 6646 21666 49696 37925 11818 14383 19569 24699 35463 5998 34246 10732 7081 17341 10039 37450 19038 22555 9972 13489 34457 37260 41491 18904 11602 6999 25670 22019 26753 7828 12958 18368 20933 35382 34151 11085 14616 28684 35248 49316 11438 6891 17151 20906 14080 34600 37165 11170 18809 9715 37070 19610 26672 7733 12863 18273 35869 20852 41111 4054 7571 9212 12729 21639 35601 49669 37968 11791 14426 19780 24910 35058 21259 11657 7068 21192 13890 34410 36975 19515 25233 13700 34220 41254 3959 21558 37536 19124 7409 9918 12539 17893 35411 49426 11576 6973 25644 21097 35221 49345 11467 6878 18314 20879 25376 13605 34573 37208 11143 22604 13510 34030 41540 45057 26645 8000 13130 18260 21777 33762 18867 10137 38948 49264 11386 6783 18219 35031 20798 4028 6649 11062 18152 20717 25186 13415 34383 37914 10981 14512 19726 24996 35480 6113 34249 41283 23042 13864 21587 42112 37509 19153 7620 9947 12750 35174 11549 25673 21084 3838 7355 14865 17839 25349 35385 13648 34168 10738 19564 24806 21155 49291 42017 37428 19296 7525 10090 12655 33735 37266 22662 13484 36356 38977 41486 49237 11359 7946 13216 18206 20827 41352 4057 11091 18125 21656 25159 28690 49210 11920 14485 25025 35005 6100 33654 37171 20002 22567 13837 34469 37104 10927 18916 9710 6059 36099 41257 7784 13026 18044 36032 21561 41162 19099 7566 11825 14628 17882 24944 35596 6005 34141 10711 25731 21142 42004 37457 19269 22800 10063 13594 34226 11160 19622 25228 13513 35937 41067 19242 7471 13189 17787 33709 7404 14438 25650 35406 21047 38923 49183 11445 7136 17396 35272 20913 34579 11065 19975 22610 25133 13432 34512 37077 10970 19841 24971 6046 13108 41244 26696 7757 12999 21772 33519 37050 18862 12036 14657 24917 35177 7842 18102 35978 20723 43040 34417 37220 10875 19760 24890 5951 34199 10685 19651 24809 5884 12918 35924 41054 37403 19215 7514 10149 12784 21582 33752 19148 22665 11846 15363 25623 35883 21314 41601 11712 7109 18321 37926 14860 19570 25176 35492 13405 34037 10495 7082 17342 5627 13137 33657 19053 22584 9959 13490 34458 37023 41520 18891 11617 7028 22048 35164 50184 26754 7815 12973 18131 20934 43013 34628 38145 11086 14603 19733 24863 35235 14536 24796 21145 13843 34363 37166 18810 10192 12757 33277 19625 26659 7734 18274 35870 20839 41140 4069 7600 9199 12730 21668 35602 49670 37955 11820 14441 19543 24701 35521 21288 49536 11658 7055 17371 10097 37452 19992 22557 25234 13463 33983 41493 11604 7953 13083 22021 33715 19111 7410 13016 17894 35440 49441 11563 6974 21098 35222 49346 11496 6893 18105 20908 25139 13606 34574 37195 11172 18783 9717 38024 45058 19612 26646 7763 12921 18247 21778 41169 19344 7573 10138 12703 21697 35127 49251 11849 14428 25864 35060 21261 4015 6650 20718 13892 34412 37929 10982 14499 19517 24759 35467 6114 34250 41312 19249 10043 21616 37510 19154 7383 9976 12541 35413 39168 49428 11550 7003 25674 21071 11469 7832 14866 18316 20937 25350 35386 13635 34155 11201 28800 49320 42018 37415 19059 7526 13132 33764 37281 18869 9663 38978 49238 11388 7737 12979 18221 35985 20856 41115 4058 6623 11120 18126 21643 25188 28705 49673 37916 11907 14486 19784 25026 35006 6087 41285 37648 23044 13838

21589 34470 37091 18679 9949 13704 36128 41258 3963 18031 21562 19128 7357 11826 14391 17897 24931 35359 6006 34142 10740 7089 25760 21157 35225 49293 41991 37458 19270 22787 10092 13609 34689 37268 11147 22720 13514 35938 41544 26649 7948 13190 18264 20829 33710 3583 11093 26113 28692 38952 49212 11446 6899 17383 35035 20914 34608 37173 11066 20004 22625 25134 13419 34499 37078 10985 19842 25000 6061 13095 36101 41231 7758 13028 21535 41164 37513 19101 7624 11799 14658 17884 24918 35178 21267 11665 25733 21200 34418 36983 19747 25353 13596 34228 10686 19680 24810 5871 35911 41069 37432 19244 7529 10150 12771 17789 33739 22666 15392 25652 36360 21105 38925 41602 49241 11475 7110 18322 20887 34581 11039 20033 22612 25163 13406 34038 10972 14489 24973 6104 13138 33658 19054 22571 13953 34473 37052 41507 18920 11618 7015 18227 35151 7844 12974 18160 35980 20725 43014 34391 38146 10877 14632 19734 24892 35712 6009 34257 10715 19653 24783 21146 13872 42008 37405 19273 7516 10179 12758 33278 19626 27136 15365 25681 35885 21316 41127 4070 7587 13193 17847 35617 37984 14442 19572 24702 35522 21051 49299 11449 7084 17400 5629 10098 12663 33631 19979 22558 25249 13492 34460 37081 41494 18893 11591 7954 13112 22022 41360 26756 7873 13003 18133 21888 35427 49442 12040 14605 24921 35237 6894 18106 20671 13845 34365 37224 10935 18812 9718 6067 34203 41265 19599 26661 7792 12922 18276 35928 21793 41170 19331 7574 10153 12732 21698 35604 49728 37957 11850 14415 25627 35047 21262 11660 7113 17373 10071 37930 14976 19518 25236 35496 13521 34041 41075 19250 7479 13085 21603 33717 19169 7412 9963 12542 35414 38931 49415 11565 7032 21100 35280 49348 11470 7819 14881 18079 20938 25141 43017 13664 34632 37197 11202 19737 24979 45060 26704 7765 12895 21780 33527 37282 18870 10140 12761 35185 49253 11375 7738 18222 35986 20843 41144 4073 6652 11107 21672 28706 49674 37903 11936 14501 19547 24817 35469 6116 34252 41286 37635 19223 10045 21590 37568 19156 22673 9950 13467 35891 41497 11608 7005 25676 22025 19115 7358 14868 17898 25408 35388 13637 34157 10727 7090 21158 35226 49294 42020 37473 19061 22816 9855 13610 34690 37255 11176 18899 9721 38980 50192 26650 7711 12981 18251 20830 41117 4060 7577 11094 14611 21645 26114 28679 35131 49199 11909 14544 25028 35064 21377 34595 37174 22626 13896 34528 37093 10986 19633 24763 6062 36102 41260 3965 9207 21564 37514 19102 7387 11828 14449 17871 24933 35417 21296 49432 11666 7063 25734 21187 42049 37460 20224 22789 25354 13583 34215 11149 13516 35940 41070 37419 19007 7530 13248 17790 33768 18873 11571 25639 21106 38926 49242 11504 6901 18337 35037 20916 34582 37203 11068 20034 22599 25192 13421 34501 38032 10959 14490 19844 24974 6091 13153 41289 23048 13954 21593 34474 37039 18683 11857 14660 25872 35180 21269 4023 18147 20726 34420 37937 10878 14395 19749 24879 35475 6010 34258 10744 19654 24812 21161 13859 51201 41995 37406 19274 7503 10208 12773 33741 37272 22668 15366 25682 35886 21079 41604 11477 8064 13194 18324 20945 35618 34163 11097 19559 25165 28696 49328 11450 6847 17387 5630 13140 33660 37177 20008 22573 25250 13479 34447 37082 41509 18894 11620 7969 13099 18229 36105 41347 7874 13032 18134 21651 43072 49681 38148 11803 14606 19792 24922 35238 5983 10717 25737 21148 13846 34366 36987 18799 10181 13712 34232 41266 19628 26662 7779 18039 35915 21794 41185 19360 7589 10154 12719 17905 35591 37958 14444 25656 35524 21053 39041 49301 11423 7114 17374 20891 10100 13617

34585 11155 19981 22616 25223 13522 34042 41552 26881 7956 13086 22080 33718 19170 7399 13005 35429 38960 49444 11566 7019 17279 35267 7848 14882 18108 20729 25142 43018 13427 34395 37198 10993 19738 25008 6069 34205 41239 19657 26691 7766 12924 21767 41172 37521 19333 7632 10127 12762 21700 35186 49254 11852 15369 25629 36001 21320 41131 4074 6639 17851 25361 37932 14502 19576 24818 35470 5879 34015 41077 37664 19252 7537 10046 12667 21605 33747 19143 22674 9965 13496 36368 38933 41498 49473 11595 7006 22026 26760 7821 14855 18137 20940 25171 35375 13638 34158 11204 14721 24981 35241 37474 19062 22579 13849 34481 37284 10939 18928 9722 5119 35159 50179 26665 7740 12982 18280 35988 20845 41118 4047 7578 11109 14640 21646 28708 35608 49676 37961 11910 14531 19549 24791 35051 21378 42240 37637 19281 10075 37094 19634 25240 13469 35893 41023 3966 7483 13201 21551 33721 19117 7416 11815 14450 17900 24934 35418 21283 49419 11681 7092 21216 35228 49352 42050 37447 19987 22790 25145 13612 34692 37313 11150 18901 9695 45064 26652 7769 13011 18253 21784 33531 18874 12048 14613 26116 28737 35133 49257 11491 6902 18338 35038 20903 34597 37232 11055 22628 13422 34502 38019 10988 14505 19607 24765 6120 13154 36160 41290 19227 10161 21594 37516 19160 7389 11858 14423 25859 34943 21270 11668 7121 25792 21189 34407 37938 14872 19750 25356 35504 13641 34273 10731 21162 51202 42024 37421 19065 7532 9971 12774 33742 37259 18847 11573 25697 21108 38984 49244 11478 7827 12985 18311 20946 43025 34640 37205 11098 20036 23553 25166 28683 49315 11913 14492 25032 6093 13127 33647 37178 22574 13956 34476 37097 41510 18685 11383 7970 18230 36106 20851 41376 4081 9211 18149 21680 49682 37911 11832 14397 19779 24937 35477 6012 34260 10718 7067 25738 21135 13861 41997 37464 19276 22793 10182 13699 34219 41729 15424 25684 35944 22033 41186 19123 7590 13196 17906 35620 34165 10623 25643 21054 39042 49302 11452 6905 17389 20920 10087 13618 34586 37151 11184 19982 22603 25252 13537 34505 37084 41539 19848 26882 7943 13101 18259 41349 7876 13006 21653 35430 38947 49207 11805 14664 24924 35296 21273 4027 18095 20730 13904 34424 36989 10994 19753 24995 6070 34206 41268 19658 26720 7781 12911 35917 21796 41159 37522 19334 7619 10156 12777 17879 35649 53248 15370 25630 36002 21083 41608 11481 7116 18328 20893 25362 13591 34111 11157 19563 25281 13524 34044 41078 37427 19239 7538 13144 21606 33776 19172 22689 9966 13483 36355 38934 41513 49474 11624 7021 18233 35269 7822 14884 18138 20703 25200 43020 13429 34397 38152 10967 14722 19740 24982 35242 6099 41297 26693 23056 13850 21825 34482 37047 18915 10185 12764 35188 50208 26666 7727 18043 35975 20846 41133 4076 7593 11110 14627 17853 24887 35595 37962 14560 19550 24820 35528 21169 49305 42003 37638 19282 7511 10104 12669 33749 20097 22676 25227 13470 35894 41500 11597 7960 13202 22028 33722 19118 7403 14913 17663 25173 35433 28928 49448 11682 7079 17395 35215 37476 20016 22581 25146 13375 34455 37314 10941 18902 9724 6073 13107 36113 41243 50181 26639 7770 13040 18254 21771 41176 19337 7580 12035 14614 21704 28738 35134 49258 11968 14533 25745 35053 21380 34598 37219 18807 10077 38048 14506 19636 24766 5883 35923 41081 19256 7485 10162 12727 21609 33695 19147 7390 11873 14452 25888 35420 21285 38937 49421 11655 7122 21190 42052 38401 14859 19989 22848 25119 35491 13642 34274 11208 24985 37422 19066 7295 13013 33533 37288 18876 11574 7027 25698 21095 35163 49231 11493 7856 12986 18340

35992 20961 43026 34627 37206 11113 23554 28712 49792 38021 11914 14479 19665 24795 6094 13156 41292 37641 19229 10135 21596 37098 18686 11860 15377 25861 35897 21328 41139 4082 6647 18150 21667 49697 37940 11819 14398 19808 24938 35478 5999 34247 10733 7096 21164 13862 51204 41998 37451 19039 22794 9973 13728 34696 37261 41730 18905 11603 25671 22034 26768 7829 12959 18369 20948 35383 34166 11100 14617 26120 28685 35249 49317 11439 6906 17390 20907 14081 34601 37180 11171 22632 13538 34506 37071 41568 19611 26673 7972 13102 18288 36108 20853 41350 4055 9213 21654 39424 49684 37969 11806 14427 19781 24911 35059 21274 11672 7069 25740 21193 13891 34411 36990 19754 25472 13701 34221 41255 7782 35918 21559 41188 37537 19125 7648 9919 12778 17908 35650 49427 11577 25645 21112 39044 49360 11482 6879 18315 20894 25377 13620 34588 37209 11158 20040 22605 25282 13511 34031 41541 45072 26884 8001 13131 18261 33763 22690 13960 36384 38949 41514 49265 11387 7022 18234 35270 20799 4029 11063 18153 20732 25187 13430 34398 37915 10996 14513 19727 24997 35481 6128 34264 41298 19660 26694 23043 13865 21826 42113 37524 19392 7621 10186 12751 35175 15372 25688 36004 21085 41134 3839 7594 15104 17854 25364 35624 13649 34169 10739 19565 24807 21170 49306 42032 37429 19297 7540 10091 12670 33750 37267 20098 22663 25256 13485 36357 38992 41487 49476 11598 7947 13217 18207 41353 7880 14914 18140 21657 25174 35434 28691 49211 11921 14724 25040 35244 6101 33655 20003 22582 13852 34484 37105 10942 18917 9711 6074 36114 41272 50182 26668 7785 13027 18045 36033 21800 41163 19338 7567 12064 14629 17883 24945 35597 37964 14534 25746 35054 21143 42005 37696 19284 22801 10078 13595 34227 11161 19623 25229 13528 35952 41082 19243 7486 13204 21610 33724 19176 7405 11874 14439 25651 35407 21286 38938 49422 11684 7137 17397 35273 38402 14888 19990 22611 25148 43136 13433 34513 37316 10971 19856 24986 6047 13109 41245 26697 7772 13014 21773 33534 37051 18863 12037 14672 28740 35192 49260 11494 7843 18103 35979 20962 43041 34656 37221 11114 19761 24891 38022 14508 19666 24824 5885 12919 35925 41055 37642 19230 7515 10164 12785 21583 33753 19149 22680 11847 15378 25862 35898 21315 41616 11713 7124 22144 49698 37927 14861 19571 25177 35493 13644 34276 10734 7083 17343 37480 19068 22585 9974 13491 34459 37262 41521 18906 11632 7029 25700 22049 35165 50185 26755 7830 12988 18370 20935 43028 34629 38160 11087 14618 23556 28686 35250 49318 11916 14537 24797 21384 14082 34602 37167 18811 10193 37100 19640 26674 7735 18275 35871 20854 41141 4084 7601 9214 12731 21669 35603 49671 37970 11821 14456 19782 24940 35536 21289 49537 11659 7070 21194 13920 42056 37453 19993 22796 25235 13702 34222 41732 11605 22036 37538 19126 7411 13017 17895 35441 49456 11578 6975 25646 21099 35223 49347 11497 6908 18344 20909 25378 13607 34575 37210 11173 22606 13540 34508 38025 41542 45059 19613 26647 8002 13160 18262 21779 41408 19345 10139 21712 38950 49266 11864 14429 25865 35061 21276 4030 6651 18154 20719 13893 34413 37944 10983 14514 19756 24998 35482 6115 34251 41313 23072 13866 51208 21617 42114 37511 19155 7622 9977 12780 35652 39169 49429 11551 25675 21086 11484 7833 14867 18317 20952 25351 35387 13650 34170 11216 19566 25284 28801 49321 42019 37430 19298 7527 13133 33765 37296 22692 13486 36358 38979 41516 49239 11389 7976 13218 18236 36224 20857 41354 4059 11121 18127 21658 25189 28720 49688 37917 11922 14487 19785 25027 35007 6102 41300 37649 27648

23045 13839 21828 34471 37106 18918 10188 13705 36129 41259 7786 18046 36034 21563 41192 19129 7596 11827 14630 17912 24946 35598 6007 34143 10741 25761 21172 39048 49308 42006 37459 19271 22802 10093 13624 34704 37269 11162 20100 22721 25230 13515 35939 41545 26888 7949 13191 18265 33711 7406 14916 26128 35436 28693 38953 49213 11447 7138 17398 35274 20915 34609 11067 20005 22640 25135 13434 34514 37079 11000 19843 25001 6076 13110 36116 41246 50240 26698 7759 13029 21774 41165 37528 19340 7625 12038 14659 17885 24919 35179 15488 25748 36008 21201 43042 34419 37222 19762 25368 13597 34229 10687 19681 24811 5886 35926 41084 37433 19245 7544 10151 12786 21612 33754 19150 22667 11876 15393 25653 36361 21344 38940 41603 49480 11714 7111 18323 38404 14862 20048 22613 25178 35494 13407 34039 10973 14728 24988 6105 13139 33659 19055 22586 13968 34488 37053 41522 18921 11619 7030 22050 35166 50186 26784 7845 12975 18161 35981 20964 43015 34630 38147 11116 14633 19735 24893 35713 38080 14538 19668 24798 21147 13873 42009 37644 19288 7517 10194 12759 33279 19627 27137 15380 25920 35900 21317 41142 4071 7602 13208 21670 35632 49700 37985 11822 14443 19573 24703 35523 21290 49538 11688 7085 17401 10099 37454 19994 22559 25264 13493 34461 37320 41495 18908 11606 7955 13113 22023 41361 26757 7888 13018 18372 21889 35442 49443 12041 14620 28744 35252 49376 11498 6895 18107 20910 14084 34604 37225 11174 18813 9719 38026 45088 19614 26676 7793 12923 18277 35929 21808 41171 19346 7575 10168 12733 21699 35605 49729 37972 11851 14430 25866 35062 21263 11661 7128 21196 13894 34414 37931 14977 19519 25237 35497 13760 34280 41314 19251 21618 37540 19184 7413 9978 12543 35415 39170 49430 11580 7033 25704 21101 35281 49349 11471 7834 14896 18318 20939 25380 43032 13665 34633 37212 11203 23560 28802 49322 42496 45061 26705 8004 13134 21781 33766 37283 18871 10141 39008 49268 11390 7739 18223 35987 20858 41145 4088 6653 11122 18156 21673 25190 28707 49675 37918 11937 14516 19786 25056 35484 6117 34253 41287 37650 23046 13868 21591 42116 37569 19157 22912 9951 13706 36130 41736 11609 25677 22040 19130 7359 14869 17899 25409 35389 13652 34172 10742 7091 25762 21159 35227 49295 42021 37488 19300 22817 10094 13611 34691 37270 11177 22722 13544 36416 38981 41546 50193 26651 7950 13220 18266 20831 41356 4061 11095 21660 26115 28694 38954 49214 11924 14545 25029 35065 21392 34610 37175 20006 22627 13897 34529 37108 10987 19872 25002 6063 36103 41261 7788 13030 36036 21565 41166 37515 19103 7626 11829 14688 17886 24948 35656 21297 49433 11667 25735 21202 42064 37461 20225 22804 25355 13598 34230 11164 19682 25288 13517 35941 41071 37434 19246 7531 13249 17791 33769 22696 15394 25654 36362 21107 38927 41632 49243 11505 7140 18352 35276 20917 34583 11069 20035 22614 25193 13436 34516 38033 10974 14491 19845 24975 6106 13168 41304 26700 23049 13955 21832 34475 37054 18922 12096 14661 25873 35181 7846 18162 35982 20727 43044 34421 38176 10879 14634 19764 24894 35714 6011 34259 10745 19655 24813 21176 13874 51216 42010 37407 19275 7518 10209 12788 33756 37273 20104 22669 27138 15367 25683 35887 21318 41605 11716 8065 13195 18325 35619 37986 14920 19574 25180 35552 28697 49329 11451 7086 17402 5631 13141 33661 20009 22588 25251 13494 34462 37083 41524 18895 11621 7984 13114 22052 36120 41362 50188 26758 7875 13033 18135 21890 43073 49920 38149 12042 14607 19793 24923 35239 14540 25752 21149 13847

34367 37226 18814 10196 13713 34233 41267 19629 26663 7794 18278 35930 21795 41200 19361 7604 10155 12734 21728 35606 49730 37959 11880 14445 25657 35525 21292 39056 49540 11662 7115 17375 10101 38408 14978 19996 22617 25238 35498 13523 34043 41553 26896 7957 13087 22081 33719 19171 7414 13020 35444 38961 49445 11567 7034 21102 35282 49350 11500 7849 14883 18109 20968 25143 43019 13666 34634 37199 11232 19739 25009 38028 45062 19672 26706 7767 12925 21782 41173 37760 19348 7633 10142 12763 21701 35187 49255 11853 15384 25868 36016 21321 41146 4075 6654 21674 29184 49704 37933 11938 14503 19577 24819 35471 6118 34254 41316 37665 19253 10047 21620 37570 19158 22675 9980 13497 36369 39172 41499 49488 11610 7007 25678 22027 26761 7836 14870 18376 20941 25410 35390 13639 34159 11205 14736 28804 35256 49324 42022 37475 19063 22818 14088 34720 37285 11178 18929 9723 38982 50194 26680 7741 12983 18281 35989 20860 41119 4062 7579 11124 14641 21647 26144 28709 35609 49677 37976 11911 14546 19788 25030 35066 21379 42241 37652 23104 13898 34530 37095 19635 25241 13708 36132 41262 3967 21566 37544 19132 7417 11830 14451 17901 24935 35419 21298 49434 11696 7093 25764 21217 35229 49353 42051 37462 20226 22791 25384 13613 34693 37328 11151 22724 13518 35942 41548 45065 26653 8008 13250 18268 21785 33770 18875 12049 26117 28752 38956 49272 11506 6903 18339 35039 20918 34612 37233 11070 20064 22629 25194 13423 34503 38034 10989 14520 19846 25004 6121 13155 36161 41291 23050 13984 21595 42120 37517 19161 7628 11859 14662 25874 35182 21271 11669 25793 21204 34422 37939 14873 19751 25357 35505 13656 34288 10746 19684 24814 21163 51203 42025 37436 19304 7533 10210 12775 33743 37274 22670 15396 25712 36364 21109 38985 41606 49245 11479 8066 13224 18326 20947 43264 34641 11099 20037 23568 25167 28698 49330 11928 14493 25033 6108 13142 33662 37179 20010 22575 13957 34477 37112 41511 18924 11622 7971 18231 36107 41377 7904 13034 18164 36040 21681 43074 49683 38150 11833 14636 19794 24952 35716 6013 34261 10719 25739 21150 13876 42012 37465 19277 22808 10183 13714 34234 41744 19630 27140 15425 25685 35945 22272 41187 19362 7591 13197 17907 35621 37988 14446 25658 35526 21055 39043 49303 11453 7144 17404 20921 10102 13619 34587 11185 19983 22618 25253 13552 34520 37085 41554 19849 26883 7958 13116 22082 41364 26816 7877 13007 21892 35431 38962 49446 12044 14665 24925 35297 7850 18110 20731 43048 13905 34425 37228 10995 19768 25010 6071 34207 41269 19659 26721 7796 12926 35932 21797 41174 37523 19335 7634 10157 12792 21702 35664 49732 53249 11854 15371 25631 36003 21322 41609 11720 7117 18329 25363 37934 14980 19578 25296 35500 13525 34045 41079 37666 19254 7539 13145 21607 33777 19173 22704 9967 13498 36370 38935 41528 49475 11625 7036 22056 35284 50304 26762 7823 14885 18139 20942 25201 43021 13668 34636 38153 11206 14723 19741 24983 35243 45120 26708 23057 13851 21840 34483 37286 18930 10200 12765 35189 50209 26667 7742 18282 35990 20847 41148 4077 7608 11111 14642 21676 28710 35610 49678 37963 11940 14561 19551 24821 35529 21408 49544 42242 37639 19283 10105 37572 20112 22677 25242 13471 35895 41501 11612 7961 13203 22029 33723 19119 7418 14928 17902 25412 35448 28929 49449 11683 7094 21218 35230 49354 42080 37477 20017 22820 25147 13614 34694 37315 11180 18903 9725 39936 45066 50196 26654 7771 13041 18255 21786 41177 19352 7581 12050 14615 21705 26118 28739 35135 49259 11969

14548 25984 35068 21381 34599 37234 22630 13900 34532 38049 10990 14507 19637 24767 6122 36162 41320 19257 10163 21624 37518 19162 7391 11888 14453 25889 35421 21300 39176 49436 11670 7123 25794 21191 42053 38416 14874 20228 22849 25358 35506 13643 34275 11209 28808 51232 42026 37423 19067 7534 13252 33772 37289 18877 11575 25699 21110 38986 49246 11508 7857 12987 18341 35993 20976 43027 34642 37207 11128 20038 23555 25196 28713 49793 38036 11915 14494 19904 25034 6095 13157 41293 37656 23052 13958 21597 34478 37099 18687 11861 15616 25876 36136 21329 41378 4083 18151 21682 49712 37941 11834 14399 19809 24939 35479 6014 34262 10748 7097 25768 21165 13863 51205 41999 37466 19278 22795 10212 13729 34697 37276 41731 22728 15426 25686 35946 22035 41664 26769 8068 13198 18384 20949 35622 34167 11101 26121 28700 39072 49332 11454 6907 17391 20922 14096 34616 37181 11186 20012 22633 25254 13539 34507 37086 41569 19850 26912 7973 13103 18289 36109 41351 7878 13036 21655 43076 39425 49685 38208 11807 14666 19796 24926 35298 21275 11673 25741 21208 13906 34426 36991 19755 25473 13716 34236 41270 19688 26722 7783 35919 21798 41189 37552 19364 7649 10158 12779 17909 35651 53250 15400 25660 36480 21113 39045 41610 49361 11483 7118 18330 20895 25392 13621 34589 11159 20041 22620 25283 13526 34046 41556 45073 26885 8016 13146 22084 33778 19174 22691 13961 36385 38964 41515 49504 11626 7023 18235 35271 7852 14886 18168 20733 25202 43022 13431 34399 38154 10997 14752 19742 25012 35720 6129 34265 41299 19661 26695 23058 13880 21827 42128 37525 19393 7636 10187 12766 35190 50210 27144 15373 25689 36005 21324 41135 4078 7595 15105 17855 25365 35625 37992 14562 19580 24822 35530 21171 49307 42033 37668 19312 7541 10106 12671 33751 20099 22678 25257 13500 36372 38993 41502 49477 11599 7962 13232 22030 41368 26764 7881 14915 18141 21896 25175 35435 28930 49450 12160 14725 25041 35245 37478 20018 22583 13853 34485 37344 10943 18932 9726 6075 36115 41273 50183 26669 7800 13042 18284 36048 21801 41178 19339 7582 12065 14644 21706 28768 35612 49736 37965 11970 14535 25747 35055 21382 42244 37697 19285 10079 38050 14984 19638 25244 13529 35953 41083 19258 7487 13205 21611 33725 19177 7420 11875 14454 25890 35422 21287 38939 49423 11685 7152 21220 35288 49356 42054 38403 14889 19991 22850 25149 43137 13672 34752 37317 11210 19857 24987 45068 26712 7773 13015 21788 33535 37290 18878 12052 14673 26176 28741 35193 49261 11495 7858 18342 35994 20963 43056 34657 37236 11115 23584 28714 49794 38023 11944 14509 19667 24825 6124 13158 36164 41294 37643 19231 10165 21598 37576 19164 22681 11862 15379 25863 35899 21330 41617 11728 7125 25796 22145 49699 37942 14876 19810 25416 35508 13645 34277 10735 7098 21166 51206 42028 37481 19069 22824 9975 13730 34698 37263 41760 18907 11633 25701 22064 38988 50200 26770 7831 12989 18371 20950 43029 34644 38161 11102 14619 23557 26122 28687 35251 49319 11917 14552 25036 21385 14083 34603 37182 22634 14016 34536 37101 41570 19641 26675 7974 18290 36110 20855 41380 4085 9215 21684 39426 49686 37971 11836 14457 19783 24941 35537 21304 49552 11674 7071 25742 21195 13921 42057 37468 20232 22797 25474 13703 34223 41733 15428 35948 22037 41190 37539 19127 7650 13256 17910 35680 49457 11579 25647 21114 39046 49362 11512 6909 18345 20924 25379 13622 34590 37211 11188 20042 22607 25312 13541 34509 38040 41543 45074 19852 26886 8003 13161 18263 41409 23168

13962 21713 36386 38951 49267 11865 14668 25880 35300 21277 4031 18155 20734 13908 34428 37945 10998 14515 19757 24999 35483 6130 34266 41328 19662 26724 23073 13867 51209 21856 42115 37526 19394 7623 10216 12781 35653 39184 53252 15374 25690 36006 21087 41612 11485 8072 15106 18332 20953 25366 35626 13651 34171 11217 19567 25285 28816 49336 42034 37431 19299 7542 13148 33780 37297 20128 22693 25258 13487 36359 38994 41517 49478 11628 7977 13219 18237 36225 41355 7882 14944 18142 21659 25204 43080 28721 49689 38156 11923 14726 19800 25042 35246 6103 41301 27649 23060 13854 21829 34486 37107 18919 10189 13720 36144 41274 50212 26670 7787 18047 36035 21802 41193 19368 7597 12066 14631 17913 24947 35599 37966 14564 25776 35532 21173 39049 49309 42007 37698 19286 22803 10108 13625 34705 11163 20101 22736 25231 13530 35954 41560 26889 7964 13206 22088 33726 19178 7407 14917 26129 35437 28932 38968 49452 11686 7139 17399 35275 38432 14890 20020 22641 25150 43138 13435 34515 37318 11001 19858 25016 6077 13111 36117 41247 50241 26699 7774 13044 21775 41180 37529 19341 7640 12039 14674 21708 28742 35194 49262 11972 15489 25749 36009 21440 43043 34658 37223 19763 25369 38052 14510 19696 24826 5887 35927 41085 37672 19260 7545 10166 12787 21613 33755 19151 22682 11877 15408 25892 36376 21345 38941 41618 49481 11715 7126 22146 57344 38405 14863 20049 22852 25179 35495 13646 34278 11212 14729 24989 37482 19070 22587 13969 34489 37292 41523 18936 11634 7031 25702 22051 35167 50187 26785 7860 12990 18400 35996 20965 43030 34631 38162 11117 14648 23558 28716 35728 49796 38081 11918 14539 19669 24799 21386 14112 42248 37645 19289 10195 37102 19642 27152 15381 25921 35901 21332 41143 4086 7603 13209 21671 35633 49701 38000 11823 14458 19812 24942 35538 21291 49539 11689 7100 21224 13922 51264 42058 37455 19995 22798 25265 13732 34700 37321 41734 18909 11607 22038 45184 26772 7889 13019 18373 21904 35443 49458 12056 14621 26124 28745 35253 49377 11499 6910 18346 20911 14085 34605 37240 11175 22636 13542 34510 38027 41572 45089 19615 26677 8032 13162 18292 36168 21809 41410 19347 10169 21714 39428 49744 37973 11866 14431 25867 35063 21278 11676 7129 25800 21197 13895 34415 37946 14992 19758 25476 35512 13761 34281 41315 23074 51210 21619 42144 37541 19185 7652 9979 12782 35654 39171 49431 11581 25705 21116 39104 49364 11486 7835 14897 18319 20954 25381 43033 13680 34648 37213 11218 20044 23561 25286 28803 49323 42497 45076 26944 8005 13135 33767 37298 22694 13964 36388 39009 41518 49269 11391 7978 18238 36226 20859 41384 4089 11123 18157 21688 25191 28722 49690 37919 11952 14517 19787 25057 35485 6132 34268 41302 37651 27650 23047 13869 21830 42117 37584 19396 22913 10190 13707 36131 41737 15432 25692 36064 22041 41194 19131 7598 15108 17914 25424 35628 13653 34173 10743 25763 21174 39050 49310 42036 37489 19301 22832 10095 13626 34706 37271 11192 20102 22723 25260 13545 36417 38996 41547 50432 26890 7951 13221 18267 41357 7884 14918 21661 26130 35438 28695 38955 49215 11925 14784 25044 35304 21393 34611 20007 22642 13912 34544 37109 11002 19873 25003 6078 36118 41276 50242 26728 7789 13031 36037 21804 41167 37530 19342 7627 12068 14689 17887 24949 35657 53256 15490 25750 36010 21203 43520 42065 37700 20240 22805 25370 13599 34231 11165 19683 25289 13532 35956 41086 37435 19247 7546 13264 21614 33784 19180 22697 11878 15395 25655 36363 21346 38942 41633 49482 11744 7141 18353 35277 38406 14892 20050 22615 25208 43140 13437 34517 38272 10975 14730 19860 24990 6107 13169 41305 26701 23064 13970 21833 34490 37055 18923 12097 14676 29696 35196 50216 26786 7847 18163 35983 20966 43045 34660 38177 11118 14635 19765 24895 35715 38082 14568 19670 24828 21177 13875 51217 42011 37646 19290 7519 10224 12789 33757 20105 22684 27139 15382 25922 35902 21319 41620 11717 8080 13210 22148 35634 49702 37987 14921 19575 25181 35553 28936 49568 11690 7087 17403 37484 20024 22589 25266 13495 34463 37322 41525 18910 11636 7985 13115 22053 36121 41363 50189 26759 7890 13048 18374 21891 43088 49921 38164 12043 14622 23616 28746 35254 49378 11976 14541 25753 21388 14086 34606 37227 18815 10197 38056 45090 19644 26678 7795 18279 35931 21810 41201 19376 7605 10170 12735 21729 35607 49731 37974 11881 14460 25896 35540 21293 39057 49541 11663 7130 21198 13924 42060 38409 14979 19997 22856 25239 35499 13762 34282 41792 26897 22096 37542 19186 7415 13021 35445 39200 49460 11582 7035 25706 21103 35283 49351 11501 7864 14898 18348 20969 25382 43034 13667 34635 37214 11233 23562 28832 49800 38029 42498 45063 19673 26707 8006 13164 21783 41412 37761 19349 10143 21716 39010 49270 11868 15385 25869 36017 21336 41147 4090 6655 18158 21675 29185 49705 37948 11939 14518 19816 25058 35486 6119 34255 41317 37680 23076 13870 51212 21621 42118 37571 19159 22914 9981 13736 36608 39173 41738 49489 11611 25679 22042 26776 7837 14871 18377 20956 25411 35391 13654 34174 11220 14737 26240 28805 35257 49325 42023 37490 19302 22819 14089 34721 37300 11179 22752 13546 36418 38983 41576 50195 26681 7980 13222 18296 36228 20861 41358 4063 11125 21662 26145 28724 39432 49692 37977 11926 14547 19789 25031 35067 21394 42256 37653 27652 23105 13899 34531 37110 19874 25480 13709 36133 41263 7790 36038 21567 41196 37545 19133 7656 11831 14690 17916 24950 35658 21299 49435 11697 25765 21232 39052 49368 42066 37463 20227 22806 25385 13628 34708 37329 11166 20160 22725 25290 13519 35943 41549 45080 26892 8009 13251 18269 33771 22698 15872 26132 36392 28753 38957 41634 49273 11507 7142 18354 35278 20919 34613 11071 20065 22644 25195 13438 34518 38035 11004 14521 19847 25005 6136 13170 36176 41306 50244 26702 23051 13985 21834 42121 37532 19400 7629 12098 14663 25875 35183 15492 25808 36012 21205 43046 34423 38178 15112 19766 25372 35744 13657 34289 10747 19685 24815 21178 51218 42040 37437 19305 7548 10211 12790 33758 37275 20106 22671 27168 15397 25713 36365 21348 39000 41607 49484 11718 8067 13225 18327 43265 38464 14922 20052 23569 25182 35554 28699 49331 11929 14732 25048 6109 13143 33663 20011 22590 13972 34492 37113 41526 18925 11623 7986 22054 36122 41392 50190 26788 7905 13035 18165 36041 21920 43075 49922 38151 12072 14637 19795 24953 35717 38084 14542 25754 21151 13877 42013 37704 19292 22809 10198 13715 34235 41745 19631 27141 15440 25924 35960 22273 41202 19363 7606 13212 21730 35636 49760 37989 11882 14447 25659 35527 21294 39058 49542 11692 7145 17405 10103 38410 15008 19998 22619 25268 43144 13553 34521 37324 41555 19864 26898 7959 13117 22083 41365 26817 7892 13022 21893 35446 38963 49447 12045 14680 28748 35312 49380 11502 7851 18111 20970 43049 14144 34664 37229 11234 19769 25011 38030 45092 19674 26736 7797 12927 35933 21812 41175 37762 19350 7635 10172 12793 21703 35665 49733 53264 11855 15386 25870 36018 21323 41624 11721 7132 22152 29186 49706 37935 14981

19579 25297 35501 13764 34284 41318 37667 19255 21622 37600 19188 22705 9982 13499 36371 39174 41529 49490 11640 7037 25708 22057 35285 50305 26763 7838 14900 18378 20943 25440 43036 13669 34637 38168 11207 14738 23564 28806 35258 49326 42500 45121 26709 23296 14090 21841 34722 37287 18931 10201 39012 50224 26682 7743 18283 35991 20862 41149 4092 7609 11126 14643 21677 26146 28711 35611 49679 37978 11941 14576 19790 25060 35544 21409 49545 42243 37654 23106 13928 42176 37573 20113 22916 25243 13710 36134 41740 11613 22044 37546 19134 7419 14929 17903 25413 35449 28944 49464 11698 7095 25766 21219 35231 49355 42081 37492 20256 22821 25386 13615 34695 37330 11181 22726 13548 36420 39937 41550 45067 50197 26655 8010 13280 18270 21787 41416 19353 12051 21720 26119 28754 38958 49274 11984 14549 25985 35069 21396 34614 37235 20066 22631 13901 34533 38064 10991 14522 19876 25006 6123 36163 41321 23080 13986 51328 21625 42122 37519 19163 7630 11889 14692 25904 35660 21301 39177 49437 11671 25795 21206 42068 38417 14875 20229 22864 25359 35507 13658 34290 11224 19686 25292 28809 51233 42027 37438 19306 7535 13253 33773 37304 22700 15398 25714 36366 21111 38987 41636 49247 11509 8096 13226 18356 36232 20977 43266 34643 11129 20039 23570 25197 28728 49808 38037 11930 14495 19905 25035 6110 13172 41308 37657 27656 23053 13959 21836 34479 37114 18926 12100 15617 25877 36137 41379 7906 18166 36042 21683 43104 49713 38180 11835 14638 19824 24954 35718 6015 34263 10749 25769 21180 13878 51220 42014 37467 19279 22810 10213 13744 34712 37277 41746 20108 22729 27142 15427 25687 35947 22274 41665 27008 8069 13199 18385 35623 37990 14924 26136 35556 28701 39073 49333 11455 7146 17406 20923 14097 34617 11187 20013 22648 25255 13554 34522 37087 41584 19851 26913 7988 13118 22112 36124 41366 50248 26818 7879 13037 21894 43077 39440 49924 38209 12046 14667 19797 24927 35299 15496 25756 21209 43050 13907 34427 37230 19770 25488 13717 34237 41271 19689 26723 7798 35934 21799 41204 37553 19365 7664 10159 12794 21732 35666 49734 53251 11884 15401 25661 36481 21352 39060 41611 49600 11722 7119 18331 25393 38412 14982 20056 22621 25298 35502 13527 34047 41557 45312 26900 8017 13147 22085 33779 19175 22706 13976 36400 38965 41530 49505 11627 7038 22058 35286 50306 26792 7853 14887 18169 20972 25203 43023 13670 34638 38155 11236 14753 19743 25013 35721 38088 45122 19676 26710 23059 13881 21842 42129 37764 19408 7637 10202 12767 35191 50211 27145 15388 25928 36020 21325 41150 4079 7610 15120 21678 29188 35640 49708 37993 11942 14563 19581 24823 35531 21410 49546 42272 37669 19313 10107 37574 20114 22679 25272 13501 36373 39232 41503 49492 11614 7963 13233 22031 41369 26765 7896 14930 18380 21897 25414 35450 28931 49451 12161 14740 28864 35260 49384 42082 37479 20019 22822 14092 34724 37345 11182 18933 9727 39938 45096 50198 26684 7801 13043 18285 36049 21816 41179 19354 7583 12080 14645 21707 26148 28769 35613 49737 37980 11971 14550 25986 35070 21383 42245 37712 23108 13902 34534 38051 14985 19639 25245 13768 36192 41322 19259 21626 37548 19192 7421 11890 14455 25891 35423 21302 39178 49438 11700 7153 25824 21221 35289 49357 42055 38418 14904 20230 22851 25388 43152 13673 34753 37332 11211 23680 28810 51234 42504 45069 26713 8012 13254 21789 33774 37291 18879 12053 26177 28756 39016 49276 11510 7859 18343 35995 20978 43057 34672 37237 11130 20068 23585

25198 28715 49795 38038 11945 14524 19906 25064 6125 13159 36165 41295 37658 23054 13988 21599 42124 37577 19165 22920 11863 15618 25878 36138 21331 41856 11729 25797 22160 49714 37943 14877 19811 25417 35509 13660 34292 10750 7099 25770 21167 51207 42029 37496 19308 22825 10214 13731 34699 37278 41761 22730 15456 25716 36424 22065 38989 41666 50201 26771 8070 13228 18386 20951 43268 34645 11103 23572 26123 28702 39074 49334 11932 14553 25037 21400 14098 34618 37183 20014 22635 14017 34537 37116 41571 19880 26914 7975 18291 36111 41381 7908 13038 36044 21685 43078 39427 49687 38210 11837 14696 19798 24956 35776 21305 49553 11675 25743 21210 13936 42072 37469 20233 22812 25475 13718 34238 41748 19690 27200 15429 35949 22276 41191 37554 19366 7651 13257 17911 35681 53280 15402 25662 36482 21115 39047 41640 49363 11513 7148 18360 20925 25394 13623 34591 11189 20043 22622 25313 13556 34524 38041 41558 45075 19853 26887 8018 13176 22086 41424 26820 23169 13963 21952 36387 38966 49506 12104 14669 25881 35301 7854 18170 20735 43052 13909 34429 38184 10999 14754 19772 25014 35722 6131 34267 41329 19663 26725 23088 13882 51224 21857 42130 37527 19395 7638 10217 12796 35668 39185 50688 53253 27146 15375 25691 36007 21326 41613 11724 8073 15107 18333 25367 35627 37994 15040 19582 25300 35560 28817 49337 42035 37670 19314 7543 13149 33781 20129 22708 25259 13502 36374 38995 41532 49479 11629 7992 13234 22060 36240 41370 50308 26766 7883 14945 18143 21898 25205 43081 28960 49928 38157 12162 14727 19801 25043 35247 45124 27664 23061 13855 21844 34487 37346 18934 10204 13721 36145 41275 50213 26671 7802 18286 36050 21803 41208 19369 7612 12067 14646 21736 28770 35614 49738 37967 12000 14565 25777 35533 21412 39064 49548 42246 37699 19287 10109 38528 14986 20116 22737 25246 13531 35955 41561 26904 7965 13207 22089 33727 19179 7422 14932 26368 35452 28933 38969 49453 11687 7154 21222 35290 49358 42084 38433 14891 20021 22880 25151 43139 13674 34754 37319 11240 19859 25017 39940 45070 50256 26714 7775 13045 21790 41181 37768 19356 7641 12054 14675 21709 26178 28743 35195 49263 11973 15504 25988 36024 21441 43058 34659 37238 23586 29192 49824 38053 11946 14511 19697 24827 6126 36166 41324 37673 19261 10167 21628 37578 19166 22683 11892 15409 25893 36377 21360 39180 41619 49496 11730 7127 25798 22147 57345 38420 14878 20288 22853 25418 35510 13647 34279 11213 14744 28812 51236 42030 37483 19071 22826 14208 34728 37293 41762 18937 11635 25703 22066 38990 50202 26800 7861 12991 18401 35997 20980 43031 34646 38163 11132 14649 23559 26152 28717 35729 49797 38096 11919 14554 19908 25038 21387 14113 42249 37660 23112 14018 34538 37103 19643 27153 15620 25936 36140 21333 41382 4087 21686 39456 49716 38001 11838 14459 19813 24943 35539 21306 49554 11704 7101 25772 21225 13923 51265 42059 37470 20234 22799 25504 13733 34701 37336 41735 22732 15430 35950 22039 41668 45185 26773 8128 13258 18388 21905 35682 49459 12057 26125 28760 39076 49392 11514 6911 18347 20926 14100 34620 37241 11190 20072 22637 25314 13543 34511 38042 41573 45104 19854 26916 8033 13163 18293 36169 41411 23170 13992 21715 44032 39429 49745 38212 11867 14670 25882 35302 21279 11677 25801 21212 13910 34430 37947 14993 19759 25477 35513 13776 34296 41330 19692 26726 23075 51211 21858 42145 37556 19424 7653 10218 12783 35655 39186 53254 15404 25720 36484

21117 39105 41614 49365 11487 8074 15136 18334 20955 25396 43272 13681 34649 11219 20045 23576 25287 28818 49338 42512 45077 26945 8020 13150 33782 37299 20130 22695 13965 36389 39024 41519 49508 11630 7979 18239 36227 41385 7912 14946 18172 21689 25206 43082 28723 49691 38158 11953 14756 19802 25072 35724 6133 34269 41303 27651 23062 13884 21831 42132 37585 19397 22928 10191 13722 36146 41752 50214 27148 15433 25693 36065 22280 41195 19370 7599 15109 17915 25425 35629 37996 14566 25778 35534 21175 39051 49311 42037 37728 19316 22833 10110 13627 34707 11193 20103 22738 25261 13560 36432 38997 41562 50433 26891 7966 13236 22090 41372 26824 7885 14919 21900 26131 35439 28934 38970 49454 12164 14785 25045 35305 38434 20022 22643 43168 13913 34545 37348 11003 19888 25018 6079 36119 41277 50243 26729 7804 13046 36052 21805 41182 37531 19343 7642 12069 14704 21710 28772 35672 49740 53257 11974 15491 25751 36011 21442 43521 42304 37701 20241 25371 38054 14988 19698 25304 13533 35957 41087 37674 19262 7547 13265 21615 33785 19181 22712 11879 15410 25894 36378 21347 38943 41648 49483 11745 7156 22176 35292 50312 57346 38407 14893 20051 22854 25209 43141 13676 34756 38273 11214 14731 19861 24991 45128 26716 23065 13971 21848 34491 37294 18938 12112 14677 26180 29697 35197 50217 26787 7862 18402 35998 20967 43060 34661 38192 11119 14650 23588 28718 35730 49798 38083 11948 14569 19671 24829 21416 14114 51456 42250 37647 19291 10225 37580 20120 22685 27154 15383 25923 35903 21334 41621 11732 8081 13211 22149 35635 49703 38002 14936 19814 25420 35568 28937 49569 11691 7102 21226 51266 42088 37485 20025 22828 25267 13734 34702 37323 41764 18911 11637 22068 39944 45186 50204 26774 7891 13049 18375 21906 43089 49936 38165 12058 14623 23617 26126 28747 35255 49379 11977 14556 25992 21389 14087 34607 37242 22638 14020 34540 38057 41574 45091 19645 26679 8034 18294 36170 21811 41440 19377 10171 21744 39430 49746 37975 11896 14461 25897 35541 21308 39296 49556 11678 7131 25802 21199 13925 42061 38424 14994 20236 22857 25478 35514 13763 34283 41793 30720 51240 22097 42146 37543 19187 7654 13260 35684 39201 49461 11583 25707 21118 39106 49366 11516 7865 14899 18349 20984 25383 43035 13682 34650 37215 11248 20046 23563 25316 28833 49801 38044 42499 45078 19912 26946 8007 13165 41413 37776 23172 13966 21717 36390 39011 49271 11869 15624 25884 36256 21337 41386 4091 18159 21690 29200 49720 37949 11954 14519 19817 25059 35487 6134 34270 41332 37681 27680 23077 13871 51213 21860 42119 37586 19398 22915 10220 13737 36609 39188 41739 53312 15434 25694 36066 22043 41672 26777 8076 15110 18392 20957 25426 35630 13655 34175 11221 26241 28820 39080 49340 42038 37491 19303 22834 14104 34736 37301 11194 20132 22753 25262 13547 36419 38998 41577 50434 26920 7981 13223 18297 36229 41359 7886 14948 21663 26160 43084 28725 39433 49693 38216 11927 14786 19804 25046 35306 21395 42257 27653 23120 13914 34546 37111 19875 25481 13724 36148 41278 50272 26730 7791 36039 21806 41197 37560 19372 7657 12070 14691 17917 24951 35659 53258 15520 25780 36488 21233 39053 43522 49369 42067 37702 20242 22807 25400 13629 34709 11167 20161 22740 25291 13534 35958 41564 45081 26893 8024 13266 22092 33786 19182 22699 15873 26133 36393 28992 38972 41635 49512 11746 7143 18355 35279 38436 14894 20080 22645 25210 43142 13439 34519 38274 11005 14760 19862 25020 6137

13171 36177 41307 50245 26703 23066 14000 21835 42136 37533 19401 7644 12099 14678 29698 35198 50218 27264 15493 25809 36013 21444 43047 34662 38179 15113 19767 25373 35745 38112 14570 19700 24830 21179 51219 42041 37676 19320 7549 10226 12791 33759 20107 22686 27169 15412 25952 36380 21349 39001 41622 49485 11719 8082 13240 22150 43280 57348 38465 14923 20053 23808 25183 35555 28938 49570 12168 14733 25049 37486 20026 22591 13973 34493 37352 41527 18940 11638 7987 22055 36123 41393 50191 26789 7920 13050 18404 36056 21921 43090 49923 38166 12073 14652 23618 28776 35732 49856 38085 11978 14543 25755 21390 14116 42252 37705 19293 10199 38058 45568 19646 27156 15441 25925 35961 22288 41203 19378 7607 13213 21731 35637 49761 38004 11883 14462 25898 35542 21295 39059 49543 11693 7160 21228 13926 51268 42062 38411 15009 19999 22858 25269 43145 13792 34760 37325 41794 19865 26899 22098 45188 26832 7893 13023 21908 35447 39202 49462 12060 14681 26184 28749 35313 49381 11503 7866 18350 20971 43064 14145 34665 37244 11235 23592 28834 49802 38031 42528 45093 19675 26737 8036 13166 36172 21813 41414 37763 19351 10173 21718 39488 49748 53265 11870 15387 25871 36019 21338 41625 11736 7133 25804 22153 29187 49707 37950 14996 19818 25536 35516 13765 34285 41319 37682 23078 51214 21623 42148 37601 19189 22944 9983 13738 36610 39175 41768 49491 11641 25709 22072 39108 50320 26778 7839 14901 18379 20958 25441 43037 13684 34652 38169 11222 14739 23565 26242 28807 35259 49327 42501 45136 26948 23297 14091 34723 37302 22754 14024 36448 39013 41578 50225 26683 7982 18298 36230 20863 41388 4093 11127 21692 26147 28726 39434 49694 37979 11956 14577 19791 25061 35545 21424 49560 42258 37655 27654 23107 13929 42177 37588 20352 22917 25482 13711 36135 41741 15436 36068 22045 41198 37547 19135 7658 15168 17918 25428 35688 28945 49465 11699 25767 21234 39054 49370 42096 37493 20257 22836 25387 13630 34710 37331 11196 20162 22727 25320 13549 36421 39952 41551 45082 50436 26894 8011 13281 18271 41417 23176 15874 21721 26134 36394 28755 38959 49275 11985 14788 26000 35308 21397 34615 20067 22646 13916 34548 38065 11006 14523 19877 25007 6138 36178 41336 50246 26732 23081 13987 51329 21864 42123 37534 19402 7631 12128 14693 25905 35661 39192 53260 15494 25810 36014 21207 43524 42069 38656 15114 20244 22865 25374 35746 13659 34291 11225 19687 25293 28824 51248 42042 37439 19307 7550 13268 33788 37305 20136 22701 27170 15399 25715 36367 21350 39002 41637 49486 11748 8097 13227 18357 36233 43267 38466 14952 20054 23571 25212 43200 28729 49809 38276 11931 14734 19920 25050 6111 13173 41309 27657 23068 13974 21837 34494 37115 18927 12101 15632 29700 36152 41394 50220 26790 7907 18167 36043 21922 43105 49952 38181 12074 14639 19825 24955 35719 38086 14572 25784 21181 13879 51221 42015 37706 19294 22811 10228 13745 34713 41747 20109 22744 27143 15442 25926 35962 22275 41680 27009 8084 13214 22208 35638 49762 37991 14925 26137 35557 28940 39088 49572 11694 7147 17407 38440 15010 20028 22649 25270 43146 13555 34523 37326 41585 19866 26928 7989 13119 22113 36125 41367 50249 26819 7894 13052 21895 43092 39441 49925 38224 12047 14682 23620 28750 35314 49382 11980 15497 25757 21448 43051 14146 34666 37231 19771 25489 38060 45094 19704 26738 7799 35935 21814 41205 37792 19380 7665 10174 12795 21733 35667 49735 53266 11885 15416

25900 36496 21353 39061 41626 49601 11723 7134 22154 29216 57352 38413 14983 20057 22860 25299 35503 13766 34286 41796 45313 26901 22100 37602 19190 22707 13977 36401 39204 41531 49520 11642 7039 25710 22059 35287 50307 26793 7868 14902 18408 20973 25442 43038 13671 34639 38170 11237 14768 23566 28836 35736 49804 38089 42502 45123 19677 26711 23298 14120 21843 42368 37765 19409 10203 39014 50226 27160 15389 25929 36021 21340 41151 4094 7611 15121 21679 29189 35641 49709 38008 11943 14578 19820 25062 35546 21411 49547 42273 37684 23136 13930 51272 42178 37575 20115 22918 25273 13740 36612 39233 41742 49493 11615 22046 45192 26780 7897 14931 18381 21912 25415 35451 28946 49466 12176 14741 26244 28865 35261 49385 42083 37494 20258 22823 14093 34725 37360 11183 22756 13550 36422 39939 41580 45097 50199 26685 8040 13282 18300 36288 21817 41418 19355 12081 21722 26149 28784 39436 49752 37981 11986 14551 25987 35071 21398 42260 37713 27712 23109 13903 34535 38066 15000 19878 25484 13769 36193 41323 23082 51330 21627 42152 37549 19193 7660 11891 14694 25906 35662 21303 39179 49439 11701 25825 21236 39112 49372 42070 38419 14905 20231 22866 25389 43153 13688 34768 37333 11226 20164 23681 25294 28811 51235 42505 45084 26952 8013 13255 33775 37306 22702 15876 26192 36396 28757 39017 41638 49277 11511 8098 18358 36234 20979 43296 34673 11131 20069 23600 25199 28730 49810 38039 11960 14525 19907 25065 6140 13174 36180 41310 37659 27658 23055 13989 21838 42125 37592 19404 22921 12102 15619 25879 36139 41857 15552 25812 36072 22161 43106 49715 38182 15116 19826 25432 35748 13661 34293 10751 25771 21182 51222 42044 37497 19309 22840 10215 13746 34714 37279 41776 20110 22731 27172 15457 25717 36425 22304 39004 41667 50440 27010 8071 13229 18387 43269 38468 14926 23573 26138 35558 28703 39075 49335 11933 14792 25052 21401 14099 34619 20015 22650 14032 34552 37117 41586 19881 26915 7990 22114 36126 41396 50250 26848 7909 13039 36045 21924 43079 39442 49926 38211 12076 14697 19799 24957 35777 53376 15498 25758 21211 43528 13937 42073 37708 20248 22813 25490 13719 34239 41749 19691 27201 15444 35964 22277 41206 37555 19367 7666 13272 21734 35696 49764 53281 11886 15403 25663 36483 21354 39062 41641 49602 11752 7149 18361 25395 38414 15012 20058 22623 25328 43148 13557 34525 38280 41559 45314 19868 26902 8019 13177 22087 41425 26821 23184 13978 21953 36402 38967 49507 12105 14684 29704 35316 50336 26794 7855 18171 20974 43053 14148 34668 38185 11238 14755 19773 25015 35723 38090 45152 19678 26740 23089 13883 51225 21872 42131 37766 19410 7639 10232 12797 35669 50689 53268 27147 15390 25930 36022 21327 41628 11725 8088 15122 22156 29190 35642 49710 37995 15041 19583 25301 35561 29056 49576 42274 37671 19315 37604 20144 22709 25274 13503 36375 39234 41533 49494 11644 7993 13235 22061 36241 41371 50309 26767 7898 14960 18382 21899 25444 43096 28961 49929 38172 12163 14742 23624 28866 35262 49386 42560 45125 27665 23300 14094 21845 34726 37347 18935 10205 39968 45098 50228 26686 7803 18287 36051 21818 41209 19384 7613 12082 14647 21737 26150 28771 35615 49739 37982 12001 14580 26016 35548 21413 39065 49549 42247 37714 23110 13932 42180 38529 14987 20117 22976 25247 13770 36194 41800 26905 22104 37550 19194 7423 14933 26369 35453 28948 39208 49468 11702 7155 25826 21223 35291 49359 42085 38448 14906 20260

22881 25390 43154 13675 34755 37334 11241 23682 28840 51712 39941 42506 45071 50257 26715 8014 13284 21791 41420 37769 19357 12055 21724 26179 28758 39018 49278 11988 15505 25989 36025 21456 43059 34674 37239 20070 23587 29193 49825 38068 11947 14526 19936 25066 6127 36167 41325 37688 23084 13990 51332 21629 42126 37579 19167 22922 11893 15648 25908 36616 21361 39181 41858 49497 11731 25799 22162 57360 38421 14879 20289 22868 25419 35511 13662 34294 11228 14745 26248 28813 51237 42031 37498 19310 22827 14209 34729 37308 41763 22760 15458 25718 36426 22067 38991 41696 50203 26801 8100 13230 18416 36236 20981 43270 34647 11133 23574 26153 28732 39552 49812 38097 11934 14555 19909 25039 21402 14128 42264 37661 27660 23113 14019 34539 37118 19882 27392 15621 25937 36141 41383 7910 36046 21687 43108 39457 49717 38240 11839 14698 19828 24958 35778 21307 49555 11705 25773 21240 13938 51280 42074 37471 20235 22814 25505 13748 34716 37337 41750 20168 22733 27202 15431 35951 22278 41669 45200 27012 8129 13259 18389 35683 53282 15880 26140 36512 28761 39077 41642 49393 11515 7150 18362 20927 14101 34621 11191 20073 22652 25315 13558 34526 38043 41588 45105 19855 26917 8048 13178 22116 36184 41426 50252 26822 23171 13993 21954 44033 39444 49984 38213 12106 14671 25883 35303 15500 25816 21213 43054 13911 34431 38186 15232 19774 25492 35752 13777 34297 41331 19693 26727 23090 51226 21859 42160 37557 19425 7668 10219 12798 35670 39187 50690 53255 27176 15405 25721 36485 21356 39120 41615 49604 11726 8075 15137 18335 25397 43273 38472 15042 20060 23577 25302 35562 28819 49339 42513 45316 26960 8021 13151 33783 20131 22710 13980 36404 39025 41534 49509 11631 7994 22062 36242 41400 50310 26796 7913 14947 18173 21928 25207 43083 28962 49930 38159 12192 14757 19803 25073 35725 38092 45126 27666 23063 13885 21846 42133 37824 19412 22929 10206 13723 36147 41753 50215 27149 15448 25932 36080 22281 41210 19371 7614 15124 21738 29248 35644 49768 37997 12002 14567 25779 35535 21414 39066 49550 42276 37729 19317 10111 38530 15016 20118 22739 25276 13561 36433 39236 41563 50448 26906 7967 13237 22091 41373 26825 7900 14934 21901 26370 35454 28935 38971 49455 12165 14800 28868 35320 49388 42086 38435 20023 22882 43169 14152 34784 37349 11242 19889 25019 39942 45100 50258 26744 7805 13047 36053 21820 41183 37770 19358 7643 12084 14705 21711 26208 28773 35673 49741 53272 11975 15506 25990 36026 21443 43536 42305 37716 24064 29194 49826 38055 14989 19699 25305 13772 36196 41326 37675 19263 21630 37608 19196 22713 11894 15411 25895 36379 21362 39182 41649 49498 11760 7157 25828 22177 35293 50313 57347 38422 14908 20290 22855 25448 43156 13677 34757 38288 11215 14746 23684 28814 51238 42508 45129 26717 23304 14210 21849 34730 37295 18939 12113 26181 29712 39020 50232 26802 7863 18403 35999 20982 43061 34676 38193 11134 14651 23589 26154 28719 35731 49799 38098 11949 14584 19910 25068 21417 14115 51457 42251 37662 23114 14048 42184 37581 20121 22924 27155 15622 25938 36142 21335 41860 11733 22164 39458 49718 38003 14937 19815 25421 35569 28952 49584 11706 7103 25774 21227 51267 42089 37500 20264 22829 25506 13735 34703 37338 41765 22734 15460 36428 22069 39945 41670 45187 50205 26775 8130 13288 18390 21907 43328 49937 12059 23632 26127 28762 39078 49394 11992 14557 25993 21404 14102 34622 37243 20074

22639 14021 34541 38072 41575 45106 19884 26918 8035 18295 36171 41441 23200 13994 51336 21745 44034 39431 49747 38214 11897 14700 25912 35780 21309 39297 49557 11679 25803 21214 13940 42076 38425 14995 20237 22872 25479 35515 13778 34298 41808 19694 27204 30721 51241 22336 42147 37558 19426 7655 13261 35685 39216 53284 15406 25722 36486 21119 39107 41644 49367 11517 8104 15138 18364 20985 25398 43274 13683 34651 11249 20047 23578 25317 28848 49816 38045 42514 45079 19913 26947 8022 13180 41428 37777 27776 23173 13967 21956 36391 39026 49510 12108 15625 25885 36257 41387 7914 18174 21691 43112 29201 49721 38188 11955 14758 19832 25074 35726 6135 34271 41333 27681 23092 13886 51228 21861 42134 37587 19399 22930 10221 13752 36624 39189 41754 50692 53313 27150 15435 25695 36067 22282 41673 27016 8077 15111 18393 25427 35631 37998 15044 26256 35564 28821 39081 49341 42039 37730 19318 22835 14105 34737 11195 20133 22768 25263 13562 36434 38999 41592 50435 26921 7996 13238 22120 36244 41374 50368 26826 7887 14949 21902 26161 43085 28964 39448 49932 38217 12166 14787 19805 25047 35307 46080 27668 23121 43170 13915 34547 37350 19890 25496 13725 36149 41279 50273 26731 7806 36054 21807 41212 37561 19373 7672 12071 14706 21740 28774 35674 49742 53259 12004 15521 25781 36489 21472 39068 43523 49608 42306 37703 20243 25401 38532 14990 20176 22741 25306 13535 35959 41565 45320 26908 8025 13267 22093 33787 19183 22714 15888 26372 36408 28993 38973 41650 49513 11747 7158 22178 35294 50314 57376 38437 14895 20081 22884 25211 43143 13678 34758 38275 11244 14761 19863 25021 40000 45130 50260 26718 23067 14001 21850 42137 37772 19416 7645 12114 14679 26182 29699 35199 50219 27265 15508 26048 36028 21445 43062 34663 38194 15128 23590 29196 35760 49828 38113 11950 14571 19701 24831 21418 51458 42280 37677 19321 10227 37582 20122 22687 27184 15413 25953 36381 21364 39240 41623 49500 11734 8083 13241 22151 43281 57349 38480 14938 20292 23809 25422 35570 28939 49571 12169 14748 28872 51296 42090 37487 20027 22830 14212 34732 37353 41766 18941 11639 22070 39946 45216 50206 26804 7921 13051 18405 36057 21936 43091 49938 38167 12088 14653 23619 26156 28777 35733 49857 38100 11979 14558 25994 21391 14117 42253 37720 23116 14022 34542 38059 45569 19647 27157 15680 25940 36200 22289 41442 19379 21746 39460 49776 38005 11898 14463 25899 35543 21310 39298 49558 11708 7161 25832 21229 13927 51269 42063 38426 15024 20238 22859 25508 43160 13793 34761 37340 41795 23688 30722 51242 22099 42624 45189 26833 8132 13262 21909 35686 39203 49463 12061 26185 28764 39136 49396 11518 7867 18351 20986 43065 14160 34680 37245 11250 20076 23593 25318 28835 49803 38046 42529 45108 19914 26976 8037 13167 36173 41415 37778 23174 13996 21719 44036 39489 49749 53504 11871 15626 25886 36258 21339 41864 11737 25805 22168 29202 49722 37951 14997 19819 25537 35517 13780 34300 41334 37683 27682 23079 51215 21862 42149 37616 19428 22945 10222 13739 36611 39190 41769 53314 15464 25724 36544 22073 39109 41674 50321 26779 8078 15140 18394 20959 25456 43276 13685 34653 11223 23580 26243 28822 39082 49342 42516 45137 26949 23312 14106 34738 37303 20134 22755 14025 36449 39028 41579 50464 26922 7983 18299 36231 41389 7916 14950 21693 26162 43086 28727 39435 49695 38218 11957 14816 19806 25076 35784 21425 49561 42259 27655 23122

13944 42192 37589 20353 22932 25483 13726 36150 41756 50274 27208 15437 36069 22284 41199 37562 19374 7659 15169 17919 25429 35689 53288 15522 25782 36490 21235 39055 43552 49371 42097 37732 20272 22837 25402 13631 34711 11197 20163 22742 25321 13564 36436 39953 41566 45083 50437 26895 8026 13296 22094 41432 26828 23177 15875 21960 26135 36395 28994 38974 49514 12224 14789 26001 35309 38438 20082 22647 43172 13917 34549 38304 11007 14762 19892 25022 6139 36179 41337 50247 26733 23096 14002 51344 21865 42138 37535 19403 7646 12129 14708 29728 35676 39193 50696 53261 27266 15495 25811 36015 21446 43525 42308 38657 15115 20245 25375 35747 38114 15048 19702 25308 28825 51249 42043 37678 19322 7551 13269 33789 20137 22716 27171 15414 25954 36382 21351 39003 41652 49487 11749 8112 13242 22180 36248 43282 50316 57350 38467 14953 20055 23810 25213 43201 28968 50048 38277 12170 14735 19921 25051 45132 27672 23069 13975 21852 34495 37354 18942 12116 15633 29701 36153 41395 50221 26791 7922 18406 36058 21923 43120 49953 38196 12075 14654 23648 28778 35734 49858 38087 12008 14573 25785 21420 14118 51460 42254 37707 19295 10229 38536 45570 20124 22745 27158 15443 25927 35963 22290 41681 27024 8085 13215 22209 35639 49763 38006 14940 26376 35572 28941 39089 49573 11695 7162 21230 51270 42092 38441 15011 20029 22888 25271 43147 13794 34762 37327 41824 19867 26929 22128 39948 45190 50264 26834 7895 13053 21910 43093 39680 49940 38225 12062 14683 23621 26186 28751 35315 49383 11981 15512 25996 21449 43066 14147 34667 37246 23594 29312 49832 38061 42530 45095 19705 26739 8038 36174 21815 41444 37793 19381 10175 21748 39490 49750 53267 11900 15417 25901 36497 21368 39300 41627 49616 11738 7135 25806 22155 29217 57353 38428 14998 20296 22861 25538 35518 13767 34287 41797 45328 30724 51244 22101 42150 37603 19191 22946 14216 36640 39205 41770 49521 11643 25711 22074 39110 50322 26808 7869 14903 18409 20988 25443 43039 13686 34654 38171 11252 14769 23567 26272 28837 35737 49805 38104 42503 45138 19916 26950 23299 14121 42369 37780 23232 14026 36450 39015 50227 27161 15628 25944 36260 21341 41390 4095 21694 29204 39464 49724 38009 11958 14579 19821 25063 35547 21426 49562 42288 37685 27684 23137 13931 51273 42179 37590 20354 22919 25512 13741 36613 39248 41743 53316 15438 36070 22047 41676 45193 26781 8136 15170 18396 21913 25430 35690 28947 49467 12177 26245 28880 39084 49400 42098 37495 20259 22838 14108 34740 37361 11198 20192 22757 25322 13551 36423 39954 41581 45112 50438 26924 8041 13283 18301 36289 41419 23178 15904 21723 26164 44040 28785 39437 49753 38220 11987 14790 26002 35310 21399 42261 27713 23124 13918 34550 38067 15001 19879 25485 13784 36208 41338 50276 26734 23083 51331 21866 42153 37564 19432 7661 12130 14695 25907 35663 39194 53262 15524 25840 36492 21237 39113 43526 49373 42071 38658 15144 20246 22867 25404 43392 13689 34769 11227 20165 23696 25295 28826 51250 42520 45085 26953 8028 13270 33790 37307 20138 22703 15877 26193 36397 28996 39032 41639 49516 11750 8099 18359 36235 43297 38496 14954 20084 23601 25214 43202 28731 49811 38278 11961 14764 19922 25080 6141 13175 36181 41311 27659 23070 14004 21839 42140 37593 19405 22936 12103 15634 29702 36154 41872 50222 27268 15553 25813 36073 22400 43107 49954 38183 15117 19827 25433 35749 38116 14574 25786 21183 51223 42045 37736

19324 22841 10230 13747 34715 41777 20111 22746
27173 15472 25956 36440 22305 39005 41682 50441
27011 8086 13244 22210 43284 57408 38469 14927 23812
26139 35559 28942 39090 49574 12172 14793 25053
38442 20030 22651 43176 14033 34553 37356 41587
19896 26930 7991 22115 36127 41397 50251 26849 7924
13054 36060 21925 43094 39443 49927 38226 12077
14712 23622 28780 35792 49860 53377 11982 15499
25759 21450 43529 14176 42312 37709 20249 25491
38062 45572 19706 27216 15445 35965 22292 41207
37794 19382 7667 13273 21735 35697 49765 53296 11887
15418 25902 36498 21355 39063 41656 49603 11753 7164
22184 29218 52224 57354 38415 15013 20059 22862
25329 43149 13796 34764 38281 41798 45315 19869
26903 22102 45248 26836 23185 13979 21968 36403
39206 49522 12120 14685 26188 29705 35317 50337
26795 7870 18410 20975 43068 14149 34669 38200 11239
14770 23596 28838 35738 49806 38091 42532 45153
19679 26741 23328 14122 51464 21873 42370 37767
19411 10233 39492 50704 53269 27162 15391 25931
36023 21342 41629 11740 8089 15123 22157 29191 35643
49711 38010 15056 19822 25540 35576 29057 49577
42275 37686 23138 51274 42208 37605 20145 22948
25275 13742 36614 39235 41772 49495 11645 22076
40064 45194 50324 26782 7899 14961 18383 21914 25445
43097 28976 49944 38173 12178 14743 23625 26246
28867 35263 49387 42561 45140 27904 23301 14095
34727 37362 22758 14028 36452 39969 41582 45099
50229 26687 8042 18302 36290 21819 41448 19385 12083
21752 26151 28786 39438 49754 37983 12016 14581
26017 35549 21428 39304 49564 42262 37715 27714
23111 13933 42181 38544 15002 20356 22977 25486
13771 36195 41801 30728 51360 22105 42154 37551
19195 7662 15172 26384 35692 28949 39209 49469 11703
25827 21238 39114 49374 42100 38449 14907 20261
22896 25391 43155 13690 34770 37335 11256 20166
23683 25324 28841 51713 39956 42507 45086 50496
26954 8015 13285 41421 37784 23180 15878 21725 26194
36398 28759 39019 49279 11989 15744 26004 36264
21457 43298 34675 20071 23602 29208 49840 38069
11962 14527 19937 25067 6142 36182 41340 37689 27688
23085 13991 51333 21868 42127 37594 19406 22923
12132 15649 25909 36617 39196 41859 53320 15554
25814 36074 22163 43584 57361 38660 15118 20304
22869 25434 35750 13663 34295 11229 26249 28828
51252 42046 37499 19311 22842 14224 34744 37309
41778 20140 22761 27174 15459 25719 36427 22306
39006 41697 50442 27040 8101 13231 18417 36237 43271
38470 14956 23575 26168 43204 28733 39553 49813
38336 11935 14794 19924 25054 21403 14129 42265
27661 23128 14034 34554 37119 19883 27393 15636
29760 36156 41398 50280 26850 7911 36047 21926 43109
39472 49956 38241 12078 14699 19829 24959 35779
53378 15528 25788 21241 43530 13939 51281 42075
37710 20250 22815 25520 13749 34717 41751 20169
22748 27203 15446 35966 22279 41684 45201 27013 8144
13274 22212 35698 49766 53283 15881 26141 36513
29000 39092 41643 49632 11754 7151 18363 38444 15014
20088 22653 25330 43150 13559 34527 38282 41589
45344 19870 26932 8049 13179 22117 36185 41427 50253
26823 23186 14008 21955 44048 39445 49985 38228
12107 14686 29706 35318 50338 27272 15501 25817
21452 43055 14150 34670 38187 15233 19775 25493
35753 38120 45154 19708 26742 23091 51227 21874
42161 37796 19440 7669 10234 12799 35671 50691 53270
27177 15420 25960 36500 21357 39121 41630 49605
11727 8090 15152 22158 29220 43288 57356 38473 15043

20061 23816 25303 35563 29058 49578 42752 45317
26961 37606 20146 22711 13981 36405 39264 41535
49524 11646 7995 22063 36243 41401 50311 26797 7928
14962 18412 21929 25446 43098 28963 49931 38174
12193 14772 23626 28896 35740 49864 38093 42562
45127 27667 23302 14124 21847 42372 37825 19413
10207 39970 45576 50230 27164 15449 25933 36081
22296 41211 19386 7615 15125 21739 29249 35645 49769
38012 12003 14582 26018 35550 21415 39067 49551
42277 37744 23140 13934 51276 42182 38531 15017
20119 22978 25277 13800 36672 39237 41802 50449
26907 22106 45196 26840 7901 14935 21916 26371 35455
28950 39210 49470 12180 14801 26304 28869 35321
49389 42087 38450 20262 22883 43184 14153 34785
37364 11243 23712 28842 51714 39943 42536 45101
50259 26745 8044 13286 36292 21821 41422 37771 19359
12085 21726 26209 28788 39496 49756 53273 11990
15507 25991 36027 21458 43537 42320 37717 27716
24065 29195 49827 38070 15004 19938 25544 13773
36197 41327 37690 23086 51334 21631 42156 37609
19197 22952 11895 15650 25910 36618 21363 39183
41888 49499 11761 25829 22192 39116 50328 57362
38423 14909 20291 22870 25449 43157 13692 34772
38289 11230 14747 23685 26250 28815 51239 42509
45144 26956 23305 14211 34731 37310 22762 15936
26196 36456 29713 39021 41698 50233 26803 8102 18418
36238 20983 43300 34677 11135 23604 26155 28734
39554 49814 38099 11964 14585 19911 25069 21432
14130 51472 42266 37663 27662 23115 14049 42185
37596 20360 22925 27394 15623 25939 36143 41861
15556 36076 22165 43110 39459 49719 38242 15176
19830 25436 35808 28953 49585 11707 25775 21242
51282 42104 37501 20265 22844 25507 13750 34718
37339 41780 20170 22735 27232 15461 36429 22308
39960 41671 45202 50444 27014 8131 13289 18391 43329
53760 15882 23633 26142 36514 28763 39079 49395
11993 14796 26008 21405 14103 34623 20075 22654
14036 34556 38073 41590 45107 19885 26919 8050 22118
36186 41456 50254 26852 23201 13995 51337 21984
44035 39446 49986 38215 12136 14701 25913 35781
39312 53380 15502 25818 21215 43532 13941 42077
38664 15234 20252 22873 25494 35754 13779 34299
41809 19695 27205 30736 51256 22337 42162 37559
19427 7670 13276 35700 39217 50720 53285 27178 15407
25723 36487 21358 39122 41645 49606 11756 8105 15139
18365 25399 43275 38474 15072 20062 23579 25332
43208 28849 49817 38284 42515 45318 19928 26962 8023
13181 41429 27777 23188 13982 21957 36406 39027
49511 12109 15640 29708 36272 41402 50340 26798 7915
18175 21930 43113 29440 49960 38189 12194 14759
19833 25075 35727 38094 45156 27696 23093 13887
51229 21876 42135 37826 19414 22931 10236 13753
36625 41755 50693 53328 27151 15450 25934 36082
22283 41688 27017 8092 15126 22216 29250 35646 49770
37999 15045 26257 35565 29060 39096 49580 42278
37731 19319 38560 15018 20148 22769 25278 13563
36435 39238 41593 50450 26936 7997 13239 22121 36245
41375 50369 26827 7902 14964 21903 26400 43100 28965
39449 49933 38232 12167 14802 23628 28870 35322
49390 42564 46081 27669 23360 43171 14154 34786
37351 19891 25497 39972 45102 50288 26746 7807 36055
21822 41213 37800 19388 7673 12086 14707 21741 26210
28775 35675 49743 53274 12005 15536 26020 36504
21473 39069 43538 49609 42307 37718 24066 29224
57472 38533 14991 20177 22980 25307 13774 36198
41804 45321 26909 22108 37610 19198 22715 15889
26373 36409 29008 39212 41651 49528 11762 7159 25830

22179 35295 50315 57377 38452 14910 20320 22885
25450 43158 13679 34759 38290 11245 14776 23686
28844 51716 40001 42510 45131 50261 26719 23306
14240 21851 42376 37773 19417 12115 26183 29714
39022 50234 27280 15509 26049 36029 21460 43063
34678 38195 15129 23591 29197 35761 49829 38128
11951 14586 19940 25070 21419 51459 42281 37692
23144 14050 51392 42186 37583 20123 22926 27185
15652 25968 36620 21365 39241 41862 49501 11735
22166 47104 57364 38481 14939 20293 23824 25423
35571 28954 49586 12184 14749 26252 28873 51297
42091 37502 20266 22831 14213 34733 37368 41767
22764 15462 36430 22071 39947 41700 45217 50207
26805 8160 13290 18420 36296 21937 43330 49939 12089
23634 26157 28792 39556 49872 38101 11994 14559
25995 21406 14132 42268 37721 27720 23117 14023
34543 38074 45584 19886 27396 15681 25941 36201
41443 23202 51338 21747 44064 39461 49777 38244
11899 14702 25914 35782 21311 39299 49559 11709 25833
21244 13942 51284 42078 38427 15025 20239 22874
25509 43161 13808 34776 37341 41810 20172 23689
27206 30723 51243 22338 42625 45204 27072 8133 13263
35687 39218 53286 15884 26200 36516 28765 39137
41646 49397 11519 8106 18366 20987 43304 14161 34681
11251 20077 23608 25319 28850 49818 38047 42544
45109 19915 26977 8052 13182 36188 41430 37779 27778
23175 13997 21958 44037 39504 49988 53505 12110
15627 25887 36259 41865 15560 25820 22169 43114
29203 49723 38190 15236 19834 25552 35756 13781
34301 41335 27683 23094 51230 21863 42164 37617
19429 22960 10223 13754 36626 39191 41784 50694
53315 27180 15465 25725 36545 22312 39124 41675
50560 27018 8079 15141 18395 25457 43277 38476 15046
23581 26258 35566 28823 39083 49343 42517 45376
26964 23313 14107 34739 20135 22770 14040 36464
39029 41594 50465 26923 7998 22122 36246 41404 50370
26856 7917 14951 21932 26163 43087 28966 39450 49934
38219 12196 14817 19807 25077 35785 53384 46082
27670 23123 43648 13945 42193 37828 20368 22933
25498 13727 36151 41757 50275 27209 15452 36084
22285 41214 37563 19375 7674 15184 21742 29252 35704
49772 53289 12006 15523 25783 36491 21474 39070
43553 49610 42336 37733 20273 25403 38534 15020
20178 22743 25336 13565 36437 40192 41567 45322
50452 26910 8027 13297 22095 41433 26829 23192 15890
21961 26374 36410 28995 38975 49515 12225 14804
29824 35324 50344 57378 38439 20083 22886 43173
14156 34788 38305 11246 14763 19893 25023 40002
45160 50262 26748 23097 14003 51345 21880 42139
37774 19418 7647 12144 14709 26212 29729 35677 50697
53276 27267 15510 26050 36030 21447 43540 42309
38672 15130 24068 29198 35762 49830 38115 15049
19703 25309 29064 51488 42282 37679 19323 37612
20152 22717 27186 15415 25955 36383 21366 39242
41653 49502 11764 8113 13243 22181 36249 43283 50317
57351 38482 14968 20294 23811 25452 43216 28969
50049 38292 12171 14750 23744 28874 51298 42568
45133 27673 23308 14214 21853 34734 37355 18943
12117 29716 39976 45218 50236 26806 7923 18407 36059
21938 43121 49968 38197 12090 14655 23649 26158
28779 35735 49859 38102 12009 14588 26024 21421
14119 51461 42255 37722 23118 14052 42188 38537
45571 20125 22984 27159 15682 25942 36202 22291
41920 27025 22224 39462 49778 38007 14941 26377
35573 28956 39328 49588 11710 7163 25834 21231 51271
42093 38456 15026 20268 22889 25510 43162 13795
34763 37342 41825 23690 30752 51720 22129 39949
42626 45191 50265 26835 8134 13292 21911 43332 39681
49941 12063 23636 26187 28766 39138 49398 11996
15513 25997 21464 43067 14162 34682 37247 20078
23595 29313 49833 38076 42531 45110 19944 26978 8039
36175 41445 37808 23204 13998 51340 21749 44038
39491 49751 53506 11901 15656 25916 36736 21369
39301 41866 49617 11739 25807 22170 29232 57368
38429 14999 20297 22876 25539 35519 13782 34302
41812 45329 28160 30725 51245 22340 42151 37618
19430 22947 14217 36641 39220 41771 53344 15466
25726 36546 22075 39111 41704 50323 26809 8108 15142
18424 20989 25458 43278 13687 34655 11253 23582
26273 28852 39560 49820 38105 42518 45139 19917
26951 23314 14136 42384 37781 27780 23233 14027
36451 39030 50466 27400 15629 25945 36261 41391 7918
21695 43116 29205 39465 49725 38248 11959 14818
19836 25078 35786 21427 49563 42289 27685 23152
13946 51288 42194 37591 20355 22934 25513 13756
36628 39249 41758 50752 53317 27210 15439 36071
22286 41677 45208 27020 8137 15171 18397 25431 35691
53290 16000 26260 36520 28881 39085 43554 49401
42099 37734 20274 22839 14109 34741 11199 20193
22772 25323 13566 36438 39955 41596 45113 50439
26925 8056 13298 22124 36304 41434 50372 26830 23179
15905 21962 26165 44041 29024 39452 49992 38221
12226 14791 26003 35311 46084 27728 23125 43174
13919 34551 38306 15240 19894 25500 13785 36209
41339 50277 26735 23098 51346 21867 42168 37565
19433 7676 12131 14710 29730 35678 39195 50698 53263
27296 15525 25841 36493 21476 39128 43527 49612
42310 38659 15145 20247 25405 43393 38592 15050
20180 23697 25310 28827 51251 42521 45324 26968 8029
13271 33791 20139 22718 15892 26432 36412 28997
39033 41654 49517 11751 8114 22182 36250 43312 50318
57380 38497 14955 20085 23840 25215 43203 28970
50050 38279 12200 14765 19923 25081 40004 45134
27674 23071 14005 21854 42141 37832 19420 22937
12118 15635 29703 36155 41873 50223 27269 15568
26052 36088 22401 43122 49955 38198 15132 23650
29256 35764 49888 38117 12010 14575 25787 21422
51462 42284 37737 19325 10231 38538 45600 20126
22747 27188 15473 25957 36441 22320 39244 41683
50456 27026 8087 13245 22211 43285 57409 38484 14942
23813 26378 35574 28943 39091 49575 12173 14808
28876 51300 42094 38443 20031 22890 43177 14272
34792 37357 41826 19897 26931 22130 39950 45220
50266 26864 7925 13055 36061 21940 43095 39682 49942
38227 12092 14713 23623 26216 28781 35793 49861
53392 11983 15514 25998 21451 43544 14177 42313
37724 24072 29314 49834 38063 45573 19707 27217
15684 36204 22293 41446 37795 19383 21750 39520
49780 53297 11902 15419 25903 36499 21370 39302
41657 49618 11768 7165 25836 22185 29219 52225 57355
38430 15028 20298 22863 25568 43164 13797 34765
38296 41799 45330 23692 30726 51246 22103 42628
45249 26837 23424 14218 21969 36642 39207 49523
12121 26189 29720 39140 50352 26810 7871 18411 20990
43069 14164 34684 38201 11254 14771 23597 26274
28839 35739 49807 38106 42533 45168 19918 26980
23329 14123 51465 42371 37782 23234 14056 44096
39493 50705 53508 27163 15630 25946 36262 21343
41868 11741 22172 29206 39466 49726 38011 15057
19823 25541 35577 29072 49592 42290 37687 27686
23139 51275 42209 37620 20384 22949 25514 13743
36615 39250 41773 53318 15468 36548 22077 40065
41678 45195 50325 26783 8138 15200 18398 21915 25460
43336 28977 49945 12179 23640 26247 28882 39086

49402 42576 45141 27905 23316 14110 34742 37363
20194 22759 14029 36453 39984 41583 45114 50468
26926 8043 18303 36291 41449 23208 15906 21753 26166
44042 28787 39439 49755 38222 12017 14820 26032
35788 21429 39305 49565 42263 27715 23126 13948
42196 38545 15003 20357 22992 25487 13786 36210
41816 50278 27212 30729 51361 22344 42155 37566
19434 7663 15173 26385 35693 39224 53292 15526 25842
36494 21239 39115 43556 49375 42101 38688 15146
20276 22897 25406 43394 13691 34771 11257 20167
23698 25325 28856 51728 39957 42522 45087 50497
26955 8030 13300 41436 37785 27784 23181 15879 21964
26195 36399 28998 39034 49518 12228 15745 26005
36265 43299 38498 20086 23603 43232 29209 49841
38308 11963 14766 19952 25082 6143 36183 41341 27689
23100 14006 51348 21869 42142 37595 19407 22938
12133 15664 29732 36632 39197 41874 50700 53321
27270 15555 25815 36075 22402 43585 57600 38661
15119 20305 25435 35751 38118 15052 26264 28829
51253 42047 37738 19326 22843 14225 34745 41779
20141 22776 27175 15474 25958 36442 22307 39007
41712 50443 27041 8116 13246 22240 36252 43286 50376
57410 38471 14957 23814 26169 43205 28972 39568
50052 38337 12174 14795 19925 25055 46088 27676
23129 43178 14035 34555 37358 19898 27408 15637
29761 36157 41399 50281 26851 7926 36062 21927 43124
39473 49957 38256 12079 14714 23652 28782 35794
49862 53379 12012 15529 25789 21480 43531 14178
51520 42314 37711 20251 25521 38540 45574 20184
22749 27218 15447 35967 22294 41685 45440 27028 8145
13275 22213 35699 49767 53298 15896 26380 36528
29001 39093 41658 49633 11755 7166 22186 52226 57384
38445 15015 20089 22892 25331 43151 13798 34766
38283 41828 45345 19871 26933 22132 40008 45250
50268 26838 23187 14009 21970 44049 39684 50000
38229 12122 14687 26190 29707 35319 50339 27273
15516 26056 21453 43070 14151 34671 38202 15248
23598 29316 35768 49836 38121 42534 45155 19709
26743 23330 51466 21875 42400 37797 19441 10235
39494 50706 53271 27192 15421 25961 36501 21372
39360 41631 49620 11742 8091 15153 22159 29221 43289
57357 38488 15058 20300 23817 25542 35578 29059
49579 42753 45332 30784 51304 42210 37607 20147
22950 14220 36644 39265 41774 49525 11647 22078
40066 45224 50326 26812 7929 14963 18413 21944 25447
43099 28978 49946 38175 12208 14773 23627 26276
28897 35741 49865 38108 42563 45142 27906 23303
14125 42373 37840 23236 14030 36454 39971 45577
50231 27165 15688 25948 36320 22297 41450 19387
21754 29264 39468 49784 38013 12018 14583 26019
35551 21430 39306 49566 42292 37745 27744 23141
13935 51277 42183 38546 15032 20358 22979 25516
13801 36673 39252 41803 54272 30730 51362 22107
42632 45197 26841 8140 15174 21917 26386 35694 28951
39211 49471 12181 26305 28884 39144 49404 42102
38451 20263 22898 43185 14168 34800 37365 11258
20196 23713 25326 28843 51715 39958 42537 45116
50498 26984 8045 13287 36293 41423 37786 23182 15908
21727 26224 44044 28789 39497 49757 53512 11991
15746 26006 36266 21459 43776 42321 27717 24080
29210 49842 38071 15005 19939 25545 13788 36212
41342 37691 27690 23087 51335 21870 42157 37624
19436 22953 12134 15651 25911 36619 39198 41889
53322 15584 25844 36552 22193 39117 43586 50329
57363 38662 15148 20306 22871 25464 43396 13693
34773 11231 23700 26251 28830 51254 42524 45145
26957 23320 14226 34746 37311 20142 22763 15937

26197 36457 29952 39036 41699 50472 27042 8103 18419
36239 43301 38500 14958 23605 26170 43206 28735
39555 49815 38338 11965 14824 19926 25084 21433
14131 51473 42267 27663 23130 14064 42200 37597
20361 22940 27395 15638 29762 36158 41876 50282
27328 15557 36077 22404 43111 39474 49958 38243
15177 19831 25437 35809 53408 15530 25790 21243
43560 51283 42105 37740 20280 22845 25522 13751
34719 41781 20171 22750 27233 15476 36444 22309
39961 41686 45203 50445 27015 8146 13304 22214 43344
57412 53761 15883 23872 26143 36515 29002 39094
49634 12232 14797 26009 38446 20090 22655 43180
14037 34557 38312 41591 45346 19900 26934 8051 22119
36187 41457 50255 26853 23216 14010 51352 21985
44050 39447 49987 38230 12137 14716 29736 35796
39313 50816 53381 27274 15503 25819 21454 43533
14180 42316 38665 15235 20253 25495 35755 38122
45632 19710 27220 30737 51257 22352 42163 37798
19442 7671 13277 35701 50721 53300 27179 15422 25962
36502 21359 39123 41660 49607 11757 8120 15154 22188
29222 43290 52228 57358 38475 15073 20063 23818
25333 43209 29088 50056 38285 42754 45319 19929
26963 45252 27792 23189 13983 21972 36407 39266
49526 12124 15641 29709 36273 41403 50341 26799 7930
18414 21931 43128 29441 49961 38204 12195 14774
23656 28898 35742 49866 38095 42592 45157 27697
23332 14126 51468 21877 42374 37827 19415 10237
40448 45578 50708 53329 27166 15451 25935 36083
22298 41689 27032 8093 15127 22217 29251 35647 49771
38014 15060 26496 35580 29061 39097 49581 42279
37746 23142 51278 42212 38561 15019 20149 23008
25279 13802 36674 39239 41832 50451 26937 22136
40068 45198 50384 26842 7903 14965 21918 26401 43101
28980 39688 49948 38233 12182 14803 23629 26306
28871 35323 49391 42565 46096 27908 23361 43186
14155 34787 37366 23714 29320 51744 39973 42538
45103 50289 26747 8046 36294 21823 41452 37801 19389
12087 21756 26211 28790 39498 49758 53275 12020
15537 26021 36505 21488 39308 43539 49624 42322
37719 27718 24067 29225 57473 38548 15006 20416
22981 25546 13775 36199 41805 45336 30732 51364
22109 42158 37611 19199 22954 16128 26388 36648
29009 39213 41890 49529 11763 25831 22194 39118
50330 57392 38453 14911 20321 22900 25451 43159
13694 34774 38291 11260 14777 23687 26280 28845
51717 40016 42511 45146 50500 26958 23307 14241
42377 37788 23240 15938 26198 36458 29715 39023
50235 27281 15748 26064 36268 21461 43302 34679
23606 29212 39584 49844 38129 11966 14587 19941
25071 21434 51474 42296 37693 27692 23145 14051
51393 42187 37598 20362 22927 27424 15653 25969
36621 39256 41863 53324 15558 36078 22167 43588
47105 57365 38720 15178 20308 23825 25438 35810
28955 49587 12185 26253 28888 51312 42106 37503
20267 22846 14228 34748 37369 41782 20200 22765
27234 15463 36431 22310 39962 41701 45232 50446
27044 8161 13291 18421 36297 43331 53762 15912 23635
26172 44160 28793 39557 49873 38340 11995 14798
26010 21407 14133 42269 27721 23132 14038 34558
38075 45585 19887 27397 15696 29764 36216 41458
50284 26854 23203 51339 21986 44065 39476 50016
38245 12138 14703 25915 35783 39314 53382 15532
25848 21245 43534 13943 51285 42079 38666 15264
20254 22875 25524 43400 13809 34777 41811 20173
23704 27207 30738 51258 22339 42640 45205 27073 8148
13278 35702 39219 50722 53287 15885 26201 36517
29004 39152 41647 49636 11758 8107 18367 43305 38504

15074 20092 23609 25334 43210 28851 49819 38286 42545 45348 19930 26992 8053 13183 36189 41431 27779 23190 14012 21959 44052 39505 49989 53520 12111 15642 29710 36274 41880 50342 27276 15561 25821 22408 43115 29442 49962 38191 15237 19835 25553 35757 38124 45158 27698 23095 51231 21878 42165 37856 19444 22961 10238 13755 36627 41785 50695 53330 27181 15480 25964 36560 22313 39125 41690 50561 27019 8094 15156 22218 29280 43292 57416 38477 15047 23820 26259 35567 29062 39098 49582 42756 45377 26965 38562 20150 22771 14041 36465 39268 41595 50480 26938 7999 22123 36247 41405 50371 26857 7932 14966 21933 26402 43102 28967 39451 49935 38234 12197 14832 23630 28900 35800 49868 53385 42566 46083 27671 23362 43649 14184 42432 37829 20369 25499 39974 45580 50290 27224 15453 36085 22300 41215 37802 19390 7675 15185 21743 29253 35705 49773 53304 12007 15538 26022 36506 21475 39071 43568 49611 42337 37748 24096 29226 52232 57474 38535 15021 20179 22982 25337 13804 36676 40193 41806 45323 50453 26911 22110 45256 26844 23193 15891 21976 26375 36411 29010 39214 49530 12240 14805 26308 29825 35325 50345 57379 38454 20322 22887 43188 14157 34789 38320 11247 14778 23716 28846 51718 40003 42540 45161 50263 26749 23336 14242 51584 21881 42378 37775 19419 12145 26213 29744 39500 50712 53277 27282 15511 26051 36031 21462 43541 42324 38673 15131 24069 29199 35763 49831 38130 15064 19942 25548 29065 51489 42283 37694 23146 51394 42216 37613 20153 22956 27187 15654 25970 36622 21367 39243 41892 49503 11765 22196 40072 47106 50332 57366 38483 14969 20295 23826 25453 43217 28984 50064 38293 12186 14751 23745 26254 28875 51299 42569 45148 27912 23309 14215 34735 37370 22766 15940 36460 29717 39977 41702 45219 50237 26807 8162 18422 36298 21939 43360 49969 12091 23664 26159 28794 39558 49874 38103 12024 14589 26025 21436 14134 51476 42270 37723 27722 23119 14053 42189 38552 45586 20364 22985 27398 15683 25943 36203 41921 30848 51368 22225 44066 39463 49779 38246 15180 26392 35812 28957 39329 49589 11711 25835 21246 51286 42108 38457 15027 20269 22904 25511 43163 13810 34778 37343 41840 20174 23691 27236 30753 51721 22368 39964 42627 45206 50504 27074 8135 13293 43333 39696 53764 15886 23637 26202 36518 28767 39139 49399 11997 15752 26012 21465 43306 14163 34683 20079 23610 29328 49848 38077 42546 45111 19945 26979 8054 36190 41460 37809 27808 23205 13999 51341 21988 44039 39506 49990 53507 12140 15657 25917 36737 39316 41867 53440 15562 25822 22171 43592 29233 57369 38668 15238 20312 22877 25554 35758 13783 34303 41813 28161 30740 51260 22341 42166 37619 19431 22962 14232 36656 39221 41786 50724 53345 27182 15467 25727 36547 22314 39126 41705 50562 27048 8109 15143 18425 25459 43279 38478 15076 23583 26288 43212 28853 39561 49821 38344 42519 45378 19932 26966 23315 14137 42385 27781 23248 14042 36466 39031 50467 27401 15644 29768 36276 41406 50400 26858 7919 21934 43117 29444 39480 49964 38249 12198 14819 19837 25079 35787 53386 46112 27700 23153 43650 13947 51289 42195 37830 20370 22935 25528 13757 36629 41759 50753 53332 27211 15454 36086 22287 41692 45209 27021 8152 15186 22220 29254 35706 49774 53291 16001 26261 36521 29120 39100 43555 49640 42338 37735 20275 38564 15022 20208 22773 25338 13567 36439 40194 41597 45352 50454 26940 8057 13299

22125 36305 41435 50373 26831 23194 15920 21963 26404 44056 29025 39453 49993 38236 12227 14806 29826 35326 50346 57856 46085 27729 23364 43175 14158 34790 38307 15241 19895 25501 40032 45162 50292 26750 23099 51347 21882 42169 37804 19448 7677 12146 14711 26214 29731 35679 50699 53278 27297 15540 26080 36508 21477 39129 43542 49613 42311 38674 15160 24070 29228 43408 57476 38593 15051 20181 23936 25311 29066 51490 42760 45325 26969 37614 20154 22719 15893 26433 36413 29012 39272 41655 49532 11766 8115 22183 36251 43313 50319 57381 38512 14970 20324 23841 25454 43218 28971 50051 38294 12201 14780 23746 28904 51776 40005 42570 45135 27675 23310 14244 21855 42380 37833 19421 12119 29718 39978 45696 50238 27284 15569 26053 36089 22416 43123 49970 38199 15133 23651 29257 35765 49889 38132 12011 14590 26026 21423 51463 42285 37752 23148 14054 51396 42190 38539 45601 20127 22986 27189 15712 25972 36680 22321 39245 41922 50457 27027 22226 47108 57424 38485 14943 23828 26379 35575 28958 39330 49590 12188 14809 26312 28877 51301 42095 38458 20270 22891 43192 14273 34793 37372 41827 23720 30754 51722 22131 39951 42656 45221 50267 26865 8164 13294 36300 21941 43334 39683 49943 12093 23638 26217 28796 39616 49876 53393 11998 15515 25999 21466 43545 14192 42328 37725 27724 24073 29315 49835 38078 45588 19946 27456 15685 36205 41447 37810 23206 51342 21751 44068 39521 49781 53536 11903 15658 25918 36738 21371 39303 41896 49619 11769 25837 22200 29234 52240 57370 38431 15029 20299 22878 25569 43165 13812 34780 38297 41814 45331 23693 28162 30727 51247 22342 42629 45264 27076 23425 14219 36643 39222 53346 15944 26204 36576 29721 39141 41706 50353 26811 8110 18426 20991 43308 14165 34685 11255 23612 26275 28854 39562 49822 38107 42548 45169 19919 26981 23344 14138 51480 42386 37783 27782 23235 14057 44097 39508 50944 53509 27402 15631 25947 36263 41869 15564 22173 43118 29207 39467 49727 38250 15296 19838 25556 35816 29073 49593 42291 27687 23154 51290 42224 37621 20385 22964 25515 13758 36630 39251 41788 50754 53319 27240 15469 36549 22316 40080 41679 45210 50564 27022 8139 15201 18399 25461 43337 53768 16002 23641 26262 36522 28883 39087 49403 42577 45380 27920 23317 14111 34743 20195 22774 14044 36468 39985 41598 45115 50469 26927 8058 22126 36306 41464 50374 26860 23209 15907 21992 26167 44043 29026 39454 49994 38223 12256 14821 26033 35789 39320 53388 46086 27730 23127 43652 13949 42197 38784 15242 20372 22993 25502 13787 36211 41817 50279 27213 30744 51376 22345 42170 37567 19435 7678 15188 30208 35708 39225 50728 53293 27298 15527 25843 36495 21478 39130 43557 49614 42340 38689 15147 20277 25407 43395 38594 15080 20182 23699 25340 28857 51729 40196 42523 45326 50512 26970 8031 13301 41437 27785 23196 15894 21965 26434 36414 28999 39035 49519 12229 15760 29828 36280 43314 50348 57382 38499 20087 23842 43233 29448 50080 38309 12202 14767 19953 25083 40006 45164 27704 23101 14007 51349 21884 42143 37834 19422 22939 12148 15665 29733 36633 41875 50701 53336 27271 15570 26054 36090 22403 43600 57601 38676 15134 24128 29258 35766 49890 38119 15053 26265 29068 51492 42286 37739 19327 38568 45602 20156 22777 27190 15475 25959 36443 22322 39246 41713 50458 27056 8117 13247 22241 36253 43287 50377 57411 38486 14972 23815

26408 43220 28973 39569 50053 38352 12175 14810 23748 28878 51302 42572 46089 27677 23368 43179 14274 34794 37359 19899 27409 29776 39980 45222 50296 26866 7927 36063 21942 43125 39712 49972 38257 12094 14715 23653 26218 28783 35795 49863 53394 12013 15544 26028 21481 43546 14179 51521 42315 37726 24074 29344 57480 38541 45575 20185 22988 27219 15686 36206 22295 41924 45441 27029 22228 39522 49782 53299 15897 26381 36529 29016 39332 41659 49648 11770 7167 25838 22187 52227 57385 38460 15030 20328 22893 25570 43166 13799 34767 38298 41829 45360 23694 30756 51724 22133 40009 42630 45251 50269 26839 23426 14248 21971 44288 39685 50001 12123 26191 29722 39142 50354 27288 15517 26057 21468 43071 14166 34686 38203 15249 23599 29317 35769 49837 38136 42535 45170 19948 26982 23331 51467 42401 37812 23264 14058 51400 44098 39495 50707 53510 27193 15660 25976 36740 21373 39361 41870 49621 11743 22174 29236 47112 57372 38489 15059 20301 23832 25543 35579 29074 49594 42768 45333 28164 30785 51305 42211 37622 20386 22951 14221 36645 39280 41775 53348 15470 36550 22079 40067 41708 45225 50327 26813 8168 15202 18428 21945 25462 43338 28979 49947 12209 23642 26277 28912 39564 49880 38109 42578 45143 27907 23318 14140 42388 37841 27840 23237 14031 36455 39986 45592 50470 27404 15689 25949 36321 41451 23210 21755 44072 29265 39469 49785 38252 12019 14822 26034 35790 21431 39307 49567 42293 27745 23156 13950 51292 42198 38547 15033 20359 22994 25517 13816 36688 39253 41818 50756 54273 27214 30731 51363 22346 42633 45212 27080 8141 15175 26387 35695 39226 53294 16004 26320 36524 28885 39145 43558 49405 42103 38690 20278 22899 43424 14169 34801 11259 20197 23728 25327 28858 51730 39959 42552 45117 50499 26985 8060 13302 36308 41438 37787 27786 23183 15909 21966 26225 44045 29028 39512 49996 53513 12230 15747 26007 36267 43777 46144 27732 24081 43234 29211 49843 38310 15244 19954 25560 13789 36213 41343 27691 23102 51350 21871 42172 37625 19437 22968 12135 15666 29734 36634 39199 41904 50702 53323 27300 15585 25845 36553 22432 39132 43587 50568 57602 38663 15149 20307 25465 43397 38596 15054 23701 26266 28831 51255 42525 45384 26972 23321 14227 34747 20143 22778 15952 26436 36472 29953 39037 41714 50473 27043 8118 22242 36254 43316 50378 57440 38501 14959 23844 26171 43207 28974 39570 50054 38339 12204 14825 19927 25085 55296 46090 27678 23131 43656 14065 42201 37836 20376 22941 27410 15639 29763 36159 41877 50283 27329 15572 36092 22405 43126 39475 49959 38258 15192 23654 29260 35824 49892 53409 12014 15531 25791 21482 43561 51522 42344 37741 20281 25523 38542 45604 20186 22751 27248 15477 36445 22324 40200 41687 45442 50460 27030 8147 13305 22215 43345 57413 53776 15898 23873 26382 36530 29003 39095 49635 12233 14812 29832 52256 57386 38447 20091 22894 43181 14276 34796 38313 41830 45347 19901 26935 22134 40010 45280 50270 26868 23217 14011 51353 22000 44051 39686 50002 38231 12152 14717 26220 29737 35797 50817 53396 27275 15518 26058 21455 43548 14181 42317 38680 15250 24076 29318 35770 49838 38123 45633 19711 27221 30976 51496 22353 42402 37799 19443 39524 50736 53301 27194 15423 25963 36503 21374 39362 41661 49622 11772 8121 15155 22189 29223 43291 52229 57359 38490 15088 20302 23819 25572 43224 29089 50057 38300

42755 45334 23752 30786 51306 42688 45253 27793 23428 14222 21973 36646 39267 49527 12125 29724 40096 45226 50356 26814 7931 18415 21946 43129 29456 49976 38205 12210 14775 23657 26278 28899 35743 49867 38110 42593 45172 27936 23333 14127 51469 42375 37842 23238 14060 44100 40449 45579 50709 53568 27167 15690 25950 36322 22299 41928 27033 22232 29266 39470 49786 38015 15061 26497 35581 29076 39336 49596 42294 37747 27746 23143 51279 42213 38576 15034 20388 23009 25518 13803 36675 39254 41833 54274 30760 51840 22137 40069 42634 45199 50385 26843 8142 15204 21919 26416 43340 28981 39689 49949 12183 23644 26307 28886 39146 49406 42580 46097 27909 23376 43187 14170 34802 37367 20198 23715 29321 51745 39988 42539 45118 50528 26986 8047 36295 41453 37816 23212 15910 21757 26226 44046 28791 39499 49759 53514 12021 15776 26036 36744 21489 39309 43778 49625 42323 27719 24082 29240 57488 38549 15007 20417 22996 25547 13790 36214 41820 45337 28168 30733 51365 22348 42159 37626 19438 22955 16129 26389 36649 39228 41891 53352 15586 25846 36554 22195 39119 43616 50331 57393 38692 15150 20336 22901 25466 43398 13695 34775 11261 23702 26281 28860 51732 40017 42526 45147 50501 26959 23322 14256 42392 37789 27788 23241 15939 26199 36459 29954 39038 50474 27520 15749 26065 36269 43303 38502 23607 43236 29213 39585 49845 38368 11967 14826 19956 25086 21435 51475 42297 27693 23160 14066 51408 42202 37599 20363 22942 27425 15668 29792 36636 39257 41878 50760 53325 27330 15559 36079 22406 43589 47120 57604 38721 15179 20309 25439 35811 53410 16008 26268 28889 43562 51313 42107 37742 20282 22847 14229 34749 41783 20201 22780 27235 15478 36446 22311 39963 41716 45233 50447 27045 8176 13306 22244 36312 43346 50380 57414 53763 15913 23874 26173 44161 29032 39572 50112 38341 12234 14799 26011 46092 27736 23133 43182 14039 34559 38314 45824 19902 27412 15697 29765 36217 41459 50285 26855 23218 51354 21987 44080 39477 50017 38260 12139 14718 29738 35798 39315 50818 53383 27304 15533 25849 21484 43535 14182 51524 42318 38667 15265 20255 25525 43401 38600 45634 20188 23705 27222 30739 51259 22354 42641 45444 27088 8149 13279 35703 50723 53302 15900 26440 36532 29005 39153 41662 49637 11759 8122 22190 43320 52230 57388 38505 15075 20093 23848 25335 43211 29090 50058 38287 42784 45349 19931 26993 40012 45254 27794 23191 14013 21974 44053 39744 50004 53521 12126 15643 29711 36275 41881 50343 27277 15576 26060 22409 43130 29443 49963 38206 15252 23658 29376 35772 49896 38125 42594 45159 27699 23334 51470 21879 42404 37857 19445 10239 40450 45608 50710 53331 27196 15481 25965 36561 22328 39364 41691 50576 27034 8095 15157 22219 29281 43293 57417 38492 15062 23821 26498 35582 29063 39099 49583 42757 45392 30788 51308 42214 38563 20151 23010 14280 36704 39269 41834 50481 26939 22138 40070 45228 50386 26872 7933 14967 21948 26403 43103 28982 39690 49950 38235 12212 14833 23631 26336 28901 35801 49869 53400 42567 46098 27910 23363 43664 14185 42433 37844 24192 29322 51746 39975 45581 50291 27225 15692 36324 22301 41454 37803 19391 21758 29268 39528 49788 53305 12022 15539 26023 36507 21490 39310 43569 49626 42352 37749 27748 24097 29227 52233 57475 38550 15036 20418 22983 25576 13805 36677 40208 41807 45338 54276 30734 51366 22111 42636

45257 26845 23432 16130 21977 26390 36650 29011
39215 49531 12241 26309 29840 39148 50360 57394
38455 20323 22902 43189 14172 34804 38321 11262
14779 23717 26282 28847 51719 40018 42541 45176
50502 26988 23337 14243 51585 42379 37790 23242
15968 26228 44104 29745 39501 50713 53516 27283
15750 26066 36270 21463 43780 42325 24084 29214
39586 49846 38131 15065 19943 25549 29080 51504
42298 37695 27694 23147 51395 42217 37628 20392
22957 27426 15655 25971 36623 39258 41893 53326
15588 36556 22197 40073 43590 47107 50333 57367
38722 15208 20310 23827 25468 43456 28985 50065
12187 23760 26255 28890 51314 42584 45149 27913
23324 14230 34750 37371 20202 22767 15941 36461
29956 39992 41703 45234 50476 27046 8163 18423 36299
43361 53792 15914 23665 26174 44162 28795 39559
49875 38342 12025 14828 26040 21437 14135 51477
42271 27723 23134 14068 42204 38553 45587 20365
23000 27399 15698 29766 36218 41936 50286 27332
30849 51369 22464 44067 39478 50018 38247 15181
26393 35813 39344 53412 15534 25850 21247 43564
51287 42109 38696 15266 20284 22905 25526 43402
13811 34779 41841 20175 23706 27237 30768 51736
22369 39965 42642 45207 50505 27075 8150 13308 43348
39697 58368 53765 15887 23876 26203 36519 29006
39154 49638 12236 15753 26013 43307 38506 20094
23611 43240 29329 49849 38316 42547 45350 19960
26994 8055 36191 41461 27809 23220 14014 51356 21989
44054 39507 49991 53522 12141 15672 29740 36752
39317 41882 50820 53441 27278 15563 25823 22410
43593 29472 57608 38669 15239 20313 25555 35759
38126 45636 28176 30741 51261 22356 42167 37858
19446 22963 14233 36657 41787 50725 53360 27183
15482 25966 36562 22315 39127 41720 50563 27049 8124
15158 22248 29282 43294 52288 57418 38479 15077
23822 26289 43213 29092 39576 50060 38345 42758
45379 19933 26967 46208 27796 23249 14043 36467
39270 50482 27416 15645 29769 36277 41407 50401
26859 7934 21935 43132 29445 39481 49965 38264 12199
14834 23660 28902 35802 49870 53387 42596 46113
27701 23392 43651 14186 51528 42434 37831 20371
25529 40452 45582 50768 53333 27226 15455 36087
22302 41693 45448 27036 8153 15187 22221 29255 35707
49775 53306 16016 26500 36536 29121 39101 43570
49641 42339 37750 24098 52234 57504 38565 15023
20209 23012 25339 13806 36678 40195 41836 45353
50455 26941 22140 40128 45258 50388 26846 23195
15921 21978 26405 44057 29040 39692 50008 38237
12242 14807 26310 29827 35327 50347 57857 46100
27968 23365 43190 14159 34791 38322 15256 23718
29324 51748 40033 42542 45163 50293 26751 23338
51586 21883 42408 37805 19449 12147 26215 29746
39502 50714 53279 27312 15541 26081 36509 21492
39368 43543 49628 42326 38675 15161 24071 29229
43409 57477 38608 15066 20420 23937 25550 29067
51491 42761 45340 30792 51424 42218 37615 20155
22958 16132 26448 36652 29013 39273 41894 49533
11767 22198 40074 47136 50334 57396 38513 14971
20325 23856 25455 43219 28986 50066 38295 12216
14781 23747 26284 28905 51777 40020 42571 45150
27914 23311 14245 42381 37848 23244 15942 36462
29719 39979 45697 50239 27285 15808 26068 36328
22417 43362 49971 23666 29272 39588 49904 38133
12026 14591 26027 21438 51478 42300 37753 27752
23149 14055 51397 42191 38554 45616 20366 22987
27428 15713 25973 36681 39260 41923 54280 30850
51370 22227 44544 47109 57425 38724 15182 23829

26394 35814 28959 39331 49591 12189 26313 28892
51316 42110 38459 20271 22906 43193 14288 34808
37373 41842 20204 23721 27238 30755 51723 22370
39966 42657 45236 50506 27104 8165 13295 36301 43335
39698 53766 15916 23639 26232 44164 28797 39617
49877 53632 11999 15754 26014 21467 43784 14193
42329 27725 24088 29330 49850 38079 45589 19947
27457 15700 36220 41462 37811 27810 23207 51343
21990 44069 39536 50020 53537 12142 15659 25919
36739 39318 41897 53442 15592 25852 22201 43594
29235 52241 57371 38670 15268 20314 22879 25584
43404 13813 34781 41815 23708 28163 30742 51262
22343 42644 45265 27077 23440 14234 36658 39223
50726 53347 15945 26205 36577 29960 39156 41707
50592 27050 8111 18427 43309 38508 15078 23613 26290
43214 28855 39563 49823 38346 42549 45408 19934
26996 23345 14139 51481 42387 27783 23250 14072
44112 39509 50945 53524 27403 15646 29770 36278
41884 50402 27336 15565 22412 43119 29446 39482
49966 38251 15297 19839 25557 35817 53416 46114
27702 23155 43680 51291 42225 37860 20400 22965
25530 13759 36631 41789 50755 53334 27241 15484
36564 22317 40081 41694 45211 50565 27023 8154 15216
22222 29284 43352 57420 53769 16003 23880 26263
36523 29122 39102 49642 42816 45381 27921 38566
20210 22775 14045 36469 40224 41599 45354 50484
26942 8059 22127 36307 41465 50375 26861 23224 15922
21993 26406 44058 29027 39455 49995 38238 12257
14836 29856 35804 39321 50824 53389 57858 46087
27731 23366 43653 14188 42436 38785 15243 20373
25503 40034 45640 50294 27228 30745 51377 22360
42171 37806 19450 7679 15189 30209 35709 50729 53308
27299 15542 26082 36510 21479 39131 43572 49615
42341 38704 15162 24100 29230 43410 52236 57478
38595 15081 20183 23938 25341 29096 51968 40197
42762 45327 50513 26971 45260 27800 23197 15895
21980 26435 36415 29014 39274 49534 12244 15761
29829 36281 43315 50349 57383 38514 20326 23843
43248 29449 50081 38324 12203 14782 23776 28906
51778 40007 42600 45165 27705 23340 14246 51588
21885 42382 37835 19423 12149 29748 40456 45698
50716 53337 27286 15571 26055 36091 22418 43601
57616 38677 15135 24129 29259 35767 49891 38134
15068 26504 29069 51493 42287 37754 23150 51398
42220 38569 45603 20157 23016 27191 15714 25974
36682 22323 39247 41952 50459 27057 22256 40076
47110 50392 57426 38487 14973 23830 26409 43221
28988 39808 50068 38353 12190 14811 23749 26314
28879 51303 42573 46104 27916 23369 43194 14275
34795 37374 23722 31232 51752 29777 39981 42658
45223 50297 26867 8166 36302 21943 43364 39713 49973
12095 23668 26219 28798 39618 49878 53395 12028
15545 26029 21496 43547 14194 51536 42330 37727
27726 24075 29345 57481 38556 45590 20424 22989
27458 15687 36207 41925 45456 30852 51372 22229
44070 39523 49783 53538 16136 26396 36768 29017
39333 41898 49649 11771 25839 22202 52242 57400
38461 15031 20329 22908 25571 43167 13814 34782
38299 41844 45361 23695 28192 30757 51725 22372
40024 42631 45266 50508 27078 23427 14249 44289
39700 53824 15946 26206 36578 29723 39143 50355
27289 15756 26072 21469 43310 14167 34687 23614
29332 39592 49852 38137 42550 45171 19949 26983
23346 51482 42416 37813 27812 23265 14059 51401
44099 39510 50946 53511 27432 15661 25977 36741
39376 41871 53444 15566 22175 43596 29237 47113
57373 38728 15298 20316 23833 25558 35818 29075

49595 42769 28165 30800 51320 42226 37623 20387
22966 14236 36660 39281 41790 50784 53349 27242
15471 36551 22318 40082 41709 45240 50566 27052 8169
15203 18429 25463 43339 53770 16032 23643 26292
44168 28913 39565 49881 38348 42579 45382 27922
23319 14141 42389 27841 23252 14046 36470 39987
45593 50471 27405 15704 29772 36336 41466 50404
26862 23211 21994 44073 29504 39484 50024 38253
12258 14823 26035 35791 39322 53390 46116 27760
23157 43654 13951 51293 42199 38786 15272 20374
22995 25532 13817 36689 41819 50757 54288 27215
30746 51378 22347 42648 45213 27081 8156 15190 30210
35710 39227 50730 53295 16005 26321 36525 29124
39160 43559 49644 42342 38691 20279 43425 38624
15082 20212 23729 25342 28859 51731 40198 42553
45356 50514 27000 8061 13303 36309 41439 27787 23198
15924 21967 26464 44060 29029 39513 49997 53528
12231 15762 29830 36282 43792 50350 57860 46145
27733 24320 43235 29450 50082 38311 15245 19955
25561 40036 45166 27706 23103 51351 21886 42173
37864 19452 22969 12150 15667 29735 36635 41905
50703 53338 27301 15600 26084 36568 22433 39133
43602 50569 57603 38678 15164 24130 29288 43412
57536 38597 15055 23940 26267 29070 51494 42764
45385 26973 38570 20158 22779 15953 26437 36473
29968 39276 41715 50488 27058 8119 22243 36255 43317
50379 57441 38516 14974 23845 26410 43222 28975
39571 50055 38354 12205 14840 23750 28908 51780
55297 42574 46091 27679 23370 43657 14304 42440
37837 20377 27411 29778 39982 45700 50298 27344
15573 36093 22420 43127 39714 49974 38259 15193
23655 29261 35825 49893 53424 12015 15546 26030
21483 43576 51523 42345 37756 24104 29346 52352
57482 38543 45605 20187 22990 27249 15716 36684
22325 40201 41926 45443 50461 27031 22230 47168
57428 53777 15899 23888 26383 36531 29018 39334
49650 12248 14813 26316 29833 52257 57387 38462
20330 22895 43196 14277 34797 38328 41831 45362
23724 30758 51726 22135 40011 42660 45281 50271
26869 23456 14250 51592 22001 44290 39687 50003
12153 26221 29752 39620 50832 53397 27290 15519
26059 21470 43549 14196 42332 38681 15251 24077
29319 35771 49839 38138 45648 19950 27460 30977
51497 42403 37814 23266 51402 44128 39525 50737
53540 27195 15662 25978 36742 21375 39363 41900
49623 11773 22204 29238 47114 52244 57374 38491
15089 20303 23834 25573 43225 29104 50072 38301
42770 45335 23753 28166 30787 51307 42689 45268
28032 23429 14223 36647 39282 53350 15948 36580
29725 40097 41710 45227 50357 26815 8170 18430 21947
43368 29457 49977 12211 23672 26279 28914 39566
49882 38111 42608 45173 27937 23348 14142 51484
42390 37843 27842 23239 14061 44101 40464 45594
50948 53569 27406 15691 25951 36323 41929 30856
22233 44074 29267 39471 49787 38254 15300 26512
35820 29077 39337 49597 42295 27747 23158 51294
42228 38577 15035 20389 23024 25519 13818 36690
39255 41848 50758 54275 27244 30761 51841 22376
40084 42635 45214 50624 27082 8143 15205 26417 43341
39704 53772 16006 23645 26322 36526 28887 39147
49407 42581 46336 27924 23377 43426 14171 34803
20199 23730 29336 51760 39989 42554 45119 50529
26987 8062 36310 41468 37817 27816 23213 15911 21996
26227 44047 29030 39514 49998 53515 12260 15777
26037 36745 39324 43779 53448 46146 27734 24083
43712 29241 57489 38788 15246 20432 22997 25562
13791 36215 41821 28169 30748 51380 22349 42174
37627 19439 22970 16144 30212 36664 39229 41906
50732 53353 27302 15587 25847 36555 22434 39134
43617 50570 57632 38693 15151 20337 25467 43399
38598 15084 23703 26296 28861 51733 40256 42527
45386 50516 26974 23323 14257 42393 27789 23256
15954 26438 36474 29955 39039 50475 27521 15764
29888 36284 43318 50408 57442 38503 23846 43237
29452 39600 50084 38369 12206 14827 19957 25087
55298 46120 27708 23161 43658 14067 51409 42203
37838 20378 22943 27440 15669 29793 36637 41879
50761 53340 27331 15574 36094 22407 43604 47121
57605 38736 15194 24132 29262 35826 49894 53411
16009 26269 29128 43563 51552 42346 37743 20283
38572 45606 20216 22781 27250 15479 36447 22326
40202 41717 45472 50462 27060 8177 13307 22245 36313
43347 50381 57415 53778 15928 23875 26412 44176
29033 39573 50113 38356 12235 14814 29834 52258
57864 46093 27737 23372 43183 14278 34798 38315
45825 19903 27413 29780 40040 45282 50300 26870
23219 51355 22002 44081 39716 50032 38261 12154
14719 26222 29739 35799 50819 53398 27305 15548
26088 21485 43550 14183 51525 42319 38682 15280
24078 29348 43416 57484 38601 45635 20189 23944
27223 30978 51498 22355 42880 45445 27089 39526
50738 53303 15901 26441 36533 29020 39392 41663
49652 11774 8123 22191 43321 52231 57389 38520 15090
20332 23849 25574 43226 29091 50059 38302 42785
45364 23754 30816 51784 40013 42690 45255 27795
23430 14252 21975 44292 39745 50005 12127 29726
40098 45704 50358 27292 15577 26061 22424 43131
29458 49978 38207 15253 23659 29377 35773 49897
38140 42595 45174 27938 23335 51471 42405 37872
23268 14062 51404 44102 40451 45609 50711 53570
27197 15720 25980 36800 22329 39365 41930 50577
27035 22234 29296 47116 57432 38493 15063 23836
26499 35583 29078 39338 49598 42772 45393 28224
30789 51309 42215 38578 20390 23011 14281 36705
39284 41835 54304 30762 51842 22139 40071 42664
45229 50387 26873 8172 15206 21949 26418 43342 28983
39691 49951 12213 23646 26337 28916 39624 49884
53401 42582 46099 27911 23378 43665 14200 42448
37845 27844 24193 29323 51747 39990 45596 50530
27464 15693 36325 41455 37818 23214 21759 44076
29269 39529 49789 53544 12023 15778 26038 36746
21491 39311 43808 49627 42353 27749 24112 29242
52248 57490 38551 15037 20419 22998 25577 13820
36692 40209 41822 45339 54277 28170 30735 51367
22350 42637 45272 27084 23433 16131 26391 36651
39230 53354 16064 26324 36584 29841 39149 43618
50361 57395 38694 20338 22903 43428 14173 34805
11263 23732 26283 28862 51734 40019 42556 45177
50503 26989 23352 14258 51600 42394 37791 27790
23243 15969 26229 44105 29984 39516 50952 53517
27522 15751 26067 36271 43781 46148 24085 43238
29215 39587 49847 38370 15304 19958 25564 29081
51505 42299 27695 23162 51410 42232 37629 20393
22972 27427 15670 29794 36638 39259 41908 50762
53327 27360 15589 36557 22436 40088 43591 47122
50572 57606 38723 15209 20311 25469 43457 53888
16010 23761 26270 28891 51315 42585 45388 27928
23325 14231 34751 20203 22782 15956 36476 29957
39993 41718 45235 50477 27047 8178 22246 36314 43376
50382 57444 53793 15915 23904 26175 44163 29034
39574 50114 38343 12264 14829 26041 55300 46094
27738 23135 43660 14069 42205 38792 45826 20380
23001 27414 15699 29767 36219 41937 50287 27333
30864 51384 22465 44082 39479 50019 38262 15196

30216 35828 39345 50848 53413 27306 15535 25851
21486 43565 51526 42348 38697 15267 20285 25527
43403 38602 45664 20190 23707 27252 30769 51737
22384 40204 42643 45446 50520 27090 8151 13309 43349
58369 53780 15902 23877 26442 36534 29007 39155
49639 12237 15768 29836 43322 52260 57390 38507
20095 23850 43241 29568 50088 38317 42786 45351
19961 26995 40014 45284 27824 23221 14015 51357
22004 44055 39746 50006 53523 12156 15673 29741
36753 41883 50821 53456 27279 15578 26062 22411
43608 29473 57609 38684 15254 24136 29378 35774
49898 38127 45637 28177 30980 51500 22357 42406
37859 19447 40480 45610 50740 53361 27198 15483
25967 36563 22330 39366 41721 50578 27064 8125 15159
22249 29283 43295 52289 57419 38494 15092 23823
26528 43228 29093 39577 50061 38360 42759 45394
23756 30790 51310 42692 46209 27797 23488 14282
36706 39271 50483 27417 29784 40100 45230 50416
26874 7935 21950 43133 29460 39720 49980 38265 12214
14835 23661 26338 28903 35803 49871 53402 42597
46128 27940 23393 43666 14187 51529 42435 37846
24194 29352 59392 40453 45583 50769 53572 27227
15694 36326 22303 41932 45449 27037 22236 29270
39530 49790 53307 16017 26501 36537 29136 39340
43571 49656 42354 37751 27750 24099 52235 57505
38580 15038 20448 23013 25578 13807 36679 40210
41837 45368 54278 30764 51844 22141 40129 42638
45259 50389 26847 23434 16160 21979 26420 44296
29041 39693 50009 12243 26311 29842 39150 50362
57872 46101 27969 23380 43191 14174 34806 38323
15257 23719 29325 51749 40048 42543 45178 50532
26990 23339 51587 42409 37820 23272 15970 26230
44106 29747 39503 50715 53518 27313 15780 26096
36748 21493 39369 43782 49629 42327 24086 29244
47232 57492 38609 15067 20421 23952 25551 29082
51506 42776 45341 28172 30793 51425 42219 37630
20394 22959 16133 26449 36653 39288 41895 53356
15590 36558 22199 40075 43620 47137 50335 57397
38752 15210 20340 23857 25470 43458 28987 50067
12217 23762 26285 28920 51792 40021 42586 45151
27915 23326 14260 42396 37849 27848 23245 15943
36463 29958 39994 45712 50478 27524 15809 26069
36329 43363 53794 23667 44192 29273 39589 49905
38372 12027 14830 26042 21439 51479 42301 27753
23164 14070 51412 42206 38555 45617 20367 23002
27429 15728 29796 36696 39261 41938 50764 54281
27334 30851 51371 22466 44545 47124 57664 38725
15183 26395 35815 39346 53414 16012 26328 28893
43566 51317 42111 38698 20286 22907 43432 14289
34809 41843 20205 23736 27239 30770 51738 22371
39967 42672 45237 50507 27105 8180 13310 36316 43350
39699 58370 53767 15917 23878 26233 44165 29036
39632 50116 53633 12238 15755 26015 43785 46152
27740 24089 43242 29331 49851 38318 45828 19962
27472 15701 36221 41463 27811 23222 51358 21991
44084 39537 50021 53552 12143 15674 29742 36754
39319 41912 50822 53443 27308 15593 25853 22440
43595 29474 52480 57610 38671 15269 20315 25585
43405 38604 45638 23709 28178 30743 51263 22358
42645 45504 27092 23441 14235 36659 50727 53362
15960 26444 36592 29961 39157 41722 50593 27051 8126
22250 43324 52290 57448 38509 15079 23852 26291
43215 29094 39578 50062 38347 42788 45409 19935
26997 55304 46210 27798 23251 14073 44113 39748
50960 53525 27418 15647 29771 36279 41885 50403
27337 15580 22413 43134 29447 39483 49967 38266
15312 23662 29380 35832 49900 53417 42598 46115

27703 23394 43681 51530 42464 37861 20401 25531
40454 45612 50770 53335 27256 15485 36565 22332
40320 41695 45450 50580 27038 8155 15217 22223 29285
43353 57421 53784 16018 23881 26502 36538 29123
39103 49643 42817 45396 31744 52264 57506 38567
20211 23014 14284 36708 40225 41838 45355 50485
26943 22142 40130 45288 50390 26876 23225 15923
22008 26407 44059 29042 39694 50010 38239 12272
14837 26340 29857 35805 50825 53404 57859 46102
27970 23367 43668 14189 42437 38800 15258 24196
29326 51750 40035 45641 50295 27229 30984 51616
22361 42410 37807 19451 30224 39532 50744 53309
27314 15543 26083 36511 21494 39370 43573 49630
42356 38705 15163 24101 29231 43411 52237 57479
38610 15096 20422 23939 25580 29097 51969 40212
42763 45342 54336 30794 51426 42696 45261 27801
23436 16134 21981 26450 36654 29015 39275 49535
12245 29844 40104 47138 50364 57398 38515 20327
23858 43249 29464 50096 38325 12218 14783 23777
26286 28907 51779 40022 42601 45180 27944 23341
14247 51589 42383 37850 23246 15972 44108 29749
40457 45699 50717 53576 27287 15810 26070 36330
22419 43840 57617 24144 29274 39590 49906 38135
15069 26505 29084 51508 42302 37755 27754 23151
51399 42221 38584 45618 20396 23017 27430 15715
25975 36683 39262 41953 54282 30880 51848 22257
40077 44546 47111 50393 57427 38726 15212 23831
26424 43460 28989 39809 50069 12191 23764 26315
28894 51318 42588 46105 27917 23384 43195 14290
34810 37375 20206 23723 31233 51753 30016 39996
42659 45238 50536 27106 8167 36303 43365 39728 53796
15918 23669 26234 44166 28799 39619 49879 53634
12029 15784 26044 21497 43786 14195 51537 42331
27727 24090 29360 57496 38557 45591 20425 23004
27459 15702 36222 41940 45457 28288 30853 51373
22468 44071 39538 50022 53539 16137 26397 36769
39348 41899 53472 15594 25854 22203 43624 52243
57401 38700 15270 20344 22909 25586 43406 13815
34783 41845 23710 28193 30772 51740 22373 40025
42646 45267 50509 27079 23442 14264 44304 39701
58372 53825 15947 26207 36579 29962 39158 50594
27528 15757 26073 43311 38510 23615 43244 29333
39593 49853 38376 42551 45410 19964 26998 23347
51483 42417 27813 23280 14074 51416 44114 39511
50947 53526 27433 15676 29800 36756 39377 41886
50880 53445 27338 15567 22414 43597 29476 47128
57612 38729 15299 20317 25559 35819 53418 46592
28180 30801 43682 51321 42227 37862 20402 22967
14237 36661 41791 50785 53364 27243 15486 36566
22319 40083 41724 45241 50567 27053 8184 15218 22252
29286 43354 52292 57422 53771 16033 23882 26293
44169 29152 39580 50120 38349 42818 45383 27923
46212 27856 23253 14047 36471 40226 45832 50486
27420 15705 29773 36337 41467 50405 26863 23226
21995 44088 29505 39485 50025 38268 12259 14838
29858 35806 39323 50826 53391 57888 46117 27761
23396 43655 14190 51532 42438 38787 15273 20375
25533 40512 45642 50772 54289 27230 30747 51379
22362 42649 45452 27096 8157 15191 30211 35711 50731
53310 16020 26560 36540 29125 39161 43574 49645
42343 38706 24102 43440 52238 57508 38625 15083
20213 23968 25343 29098 51970 40199 42792 45357
50515 27001 40132 45262 27802 23199 15925 21982
26465 44061 29044 39752 50012 53529 12246 15763
29831 36283 43793 50351 57861 46160 27972 24321
43250 29451 50083 38326 15260 23778 29384 51808
40037 42602 45167 27707 23342 51590 21887 42412

37865 19453 12151 29750 40458 45728 50718 53339
27316 15601 26085 36569 22448 39372 43603 50584
57618 38679 15165 24131 29289 43413 57537 38612
15070 23941 26506 29071 51495 42765 45400 30796
51428 42222 38571 20159 23018 16192 26452 36712
29969 39277 41954 50489 27059 22258 40078 47140
50394 57456 38517 14975 23860 26411 43223 28990
39810 50070 38355 12220 14841 23751 26344 28909
51781 55312 42575 46106 27918 23371 43672 14305
42441 37852 24200 31234 51754 29779 39983 45701
50299 27345 15812 36332 22421 43366 39715 49975
23670 29276 39648 49908 53425 12030 15547 26031
21498 43577 51538 42360 37757 27756 24105 29347
52353 57483 38558 45620 20426 22991 27488 15717
36685 40216 41927 45458 54284 30854 51374 22231
44548 47169 57429 54016 16138 23889 26398 36770
29019 39335 49651 12249 26317 29848 52272 57402
38463 20331 22910 43197 14292 34812 38329 41846
45363 23725 28194 30759 51727 22374 40026 42661
45296 50510 27108 23457 14251 51593 44291 39702
53826 15976 26236 44224 29753 39621 50833 53636
27291 15758 26074 21471 43788 14197 42333 24092
29334 39594 49854 38139 45649 19951 27461 30992
51512 42418 37815 27814 23267 51403 44129 39540
50976 53541 27434 15663 25979 36743 39378 41901
53446 15596 22205 43598 29239 47115 52245 57375
38730 15328 20318 23835 25588 43464 29105 50073
42771 23768 28167 30802 51322 42704 45269 28033
23444 14238 36662 39283 50786 53351 15949 36581
29964 40112 41711 45242 50596 27054 8171 18431 43369
53800 16034 23673 26294 44170 28915 39567 49883
38350 42609 45412 27952 23349 14143 51485 42391
27843 23254 14076 44116 40465 45595 50949 53584
27407 15706 29774 36338 41944 50406 27340 30857
22472 44075 29506 39486 50026 38255 15301 26513
35821 39352 53420 46118 27762 23159 43684 51295
42229 38816 15274 20404 23025 25534 13819 36691
41849 50759 54290 27245 30776 51856 22377 40085
42650 45215 50625 27083 8158 15220 30240 43356 39705
58376 53773 16007 23884 26323 36527 29126 39162
49646 42820 46337 27925 43427 38626 20214 23731
29337 51761 40228 42555 45358 50544 27002 8063 36311
41469 27817 23228 15926 21997 26466 44062 29031
39515 49999 53530 12261 15792 29860 36760 39325
43794 50828 53449 57862 46147 27735 24322 43713
29480 57728 38789 15247 20433 25563 40038 45644
28184 30749 51381 22364 42175 37866 19454 22971
16145 30213 36665 41907 50733 53368 27303 15602
26086 36570 22435 39135 43632 50571 57633 38708
15166 24160 29290 43414 52296 57538 38599 15085
23942 26297 29100 51972 40257 42766 45387 50517
26975 46216 27804 23257 15955 26439 36475 29970
39278 50490 27536 15765 29889 36285 43319 50409
57443 38518 23847 43252 29453 39601 50085 38384
12207 14842 23780 28910 51782 55299 42604 46121
27709 23400 43659 14306 51648 42442 37839 20379
27441 29808 40460 45702 50776 53341 27346 15575
36095 22422 43605 47360 57620 38737 15195 24133
29263 35827 49895 53426 16024 26508 29129 43578
51553 42347 37758 24106 52354 57512 38573 45607
20217 23020 27251 15718 36686 22327 40203 41956
45473 50463 27061 22260 40136 47170 50396 57430
53779 15929 23890 26413 44177 29048 39812 50128
38357 12250 14815 26318 29835 52259 57865 46108
27976 23373 43198 14279 34799 38330 45840 23726
31236 51756 29781 40041 42662 45283 50301 26871
23458 51594 22003 44320 39717 50033 12155 26223

29754 39622 50834 53399 27320 15549 26089 21500
43551 14198 51540 42334 38683 15281 24079 29349
43417 57485 38616 45650 20428 23945 27462 30979
51499 42881 45460 30912 51432 44130 39527 50739
53542 16140 26456 36772 29021 39393 41902 49653
11775 22206 47144 52246 57404 38521 15091 20333
23864 25575 43227 29106 50074 38303 42800 45365
23755 28196 30817 51785 40028 42691 45270 28034
23431 14253 44293 39760 53828 15950 36582 29727
40099 45705 50359 27293 15816 26076 22425 43370
29459 49979 23674 29392 39596 49912 38141 42610
45175 27939 23350 51486 42420 37873 27872 23269
14063 51405 44103 40466 45624 50950 53571 27436
15721 25981 36801 39380 41931 54400 30858 22235
44552 29297 47117 57433 38732 15302 23837 26514
35822 29079 39339 49599 42773 28225 30804 51324
42230 38579 20391 23026 14296 36720 39285 41850
50788 54305 27246 30763 51843 22378 40086 42665
45244 50626 27112 8173 15207 26419 43343 39706 53774
16036 23647 26352 44172 28917 39625 49885 53640
42583 46338 27926 23379 43904 14201 42449 27845
24208 29338 51762 39991 45597 50531 27465 15708
36340 41470 37819 27818 23215 21998 44077 29508
39544 50028 53545 12262 15779 26039 36747 39326
43809 53450 46176 27764 24113 43714 29243 52249
57491 38790 15276 20434 22999 25592 13821 36693
41823 54292 28171 30750 51382 22351 42652 45273
27085 23448 16146 30214 36666 39231 50734 53355
16065 26325 36585 30080 39164 43619 50600 57634
38695 20339 43429 38628 15086 23733 26298 28863
51735 40258 42557 45416 50518 27004 23353 14259
51601 42395 27791 23258 15984 26468 44120 29985
39517 50953 53532 27523 15766 29890 36286 43796
50410 57920 46149 24324 43239 29454 39602 50086
38371 15305 19959 25565 55328 46122 27710 23163
43688 51411 42233 37868 20408 22973 27442 15671
29795 36639 41909 50763 53342 27361 15604 36572
22437 40089 43606 47123 50573 57607 38738 15224
24134 29292 43472 57540 53889 16011 24000 26271
29130 51554 42824 45389 27929 38574 20218 22783
15957 36477 29972 40232 41719 45474 50492 27062 8179
22247 36315 43377 50383 57445 53808 15930 23905
26414 44178 29035 39575 50115 38358 12265 14844
29864 52736 55301 57866 46095 27739 23374 43661
14308 42444 38793 45827 20381 27415 29782 40042
45760 50302 27348 30865 51385 22480 44083 39718
50034 38263 15197 30217 35829 50849 53428 27307
15550 26090 21487 43580 51527 42349 38712 15282
24108 29350 43418 52356 57486 38603 45665 20191
23946 27253 31008 51976 22385 40205 42882 45447
50521 27091 47172 58384 53781 15903 23892 26443
36535 29022 39394 49654 12252 15769 29837 43323
52261 57391 38522 20334 23851 43256 29569 50089
38332 42787 45366 23784 30818 51786 40015 42720
45285 27825 23460 14254 51596 22005 44294 39747
50007 12157 29756 40576 45706 50836 53457 27294
15579 26063 22426 43609 29488 57624 38685 15255
24137 29379 35775 49899 38142 45652 28416 30981
51501 42407 37874 23270 51406 44132 40481 45611
50741 53600 27199 15722 25982 36802 22331 39367
41960 50579 27065 22264 29298 47118 52304 57434
38495 15093 23838 26529 43229 29108 39816 50076
38361 42774 45395 23757 28226 30791 51311 42693
46224 28036 23489 14283 36707 39286 54306 31240
51872 29785 40101 42666 45231 50417 26875 8174 21951
43372 29461 39721 49981 12215 23676 26339 28918
39626 49886 53403 42612 46129 27941 23408 43667

14202 51544 42450 37847 27846 24195 29353 59393
40468 45598 51008 53573 27466 15695 36327 41933
45464 30860 22237 44078 29271 39531 49791 53546
16256 26516 36776 29137 39341 43810 49657 42355
27751 24114 52250 57520 38581 15039 20449 23028
25579 13822 36694 40211 41852 45369 54279 28200
30765 51845 22380 40144 42639 45274 50628 27086
23435 16161 26421 44297 39708 53832 16066 26326
36586 29843 39151 50363 57873 46340 27984 23381
43430 14175 34807 23734 29340 51764 40049 42558
45179 50533 26991 23354 51602 42424 37821 27820
23273 15971 26231 44107 29986 39518 50954 53519
27552 15781 26097 36749 39384 43783 53452 46150
24087 43716 29245 47233 57493 38848 15306 20436
23953 25566 29083 51507 42777 28173 30808 51440
42234 37631 20395 22974 16148 30272 36668 39289
41910 50792 53357 27362 15591 36559 22438 40090
43621 47152 50574 57636 38753 15211 20341 25471
43459 53890 16040 23763 26300 28921 51793 40260
42587 45390 27930 23327 14261 42397 27849 23260
15958 36478 29959 39995 45713 50479 27525 15824
29892 36344 43378 50412 57446 53795 23906 44193
29512 39604 50144 38373 12266 14831 26043 55302
46124 27768 23165 43662 14071 51413 42207 38794
45856 20382 23003 27444 15729 29797 36697 41939
50765 54296 27335 30866 51386 22467 44560 47125
57665 38740 15198 30218 35830 39347 50850 53415
16013 26329 29132 43567 51556 42350 38699 20287
43433 38632 45666 20220 23737 27254 30771 51739
22386 40206 42673 45476 50522 27120 8181 13311 36317
43351 58371 53782 15932 23879 26472 44180 29037
39633 50117 53648 12239 15770 29838 43800 52262
57868 46153 27741 24328 43243 29570 50090 38319
45829 19963 27473 40044 45286 27826 23223 51359
22006 44085 39776 50036 53553 12158 15675 29743
36755 41913 50823 53458 27309 15608 26092 22441
43610 29475 52481 57611 38686 15284 24138 29408
43420 57544 38605 45639 23948 28179 30982 51502
22359 42884 45505 27093 40482 50742 53363 15961
26445 36593 29976 39396 41723 50608 27066 8127 22251
43325 52291 57449 38524 15094 23853 26530 43230
29095 39579 50063 38362 42789 45424 23758 30820
51788 55305 42694 46211 27799 23490 14312 44352
39749 50961 27419 29786 40102 45708 50418 27352
15581 22428 43135 29462 39722 49982 38267 15313
23663 29381 35833 49901 53432 42599 46130 27942
23395 43696 51531 42465 37876 24224 29354 52360
59394 40455 45613 50771 53574 27257 15724 36804
22333 40321 41934 45451 50581 27039 22238 29300
47176 57436 53785 16019 23896 26503 36539 29138
39342 49658 42832 45397 28228 31745 52265 57507
38582 20450 23015 14285 36709 40240 41839 45370
54308 30766 51846 22143 40131 42668 45289 50391
26877 23464 16162 22009 26422 44298 29043 39695
50011 12273 26341 29872 39628 50840 53405 57874
46103 27971 23382 43669 14204 42452 38801 15259
24197 29327 51751 40050 45656 50534 27468 30985
51617 42411 37822 23274 44136 30225 39533 50745
53548 27315 15782 26098 36750 21495 39371 43812
49631 42357 24116 29246 47234 52252 57494 38611
15097 20423 23954 25581 29112 51984 40213 42778
45343 54337 28174 30795 51427 42697 45276 28040
23437 16135 26451 36655 39290 53358 16068 36588
29845 40105 43622 47139 50365 57399 38754 20342
23859 43488 29465 50097 12219 23792 26287 28922
51794 40023 42616 45181 27945 23356 14262 51604
42398 37851 27850 23247 15973 44109 29988 40472

45714 50956 53577 27526 15811 26071 36331 43841
61440 24145 44194 29275 39591 49907 38374 15308
26520 29085 51509 42303 27755 23166 51414 42236
38585 45619 20397 23032 27431 15730 29798 36698
39263 41968 50766 54283 27364 30881 51849 22496
40092 44547 47126 50632 57666 38727 15213 26425
43461 39824 53892 16014 23765 26330 28895 51319
42589 46344 27932 23385 43434 14291 34811 20207
23738 31248 51768 30017 39997 42674 45239 50537
27107 8182 36318 43380 39729 58400 53797 15919 23908
26235 44167 29038 39634 50118 53635 12268 15785
26045 43787 55360 46154 27742 24091 43720 29361
57497 38796 45830 20440 23005 27474 15703 36223
41941 28289 30868 51388 22469 44086 39539 50023
53554 16152 30220 36784 39349 41914 50852 53473
27310 15595 25855 22442 43625 52482 57640 38701
15271 20345 25587 43407 38606 45668 23711 28208
30773 51741 22388 40264 42647 45506 50524 27094
23443 14265 44305 58373 53840 15962 26446 36594
29963 39159 50595 27529 15772 29896 43326 52320
57450 38511 23854 43245 29572 39608 50092 38377
42790 45411 19965 26999 55306 46240 27828 23281
14075 51417 44115 39750 50962 53527 27448 15677
29801 36757 41887 50881 53460 27339 15582 22415
43612 29477 47129 57613 38744 15314 24140 29382
35834 49902 53419 46593 28181 31040 43683 51560
42466 37863 20403 40484 45614 50800 53365 27258
15487 36567 22334 40322 41725 45480 50582 27068 8185
15219 22253 29287 43355 52293 57423 53786 16048
23883 26532 44184 29153 39581 50121 38364 42819
45398 31746 52266 57984 46213 27857 23492 14286
36710 40227 45833 50487 27421 29788 40160 45290
50420 26878 23227 22010 44089 29520 39724 50040
38269 12274 14839 26342 29859 35807 50827 53406
57889 46132 28000 23397 43670 14191 51533 42439
38802 15288 24198 29356 59396 40513 45643 50773
54528 27231 30986 51618 22363 42888 45453 27097
30226 39534 50746 53311 16021 26561 36541 29140
39400 43575 49660 42358 38707 24103 43441 52239
57509 38640 15098 20452 23969 25582 29099 51971
40214 42793 45372 54338 30824 51904 40133 42698
45263 27803 23438 16164 21983 26480 44300 29045
39753 50013 12247 29846 40106 47616 50366 57876
46161 27973 24336 43251 29466 50098 38327 15261
23779 29385 51809 40052 42603 45182 27946 23343
51591 42413 37880 23276 15974 44110 29751 40459
45729 50719 53578 27317 15840 26100 36808 22449
39373 43842 50585 57619 24146 29304 47236 57552
38613 15071 23956 26507 29086 51510 42780 45401
28232 30797 51429 42223 38586 20398 23019 16193
26453 36713 39292 41955 54312 30882 51850 22259
40079 44576 47141 50395 57457 38756 15214 23861
26426 43462 28991 39811 50071 12221 23766 26345
28924 51796 55313 42590 46107 27919 23386 43673
14320 42456 37853 27852 24201 31235 51755 30018
39998 45716 50538 27584 15813 36333 43367 39730
53798 23671 44196 29277 39649 49909 53664 12031
15786 26046 21499 43816 51539 42361 27757 24120
29362 52368 57498 38559 45621 20427 23006 27489
15732 36700 40217 41942 45459 54285 28290 30855
51375 22470 44549 47184 57668 54017 16139 26399
36771 39350 53474 16072 26332 29849 43626 52273
57403 38702 20346 22911 43436 14293 34813 41847
23740 28195 30774 51742 22375 40027 42676 45297
50511 27109 23472 14266 51608 44306 39703 58374
53827 15977 26237 44225 29992 39636 51072 53637
27530 15759 26075 43789 46156 24093 43246 29335

39595 49855 38378 45888 19966 27476 30993 51513
42419 27815 23282 51418 44144 39541 50977 53556
27435 15678 29802 36758 39379 41916 50882 53447
27368 15597 22444 43599 29478 47130 52484 57614
38731 15329 20319 25589 43465 53896 46594 23769
28182 30803 51323 42705 45508 28048 23445 14239
36663 50787 53366 15964 36596 29965 40113 41726
45243 50597 27055 8186 22254 43384 52294 57452 53801
16035 23912 26295 44171 29154 39582 50122 38351
42848 45413 27953 55308 46214 27858 23255 14077
44117 40704 45834 50964 53585 27422 15707 29775
36339 41945 50407 27341 30872 22473 44090 29507
39487 50027 38270 15316 30336 35836 39353 50856
53421 57890 46119 27763 23398 43685 51534 42468
38817 15275 20405 25535 40514 45672 50774 54291
27260 30777 51857 22392 40324 42651 45454 50640
27098 8159 15221 30241 43357 58377 53788 16022 23885
26562 36542 29127 39163 49647 42821 46352 31748
43442 52268 57510 38627 20215 23970 29576 52000
40229 42794 45359 50545 27003 40134 45292 27832
23229 15927 22012 26467 44063 29046 39754 50014
53531 12276 15793 29861 36761 43795 50829 53464
57863 46162 27974 24323 43728 29481 57729 38804
15262 24256 29386 51810 40039 45645 28185 30988
51620 22365 42414 37867 19455 30228 40488 45730
50748 53369 27318 15603 26087 36571 22450 39374
43633 50586 57648 38709 15167 24161 29291 43415
52297 57539 38614 15100 23943 26536 29101 51973
40272 42767 45402 54340 30798 51430 42700 46217
27805 23496 16194 26454 36714 29971 39279 50491
27537 29904 40108 47142 50424 57458 38519 23862
43253 29468 39840 50100 38385 12222 14843 23781
26346 28911 51783 55314 42605 46136 27948 23401
43674 14307 51649 42443 37854 24202 31264 59400
29809 40461 45703 50777 53580 27347 15814 36334
22423 43844 47361 57621 24148 29278 39650 49910
53427 16025 26509 29144 43579 51568 42362 37759
27758 24107 52355 57513 38588 45622 20456 23021
27490 15719 36687 40218 41957 45488 54286 30884
51852 22261 40137 44550 47171 50397 57431 54018
16168 23891 26428 44416 29049 39813 50129 12251
26319 29850 52274 57880 46109 27977 23388 43199
14294 34814 38331 45841 23727 31237 51757 30020
40056 42663 45298 50540 27110 23459 51595 44321
39732 53856 15978 26238 44226 29755 39623 50835
53638 27321 15788 26104 21501 43790 14199 51541
42335 24094 29364 47240 57500 38617 45651 20429
23960 27463 30994 51514 42896 45461 28292 30913
51433 44131 39542 50978 53543 16141 26457 36773
39408 41903 53476 15598 22207 43628 47145 52247
57405 38760 15330 20348 23865 25590 43466 29107
50075 42801 23770 28197 30832 51800 40029 42706
45271 28035 23446 14268 44308 39761 58432 53829
15951 36583 29966 40114 45720 50598 27532 15817
26077 43371 53802 23675 44200 29393 39597 49913
38380 42611 45414 27954 23351 51487 42421 27873
23284 14078 51420 44118 40467 45625 50951 53586
27437 15736 29804 36816 39381 41946 50884 54401
27342 30859 22474 44553 29536 47132 57672 38733
15303 26515 35823 39354 53422 46596 28240 30805
43686 51325 42231 38818 20406 23027 14297 36721
41851 50789 54320 27247 30778 51858 22379 40087
42680 45245 50627 27113 8188 15222 30242 43358 39707
58378 53775 16037 23886 26353 44173 29156 39640
50124 53641 42822 46339 27927 43905 46272 27860
24209 29339 51763 40230 45836 50546 27480 15709
36341 41471 27819 23230 21999 44092 29509 39545

50029 53560 12263 15794 29862 36762 39327 43824
50830 53451 57892 46177 27765 24352 43715 29482
52488 57730 38791 15277 20435 25593 40516 45646
54293 28186 30751 51383 22366 42653 45512 27100
23449 16147 30215 36667 50735 53370 16080 26564
36600 30081 39165 43634 50601 57635 38710 24162
43444 52298 57568 38629 15087 23972 26299 29102
51974 40259 42796 45417 50519 27005 55424 46218
27806 23259 15985 26469 44121 30000 39756 50968
53533 27538 15767 29891 36287 43797 50411 57921
46164 24325 43254 29455 39603 50087 38386 15320
23782 29388 51812 55329 42606 46123 27711 23402
43689 51650 42472 37869 20409 27443 29810 40462
45732 50778 53343 27376 15605 36573 22452 40328
43607 47362 50588 57622 38739 15225 24135 29293
43473 57541 53904 16026 24001 26510 29131 51555
42825 45404 31752 52384 57514 38575 20219 23022
16196 36716 29973 40233 41958 45475 50493 27063
22262 40138 47200 50398 57460 53809 15931 23920
26415 44179 29050 39814 50130 38359 12280 14845
26348 29865 52737 55316 57867 46110 27978 23375
43676 14309 42445 38808 45842 24204 31238 51758
29783 40043 45761 50303 27349 31104 51624 22481
44322 39719 50035 30232 39652 50864 53429 27322
15551 26091 21502 43581 51542 42364 38713 15283
24109 29351 43419 52357 57487 38618 45680 20430
23947 27492 31009 51977 40220 42883 45462 54344
30914 51434 44608 47173 58385 54020 16142 23893
26458 36774 29023 39395 49655 12253 29852 47146
52276 57406 38523 20335 23866 43257 29584 50104
38333 42802 45367 23785 28198 30819 51787 40030
42721 45300 28064 23461 14255 51597 44295 39762
53830 15980 44228 29757 40577 45707 50837 53696
27295 15818 26078 22427 43848 29489 57625 24152
29394 39598 49914 38143 45653 28417 30996 51516
42422 37875 27874 23271 51407 44133 40496 45626
50980 53601 27438 15723 25983 36803 39382 41961
54402 30888 22265 44554 29299 47119 52305 57435
38734 15332 23839 26544 43468 29109 39817 50077
42775 23772 28227 30806 51326 42708 46225 28037
23504 14298 36722 39287 50790 54307 31241 51873
30024 40116 42667 45246 50656 27114 8175 43373 39736
53804 16038 23677 26354 44174 28919 39627 49887
53642 42613 46368 27956 23409 43906 14203 51545
42451 27847 24210 29368 59408 40469 45599 51009
53588 27467 15710 36342 41948 45465 28296 30861
22476 44079 29510 39546 50030 53547 16257 26517
36777 39356 43811 53480 46178 27766 24115 43744
52251 57521 38820 15278 20464 23029 25594 13823
36695 41853 54294 28201 30780 51860 22381 40145
42654 45275 50629 27087 23450 16176 30244 44312
39709 58380 53833 16067 26327 36587 30082 39166
50602 58112 46341 27985 43431 38630 23735 29341
51765 40288 42559 45418 50548 27006 23355 51603
42425 27821 23288 15986 26470 44122 29987 39519
50955 53534 27553 15796 29920 36764 39385 43798
50888 53453 57922 46151 24326 43717 29484 47248
57732 38849 15307 20437 25567 55330 46600 28188
30809 43690 51441 42235 37870 20410 22975 16149
30273 36669 41911 50793 53372 27363 15606 36574
22439 40091 43636 47153 50575 57637 38768 15226
24164 29294 43474 52300 57542 53891 16041 24002
26301 29160 52032 40261 42826 45391 27931 46220
27864 23261 15959 36479 29974 40234 45952 50494
27540 15825 29893 36345 43379 50413 57447 53810
23907 44208 29513 39605 50145 38388 12267 14846
29866 52738 55303 57896 46125 27769 23404 43663

14310 51652 42446 38795 45857 20383 27445 29812
40520 45762 50780 54297 27350 30867 51387 22482
44561 47364 57680 38741 15199 30219 35831 50851
53430 16028 26568 29133 43582 51557 42351 38714
24110 43448 52358 57516 38633 45667 20221 23976
27255 31010 51978 22387 40207 42912 45477 50523
27121 40140 47174 58386 53783 15933 23894 26473
44181 29052 39872 50132 53649 12254 15771 29839
43801 52263 57869 46168 27980 24329 43258 29571
50091 38334 45844 23786 31296 51816 40045 42722
45287 27827 23462 51598 22007 44324 39777 50037
12159 29758 40578 45736 50838 53459 27324 15609
26093 22456 43611 29490 52496 57626 38687 15285
24139 29409 43421 57545 38620 45654 23949 28418
30983 51503 42885 45520 30916 51436 44134 40483
50743 53602 16200 26460 36832 29977 39397 41962
50609 27067 22266 47148 52306 57464 38525 15095
23868 26531 43231 29110 39818 50078 38363 42804
45425 23759 28256 30821 51789 55320 42695 46226
28038 23491 14313 44353 39764 54784 31242 51874
29787 40103 45709 50419 27353 15820 22429 43374
29463 39723 49983 23678 29396 39656 49916 53433
42614 46131 27943 23410 43697 51546 42480 37877
27876 24225 29355 52361 59395 40470 45628 51010
53575 27496 15725 36805 40336 41935 45466 54404
30862 22239 44556 29301 47177 57437 54024 16258
23897 26518 36778 29139 39343 49659 42833 28229
31760 52280 57522 38583 20451 23030 14300 36724
40241 41854 45371 54309 28202 30767 51847 22382
40146 42669 45304 50630 27116 23465 16163 26423
44299 39710 53834 16096 26356 44232 29873 39629
50841 53644 57875 46342 27986 23383 43908 14205
42453 24212 29342 51766 40051 45657 50535 27469
31000 51632 42426 37823 27822 23275 44137 30464
39548 50984 53549 27554 15783 26099 36751 39386
43813 53454 46180 24117 43718 29247 47235 52253
57495 38850 15336 20438 23955 25596 29113 51985
42779 54352 28175 30810 51442 42712 45277 28041
23452 16150 30274 36670 39291 50794 53359 16069
36589 30084 40120 43623 47154 50604 57638 38755
20343 43489 53920 16042 23793 26302 28923 51795
40262 42617 45420 27960 23357 14263 51605 42399
27851 23262 15988 44124 29989 40473 45715 50957
53592 27527 15826 29894 36346 43856 50414 57924
61441 24384 44195 29514 39606 50146 38375 15309
26521 55332 46126 27770 23167 43692 51415 42237
38824 45858 20412 23033 27446 15731 29799 36699
41969 50767 54298 27365 30896 51864 22497 40093
44562 47127 50633 57667 38742 15228 30248 43476
39825 58496 53893 16015 24004 26331 29134 51558
42828 46345 27933 43435 38634 20222 23739 31249
51769 30032 40236 42675 45478 50552 27122 8183 36319
43381 58401 53812 15934 23909 26474 44182 29039
39635 50119 53650 12269 15800 29868 43802 52740
55361 57870 46155 27743 24330 43721 29600 57736
38797 45831 20441 27475 40046 45764 28304 30869
51389 22484 44087 39778 50038 53555 16153 30221
36785 41915 50853 53488 27311 15610 26094 22443
43640 52483 57641 38716 15286 24168 29410 43422
52416 57546 38607 45669 23950 28209 31012 51980
22389 40265 42886 45507 50525 27095 48128 58388
53841 15963 26447 36595 29978 39398 50610 27544
15773 29897 43327 52321 57451 38526 23855 43260
29573 39609 50093 38392 42791 45426 23788 30822
51790 55307 42724 46241 27829 23520 14314 51656
44354 39751 50963 27449 29816 40580 45710 50896
53461 27354 15583 22430 43613 29492 47368 57628

38745 15315 24141 29383 35835 49903 53434 46608
28420 31041 43698 51561 42467 37878 24226 52362
59424 40485 45615 50801 53604 27259 15726 36806
22335 40323 41964 45481 50583 27069 22268 29302
47178 52308 57438 53787 16049 23898 26533 44185
29168 39820 50136 38365 42834 45399 28230 31747
52267 57985 46228 28096 23493 14287 36711 40242
45848 54310 31244 51876 29789 40161 42670 45291
50421 26879 23466 22011 44328 29521 39725 50041
12275 26343 29874 39630 50842 53407 57904 46133
28001 23412 43671 14206 51548 42454 38803 15289
24199 29357 59397 40528 45658 51012 54529 27470
30987 51619 42889 45468 30920 44138 30227 39535
50747 53550 16260 26576 36780 29141 39401 43814
49661 42359 24118 47264 52254 57524 38641 15099
20453 23984 25583 29114 51986 40215 42808 45373
54339 28204 30825 51905 40148 42699 45278 28042
23439 16165 26481 44301 39768 53836 16070 36590
29847 40107 47617 50367 57877 46400 27988 24337
43490 29467 50099 23794 29400 51824 40053 42618
45183 27947 23358 51606 42428 37881 27880 23277
15975 44111 29990 40474 45744 50958 53579 27556
15841 26101 36809 39388 43843 54408 61442 24147
44672 29305 47237 57553 38852 15310 23957 26522
29087 51511 42781 28233 30812 51444 42238 38587
20399 23034 16208 30276 36728 39293 41970 50796
54313 27366 30883 51851 22498 40094 44577 47156
50634 57696 38757 15215 26427 43463 39826 53894
16044 23767 26360 28925 51797 55552 42591 46346
27934 23387 43912 14321 42457 27853 24216 31250
51770 30019 39999 45717 50539 27585 15828 36348
43382 39731 58402 53799 23910 44197 29516 39664
50148 53665 12270 15787 26047 43817 55362 46184
27772 24121 43722 29363 52369 57499 38798 45860
20442 23007 27504 15733 36701 41943 54300 28291
30870 51390 22471 44564 47185 57669 54032 16154
30222 36786 39351 50854 53475 16073 26333 30088
43627 52512 57642 38703 20347 43437 38636 45670
23741 28210 30775 51743 22390 40266 42677 45536
50526 27124 23473 14267 51609 44307 58375 53842
15992 26476 44240 29993 39637 51073 53652 27531
15774 29898 43804 52322 57928 46157 24332 43247
29574 39610 50094 38379 45889 19967 27477 55336
46242 27830 23283 51419 44145 39780 50992 53557
27450 15679 29803 36759 41917 50883 53462 27369
15612 22445 43614 29479 47131 52485 57615 38746
15344 24142 29412 43480 57548 53897 46595 24008
28183 31042 51562 42944 45509 28049 40486 50802
53367 15965 36597 29980 40352 41727 45482 50612
27070 8187 22255 43385 52295 57453 53816 16050 23913
26534 44186 29155 39583 50123 38366 42849 45428
31776 52744 55309 57986 46215 27859 23494 14316
44356 40705 45835 50965 27423 29790 40162 45768
50422 27356 30873 22488 44091 29522 39726 50042
38271 15317 30337 35837 50857 53436 57891 46134
28002 23399 43700 51535 42469 38832 15290 24228
29358 52364 59398 40515 45673 50775 54530 27261
31016 52096 22393 40325 42890 45455 50641 27099
30256 47180 58392 53789 16023 23900 26563 36543
29142 39402 49662 42836 46353 31749 43443 52269
57511 38642 20454 23971 29577 52001 40244 42795
45374 54368 30826 51906 40135 42728 45293 27833
23468 16166 22013 26482 44302 29047 39755 50015
12277 29876 40584 47618 50844 53465 57878 46163
27975 24338 43729 29496 57744 38805 15263 24257
29387 51811 40054 45660 28424 30989 51621 42415
37882 23278 44140 30229 40489 45731 50749 53608

27319 15842 26102 36810 22451 39375 43872 50587
57649 24176 29306 47238 52312 57554 38615 15101
23958 26537 29116 51988 40273 42782 45403 54341
28234 30799 51431 42701 46232 28044 23497 16195
26455 36715 39294 54314 31360 51880 29905 40109
44578 47143 50425 57459 38758 23863 43492 29469
39841 50101 12223 23796 26347 28926 51798 55315
42620 46137 27949 23416 43675 14322 51664 42458
37855 27854 24203 31265 59401 30048 40476 45718
51016 53581 27586 15815 36335 43845 47376 61444
24149 44198 29279 39651 49911 53666 16264 26524
29145 43818 51569 42363 27759 24122 52370 57528
38589 45623 20457 23036 27491 15734 36702 40219
41972 45489 54287 28320 30885 51853 22500 40152
44551 47186 50636 57670 54019 16169 26429 44417
39828 53952 16074 26334 29851 52275 57881 46348
27992 23389 43438 14295 34815 23742 31252 51772
30021 40057 42678 45299 50541 27111 23474 51610
44336 39733 58404 53857 15979 26239 44227 29994
39638 51074 53639 27560 15789 26105 43791 55364
46158 24095 43724 29365 47241 57501 38856 45890
20444 23961 27478 30995 51515 42897 28293 30928
51448 44146 39543 50979 53558 16156 30280 36788
39409 41918 50912 53477 27370 15599 22446 43629
47160 52486 57644 38761 15331 20349 25591 43467
53898 46624 23771 28212 30833 51801 40268 42707
45510 28050 23447 14269 44309 58433 53844 15966
36598 29967 40115 45721 50599 27533 15832 29900
43386 52324 57454 53803 23914 44201 29632 39612
50152 38381 42850 45415 27955 55310 46244 27888
23285 14079 51421 44119 40706 45864 50966 53587
27452 15737 29805 36817 41947 50885 54416 27343
30874 22475 44568 29537 47133 57673 38748 15318
30338 35838 39355 50858 53423 46597 28241 31044
43687 51564 42470 38819 20407 40544 45674 50804
54321 27262 30779 51859 22394 40326 42681 45484
50642 27128 8189 15223 30243 43359 58379 53790 16052
23887 26592 44188 29157 39641 50125 53656 42823
46354 31750 43920 52270 57988 46273 27861 24448
29578 52002 40231 45837 50547 27481 40164 45294
27834 23231 22014 44093 29524 39784 50044 53561
12278 15795 29863 36763 43825 50831 53466 57893
46192 28004 24353 43730 29483 52489 57731 38806
15292 24258 29416 59456 40517 45647 54532 28187
30990 51622 22367 42892 45513 27101 30230 40490
50750 53371 16081 26565 36601 30096 39404 43635
50616 57650 38711 24163 43445 52299 57569 38644
15102 23973 26538 29103 51975 40274 42797 45432
54342 30828 51908 55425 42702 46219 27807 23498
16224 26484 44360 30001 39757 50969 27539 29906
40110 47620 50426 57936 46165 24340 43255 29470
39842 50102 38387 15321 23783 29389 51813 55344
42607 46138 27950 23403 43704 51651 42473 37884
24232 31266 59402 29811 40463 45733 50779 53582
27377 15844 36812 22453 40329 43846 47363 50589
57623 24150 29308 47296 57556 53905 16027 24016
26511 29146 51570 42840 45405 28236 31753 52385
57515 38590 20458 23023 16197 36717 40248 41959
45490 54316 30886 51854 22263 40139 44580 47201
50399 57461 54048 16170 23921 26430 44418 29051
39815 50131 12281 26349 29880 52752 55317 57882
46111 27979 23390 43677 14324 42460 38809 45843
24205 31239 51759 30022 40058 45776 50542 27588
31105 51625 44323 39734 53858 44256 30233 39653
50865 53668 27323 15790 26106 21503 43820 51543
42365 24124 29366 47242 52372 57502 38619 45681
20431 23962 27493 31024 51992 40221 42898 45463

54345 28294 30915 51435 44609 47188 58624 54021
16143 26459 36775 39410 53478 16076 29853 43630
47147 52277 57407 38762 20350 23867 43496 29585
50105 42803 23800 28199 30834 51802 40031 42736
45301 28065 23476 14270 51612 44310 39763 58434
53831 15981 44229 29996 40592 45722 51076 53697
27534 15819 26079 43849 61448 24153 44202 29395
39599 49915 38382 45892 28432 30997 51517 42423
27875 23286 51422 44148 40497 45627 50981 53616
27439 15738 29806 36818 39383 41976 50886 54403
27372 30889 22504 44555 29538 47134 52544 57674
38735 15333 26545 43469 39832 53900 46598 23773
28242 30807 51327 42709 46464 28052 23505 14299
36723 50791 54322 31256 51888 30025 40117 42682
45247 50657 27115 8190 43388 39737 58408 53805 16039
23916 26355 44175 29158 39642 50126 53643 42852
46369 27957 43907 55368 46274 27862 24211 29369
59409 40708 45838 51024 53589 27482 15711 36343
41949 28297 30876 22477 44094 29511 39547 50031
53562 16272 30340 36792 39357 43826 50860 53481
57894 46179 27767 24354 43745 52490 57760 38821
15279 20465 25595 40518 45676 54295 28216 30781
51861 22396 40384 42655 45514 50644 27102 23451
16177 30245 44313 58381 53848 16082 26566 36602
30083 39167 50603 58113 46356 31808 43446 52328
57570 38631 23974 29580 52004 40289 42798 45419
50549 27007 55426 46248 27836 23289 15987 26471
44123 30002 39758 50970 53535 27568 15797 29921
36765 43799 50889 53468 57923 46166 24327 43732
29485 47249 57733 38864 15322 24260 29390 51814
55331 46601 28189 31048 43691 51680 42474 37871
20411 30288 40492 45734 50808 53373 27378 15607
36575 22454 40330 43637 47392 50590 57652 38769
15227 24165 29295 43475 52301 57543 53906 16056
24003 26540 29161 52033 40276 42827 45406 31754
52386 57992 46221 27865 23500 16198 36718 29975
40235 45953 50495 27541 29908 40168 47202 50428
57462 53811 23922 44209 29528 39844 50160 38389
12282 14847 26350 29867 52739 55318 57897 46140
28008 23405 43678 14311 51653 42447 38810 45872
24206 31268 59404 29813 40521 45763 50781 54536
27351 31106 51626 22483 44800 47365 57681 30234
39654 50866 53431 16029 26569 29148 43583 51572
42366 38715 24111 43449 52359 57517 38648 45682
20460 23977 27494 31011 51979 40222 42913 45492
54346 30944 51912 40141 44610 47175 58387 54022
16172 23895 26488 44420 29053 39873 50133 12255
29854 47624 52278 57884 46169 27981 24344 43259
29586 50106 38335 45845 23787 31297 51817 40060
42723 45302 28066 23463 51599 44325 39792 53860
15982 44230 29759 40579 45737 50839 53698 27325
15848 26108 22457 43850 29491 52497 57627 24154
29424 47244 57560 38621 45655 23964 28419 30998
51518 42900 45521 28352 30917 51437 44135 40498
50982 53603 16201 26461 36833 39412 41963 54432
30890 22267 44584 47149 52307 57465 38764 15334
23869 26546 43470 29111 39819 50079 42805 23774
28257 30836 51804 55321 42710 46227 28039 23506
14328 44368 39765 58436 54785 31243 51875 30026
40118 45724 50658 27592 15821 43375 39738 53806
23679 44204 29397 39657 49917 53672 42615 46370
27958 23411 43936 51547 42481 27877 24240 29370
52376 59410 40471 45629 51011 53590 27497 15740
36820 40337 41950 45467 54405 28298 30863 22478
44557 29540 47192 57676 54025 16259 26519 36779
39358 53482 46656 28244 31761 43746 52281 57523
38822 20466 23031 14301 36725 41855 54324 28203

| | | | | | | | |
|---|---|---|---|---|---|---|---|
| 30782 | 51862 | 22383 | 40147 | 42684 | 45305 | 50631 | 27117 |
| 23480 | 16178 | 30246 | 44314 | 39711 | 58382 | 53835 | 16097 |
| 26357 | 44233 | 30112 | 39644 | 51080 | 53645 | 58114 | 46343 |
| 27987 | 43909 | 46276 | 24213 | 29343 | 51767 | 40290 | 45896 |
| 50550 | 27484 | 31001 | 51633 | 42427 | 27823 | 23290 | 44152 |
| 30465 | 39549 | 50985 | 53564 | 27555 | 15798 | 29922 | 36766 |
| 39387 | 43828 | 50890 | 53455 | 57952 | 46181 | 24356 | 43719 |
| 29486 | 47250 | 52492 | 57734 | 38851 | 15337 | 20439 | 25597 |
| 55808 | 46602 | 54353 | 28190 | 30811 | 51443 | 42713 | 45516 |
| 28056 | 23453 | 16151 | 30275 | 36671 | 50795 | 53374 | 16084 |
| 36604 | 30085 | 40121 | 43638 | 47155 | 50605 | 57639 | 38770 |
| 24166 | 43504 | 52302 | 57572 | 53921 | 16043 | 24032 | 26303 |
| 29162 | 52034 | 40263 | 42856 | 45421 | 27961 | 55428 | 46222 |
| 27866 | 23263 | 15989 | 44125 | 30004 | 40712 | 45954 | 50972 |
| 53593 | 27542 | 15827 | 29895 | 36347 | 43857 | 50415 | 57925 |
| 61456 | 24385 | 44210 | 29515 | 39607 | 50147 | 38390 | 15324 |
| 30344 | 52768 | 55333 | 57898 | 46127 | 27771 | 23406 | 43693 |
| 51654 | 42476 | 38825 | 45859 | 20413 | 27447 | 29814 | 40522 |
| 45792 | 50782 | 54299 | 27380 | 30897 | 51865 | 22512 | 40332 |
| 44563 | 47366 | 50648 | 57682 | 38743 | 15229 | 30249 | 43477 |
| 58497 | 53908 | 16030 | 24005 | 26570 | 29135 | 51559 | 42829 |
| 46360 | 31756 | 43450 | 52388 | 57518 | 38635 | 20223 | 23978 |
| 31488 | 52008 | 30033 | 40237 | 42914 | 45479 | 50553 | 27123 |
| 40142 | 47204 | 58416 | 53813 | 15935 | 23924 | 26475 | 44183 |
| 29054 | 39874 | 50134 | 53651 | 12284 | 15801 | 29869 | 43803 |
| 52741 | 55376 | 57871 | 46170 | 27982 | 24331 | 43736 | 29601 |
| 57737 | 38812 | 45846 | 24264 | 31298 | 51818 | 40047 | 45765 |
| 28305 | 31108 | 51628 | 22485 | 44326 | 39779 | 50039 | 30236 |
| 40608 | 45738 | 50868 | 53489 | 27326 | 15611 | 26095 | 22458 |
| 43641 | 52498 | 57656 | 38717 | 15287 | 24169 | 29411 | 43423 |
| 52417 | 57547 | 38622 | 45684 | 23951 | 28448 | 31013 | 51981 |
| 40280 | 42887 | 45522 | 54348 | 30918 | 51438 | 44612 | 48129 |
| 58389 | 54080 | 16202 | 26462 | 36834 | 29979 | 39399 | 50611 |
| 27545 | 29912 | 47150 | 52336 | 57466 | 38527 | 23870 | 43261 |
| 29588 | 39848 | 50108 | 38393 | 42806 | 45427 | 23789 | 28258 |
| 30823 | 51791 | 55322 | 42725 | 46256 | 28068 | 23521 | 14315 |
| 51657 | 44355 | 39766 | 54786 | 31272 | 59520 | 29817 | 40581 |
| 45711 | 50897 | 53700 | 27355 | 15822 | 22431 | 43852 | 29493 |
| 47369 | 57629 | 24156 | 29398 | 39658 | 49918 | 53435 | 46609 |
| 28421 | 31056 | 43699 | 51576 | 42482 | 37879 | 27878 | 24227 |
| 52363 | 59425 | 40500 | 45630 | 51040 | 53605 | 27498 | 15727 |
| 36807 | 40338 | 41965 | 45496 | 54406 | 30892 | 22269 | 44558 |
| 29303 | 47179 | 52309 | 57439 | 54026 | 16288 | 23899 | 26548 |
| 44424 | 29169 | 39821 | 50137 | 42835 | 28231 | 31762 | 52282 |
| 58000 | 46229 | 28097 | 23508 | 14302 | 36726 | 40243 | 45849 |
| 54311 | 31245 | 51877 | 30028 | 40176 | 42671 | 45306 | 50660 |
| 27118 | 23467 | 44329 | 39740 | 53864 | 16098 | 26358 | 44234 |
| 29875 | 39631 | 50843 | 53646 | 57905 | 46372 | 28016 | 23413 |
| 43910 | 14207 | 51549 | 42455 | 24214 | 29372 | 59412 | 40529 |
| 45659 | 51013 | 54544 | 27471 | 31002 | 51634 | 42904 | 45469 |
| 28300 | 30921 | 44139 | 30466 | 39550 | 50986 | 53551 | 16261 |
| 26577 | 36781 | 39416 | 43815 | 53484 | 46182 | 24119 | 43748 |
| 47265 | 52255 | 57525 | 38880 | 15338 | 20468 | 23985 | 25598 |
| 29115 | 51987 | 42809 | 54354 | 28205 | 30840 | 51920 | 40149 |
| 42714 | 45279 | 28043 | 23454 | 16180 | 30304 | 44316 | 39769 |
| 58440 | 53837 | 16071 | 36591 | 30086 | 40122 | 47632 | 50606 |
| 58116 | 46401 | 27989 | 43491 | 53922 | 23795 | 29401 | 51825 |
| 40292 | 42619 | 45422 | 27962 | 23359 | 51607 | 42429 | 27881 |
| 23292 | 15990 | 44126 | 29991 | 40475 | 45745 | 50959 | 53594 |
| 27557 | 15856 | 29924 | 36824 | 39389 | 43858 | 50892 | 54409 |
| 57926 | 61443 | 24386 | 44673 | 29544 | 47252 | 57792 | 38853 |
| 15311 | 26523 | 55334 | 46604 | 28248 | 30813 | 43694 | 51445 |
| 42239 | 38826 | 20414 | 23035 | 16209 | 30277 | 36729 | 41971 |
| 50797 | 54328 | 27367 | 30898 | 51866 | 22499 | 40095 | 44592 |
| 47157 | 50635 | 57697 | 38772 | 15230 | 30250 | 43478 | 39827 |
| 58498 | 53895 | 16045 | 24006 | 26361 | 29164 | 52036 | 55553 |
| 42830 | 46347 | 27935 | 43913 | 46280 | 27868 | 24217 | 31251 |

| | | | | | | | |
|---|---|---|---|---|---|---|---|
| 51771 | 30034 | 40238 | 45956 | 50554 | 27600 | 15829 | 36349 |
| 43383 | 58403 | 53814 | 23911 | 44212 | 29517 | 39665 | 50149 |
| 53680 | 12271 | 15802 | 29870 | 43832 | 52742 | 55363 | 57900 |
| 46185 | 27773 | 24360 | 43723 | 29602 | 52608 | 57738 | 38799 |
| 45861 | 20443 | 27505 | 40524 | 45766 | 54301 | 28306 | 30871 |
| 51391 | 22486 | 44565 | 47424 | 57684 | 54033 | 16155 | 30223 |
| 36787 | 50855 | 53490 | 16088 | 26572 | 30089 | 43642 | 52513 |
| 57643 | 38718 | 24170 | 43452 | 52418 | 57576 | 38637 | 45671 |
| 23980 | 28211 | 31014 | 51982 | 22391 | 40267 | 42916 | 45537 |
| 50527 | 27125 | 55432 | 48130 | 58390 | 53843 | 15993 | 26477 |
| 44241 | 30008 | 39876 | 51088 | 53653 | 27546 | 15775 | 29899 |
| 43805 | 52323 | 57929 | 46172 | 24333 | 43262 | 29575 | 39611 |
| 50095 | 38394 | 45904 | 23790 | 31300 | 51820 | 55337 | 42726 |
| 46243 | 27831 | 23522 | 51658 | 44384 | 39781 | 50993 | 27451 |
| 29818 | 40582 | 45740 | 50898 | 53463 | 27384 | 15613 | 22460 |
| 43615 | 29494 | 47370 | 52500 | 57630 | 38747 | 15345 | 24143 |
| 29413 | 43481 | 57549 | 53912 | 46610 | 24009 | 28422 | 31043 |
| 51563 | 42945 | 45524 | 31872 | 52392 | 59426 | 40487 | 50803 |
| 53606 | 16204 | 36836 | 29981 | 40353 | 41966 | 45483 | 50613 |
| 27071 | 22270 | 47208 | 52310 | 57468 | 53817 | 16051 | 23928 |
| 26535 | 44187 | 29170 | 39822 | 50138 | 38367 | 42864 | 45429 |
| 28260 | 31777 | 52745 | 55324 | 57987 | 46230 | 28098 | 23495 |
| 14317 | 44357 | 40720 | 45850 | 54788 | 31246 | 51878 | 29791 |
| 40163 | 45769 | 50423 | 27357 | 31112 | 22489 | 44330 | 29523 |
| 39727 | 50043 | 30352 | 39660 | 50872 | 53437 | 57906 | 46135 |
| 28003 | 23414 | 43701 | 51550 | 42484 | 38833 | 15291 | 24229 |
| 29359 | 52365 | 59399 | 40530 | 45688 | 51014 | 54531 | 27500 |
| 31017 | 52097 | 40340 | 42891 | 45470 | 54464 | 30922 | 44616 |
| 30257 | 47181 | 58393 | 54028 | 16262 | 23901 | 26578 | 36782 |
| 29143 | 39403 | 49663 | 42837 | 31764 | 47266 | 52284 | 57526 |
| 38643 | 20455 | 23986 | 29592 | 52016 | 40245 | 42810 | 45375 |
| 54369 | 28206 | 30827 | 51907 | 40150 | 42729 | 45308 | 28072 |
| 23469 | 16167 | 26483 | 44303 | 39770 | 53838 | 16100 | 44236 |
| 29877 | 40585 | 47619 | 50845 | 53704 | 57879 | 46402 | 27990 |
| 24339 | 43968 | 29497 | 57745 | 24272 | 29402 | 51826 | 40055 |
| 45661 | 28425 | 31004 | 51636 | 42430 | 37883 | 27882 | 23279 |
| 44141 | 30468 | 40504 | 45746 | 50988 | 53609 | 27558 | 15843 |
| 26103 | 36811 | 39390 | 43873 | 54410 | 61472 | 24177 | 44674 |
| 29307 | 47239 | 52313 | 57555 | 38854 | 15340 | 23959 | 26552 |
| 29117 | 51989 | 42783 | 54356 | 28235 | 30814 | 51446 | 42716 |
| 46233 | 28045 | 23512 | 16210 | 30278 | 36730 | 39295 | 50798 |
| 54315 | 31361 | 51881 | 30144 | 40124 | 44579 | 47158 | 50664 |
| 57698 | 38759 | 43493 | 39856 | 53924 | 16046 | 23797 | 26362 |
| 28927 | 51799 | 55554 | 42621 | 46376 | 27964 | 23417 | 43914 |
| 14323 | 51665 | 42459 | 27855 | 24218 | 31280 | 59416 | 30049 |
| 40477 | 45719 | 51017 | 53596 | 27587 | 15830 | 36350 | 43860 |
| 47377 | 58880 | 61445 | 24388 | 44199 | 29518 | 39666 | 50150 |
| 53667 | 16265 | 26525 | 43819 | 55392 | 46186 | 27774 | 24123 |
| 43752 | 52371 | 57529 | 38828 | 45862 | 20472 | 23037 | 27506 |
| 15735 | 36703 | 41973 | 54302 | 28321 | 30900 | 51868 | 22501 |
| 40153 | 44566 | 47187 | 50637 | 57671 | 54034 | 16184 | 30252 |
| 44432 | 39829 | 58500 | 53953 | 16075 | 26335 | 30090 | 52514 |
| 58120 | 46349 | 27993 | 43439 | 38638 | 23743 | 31253 | 51773 |
| 30036 | 40296 | 42679 | 45538 | 50556 | 27126 | 23475 | 51611 |
| 44337 | 58405 | 53872 | 15994 | 26478 | 44242 | 29995 | 39639 |
| 51075 | 53654 | 27561 | 15804 | 29928 | 43806 | 52800 | 55365 |
| 57930 | 46159 | 24334 | 43725 | 29604 | 47256 | 57740 | 38857 |
| 45891 | 20445 | 27479 | 55338 | 46720 | 28308 | 30929 | 51449 |
| 44147 | 39782 | 50994 | 53559 | 16157 | 30281 | 36789 | 41919 |
| 50913 | 53492 | 27371 | 15614 | 22447 | 43644 | 47161 | 52487 |
| 57645 | 38776 | 15346 | 24172 | 29414 | 43482 | 52420 | 57550 |
| 53899 | 46625 | 24010 | 28213 | 31072 | 52040 | 40269 | 42946 |
| 45511 | 28051 | 48132 | 58448 | 53845 | 15967 | 36599 | 29982 |
| 40354 | 45960 | 50614 | 27548 | 15833 | 29901 | 43387 | 52325 |
| 57455 | 53818 | 23915 | 44216 | 29633 | 39613 | 50153 | 38396 |
| 42851 | 45430 | 31778 | 52746 | 55311 | 58016 | 46245 | 27889 |
| 23524 | 14318 | 51660 | 44358 | 40707 | 45865 | 50967 | 27453 |

29820 40640 45770 50900 54417 27358 30875 22490
44569 29552 47372 57688 38749 15319 30339 35839
50859 53438 46612 28480 31045 43702 51565 42471
38834 24230 52366 59428 40545 45675 50805 54560
27263 31018 52098 22395 40327 42920 45485 50643
27129 30258 47182 58394 53791 16053 23902 26593
44189 29172 39880 50140 53657 42838 46355 31751
43921 52271 57989 46288 28100 24449 29579 52003
40246 45852 54370 31304 51936 40165 42730 45295
27835 23470 22015 44332 29525 39785 50045 12279
29878 40586 47648 50846 53467 57908 46193 28005
24368 43731 29498 52504 57746 38807 15293 24259
29417 59457 40532 45662 54533 28426 30991 51623
42893 45528 30924 44142 30231 40491 50751 53610
16320 26580 36840 30097 39405 43874 50617 57651
24178 47268 52314 57584 38645 15103 23988 26539
29118 51990 40275 42812 45433 54343 28264 30829
51909 55440 42703 46234 28046 23499 16225 26485
44361 39772 54792 31362 51882 29907 40111 47621
50427 57937 46404 24341 43494 29471 39843 50103
23798 29404 51828 55345 42622 46139 27951 23418
43705 51666 42488 37885 27884 24233 31267 59403
30050 40478 45748 51018 53583 27616 15845 36813
40344 43847 47378 54412 61446 24151 44676 29309
47297 57557 54144 16266 24017 26526 29147 51571
42841 28237 31768 52400 57530 38591 20459 23038
16212 36732 40249 41974 45491 54317 28322 30887
51855 22502 40154 44581 47216 50638 57700 54049
16171 26431 44419 39830 53954 16104 26364 29881
52753 55556 57883 46350 27994 23391 43916 14325
42461 24220 31254 51774 30023 40059 45777 50543
27589 31120 51640 44338 39735 58406 53859 44257
30472 39668 51104 53669 27562 15791 26107 43821
55366 46188 24125 43726 29367 47243 52373 57503
38858 45920 20446 23963 27508 31025 51993 42899
54360 28295 30930 51450 44624 47189 58625 54036
16158 30282 36790 39411 50914 53479 16077 30092
43631 47162 52516 57646 38763 20351 43497 53928
46626 23801 28214 30835 51803 40270 42737 45540
28080 23477 14271 51613 44311 58435 53846 15996
44244 29997 40593 45723 51077 53712 27535 15834
29902 43864 52326 57932 61449 24392 44203 29634
39614 50154 38383 45893 28433 55340 46246 27890
23287 51423 44149 40736 45866 50996 53617 27454
15739 29807 36819 41977 50887 54418 27373 30904
22505 44570 29539 47135 52545 57675 38750 15348
30368 43484 39833 58504 53901 46599 24012 28243
31046 51566 42948 46465 28053 40546 50806 54323
31257 51889 30040 40356 42683 45486 50672 27130 8191
43389 58409 53820 16054 23917 26594 44190 29159
39643 50127 53658 42853 46384 31780 43922 52748
55369 57990 46275 27863 24450 29608 59648 40709
45839 51025 27483 40166 45772 28312 30877 22492
44095 29526 39786 50046 53563 16273 30341 36793
43827 50861 53496 57895 46194 28006 24355 43760
52491 57761 38836 15294 24288 29418 52424 59458
40519 45677 54534 28217 31020 52100 22397 40385
42894 45515 50645 27103 30260 48136 58396 53849
16083 26567 36603 30098 39406 50618 58128 46357
31809 43447 52329 57571 38646 23975 29581 52005
40304 42799 45434 54372 30830 51910 55427 42732
46249 27837 23528 16226 26486 44362 30003 39759
50971 27569 29936 40588 47622 50904 53469 57938
46167 24342 43733 29500 47488 57748 38865 15323
24261 29391 51815 55346 46616 28428 31049 43706
51681 42475 37886 24234 59432 30289 40493 45735
50809 53612 27379 15846 36814 22455 40331 43876
47393 50591 57653 24180 29310 47298 52316 57558
53907 16057 24018 26541 29176 52048 40277 42842
45407 28238 31755 52387 57993 46236 28104 23501
16199 36719 40250 45968 54318 31364 51884 29909
40169 44582 47203 50429 57463 54050 23923 44448
29529 39845 50161 12283 26351 29882 52754 55319
57912 46141 28009 23420 43679 14326 51668 42462
38811 45873 24207 31269 59405 30052 40536 45778
51020 54537 27590 31107 51627 44801 47380 61504
44258 30235 39655 50867 53670 16268 26584 29149
43822 51573 42367 24126 47272 52374 57532 38649
45683 20461 23992 27495 31026 51994 40223 42928
45493 54347 28324 30945 51913 40156 44611 47190
58626 54023 16173 26489 44421 39888 53956 16078
29855 47625 52279 57885 46408 27996 24345 43498
29587 50107 23802 31312 51832 40061 42738 45303
28067 23478 51614 44340 39793 58464 53861 15983
44231 29998 40594 45752 51078 53699 27564 15849
26109 43851 56320 61450 24155 44680 29425 47245
57561 38860 45894 23965 28434 30999 51519 42901
28353 30932 51452 44150 40499 50983 53618 16216
30284 36848 39413 41978 50916 54433 27374 30891
22506 44585 47164 52546 57704 38765 15335 26547
43471 39834 53902 46628 23775 28272 30837 51805
55560 42711 46466 28054 23507 14329 44369 58437
54800 31258 51890 30027 40119 45725 50659 27593
15836 43390 39739 58410 53807 23918 44205 29636
39672 50156 53673 42854 46371 27959 43937 55370
46304 27892 24241 29371 52377 59411 40710 45868
51026 53591 27512 15741 36821 41951 54420 28299
30878 22479 44572 29541 47193 57677 54040 16274
30342 36794 39359 50862 53483 46657 28245 32000
43747 52520 57762 38823 20467 40548 45678 54325
28218 30783 51863 22398 40386 42685 45544 50646
27132 23481 16179 30247 44315 58383 53850 16112
26596 44248 30113 39645 51081 53660 58115 46358
31810 43924 52330 58048 46277 24452 29582 52006
40291 45897 50551 27485 55456 46250 27838 23291
44153 30480 39788 51000 53565 27570 15799 29923
36767 43829 50891 53470 57953 46196 24357 43734
29487 47251 52493 57735 38866 15352 24262 29420
59460 55809 46603 54592 28191 31050 51682 42952
45517 28057 30290 40494 50810 53375 16085 36605
30100 40360 43639 47394 50620 57654 38771 24167
43505 52303 57573 53936 16058 24033 26542 29163
52035 40278 42857 45436 31784 52864 55429 57994
46223 27867 23502 16228 44364 30005 40713 45955
50973 27543 29910 40170 47680 50430 57940 61457
24400 44211 29530 39846 50162 38391 15325 30345
52769 55348 57899 46142 28010 23407 43708 51655
42477 38840 45874 24236 31270 59406 29815 40523
45793 50783 54538 27381 31136 52104 22513 40333
44802 47367 50649 57683 30264 47300 58512 53909
16031 24020 26571 29150 51574 42844 46361 31757
43451 52389 57519 38650 20462 23979 31489 52009
40252 42915 45494 54376 30946 51914 40143 44640
47205 58417 54052 16174 23925 26490 44422 29055
39875 50135 12285 29884 47626 52756 55377 57886
46171 27983 24346 43737 29616 57752 38813 45847
24265 31299 51819 40062 45780 28544 31109 51629
44327 39794 53862 44260 30237 40609 45739 50869
53728 27327 15850 26110 22459 43880 52499 57657
24184 29426 47246 52432 57562 38623 45685 23966
28449 31028 51996 40281 42902 45523 54349 28354
30919 51439 44613 48144 58628 54081 16203 26463
36835 39414 54434 31368 29913 44586 47151 52337
57467 38766 23871 43500 29589 39849 50109 42807

| | | | | | | | |
|---|---|---|---|---|---|---|---|
| 23804 | 28259 | 30838 | 51806 | 55323 | 42740 | 46257 | 28069 |
| 23536 | 14330 | 51672 | 44370 | 39767 | 58438 | 54787 | 31273 |
| 59521 | 30056 | 40596 | 45726 | 51136 | 53701 | 27594 | 15823 |
| 43853 | 47384 | 61452 | 24157 | 44206 | 29399 | 39659 | 49919 |
| 53674 | 46848 | 28436 | 31057 | 43938 | 51577 | 42483 | 27879 |
| 24242 | 52378 | 59440 | 40501 | 45631 | 51041 | 53620 | 27499 |
| 15742 | 36822 | 40339 | 41980 | 45497 | 54407 | 28328 | 30893 |
| 22508 | 44559 | 29542 | 47194 | 52548 | 57678 | 54027 | 16289 |
| 26549 | 44425 | 39836 | 53960 | 46658 | 28246 | 31763 | 52283 |
| 58001 | 46468 | 28112 | 23509 | 14303 | 36727 | 54326 | 31260 |
| 51892 | 30029 | 40177 | 42686 | 45307 | 50661 | 27119 | 23482 |
| 44344 | 39741 | 58412 | 53865 | 16099 | 26359 | 44235 | 30114 |
| 39646 | 51082 | 53647 | 58144 | 46373 | 28017 | 43911 | 55372 |
| 46278 | 24215 | 29373 | 59413 | 40768 | 45898 | 51028 | 54545 |
| 27486 | 31003 | 51635 | 42905 | 28301 | 30936 | 44154 | 30467 |
| 39551 | 50987 | 53566 | 16276 | 30400 | 36796 | 39417 | 43830 |
| 50920 | 53485 | 57954 | 46183 | 24358 | 43749 | 47280 | 52494 |
| 57764 | 38881 | 15339 | 20469 | 25599 | 55810 | 46632 | 54355 |
| 28220 | 30841 | 51921 | 40388 | 42715 | 45518 | 28058 | 23455 |
| 16181 | 30305 | 44317 | 58441 | 53852 | 16086 | 36606 | 30087 |
| 40123 | 47633 | 50607 | 58117 | 46416 | 31812 | 43506 | 52332 |
| 57574 | 53923 | 24034 | 29640 | 52064 | 40293 | 42858 | 45423 |
| 27963 | 55430 | 46252 | 27896 | 23293 | 15991 | 44127 | 30006 |
| 40714 | 45984 | 50974 | 53595 | 27572 | 15857 | 29925 | 36825 |
| 43859 | 50893 | 54424 | 57927 | 61458 | 24387 | 44688 | 29545 |
| 47253 | 57793 | 38868 | 15326 | 30346 | 52770 | 55335 | 46605 |
| 28249 | 31052 | 43695 | 51684 | 42478 | 38827 | 20415 | 30292 |
| 40552 | 45794 | 50812 | 54329 | 27382 | 30899 | 51867 | 22514 |
| 40334 | 44593 | 47396 | 50650 | 57712 | 38773 | 15231 | 30251 |
| 43479 | 58499 | 53910 | 16060 | 24007 | 26600 | 29165 | 52037 |
| 55568 | 42831 | 46362 | 31758 | 43928 | 52390 | 57996 | 46281 |
| 27869 | 24456 | 31490 | 52010 | 30035 | 40239 | 45957 | 50555 |
| 27601 | 40172 | 47206 | 58418 | 53815 | 23926 | 44213 | 29532 |
| 39904 | 50164 | 53681 | 12286 | 15803 | 29871 | 43833 | 52743 |
| 55378 | 57901 | 46200 | 28012 | 24361 | 43738 | 29603 | 52609 |
| 57739 | 38814 | 45876 | 24266 | 31328 | 59464 | 40525 | 45767 |
| 54540 | 28307 | 31110 | 51630 | 22487 | 44804 | 47425 | 57685 |
| 30238 | 40610 | 50870 | 53491 | 16089 | 26573 | 30104 | 43643 |
| 52528 | 57658 | 38719 | 24171 | 43453 | 52419 | 57577 | 38652 |
| 45686 | 23981 | 28450 | 31015 | 51983 | 40282 | 42917 | 45552 |
| 54350 | 30948 | 51916 | 55433 | 44614 | 48131 | 58391 | 54082 |
| 16232 | 26492 | 44480 | 30009 | 39877 | 51089 | 27547 | 29914 |
| 47628 | 52338 | 57944 | 46173 | 24348 | 43263 | 29590 | 39850 |
| 50110 | 38395 | 45905 | 23791 | 31301 | 51821 | 55352 | 42727 |
| 46258 | 28070 | 23523 | 51659 | 44385 | 39796 | 54816 | 31274 |
| 59522 | 29819 | 40583 | 45741 | 50899 | 53702 | 27385 | 15852 |
| 22461 | 43854 | 29495 | 47371 | 52501 | 57631 | 24158 | 29428 |
| 47304 | 57564 | 53913 | 46611 | 24024 | 28423 | 31058 | 51578 |
| 42960 | 45525 | 28356 | 31873 | 52393 | 59427 | 40502 | 51042 |
| 53607 | 16205 | 36837 | 40368 | 41967 | 45498 | 54436 | 30894 |
| 22271 | 44588 | 47209 | 52311 | 57469 | 54056 | 16290 | 23929 |
| 26550 | 44426 | 29171 | 39823 | 50139 | 42865 | 28261 | 31792 |
| 52760 | 55325 | 58002 | 46231 | 28099 | 23510 | 14332 | 44372 |
| 40721 | 45851 | 54789 | 31247 | 51879 | 30030 | 40178 | 45784 |
| 50662 | 27596 | 31113 | 44331 | 39742 | 53866 | 44264 | 30353 |
| 39661 | 50873 | 53676 | 57907 | 46374 | 28018 | 23415 | 43940 |
| 51551 | 42485 | 24244 | 29374 | 52380 | 59414 | 40531 | 45689 |
| 51015 | 54546 | 27501 | 31032 | 52112 | 40341 | 42906 | 45471 |
| 54465 | 28302 | 30923 | 44617 | 30496 | 47196 | 58632 | 54029 |
| 16263 | 26579 | 36783 | 39418 | 53486 | 46660 | 31765 | 43750 |
| 47267 | 52285 | 57527 | 38882 | 20470 | 23987 | 29593 | 52017 |
| 42811 | 54384 | 28207 | 30842 | 51922 | 40151 | 42744 | 45309 |
| 28073 | 23484 | 16182 | 30306 | 44318 | 39771 | 58442 | 53839 |
| 16101 | 44237 | 30116 | 40600 | 47634 | 51084 | 53705 | 58118 |
| 46403 | 27991 | 43969 | 61568 | 24273 | 29403 | 51827 | 40294 |
| 45900 | 28440 | 31005 | 51637 | 42431 | 27883 | 23294 | 44156 |
| 30469 | 40505 | 45747 | 50989 | 53624 | 27559 | 15858 | 29926 |

| | | | | | | | |
|---|---|---|---|---|---|---|---|
| 36826 | 39391 | 43888 | 50894 | 54411 | 57956 | 61473 | 24416 |
| 44675 | 29546 | 47254 | 52552 | 57794 | 38855 | 15341 | 26553 |
| 55812 | 46606 | 54357 | 28250 | 30815 | 51447 | 42717 | 46472 |
| 28060 | 23513 | 16211 | 30279 | 36731 | 50799 | 54330 | 31376 |
| 51896 | 30145 | 40125 | 44594 | 47159 | 50665 | 57699 | 38774 |
| 43508 | 39857 | 58528 | 53925 | 16047 | 24036 | 26363 | 29166 |
| 52038 | 55555 | 42860 | 46377 | 27965 | 43915 | 55488 | 46282 |
| 27870 | 24219 | 31281 | 59417 | 30064 | 40716 | 45958 | 51032 |
| 53597 | 27602 | 15831 | 36351 | 43861 | 58881 | 61460 | 24389 |
| 44214 | 29519 | 39667 | 50151 | 53682 | 16280 | 30348 | 43834 |
| 52772 | 55393 | 57902 | 46187 | 27775 | 24362 | 43753 | 52610 |
| 57768 | 38829 | 45863 | 20473 | 27507 | 40526 | 45796 | 54303 |
| 28336 | 30901 | 51869 | 22516 | 40392 | 44567 | 47426 | 50652 |
| 57686 | 54035 | 16185 | 30253 | 44433 | 58501 | 53968 | 16090 |
| 26574 | 30091 | 52515 | 58121 | 46364 | 31816 | 43454 | 52448 |
| 57578 | 38639 | 23982 | 31492 | 52012 | 30037 | 40297 | 42918 |
| 45539 | 50557 | 27127 | 55434 | 48160 | 58420 | 53873 | 15995 |
| 26479 | 44243 | 30010 | 39878 | 51090 | 53655 | 27576 | 15805 |
| 29929 | 43807 | 52801 | 55380 | 57931 | 46174 | 24335 | 43740 |
| 29605 | 47257 | 57741 | 38872 | 45906 | 24268 | 31302 | 51822 |
| 55339 | 46721 | 28309 | 31168 | 51688 | 44386 | 39783 | 50995 |
| 30296 | 40612 | 45742 | 50928 | 53493 | 27386 | 15615 | 22462 |
| 43645 | 47400 | 52502 | 57660 | 38777 | 15347 | 24173 | 29415 |
| 43483 | 52421 | 57551 | 53914 | 46640 | 24011 | 28452 | 31073 |
| 52041 | 40284 | 42947 | 45526 | 31874 | 52394 | 59904 | 48133 |
| 58449 | 54084 | 16206 | 36838 | 29983 | 40355 | 45961 | 50615 |
| 27549 | 29916 | 47210 | 52340 | 57470 | 53819 | 23930 | 44217 |
| 29648 | 39852 | 50168 | 38397 | 42866 | 45431 | 28262 | 31779 |
| 52747 | 55326 | 58017 | 46260 | 28128 | 23525 | 14319 | 51661 |
| 44359 | 40722 | 45880 | 54790 | 31276 | 59524 | 29821 | 40641 |
| 45771 | 50901 | 54656 | 27359 | 31114 | 22491 | 44808 | 29553 |
| 47373 | 57689 | 30354 | 39662 | 50874 | 53439 | 46613 | 28481 |
| 31060 | 43703 | 51580 | 42486 | 38835 | 24231 | 52367 | 59429 |
| 40560 | 45690 | 51044 | 54561 | 27502 | 31019 | 52099 | 40342 |
| 42921 | 45500 | 54466 | 30952 | 44618 | 30259 | 47183 | 58395 |
| 54030 | 16292 | 23903 | 26608 | 44428 | 29173 | 39881 | 50141 |
| 42839 | 31766 | 47744 | 52286 | 58004 | 46289 | 28101 | 24464 |
| 29594 | 52018 | 40247 | 45853 | 54371 | 31305 | 51937 | 40180 |
| 42731 | 45310 | 28074 | 23471 | 44333 | 39800 | 53868 | 16102 |
| 44238 | 29879 | 40587 | 47649 | 50847 | 53706 | 57909 | 46432 |
| 28020 | 24369 | 43970 | 29499 | 52505 | 57747 | 24274 | 29432 |
| 59472 | 40533 | 45663 | 54548 | 28427 | 31006 | 51638 | 42908 |
| 45529 | 28360 | 30925 | 44143 | 30470 | 40506 | 50990 | 53611 |
| 16321 | 26581 | 36841 | 39420 | 43875 | 54440 | 61474 | 24179 |
| 44704 | 47269 | 52315 | 57585 | 38884 | 15342 | 23989 | 26554 |
| 29119 | 51991 | 42813 | 54358 | 28265 | 30844 | 51924 | 55441 |
| 42718 | 46235 | 28047 | 23514 | 16240 | 30308 | 44376 | 39773 |
| 58444 | 54793 | 31363 | 51883 | 30146 | 40126 | 47636 | 50666 |
| 58176 | 46405 | 43495 | 39858 | 53926 | 23799 | 29405 | 51829 |
| 55584 | 42623 | 46378 | 27966 | 23419 | 43944 | 51667 | 42489 |
| 27885 | 24248 | 31282 | 59418 | 30051 | 40479 | 45749 | 51019 |
| 53598 | 27617 | 15860 | 36828 | 40345 | 43862 | 47379 | 54413 |
| 58882 | 61447 | 24390 | 44677 | 29548 | 47312 | 57796 | 54145 |
| 16267 | 26527 | 55394 | 46664 | 28252 | 31769 | 43754 | 52401 |
| 57531 | 38830 | 20474 | 23039 | 16213 | 36733 | 41975 | 54332 |
| 28323 | 30902 | 51870 | 22503 | 40155 | 44596 | 47217 | 50639 |
| 57701 | 54064 | 16186 | 30254 | 44434 | 39831 | 58502 | 53955 |
| 16105 | 26365 | 30120 | 52992 | 55557 | 58122 | 46351 | 27995 |
| 43917 | 46284 | 24221 | 31255 | 51775 | 30038 | 40298 | 46016 |
| 50558 | 27604 | 31121 | 51641 | 44339 | 58407 | 53874 | 44272 |
| 30473 | 39669 | 51105 | 53684 | 27563 | 15806 | 29930 | 43836 |
| 52802 | 55367 | 57960 | 46189 | 24364 | 43727 | 29606 | 47258 |
| 52612 | 57742 | 38859 | 45921 | 20447 | 27509 | 55816 | 46722 |
| 54361 | 28310 | 30931 | 51451 | 44625 | 47428 | 58640 | 54037 |
| 16159 | 30283 | 36791 | 50915 | 53494 | 16092 | 30093 | 43646 |
| 47163 | 52517 | 57647 | 38778 | 24174 | 43512 | 52422 | 57580 |
| 53929 | 46627 | 24040 | 28215 | 31074 | 52042 | 40271 | 42976 |

| | | | | | | | |
|---|---|---|---|---|---|---|---|
| 45541 | 28081 | 55436 | 48134 | 58450 | 53847 | 15997 | 44245 |
| 30012 | 40832 | 45962 | 51092 | 53713 | 27550 | 15835 | 29903 |
| 43865 | 52327 | 57933 | 61464 | 24393 | 44218 | 29635 | 39615 |
| 50155 | 38398 | 45908 | 32256 | 52776 | 55341 | 58018 | 46247 |
| 27891 | 23526 | 51662 | 44388 | 40737 | 45867 | 50997 | 27455 |
| 29822 | 40642 | 45800 | 50902 | 54419 | 27388 | 30905 | 22520 |
| 44571 | 29554 | 47374 | 52560 | 57690 | 38751 | 15349 | 30369 |
| 43485 | 58505 | 53916 | 46614 | 24013 | 28482 | 31047 | 51567 |
| 42949 | 46480 | 31876 | 52396 | 59430 | 40547 | 50807 | 54562 |
| 31496 | 52128 | 30041 | 40357 | 42922 | 45487 | 50673 | 27131 |
| 47212 | 58424 | 53821 | 16055 | 23932 | 26595 | 44191 | 29174 |
| 39882 | 50142 | 53659 | 42868 | 46385 | 31781 | 43923 | 52749 |
| 55384 | 57991 | 46290 | 28102 | 24451 | 29609 | 59649 | 40724 |
| 45854 | 54848 | 31306 | 51938 | 40167 | 45773 | 28313 | 31116 |
| 22493 | 44334 | 29527 | 39787 | 50047 | 30356 | 40616 | 47650 |
| 50876 | 53497 | 57910 | 46195 | 28007 | 24370 | 43761 | 52506 |
| 57776 | 38837 | 15295 | 24289 | 29419 | 52425 | 59459 | 40534 |
| 45692 | 54535 | 28456 | 31021 | 52101 | 40400 | 42895 | 45530 |
| 54468 | 30926 | 44620 | 30261 | 48137 | 58397 | 54088 | 16322 |
| 26582 | 36842 | 30099 | 39407 | 50619 | 58129 | 31824 | 47270 |
| 52344 | 57586 | 38647 | 23990 | 29596 | 52020 | 40305 | 42814 |
| 45435 | 54373 | 28266 | 30831 | 51911 | 55442 | 42733 | 46264 |
| 28076 | 23529 | 16227 | 26487 | 44363 | 39774 | 54794 | 31392 |
| 59528 | 29937 | 40589 | 47623 | 50905 | 53708 | 57939 | 46406 |
| 24343 | 43972 | 29501 | 47489 | 57749 | 24276 | 29406 | 51830 |
| 55347 | 46617 | 28429 | 31064 | 43707 | 51696 | 42490 | 37887 |
| 27886 | 24235 | 59433 | 30528 | 40508 | 45750 | 51048 | 53613 |
| 27618 | 15847 | 36815 | 40346 | 43877 | 47408 | 54414 | 61476 |
| 24181 | 44678 | 29311 | 47299 | 52317 | 57559 | 54146 | 16296 |
| 24019 | 26556 | 29177 | 52049 | 42843 | 28239 | 31770 | 52402 |
| 58008 | 46237 | 28105 | 23516 | 16214 | 36734 | 40251 | 45969 |
| 54319 | 31365 | 51885 | 30148 | 40184 | 44583 | 47218 | 50668 |
| 57702 | 54051 | 44449 | 39860 | 53984 | 16106 | 26366 | 29883 |
| 52755 | 55558 | 57913 | 46380 | 28024 | 23421 | 43918 | 14327 |
| 51669 | 42463 | 24222 | 31284 | 59420 | 30053 | 40537 | 45779 |
| 51021 | 54552 | 27591 | 31122 | 51642 | 44816 | 47381 | 58884 |
| 61505 | 44259 | 30474 | 39670 | 51106 | 53671 | 16269 | 26585 |
| 43823 | 55396 | 46190 | 24127 | 43756 | 47273 | 52375 | 57533 |
| 38888 | 45922 | 20476 | 23993 | 27510 | 31027 | 51995 | 42929 |
| 54362 | 28325 | 30960 | 51928 | 40157 | 44626 | 47191 | 58627 |
| 54038 | 16188 | 30312 | 44436 | 39889 | 58560 | 53957 | 16079 |
| 30094 | 47640 | 52518 | 58124 | 46409 | 27997 | 43499 | 53930 |
| 23803 | 31313 | 51833 | 40300 | 42739 | 45542 | 28082 | 23479 |
| 51615 | 44341 | 58465 | 53876 | 15998 | 44246 | 29999 | 40595 |
| 45753 | 51079 | 53714 | 27565 | 15864 | 29932 | 43866 | 52804 |
| 56321 | 57934 | 61451 | 24394 | 44681 | 29664 | 47260 | 57800 |
| 38861 | 45895 | 28435 | 55342 | 46724 | 28368 | 30933 | 51453 |
| 44151 | 40738 | 50998 | 53619 | 16217 | 30285 | 36849 | 41979 |
| 50917 | 54448 | 27375 | 30906 | 22507 | 44600 | 47165 | 52547 |
| 57705 | 38780 | 15350 | 30370 | 43486 | 39835 | 58506 | 53903 |
| 46629 | 24014 | 28273 | 31076 | 52044 | 55561 | 42950 | 46467 |
| 28055 | 48192 | 58452 | 54801 | 31259 | 51891 | 30042 | 40358 |
| 45964 | 50674 | 27608 | 15837 | 43391 | 58411 | 53822 | 23919 |
| 44220 | 29637 | 39673 | 50157 | 53688 | 42855 | 46386 | 31782 |
| 43952 | 52750 | 55371 | 58020 | 46305 | 27893 | 24480 | 29610 |
| 52616 | 59650 | 40711 | 45869 | 51027 | 27513 | 40644 | 45774 |
| 54421 | 28314 | 30879 | 22494 | 44573 | 29556 | 47432 | 57692 |
| 54041 | 16275 | 30343 | 36795 | 50863 | 53498 | 46672 | 28484 |
| 32001 | 43762 | 52521 | 57763 | 38838 | 24290 | 52426 | 59488 |
| 40549 | 45679 | 54564 | 28219 | 31022 | 52102 | 22399 | 40387 |
| 42924 | 45545 | 50647 | 27133 | 30262 | 48138 | 58398 | 53851 |
| 16113 | 26597 | 44249 | 30128 | 39884 | 51096 | 53661 | 58130 |
| 46359 | 31811 | 43925 | 52331 | 58049 | 46292 | 24453 | 29583 |
| 52007 | 40306 | 45912 | 54374 | 31308 | 51940 | 55457 | 42734 |
| 46251 | 27839 | 23530 | 44392 | 30481 | 39789 | 51001 | 27571 |
| 29938 | 40590 | 47652 | 50906 | 53471 | 57968 | 46197 | 24372 |
| 43735 | 29502 | 47490 | 52508 | 57750 | 38867 | 15353 | 24263 |

| | | | | | | | | |
|---|---|---|---|---|---|---|---|---|
| 29421 | 59461 | 55824 | 46618 | 54593 | 28430 | 31051 | 51683 | |
| 42953 | 45532 | 31880 | 59434 | 30291 | 40495 | 50811 | 53614 | |
| 16324 | 36844 | 30101 | 40361 | 43878 | 47395 | 50621 | 57655 | |
| 24182 | 47328 | 52318 | 57588 | 53937 | 16059 | 24048 | 26543 | |
| 29178 | 52050 | 40279 | 42872 | 45437 | 28268 | 31785 | 52865 | |
| 55444 | 57995 | 46238 | 28106 | 23503 | 16229 | 44365 | 40728 | |
| 45970 | 54796 | 31366 | 51886 | 29911 | 40171 | 47681 | 50431 | |
| 57941 | 61696 | 24401 | 44450 | 29531 | 39847 | 50163 | 30360 | |
| 52784 | 55349 | 57914 | 46143 | 28011 | 23422 | 43709 | 51670 | |
| 42492 | 38841 | 45875 | 24237 | 31271 | 59407 | 30054 | 40538 | |
| 45808 | 51022 | 54539 | 27620 | 31137 | 52105 | 40348 | 44803 | |
| 47382 | 54472 | 61506 | 44736 | 30265 | 47301 | 58513 | 54148 | |
| 16270 | 24021 | 26586 | 29151 | 51575 | 42845 | 31772 | 47274 | |
| 52404 | 57534 | 38651 | 20463 | 23994 | 31504 | 52024 | 40253 | |
| 42930 | 45495 | 54377 | 28326 | 30947 | 51915 | 40158 | 44641 | |
| 47220 | 58656 | 54053 | 16175 | 26491 | 44423 | 39890 | 53958 | |
| 16108 | 29885 | 47627 | 52757 | 55616 | 57887 | 46410 | 27998 | |
| 24347 | 43976 | 29617 | 57753 | 24280 | 31314 | 51834 | 40063 | |
| 45781 | 28545 | 31124 | 51644 | 44342 | 39795 | 58466 | 53863 | |
| 44261 | 30476 | 40624 | 45754 | 51108 | 53729 | 27566 | 15851 | 26111 |
| 43881 | 56322 | 61480 | 24185 | 44682 | 29427 | 47247 | 52433 | |
| 57563 | 38862 | 45924 | 23967 | 28464 | 31029 | 51997 | 42903 | |
| 54364 | 28355 | 30934 | 51454 | 44628 | 48145 | 58629 | 54096 | |
| 16218 | 30286 | 36850 | 39415 | 50918 | 54435 | 31369 | 30152 | |
| 44587 | 47166 | 52576 | 57706 | 38767 | 43501 | 39864 | 53932 | |
| 46630 | 23805 | 28274 | 30839 | 51807 | 55562 | 42741 | 46496 | |
| 28084 | 23537 | 14331 | 51673 | 44371 | 58439 | 54802 | 31288 | |
| 59536 | 30057 | 40597 | 45727 | 51137 | 53716 | 27595 | 15838 | |
| 43868 | 47385 | 58888 | 61453 | 24396 | 44207 | 29638 | 39674 | |
| 50158 | 53675 | 46849 | 28437 | 43939 | 55400 | 46306 | 27894 | |
| 24243 | 52379 | 59441 | 40740 | 45870 | 51056 | 53621 | 27514 | |
| 15743 | 36823 | 41981 | 54422 | 28329 | 30908 | 22509 | 44574 | |
| 29543 | 47195 | 52549 | 57679 | 54042 | 16304 | 30372 | 44440 | |
| 39837 | 58508 | 53961 | 46659 | 28247 | 32002 | 52522 | 58240 | |
| 46469 | 28113 | 40550 | 54327 | 31261 | 51893 | 30044 | 40416 | |
| 42687 | 45546 | 50676 | 27134 | 23483 | 44345 | 58413 | 53880 | |
| 16114 | 26598 | 44250 | 30115 | 39647 | 51083 | 53662 | 58145 | |
| 46388 | 31840 | 43926 | 52808 | 55373 | 58050 | 46279 | 24454 | |
| 29612 | 59652 | 40769 | 45899 | 51029 | 27487 | 55458 | 46728 | |
| 28316 | 30937 | 44155 | 30482 | 39790 | 51002 | 53567 | 16277 | |
| 30401 | 36797 | 43831 | 50921 | 53500 | 57955 | 46198 | 24359 | |
| 43764 | 47281 | 52495 | 57765 | 38896 | 15354 | 24292 | 29422 | |
| 52428 | 59462 | 55811 | 46633 | 54594 | 28221 | 31080 | 52160 | |
| 40389 | 42954 | 45519 | 28059 | 30320 | 48140 | 58456 | 53853 | |
| 16087 | 36607 | 30102 | 40362 | 47872 | 50622 | 58132 | 46417 | |
| 31813 | 43507 | 52333 | 57575 | 53938 | 24035 | 29641 | 52065 | |
| 40308 | 42859 | 45438 | 31786 | 52866 | 55431 | 58024 | 46253 | |
| 27897 | 23532 | 16230 | 44366 | 30007 | 40715 | 45985 | 50975 | |
| 27573 | 29940 | 40648 | 47682 | 50908 | 54425 | 57942 | 61459 | |
| 24402 | 44689 | 29560 | 47492 | 57808 | 38869 | 15327 | 30347 | |
| 52771 | 55350 | 46620 | 28488 | 31053 | 43710 | 51685 | 42479 | |
| 38842 | 24238 | 59436 | 30293 | 40553 | 45795 | 50813 | 54568 | |
| 27383 | 31138 | 52106 | 22515 | 40335 | 44832 | 47397 | 50651 | |
| 57713 | 30266 | 47302 | 58514 | 53911 | 16061 | 24022 | 26601 | |
| 29180 | 52052 | 55569 | 42846 | 46363 | 31759 | 43929 | 52391 | |
| 57997 | 46296 | 28108 | 24457 | 31491 | 52011 | 40254 | 45972 | |
| 54378 | 31424 | 51944 | 40173 | 44642 | 47207 | 58419 | 54054 | |
| 23927 | 44452 | 29533 | 39905 | 50165 | 12287 | 29886 | 47656 | |
| 52758 | 55379 | 57916 | 46201 | 28013 | 24376 | 43739 | 29618 | |
| 52624 | 57754 | 38815 | 45877 | 24267 | 31329 | 59465 | 40540 | |
| 45782 | 54541 | 28546 | 31111 | 51631 | 44805 | 47440 | 61508 | 44262 |
| 30239 | 40611 | 50871 | 53730 | 16328 | 26588 | 30105 | 43882 | |
| 52529 | 57659 | 24186 | 47276 | 52434 | 57592 | 38653 | 45687 | |
| 23996 | 28451 | 31030 | 51998 | 40283 | 42932 | 45553 | 54351 | |
| 28384 | 30949 | 51917 | 55448 | 44615 | 48146 | 58630 | 54083 | |
| 16233 | 26493 | 44481 | 39892 | 54912 | 31370 | 29915 | 47629 | |
| 52339 | 57945 | 46412 | 24349 | 43502 | 29591 | 39851 | 50111 | |

23806 31316 51836 55353 42742 46259 28071 23538
51674 44400 39797 58468 54817 31275 59523 30058
40598 45756 51138 53703 27624 15853 43855 47386
56324 61454 24159 44684 29429 47305 57565 54152
46850 24025 28438 31059 51579 42961 28357 31888
52408 59442 40503 51043 53622 16220 36852 40369
41982 45499 54437 28330 30895 22510 44589 47224
52550 57708 54057 16291 26551 44427 39838 53962
46688 28276 31793 52761 55564 58003 46470 28114
23511 14333 44373 54804 31262 51894 30031 40179
45785 50663 27597 31128 44346 39743 58414 53867
44265 30592 39676 51112 53677 58146 46375 28019
43941 55374 46308 24245 29375 52381 59415 40770
45928 51030 54547 27516 31033 52113 42907 54480
28303 30938 44632 30497 47197 58633 54044 16278
30402 36798 39419 50922 53487 46661 32004 43751
47282 52524 57766 38883 20471 55840 46634 54385
28222 30843 51923 40390 42745 45548 28088 23485
16183 30307 44319 58443 53854 16116 44252 30117
40601 47635 51085 53720 58119 46418 31814 43984
52334 58052 61569 24512 29642 52066 40295 45901
28441 55460 46254 27898 23295 44157 30484 40744
45986 51004 53625 27574 15859 29927 36827 43889
50895 54426 57957 61488 24417 44690 29547 47255
52553 57795 38870 15356 30376 60416 55813 46607
54596 28251 31054 51686 42956 46473 28061 30294
40554 50814 54331 31377 51897 30160 40364 44595
47398 50680 57714 38775 43509 58529 53940 16062
24037 26602 29167 52039 55570 42861 46392 31788
43930 52868 55489 57998 46283 27871 24458 31520
59656 30065 40717 45959 51033 27603 40174 47684
58896 61461 24404 44215 29534 39906 50166 53683
16281 30349 43835 52773 55408 57903 46202 28014
24363 43768 52611 57769 38844 45878 24296 31330
59466 40527 45797 54542 28337 31140 52108 22517
40393 44806 47427 50653 57687 30268 48256 58516
53969 16091 26575 30106 52530 58136 46365 31817
43455 52449 57579 38654 23983 31493 52013 40312
42919 45554 54380 30950 51918 55435 44644 48161
58421 54112 16234 26494 44482 30011 39879 51091
27577 29944 47630 52816 55381 57946 46175 24350
43741 29620 47496 57756 38873 45907 24269 31303
51823 55354 46736 28548 31169 51689 44387 39798
54818 59552 30297 40613 45743 50929 53732 27387
15854 22463 43884 47401 52503 57661 24188 29430
47306 52436 57566 53915 46641 24026 28453 31088
52056 40285 42962 45527 28358 31875 52395 59905
48148 58688 54085 16207 36839 40370 45976 54438
31372 29917 44590 47211 52341 57471 54058 23931
44456 29649 39853 50169 42867 28263 31794 52762
55327 58032 46261 28129 23540 14334 51676 44374
40723 45881 54791 31277 59525 30060 40656 45786
51140 54657 27598 31115 44809 47388 61512 44266 30355
39663 50875 53678 46852 28496 31061 43942 51581
42487 24246 52382 59444 40561 45691 51045 54576
27503 31034 52114 40343 42936 45501 54467 28332
30953 44619 30498 47198 58634 54031 16293 26609
44429 39896 53964 46662 31767 47745 52287 58005
46528 28116 24465 29595 52019 54386 31320 51952
40181 42746 45311 28075 23486 44348 39801 58472
53869 16103 44239 30118 40602 47664 51086 53707
58148 46433 28021 43971 56328 61570 24275 29433
59473 40772 45902 54549 28442 31007 51639 42909
28361 30940 44158 30471 40507 50991 53626 16336
30404 36856 39421 43890 50924 54441 57958 61475
24418 44705 47284 52554 57824 38885 15343 26555
55814 46636 54359 28280 30845 51925 55680 42719

46474 28062 23515 16241 30309 44377 58445 54808
31378 51898 30147 40127 47637 50667 58177 46420
43510 39859 58530 53927 24038 29644 52068 55585
42862 46379 27967 43945 55490 46312 27900 24249
31283 59419 30066 40718 45988 51034 53599 27632
15861 36829 43863 54428 58883 61462 24391 44692
29549 47313 57797 54160 16282 30350 52774 55395
46665 28253 32008 43755 52640 57770 38831 20475
40556 45798 54333 28338 30903 51871 22518 40394
44597 47456 50654 57716 54065 16187 30255 44435
58503 53970 16120 26604 30121 52993 55572 58123
46366 31818 43932 52450 58056 46285 24460 31494
52014 30039 40299 46017 50559 27605 55464 48162
58422 53875 44273 30488 39908 51120 53685 27578
15807 29931 43837 52803 55382 57961 46204 24365
43742 29607 47259 52613 57743 38874 45936 24270
31332 59468 55817 46723 54600 28311 31170 51690
44864 47429 58641 30298 40614 50930 53495 16093
30108 43647 47402 52532 57662 38779 24175 43513
52423 57581 53944 46642 24041 28454 31075 52043
40286 42977 45556 31904 52872 55437 59906 48135
58451 54086 16236 44484 30013 40833 45963 51093
27551 29918 47688 52342 57948 61465 24408 44219
29650 39854 50170 38399 45909 32257 52777 55356
58019 46262 28130 23527 51663 44389 40752 45882
54820 31278 59526 29823 40643 45801 50903 54658
27389 31144 22521 44810 29555 47375 52561 57691
30384 47308 58520 53917 46615 24028 28483 31062
51582 42964 46481 31877 52397 59431 40562 51046
54563 31497 52129 40372 42923 45502 54496 30954
44648 47213 58425 54060 16294 23933 26610 44430
29175 39883 50143 42869 31796 47746 52764 55385
58006 46291 28103 24466 29624 59664 40725 45855
54849 31307 51939 40182 45788 28552 31117 44335
39802 53870 44268 30357 40617 47651 50877 53736
57911 46434 28022 24371 44000 52507 57777 24304
29434 52440 59474 40535 45693 54550 28457 31036
52116 40401 42910 45531 54469 28362 30927 44621
30500 48152 58636 54089 16323 26583 36843 39422
54442 61952 31825 44706 47271 52345 57587 38886
23991 29597 52021 42815 54388 28267 30846 51926
55443 42748 46265 28077 23544 16242 30310 44378
39775 58446 54795 31393 59529 30176 40604 47638
51144 53709 58178 46407 43973 47504 61572 24277
29407 51831 55586 46856 28444 31065 43946 51697
42491 27887 24250 59448 30529 40509 45751 51049
53628 27619 15862 36830 40347 43892 47409 54415
58912 61477 24420 44679 29550 47314 52556 57798
54147 16297 26557 55872 46666 28254 31771 52403
58009 46476 28120 23517 16215 36735 54334 31380
51900 30149 40185 44598 47219 50669 57703 54066
44464 39861 58532 53985 16107 26367 30122 52994
55559 58152 46381 28025 43919 55492 46286 24223
31285 59421 30068 40776 46018 51036 54553 27606
31123 51643 44817 58885 61520 44274 30475 39671
51107 53686 16284 30408 43838 52832 55397 57962
46191 24366 43757 47288 52614 57772 38889 45923
20477 27511 55818 46752 54363 28340 30961 51929
40396 44627 47430 58642 54039 16189 30313 44437
58561 53972 16094 30095 47641 52519 58125 46424
31820 43514 52452 57582 53931 24042 31552 52072
40301 42978 45543 28083 55438 48164 58480 53877
15999 44247 30014 40834 45992 51094 53715 27580
15865 29933 43867 52805 56336 57935 61466 24395
44696 29665 47261 57801 38876 45910 32258 52778
55343 46725 28369 31172 51692 44390 40739 50999
30300 40672 45802 50932 54449 27390 30907 22522

44601 47404 52562 57720 38781 15351 30371 43487
58507 53918 46644 24015 28512 31077 52045 55576
42951 46482 31878 52398 59908 48193 58453 55040
31498 52130 30043 40359 45965 50675 27609 47214
58426 53823 23934 44221 29652 39912 50172 53689
42870 46387 31783 43953 52751 55386 58021 46320
28132 24481 29611 52617 59651 40726 45884 54850
31336 59584 40645 45775 54660 28315 31118 22495
44812 29557 47433 57693 30358 40618 50878 53499
46673 28485 32016 43763 52536 57778 38839 24291
52427 59489 40564 45694 54565 28458 31023 52103
40402 42925 45560 54470 30956 44622 30263 48139
58399 54090 16352 26612 44488 30129 39885 51097
58131 31826 47748 52346 58064 46293 24468 29598
52022 40307 45913 54375 31309 51941 55472 42735
46266 28078 23531 44393 39804 54824 31394 59530
29939 40591 47653 50907 53710 57969 46436 24373
43974 29503 47491 52509 57751 24278 29436 59476
55825 46619 54608 28431 31066 51698 42968 45533
28364 31881 59435 30530 40510 51050 53615 16325
36845 40376 43879 47410 54444 61478 24183 44708
47329 52319 57589 54176 16298 24049 26558 29179
52051 42873 28269 31800 52880 55445 58010 46239
28107 23518 16244 44380 40729 45971 54797 31367
51887 30150 40186 47696 50670 58180 61697 44451
39862 53986 30361 52785 55588 57915 46382 28026
23423 43948 51671 42493 24252 31286 59422 30055
40539 45809 51023 54554 27621 31152 52120 40349
44818 47383 54473 58886 61507 44737 30504 47316
58752 54149 16271 26587 55398 46668 31773 43758
47275 52405 57535 38890 20478 23995 31505 52025
42931 54392 28327 30962 51930 40159 44656 47221
58657 54068 16190 30314 44438 39891 58562 53959
16109 30124 47642 52996 55617 58126 46411 27999
43977 61576 24281 31315 51835 40302 46020 28560
31125 51645 44343 58467 53878 44276 30477 40625
45755 51109 53744 27567 15866 29934 43896 52806
56323 57964 61481 24424 44683 29666 47262 52672
57802 38863 45925 28465 55820 46726 54365 28370
30935 51455 44629 48384 58644 54097 16219 30287
36851 50919 54450 31384 30153 44602 47167 52577
57707 38782 43516 39865 58536 53933 46631 24044
28275 31078 52046 55563 42980 46497 28085 55496
48194 58454 54803 31289 59537 30072 40836 45966
51152 53717 27610 15839 43869 58889 61468 24397
44222 29639 39675 50159 53690 46864 32260 43954
52780 55401 58022 46307 27895 24482 52618 59680
40741 45871 51057 27515 40646 45804 54423 28344
30909 22524 44575 29558 47434 52564 57694 54043
16305 30373 44441 58509 53976 46674 28486 32003
52523 58241 46484 31936 52456 59490 40551 54566
31500 52132 30045 40417 42926 45547 50677 27135
48168 58428 53881 16115 26599 44251 30130 39886
51098 53663 58160 46389 31841 43927 52809 55388
58051 46294 24455 29613 59653 40784 45914 54852
31310 51942 55459 46729 28317 31176 44394 30483
39791 51003 30416 40620 47654 50936 53501 57970
46199 24374 43765 47520 52510 57780 38897 15355
24293 29423 52429 59463 55826 46648 54595 28460
31081 52161 40404 42955 45534 31882 59912 30321
48141 58457 54092 16326 36846 30103 40363 47873
50623 58133 31828 47330 52348 57590 53939 24050
29656 52080 40309 42874 45439 28270 31787 52867
55446 58025 46268 28136 23533 16231 44367 40730
46000 54798 31396 59532 29941 40649 47683 50909
54664 57943 61698 24403 44928 29561 47493 57809
30362 52786 55351 46621 28489 31068 43711 51700

42494 38843 24239 59437 30532 40568 45810 51052
54569 27622 31139 52107 40350 44833 47412 54474
61536 44738 30267 47303 58515 54150 16300 24023
26616 29181 52053 42847 31774 47752 52406 58012
46297 28109 24472 31506 52026 40255 45973 54379
31425 51945 40188 44643 47222 58658 54055 44453
39920 53988 16110 29887 47657 52759 55618 57917
46440 28028 24377 43978 29619 52625 57755 24282
31344 59480 40541 45783 54556 28547 31126 51646
44820 47441 58944 61509 44263 30478 40626 51110
53731 16329 26589 43883 56352 61482 24187 44712
47277 52435 57593 38892 45926 23997 28466 31031
51999 42933 54366 28385 30964 51932 55449 44630
48147 58631 54098 16248 30316 44496 39893 58564
54913 31371 30154 47644 52578 58184 46413 43503
39866 53934 23807 31317 51837 55592 42743 46498
28086 23539 51675 44401 58469 54832 31290 59538
30059 40599 45757 51139 53718 27625 15868 43870
47387 56325 58890 61455 24398 44685 29668 47320
57804 54153 46851 28439 55402 46784 28372 31889
52409 59443 40742 51058 53623 16221 36853 41983
54452 28331 30910 22511 44604 47225 52551 57709
54072 16306 30374 44442 39839 58510 53963 46689
28277 32032 53000 55565 58242 46471 28115 48196
54805 31263 51895 30046 40418 46024 50678 27612
31129 44347 58415 53882 44280 30593 39677 51113 53692
58147 46390 31842 43956 52810 55375 58080 46309
24484 29614 52620 59654 40771 45929 51031 27517
55936 46730 54481 28318 30939 44633 30512 47436
58648 54045 16279 30403 36799 50923 53502 46676
32005 43766 47283 52525 57767 38898 24294 52430
59492 55841 46635 54624 28223 31082 52162 40391
42984 45549 28089 30322 48142 58458 53855 16117
44253 30132 40840 47874 51100 53721 58134 46419
31815 43985 52335 58053 61584 24513 29643 52067
40310 45916 32264 52896 55461 58026 46255 27899
23534 44396 30485 40745 45987 51005 27575 29942
40650 47712 50910 54427 57972 61489 24432 44691
29562 47494 52568 57810 38871 15357 30377 60417
55828 46622 54597 28490 31055 51687 42957 46488
31884 59438 30295 40555 50815 54570 31616 52136
30161 40365 44834 47399 50681 57715 47332 58544
53941 16063 24052 26603 29182 52054 55571 42876
46393 31789 43931 52869 55504 57999 46298 28110
24459 31521 59657 40732 45974 54856 31426 51946
40175 47685 58897 61700 24405 44454 29535 39907
50167 30364 47658 52788 55409 57918 46203 28015
24378 43769 52626 57784 38845 45879 24297 31331
59467 40542 45812 54543 28576 31141 52109 40408
44807 47442 54476 61510 44740 30269 48257 58517
54208 16330 26590 30107 52531 58137 31832 47278
52464 57594 38655 23998 31508 52028 40313 42934
45555 54381 28386 30951 51919 55450 44645 48176
58660 54113 16235 26495 44483 39894 54914 31400
29945 47631 52817 55620 57947 46414 24351 43980
29621 47497 57757 24284 31318 51838 55355 46737
28549 31184 51704 44402 39799 58470 54819 59553
30536 40628 45758 51168 53733 27626 15855 43885
47416 56326 61484 24189 44686 29431 47307 52437
57567 54154 46880 24027 28468 31089 52057 42963
28359 31890 52410 59920 48149 58689 54100 16222
36854 40371 45977 54439 31373 30156 44591 47226
52580 57710 54059 44457 39868 53992 46690 28278
31795 52763 55566 58033 46500 28144 23541 14335
51677 44375 54806 31292 59540 30061 40657 45787
51141 54672 27599 31130 44824 47389 58892 61513
44267 30594 39678 51114 53679 46853 28497 43943

55404 46310 24247 52383 59445 40800 45930 51060
54577 27518 31035 52115 42937 54482 28333 30968
44634 30499 47199 58635 54046 16308 30432 44444
39897 58568 53965 46663 32006 47760 52526 58244
46529 28117 55842 54387 31321 51953 40420 42747
45550 28090 23487 44349 58473 53884 16118 44254
30119 40603 47665 51087 53722 58149 46448 31844
43986 52812 56329 58054 61571 24514 29672 59712
40773 45903 28443 55462 46732 28376 30941 44159
30486 40746 51006 53627 16337 30405 36857 43891
50925 54456 57959 61490 24419 44720 47285 52555
57825 38900 15358 30378 60418 55815 46637 54598
28281 31084 52164 55681 42958 46475 28063 30324
48200 58460 54809 31379 51899 30162 40366 47876
50682 58192 46421 43511 58531 53942 24039 29645
52069 55600 42863 46394 31790 43960 52870 55491
58028 46313 27901 24488 31522 59658 30067 40719
45989 51035 27633 40652 47686 54429 58898 61463
24406 44693 29564 47552 57812 54161 16283 30351
52775 55410 46680 28492 32009 43770 52641 57771
38846 24298 59496 40557 45799 54572 28339 31142
52110 22519 40395 44836 47457 50655 57717 30270
48258 58518 53971 16121 26605 30136 53008 55573
58138 46367 31819 43933 52451 58057 46300 24461
31495 52015 40314 46032 54382 31428 51948 55465
44646 48163 58423 54114 44512 30489 39909 51121
27579 29946 47660 52818 55383 57976 46205 24380
43743 29622 47498 52628 57758 38875 45937 24271
31333 59469 55832 46738 54601 28550 31171 51691
44865 47444 62464 59554 30299 40615 50931 53734
16332 30109 43886 47403 52533 57663 24190 47336
52438 57596 53945 46643 24056 28455 31090 52058
40287 42992 45557 28388 31905 52873 55452 59907
48150 58690 54087 16237 44485 40848 45978 54916
31374 29919 47689 52343 57949 61704 24409 44458
29651 39855 50171 32272 52792 55357 58034 46263
28131 23542 51678 44404 40753 45883 54821 31279
59527 30062 40658 45816 51142 54659 27628 31145 44811
47390 56384 61514 44744 30385 47309 58521 54156
46854 24029 28498 31063 51583 42965 31892 52412
59446 40563 51047 54578 31512 52144 40373 42938
45503 54497 28334 30955 44649 47228 58664 54061
16295 26611 44431 39898 53966 46692 31797 47747
52765 55624 58007 46530 28118 24467 29625 59665
54864 31322 51954 40183 45789 28553 31132 44350
39803 58474 53871 44269 30596 40632 47666 51116
53737 58150 46435 28023 44001 56330 61600 24305
29435 52441 59475 40774 45932 54551 28472 31037
52117 42911 54484 28363 30942 44636 30501 48153
58637 54104 16338 30406 36858 39423 50926 54443
61953 32064 44707 47286 52584 57826 38887 55844
46638 54389 28282 30847 51927 55682 42749 46504
28092 23545 16243 30311 44379 58447 54810 31408
59544 30177 40605 47639 51145 53724 58179 46422
43988 47505 59008 61573 24516 29646 52070 55587
46857 28445 43947 55520 46314 27902 24251 59449
30544 40748 45990 51064 53629 27634 15863 36831
43893 54430 58913 61492 24421 44694 29551 47315
52557 57799 54162 16312 30380 60420 55873 46667
28255 32010 52642 58248 46477 28121 40558 54335
31381 51901 30164 40424 44599 47458 50684 57718
54067 44465 58533 54000 16122 26606 30123 52995
55574 58153 46396 31848 43934 52928 55493 58058
46287 24462 31524 59660 30069 40777 46019 51037
27607 55466 48640 58900 61521 44275 30490 39910
51122 53687 16285 30409 43839 52833 55412 57963
46206 24367 43772 47289 52615 57773 38904 45938

24300 31334 59470 55819 46753 54602 28341 31200
52168 40397 44866 47431 58643 30328 48260 58576
53973 16095 30110 47880 52534 58140 46425 31821
43515 52453 57583 53946 24043 31553 52073 40316
42979 45558 31906 52874 55439 59936 48165 58481
54116 16238 44486 30015 40835 45993 51095 27581
29948 47690 52820 56337 57950 61467 24410 44697
29680 47500 57816 38877 45911 32259 52779 55358
46740 28608 31173 51693 44391 40754 54822 59556
30301 40673 45803 50933 54688 27391 31146 22523
44840 47405 52563 57721 30386 47310 58522 53919
46645 24030 28513 31092 52060 55577 42966 46483
31879 52399 59909 48208 58692 55041 31499 52131
40374 45980 54498 31432 44650 47215 58427 54062
23935 44460 29653 39913 50173 42871 31798 47776
52766 55387 58036 46321 28133 24496 29626 52632
59666 40727 45885 54851 31337 59585 40660 45790
54661 28554 31119 44813 47448 61516 44270 30359
40619 50879 53738 46912 28500 32017 44002 52537
57779 24306 52442 59504 40565 45695 54580 28459
31038 52118 40403 42940 45561 54471 28392 30957
44623 30502 48154 58638 54091 16353 26613 44489
39900 54920 61954 31827 47749 52347 58065 46532
24469 29599 52023 54390 31324 51956 55473 42750
46267 28079 23546 44408 39805 58476 54825 31395
59531 30178 40606 47668 51146 53711 58208 46437
43975 47506 56332 61574 24279 29437 59477 56064
46858 54609 28446 31067 51699 42969 28365 31896
59450 30531 40511 51051 53630 16340 36860 40377
43894 47411 54445 58914 61479 24422 44709 47344
52558 57828 54177 16299 26559 55874 46696 28284
31801 52881 55684 58011 46478 28122 23519 16245
44381 54812 31382 51902 30151 40187 47697 50671
58181 61712 44466 39863 58534 53987 30600 53024
55589 58154 46383 28027 43949 55494 46316 24253
31287 59423 30070 40778 46048 51038 54555 27636
31153 52121 44819 54488 58887 61522 44752 30505
47317 58753 54164 16286 30410 52834 55399 46669
32012 43759 47290 52644 57774 38891 20479 55848
46754 54393 28342 30963 51931 40398 44657 47460
58672 54069 16191 30315 44439 58563 53974 16124
30125 47643 52997 55632 58127 46426 31822 43992
52454 58060 61577 24520 31554 52074 40303 46021
28561 55468 48166 58482 53879 44277 30492 40864
45994 51124 53745 27582 15867 29935 43897 52807
56338 57965 61496 24425 44698 29667 47263 52673
57803 38878 45940 32288 60424 55821 46727 54604
28371 31174 51694 44868 48385 58645 30302 40674
50934 54451 31385 30168 44603 47406 52592 57722
38783 43517 58537 53948 46646 24045 28514 31079
52047 55578 42981 46512 31908 52876 55497 59910
48195 58455 55042 31528 59776 30073 40837 45967
51153 27611 47692 58904 61469 24412 44223 29654
39914 50174 53691 46865 32261 43955 52781 55416
58023 46322 28134 24483 52619 59681 40756 45886
54880 31338 59586 40647 45805 54662 28345 31148
22525 44814 29559 47435 52565 57695 30388 48264
58524 53977 46675 28487 32018 52538 58256 46485
31937 52457 59491 40566 54567 31501 52133 40432
42927 45562 54500 30958 44652 48169 58429 54120
16354 26614 44490 30131 39887 51099 58161 31856
47750 52824 55389 58066 46295 24470 29628 59668
40785 45915 54853 31311 51943 55474 46744 28556
31177 44395 39806 54826 59560 30417 40621 47655
50937 53740 57971 46438 24375 44004 47521 52511
57781 24308 29438 52444 59478 55827 46649 54610
28461 31096 52176 40405 42970 45535 28366 31883

59913 30560 48156 58696 54093 16327 36847 40378
47888 54446 61956 31829 44710 47331 52349 57591
54178 24051 29657 52081 42875 28271 31802 52882
55447 58040 46269 28137 23548 16246 44382 40731
46001 54799 31397 59533 30180 40664 47698 51148
54665 58182 61699 44929 47508 61632 30363 52787
55590 46860 28504 31069 43950 51701 42495 24254
59452 30533 40569 45811 51053 54584 27623 31154
52122 40351 44848 47413 54475 58916 61537 44739
30506 47318 58754 54151 16301 26617 55876 46670
31775 47753 52407 58013 46536 28124 24473 31507
52027 54394 31440 51960 40189 44658 47223 58659
54070 44468 39921 58592 53989 16111 30126 47672
52998 55619 58156 46441 28029 43979 56448 61578
24283 31345 59481 40780 46022 54557 28562 31127
51647 44821 58945 61524 44278 30479 40627 51111 53746
16344 30412 43898 52836 56353 57966 61483 24426
44713 47292 52674 57832 38893 45927 28467 55822
46756 54367 28400 30965 51933 55688 44631 48386
58646 54099 16249 30317 44497 58565 54928 31386
30155 47645 52579 58185 46428 43518 39867 58538
53935 24046 31556 52076 55593 42982 46499 28087
55498 48224 58484 54833 31291 59539 30074 40838
45996 51154 53719 27640 15869 43871 56340 58891
61470 24399 44700 29669 47321 57805 54168 46866
32262 52782 55403 46785 28373 32128 52648 59682
40743 51059 40676 45806 54453 28346 30911 22526
44605 47464 52566 57724 54073 16307 30375 44443
58511 53978 46704 28516 32033 53001 55580 58243
46486 31938 52458 59968 48197 55044 31502 52134
30047 40419 46025 50679 27613 48170 58430 53883
44281 30608 39916 51128 53693 58162 46391 31843
43957 52811 55390 58081 46324 24485 29615 52621
59655 40786 45944 54854 31340 59588 55937 46731
54720 28319 31178 44872 30513 47437 58649 30418
40622 50938 53503 46677 32020 43767 47522 52540
57782 38899 24295 52431 59493 55856 46650 54625
28462 31083 52163 40406 42985 45564 31912 59914
30323 48143 58459 54094 16356 44492 30133 40841
47875 51101 58135 31830 47808 52350 58068 61585
24528 29658 52082 40311 45917 32265 52897 55476
58027 46270 28138 23535 44397 40760 46002 54828
31398 59534 29943 40651 47713 50911 54666 57973
61728 24433 44930 29563 47495 52569 57811 30392
60432 55829 46623 54612 28491 31070 51702 42972
46489 31885 59439 30534 40570 51054 54571 31617
52137 40380 44835 47414 54504 61538 44768 47333
58545 54180 16302 24053 26618 29183 52055 42877
31804 47754 52884 55505 58014 46299 28111 24474
31536 59672 40733 45975 54857 31427 51947 40190
47700 59136 61701 44455 39922 53990 30365 47659
52789 55648 57919 46442 28030 24379 44008 52627
57785 24312 31346 59482 40543 45813 54558 28577
31156 52124 40409 44822 47443 54477 58946 61511
44741 30508 48272 58756 54209 16331 26591 56354
61960 31833 44714 47279 52465 57595 38894 23999
31509 52029 42935 54396 28387 30966 51934 55451
44660 48177 58661 54128 16250 30318 44498 39895
58566 54915 31401 30184 47646 53056 55621 58186
46415 43981 47512 61580 24285 31319 51839 55594
46976 28564 31185 51705 44403 58471 54834 59568
30537 40629 45759 51169 53748 27627 15870 43900
47417 56327 58920 61485 24428 44687 29670 47322
52676 57806 54155 46881 28469 55880 46786 28374
31891 52411 59921 48388 58704 54101 16223 36855
54454 31388 30157 44606 47227 52581 57711 54074
44472 39869 58540 53993 46691 28279 32034 53002

55567 58272 46501 28145 55500 48198 54807 31293
59541 30076 40896 46026 51156 54673 27614 31131
44825 58893 61528 44282 30595 39679 51115 53694
46868 32320 43958 52840 55405 58082 46311 24486
52622 59684 40801 45931 51061 27519 55938 46760
54483 28348 30969 44635 30514 47438 58650 54047
16309 30433 44445 58569 53980 46678 32007 47761
52527 58245 46544 31940 52460 59494 55843 54626
31560 52192 40421 42986 45551 28091 48172 58488
53885 16119 44255 30134 40842 47904 51102 53723
58164 46449 31845 43987 52813 56344 58055 61586
24515 29673 59713 40788 45918 32266 52898 55463
46733 28377 31180 44398 30487 40747 51007 30420
40680 47714 50940 54457 57974 61491 24434 44721
47524 52570 57840 38901 15359 30379 60419 55830
46652 54599 28520 31085 52165 55696 42959 46490
31886 59916 30325 48201 58461 55048 31618 52138
30163 40367 47877 50683 58193 47334 58546 53943
24054 29660 52084 55601 42878 46395 31791 43961
52871 55506 58029 46328 28140 24489 31523 59659
40734 46004 54858 31456 59592 40653 47687 54668
58899 61702 24407 44932 29565 47553 57813 30366
52790 55411 46681 28493 32024 43771 52656 57786
38847 24299 59497 40572 45814 54573 28578 31143 52111
40410 44837 47472 54478 61540 44742 30271 48259
58519 54210 16360 26620 30137 53009 58139 31834
47756 52466 58072 46301 24476 31510 52030 40315
46033 54383 31429 51949 55480 44647 48178 58662
54115 44513 39924 54944 31402 29947 47661 52819
55622 57977 46444 24381 43982 29623 47499 52629
57759 24286 31348 59484 55833 46739 54616 28551
31186 51706 44880 47445 58948 62465 59555 30538
40630 51170 53735 16333 43887 47418 56356 61486
24191 44716 47337 52439 57597 54184 46882 24057
28470 31091 52059 42993 28389 31920 52888 55453
59922 48151 58691 54102 16252 44500 40849 45979
54917 31375 30158 47704 52582 58188 61705 44459
39870 53994 32273 52793 55596 58035 46502 28146
23543 51679 44405 54836 31294 59542 30063 40659
45817 51143 54674 27629 31160 44826 47391 56385
58894 61515 44745 30624 47324 58760 54157 46855
28499 55406 46788 31893 52413 59447 40802 51062
54579 31513 52145 42939 54512 28335 30970 44664
47229 58665 54076 16310 30434 44446 39899 58570
53967 46693 32036 47762 53004 55625 58246 46531
28119 63488 54865 31323 51955 40422 46028 28568
31133 44351 58475 53886 44284 30597 40633 47667 51117
53752 58151 46450 31846 44016 52814 56331 58084
61601 24544 29674 52680 59714 40775 45933 28473
55940 46734 54485 28378 30943 44637 30516 48392
58652 54105 16339 30407 36859 50927 54458 61968
32065 44722 47287 52585 57827 38902 60448 55845
46639 54628 28283 31086 52166 55683 42988 46505
28093 30326 48202 58462 54811 31409 59545 30192
40844 47878 51160 53725 58194 46423 43989 59009
61588 24517 29647 52071 55602 46872 32268 43962
52900 55521 58030 46315 27903 24490 59688 30545
40749 45991 51065 27635 40654 47716 54431 58928
61493 24436 44695 29566 47554 52572 57814 54163
16313 30381 60421 55888 46682 28494 32011 52643
58249 46492 31944 59498 40559 54574 31620 52140
30165 40425 44838 47459 50685 57719 48288 58548
54001 16123 26607 30138 53010 55575 58168 46397
31849 43935 52929 55508 58059 46302 24463 31525
59661 40792 46034 54860 31430 51950 55467 48641
58901 61760 44514 30491 39911 51123 30424 47662
52848 55413 57978 46207 24382 43773 47528 52630

| | | | | | | | |
|---|---|---|---|---|---|---|---|
| 57788 | 38905 | 45939 | 24301 | 31335 | 59471 | 55834 | 46768 |
| 54603 | 28580 | 31201 | 52169 | 40412 | 44867 | 47446 | 62466 |
| 60032 | 30329 | 48261 | 58577 | 54212 | 16334 | 30111 | 47881 |
| 52535 | 58141 | 31836 | 47338 | 52468 | 57598 | 53947 | 24058 |
| 31568 | 52088 | 40317 | 42994 | 45559 | 28390 | 31907 | 52875 |
| 55454 | 59937 | 48180 | 58720 | 54117 | 16239 | 44487 | 40850 |
| 46008 | 54918 | 31404 | 29949 | 47691 | 52821 | 56576 | 57951 |
| 61706 | 24411 | 44936 | 29681 | 47501 | 57817 | 32274 | 52794 |
| 55359 | 46741 | 28609 | 31188 | 51708 | 44406 | 40755 | 54823 |
| 59557 | 30540 | 40688 | 45818 | 51172 | 54689 | 27630 | 31147 |
| 44841 | 47420 | 56386 | 61544 | 44746 | 30387 | 47311 | 58523 |
| 54158 | 46884 | 24031 | 28528 | 31093 | 52061 | 42967 | 31894 |
| 52414 | 59924 | 48209 | 58693 | 55056 | 31514 | 52146 | 40375 |
| 45981 | 54499 | 31433 | 44651 | 47230 | 58666 | 54063 | 44461 |
| 39928 | 53996 | 46694 | 31799 | 47777 | 52767 | 55626 | 58037 |
| 46560 | 28148 | 24497 | 29627 | 52633 | 59667 | 54866 | 31352 |
| 59600 | 40661 | 45791 | 54676 | 28555 | 31134 | 44828 | 47449 |
| 58952 | 61517 | 44271 | 30598 | 40634 | 51118 | 53739 | 46913 |
| 28501 | 44003 | 56360 | 61602 | 24307 | 52443 | 59505 | 40804 |
| 45934 | 54581 | 28474 | 31039 | 52119 | 42941 | 54486 | 28393 |
| 30972 | 44638 | 30503 | 48155 | 58639 | 54106 | 16368 | 30436 |
| 44504 | 39901 | 58572 | 54921 | 61955 | 32066 | 47764 | 52586 |
| 58304 | 46533 | 55846 | 54391 | 31325 | 51957 | 55712 | 42751 |
| 46506 | 28094 | 23547 | 44409 | 58477 | 54840 | 31410 | 59546 |
| 30179 | 40607 | 47669 | 51147 | 53726 | 58209 | 46452 | 43990 |
| 47507 | 56333 | 59010 | 61575 | 24518 | 29676 | 59716 | 56065 |
| 46859 | 28447 | 55522 | 46792 | 28380 | 31897 | 59451 | 30546 |
| 40750 | 51066 | 53631 | 16341 | 36861 | 43895 | 54460 | 58915 |
| 61494 | 24423 | 44724 | 47345 | 52559 | 57829 | 54192 | 16314 |
| 30382 | 60422 | 55875 | 46697 | 28285 | 32040 | 53120 | 55685 |
| 58250 | 46479 | 28123 | 48204 | 54813 | 31383 | 51903 | 30166 |
| 40426 | 47936 | 50686 | 58196 | 61713 | 44467 | 58535 | 54002 |
| 30601 | 53025 | 55604 | 58155 | 46398 | 31850 | 43964 | 52930 |
| 55495 | 58088 | 46317 | 24492 | 31526 | 59662 | 30071 | 40779 |
| 46049 | 51039 | 27637 | 55944 | 48642 | 54489 | 58902 | 61523 |
| 44753 | 30520 | 47556 | 58768 | 54165 | 16287 | 30411 | 52835 |
| 55414 | 46684 | 32013 | 43774 | 47291 | 52645 | 57775 | 38906 |
| 24302 | 59500 | 55849 | 46755 | 54632 | 28343 | 31202 | 52170 |
| 40399 | 44896 | 47461 | 58673 | 30330 | 48262 | 58578 | 53975 |
| 16125 | 30140 | 47882 | 53012 | 55633 | 58142 | 46427 | 31823 |
| 43993 | 52455 | 58061 | 61592 | 24521 | 31555 | 52075 | 40318 |
| 46036 | 32384 | 52904 | 55469 | 59938 | 48167 | 58483 | 54118 |
| 44516 | 30493 | 40865 | 45995 | 51125 | 27583 | 29950 | 47720 |
| 52822 | 56339 | 57980 | 61497 | 24440 | 44699 | 29682 | 47502 |
| 52688 | 57818 | 38879 | 45941 | 32289 | 60425 | 55836 | 46742 |
| 54605 | 28610 | 31175 | 51695 | 44869 | 48400 | 62468 | 59558 |
| 30303 | 40675 | 50935 | 54690 | 31624 | 30169 | 44842 | 47407 |
| 52593 | 57723 | 47340 | 58552 | 53949 | 46647 | 24060 | 28515 |
| 31094 | 52062 | 55579 | 42996 | 46513 | 31909 | 52877 | 55512 |
| 59911 | 48210 | 58694 | 55043 | 31529 | 59777 | 40852 | 45982 |
| 54976 | 31434 | 47693 | 58905 | 61708 | 24413 | 44462 | 29655 |
| 39915 | 50175 | 32276 | 47778 | 52796 | 55417 | 58038 | 46323 |
| 28135 | 24498 | 52634 | 59696 | 40757 | 45887 | 54881 | 31339 |
| 59587 | 40662 | 45820 | 54663 | 28584 | 31149 | 44815 | 47450 |
| 56388 | 61518 | 44748 | 30389 | 48265 | 58525 | 54216 | 46914 |
| 28502 | 32019 | 52539 | 58257 | 31952 | 52472 | 59506 | 40567 |
| 54582 | 31516 | 52148 | 40433 | 42942 | 45563 | 54501 | 28394 |
| 30959 | 44653 | 48184 | 58668 | 54121 | 16355 | 26615 | 44491 |
| 39902 | 54922 | 61984 | 31857 | 47751 | 52825 | 55628 | 58067 |
| 46534 | 24471 | 29629 | 59669 | 54868 | 31326 | 51958 | 55475 |
| 46745 | 28557 | 31192 | 44410 | 39807 | 58478 | 54827 | 59561 |
| 30656 | 40636 | 47670 | 51176 | 53741 | 58210 | 46439 | 44005 |
| 47536 | 56334 | 61604 | 24309 | 29439 | 52445 | 59479 | 56066 |
| 46888 | 54611 | 28476 | 31097 | 52177 | 42971 | 28367 | 31898 |
| 59928 | 30561 | 48157 | 58697 | 54108 | 16342 | 36862 | 40379 |
| 47889 | 54447 | 61957 | 32068 | 44711 | 47346 | 52588 | 57830 |
| 54179 | 55904 | 46698 | 28286 | 31803 | 52883 | 55686 | 58041 |
| 46508 | 28152 | 23549 | 16247 | 44383 | 54814 | 31412 | 59548 |
| 30181 | 40665 | 47699 | 51149 | 54680 | 58183 | 61714 | 44944 |
| 47509 | 59012 | 61633 | 30602 | 53026 | 55591 | 46861 | 28505 |
| 43951 | 55524 | 46318 | 24255 | 59453 | 30548 | 40808 | 46050 |
| 51068 | 54585 | 27638 | 31155 | 52123 | 44849 | 54490 | 58917 |
| 61552 | 44754 | 30507 | 47319 | 58755 | 54166 | 16316 | 30440 |
| 60480 | 55877 | 46671 | 32014 | 47768 | 52646 | 58252 | 46537 |
| 28125 | 55850 | 54395 | 31441 | 51961 | 40428 | 44659 | 47462 |
| 58674 | 54071 | 44469 | 58593 | 54004 | 16126 | 30127 | 47673 |
| 52999 | 55634 | 58157 | 46456 | 31852 | 43994 | 52932 | 56449 |
| 58062 | 61579 | 24522 | 31584 | 59720 | 40781 | 46023 | 28563 |
| 55470 | 48644 | 58960 | 61525 | 44279 | 30494 | 40866 | 51126 |
| 53747 | 16345 | 30413 | 43899 | 52837 | 56368 | 57967 | 61498 |
| 24427 | 44728 | 47293 | 52675 | 57833 | 38908 | 45942 | 32290 |
| 60426 | 55823 | 46757 | 54606 | 28401 | 31204 | 52172 | 55689 |
| 44870 | 48387 | 58647 | 30332 | 48320 | 58580 | 54929 | 31387 |
| 30170 | 47884 | 52594 | 58200 | 46429 | 43519 | 58539 | 53950 |
| 24047 | 31557 | 52077 | 55608 | 42983 | 46514 | 31910 | 52878 |
| 55499 | 59940 | 48225 | 58485 | 55072 | 31530 | 59778 | 30075 |
| 40839 | 45997 | 51155 | 27641 | 47694 | 56341 | 58906 | 61471 |
| 24414 | 44701 | 29684 | 47560 | 57820 | 54169 | 46867 | 32263 |
| 52783 | 55418 | 46800 | 28612 | 32129 | 52649 | 59683 | 40758 |
| 54882 | 59616 | 40677 | 45807 | 54692 | 28347 | 31150 | 22527 |
| 44844 | 47465 | 52567 | 57725 | 30390 | 48266 | 58526 | 53979 |
| 46705 | 28517 | 32048 | 53016 | 55581 | 58258 | 46487 | 31939 |
| 52459 | 59969 | 48212 | 55045 | 31503 | 52135 | 40434 | 46040 |
| 54502 | 31436 | 44654 | 48171 | 58431 | 54122 | 44520 | 30609 |
| 39917 | 51129 | 58163 | 31858 | 47780 | 52826 | 55391 | 58096 |
| 46325 | 24500 | 29630 | 52636 | 59670 | 40787 | 45945 | 54855 |
| 31341 | 59589 | 55952 | 46746 | 54721 | 28558 | 31179 | 44873 |
| 47452 | 62472 | 59562 | 30419 | 40623 | 50939 | 53742 | 46916 |
| 32021 | 44006 | 47523 | 52541 | 57783 | 24310 | 52446 | 59508 |
| 55857 | 46651 | 54640 | 28463 | 31098 | 52178 | 40407 | 43000 |
| 45565 | 28396 | 31913 | 59915 | 30562 | 48158 | 58698 | 54095 |
| 16357 | 44493 | 40856 | 47890 | 54924 | 61958 | 31831 | 47809 |
| 52351 | 58069 | 61824 | 24529 | 29659 | 52083 | 32280 | 52912 |
| 55477 | 58042 | 46271 | 28139 | 23550 | 44412 | 40761 | 46003 |
| 54829 | 31399 | 59535 | 30182 | 40666 | 47728 | 51150 | 54667 |
| 58212 | 61729 | 44931 | 47510 | 56392 | 61634 | 30393 | 60433 |
| 56068 | 46862 | 54613 | 28506 | 31071 | 51703 | 42973 | 31900 |
| 59454 | 30535 | 40571 | 51055 | 54586 | 31632 | 52152 | 40381 |
| 44850 | 47415 | 54505 | 58918 | 61539 | 44769 | 47348 | 58784 |
| 54181 | 16303 | 26619 | 55878 | 46700 | 31805 | 47755 | 52885 |
| 55744 | 58015 | 46538 | 28126 | 24475 | 31537 | 59673 | 54872 |
| 31442 | 51962 | 40191 | 47701 | 59137 | 61716 | 44470 | 39923 |
| 58594 | 53991 | 30604 | 47674 | 53028 | 55649 | 58158 | 46443 |
| 28031 | 44009 | 56450 | 61608 | 24313 | 31347 | 59483 | 40782 |
| 46052 | 54559 | 28592 | 31157 | 52125 | 44823 | 54492 | 58947 |
| 61526 | 44756 | 30509 | 48273 | 58757 | 54224 | 16346 | 30414 |
| 52838 | 56355 | 61961 | 32072 | 44715 | 47294 | 52704 | 57834 |
| 38895 | 55852 | 46758 | 54397 | 28402 | 30967 | 51935 | 55690 |
| 44661 | 48416 | 58676 | 54129 | 16251 | 30319 | 44499 | 58567 |
| 54930 | 31416 | 30185 | 47647 | 53057 | 55636 | 58187 | 46430 |
| 43996 | 47513 | 59016 | 61581 | 24524 | 31558 | 52078 | 55595 |
| 46977 | 28565 | 55528 | 48226 | 58486 | 54835 | 59569 | 30552 |
| 40868 | 45998 | 51184 | 53749 | 27642 | 15871 | 43901 | 56342 |
| 58921 | 61500 | 24429 | 44702 | 29671 | 47323 | 52677 | 57807 |
| 54170 | 46896 | 32292 | 60428 | 55881 | 46787 | 28375 | 32130 |
| 52650 | 60160 | 48389 | 58705 | 40678 | 54455 | 31389 | 30172 |
| 44607 | 47466 | 52596 | 57726 | 54075 | 44473 | 58541 | 54008 |
| 46706 | 28518 | 32035 | 53003 | 55582 | 58273 | 46516 | 31968 |
| 52936 | 55501 | 59970 | 48199 | 55046 | 31532 | 59780 | 30077 |
| 40897 | 46027 | 51157 | 27615 | 48648 | 58908 | 61529 | 44283 |
| 30610 | 39918 | 51130 | 53695 | 46869 | 32321 | 43959 | 52841 |
| 55420 | 58083 | 46326 | 24487 | 52623 | 59685 | 40816 | 45946 |
| 54884 | 31342 | 59590 | 55939 | 46761 | 54722 | 28349 | 31208 |
| 44874 | 30515 | 47439 | 58651 | 30448 | 48268 | 58584 | 53981 |

46679 32022 48000 52542 58260 46545 31941 52461
59495 55858 54627 31561 52193 40436 42987 45566
31914 59944 48173 58489 54124 16358 44494 30135
40843 47905 51103 58165 31860 47810 52828 56345
58070 61587 24530 29688 59728 40789 45919 32267
52899 55478 46748 28616 31181 44399 40762 54830
59564 30421 40681 47715 50941 54696 57975 61730
24435 44960 47525 52571 57841 30394 60434 55831
46653 54614 28521 31100 52180 55697 42974 46491
31887 59917 30564 48216 58700 55049 31619 52139
40382 47892 54506 62016 44770 47335 58547 54182
24055 29661 52085 42879 31806 47784 52886 55507
58044 46329 28141 24504 31538 59674 40735 46005
54859 31457 59593 40668 47702 54669 59138 61703
44933 47568 61636 30367 52791 55650 46920 28508
32025 44010 52657 57787 24314 59512 40573 45815
54588 28579 31158 52126 40411 44852 47473 54479
58976 61541 44743 30510 48274 58758 54211 16361
26621 56832 61962 31835 47757 52467 58073 46540
24477 31511 52031 54398 31444 51964 55481 44662
48179 58663 54130 44528 39925 58596 54945 31403
30186 47676 53058 55623 58216 46445 43983 47514
56452 61582 24287 31349 59485 56072 46978 54617
28566 31187 51707 44881 58949 62480 59570 30539
40631 51171 53750 16348 43902 47419 56357 58922
61487 24430 44717 47352 52678 57836 54185 46883
28471 55882 46816 28404 31921 52889 55692 59923
48390 58706 54103 16253 44501 54932 31390 30159
47705 52583 58189 61720 44474 39871 58542 53995
32512 53032 55597 58274 46503 28147 55502 48228
54837 31295 59543 30078 40898 46056 51158 54675
27644 31161 44827 56400 58895 61530 44760 30625
47325 58761 54172 46870 32322 52842 55407 46789
32132 52652 59686 40803 51063 55968 46762 54513
28350 30971 44665 47468 58680 54077 16311 30435
44447 58571 53982 46708 32037 47763 53005 55640
58247 46546 31942 52462 59972 63489 55104 31562
52194 40423 46029 28569 48174 58490 53887 44285
30612 40872 47906 51132 53753 58166 46451 31847
44017 52815 56346 58085 61616 24545 29675 52681
59715 40790 45948 32296 60544 55941 46735 54724
28379 31182 44876 30517 48393 58653 30422 40682
50942 54459 61969 32080 44723 47526 52600 57842
38903 60449 55860 46654 54629 28522 31087 52167
55698 42989 46520 31916 59918 30327 48203 58463
55050 31648 59784 30193 40845 47879 51161 58195
47812 59024 61589 24532 29662 52086 55603 46873
32269 43963 52901 55536 58031 46330 28142 24491
59689 40764 46006 54888 31458 59594 40655 47717
54670 58929 61732 24437 44934 29567 47555 52573
57815 30396 60436 55889 46683 28495 32026 52658
58264 46493 31945 59499 40574 54575 31621 52141
40440 44839 47474 54508 61542 44772 48289 58549
54240 16362 26622 30139 53011 58169 31864 47758
52944 55509 58074 46303 24478 31540 59676 40793
46035 54861 31431 51951 55482 48656 59140 61761
44515 39926 54946 30425 47663 52849 55652 57979
46446 24383 44012 47529 52631 57789 24316 31350
59486 55835 46769 54618 28581 31216 52184 40413
44882 47447 58950 62467 60033 30568 48276 58816
54213 16335 47896 56358 61964 31837 44718 47339
52469 57599 54186 24059 31569 52089 42995 28391
31922 52890 55455 59952 48181 58721 54132 16254
44502 40851 46009 54919 31405 30188 47706 53060
56577 58190 61707 44937 47516 61640 32275 52795
55598 46980 28624 31189 51709 44407 54838 59572
30541 40689 45819 51173 54704 27631 31162 44856

47421 56387 58924 61545 44747 30626 47326 58762
54159 46885 28529 55884 46790 31895 52415 59925
48448 58708 55057 31515 52147 54514 31448 44666
47231 58667 54078 44476 39929 58600 53997 46695
32038 47792 53006 55627 58276 46561 28149 56456
63490 54867 31353 59601 40900 46030 54677 28570
31135 44829 58953 61532 44286 30599 40635 51119 53754
46928 32324 44018 52844 56361 58086 61603 24546
52682 59744 40805 45935 28475 55942 46764 54487
28408 30973 44639 30518 48394 58654 54107 16369
30437 44505 58573 54936 61970 32067 47765 52587
58305 46548 60450 55847 54630 31564 52196 55713
42990 46507 28095 48232 58492 54841 31411 59547
30194 40846 47908 51162 53727 58224 46453 43991
56348 59011 61590 24519 29677 59717 56080 46874
32270 52902 55523 46793 28381 32136 59690 30547
40751 51067 40684 47718 54461 58930 61495 24438
44725 47584 52574 57844 54193 16315 30383 60423
55890 46712 28524 32041 53121 55700 58251 46494
31946 59976 48205 55052 31622 52142 30167 40427
47937 50687 58197 48290 58550 54003 30616 53040
55605 58170 46399 31851 43965 52931 55510 58089
46332 24493 31527 59663 40794 46064 54862 31460
59596 55945 48643 54728 58903 61762 44992 30521
47557 58769 30426 52850 55415 46685 32028 43775
47530 52660 57790 38907 24303 59501 55864 46770
54633 28582 31203 52171 40414 44897 47476 62496
60034 30331 48263 58579 54214 16364 30141 47883
53013 58143 31838 47816 52470 58076 61593 24536
31570 52090 40319 46037 32385 52905 55484 59939
48182 58722 54119 44517 40880 46010 54948 31406
29951 47721 52823 56578 57981 61736 24441 44938
29683 47503 52689 57819 32304 60440 55837 46743
54620 28611 31190 51710 44884 48401 62469 59559
30542 40690 51174 54691 31625 44843 47422 56416
61546 44776 47341 58553 54188 46886 24061 28530
31095 52063 42997 31924 52892 55513 59926 48211
58695 55058 31544 59792 40853 45983 54977 31435
47708 59144 61709 44463 39930 53998 32277 47779
52797 55656 58039 46562 28150 24499 52635 59697
54896 31354 59602 40663 45821 54678 28585 31164
44830 47451 56389 58954 61519 44749 30628 48280
58764 54217 46915 28503 56362 62080 31953 52473
59507 40806 54583 31517 52149 42943 54516 28395
30974 44668 48185 58669 54136 16370 30438 44506
39903 58574 54923 61985 32096 47766 53064 55629
58306 46535 63492 54869 31327 51959 55714 46984
28572 31193 44411 58479 54842 59576 30657 40637
47671 51177 53756 58211 46454 44020 47537 56335
59040 61605 24548 29678 52684 59718 56067 46889
28477 56000 46794 28382 31899 59929 30576 48396
58712 54109 16343 36863 54462 61972 32069 44726
47347 52589 57831 54194 60452 55905 46699 28287
32042 53122 55687 58280 46509 28153 48206 54815
31413 59549 30196 40904 47938 51164 54681 58198
61715 44945 59013 61648 30603 53027 55606 46876
32328 43966 52960 55525 58090 46319 24494 59692
30549 40809 46051 51069 27639 55946 48672 54491
58932 61553 44755 30522 47558 58770 54167 16317
30441 60481 55892 46686 32015 47769 52647 58253
46552 31948 59502 55851 54634 31680 52200 40429
44898 47463 58675 48292 58608 54005 16127 30142
47912 53014 55635 58172 46457 31853 43995 52933
56464 58063 61594 24523 31585 59721 40796 46038
32386 52906 55471 48645 58961 61764 44518 30495
40867 51127 30428 47722 52852 56369 57982 61499
24442 44729 47532 52690 57848 38909 45943 32291

| | | | | | | | |
|---|---|---|---|---|---|---|---|
| 60427 | 55838 | 46772 | 54607 | 28640 | 31205 | 52173 | 55704 |
| 44871 | 48402 | 62470 | 60036 | 30333 | 48321 | 58581 | 55168 |
| 31626 | 30171 | 47885 | 52595 | 58201 | 47342 | 58554 | 53951 |
| 24062 | 31572 | 52092 | 55609 | 42998 | 46515 | 31911 | 52879 |
| 55514 | 59941 | 48240 | 58724 | 55073 | 31531 | 59779 | 40854 |
| 46012 | 54978 | 31464 | 47695 | 56580 | 58907 | 61710 | 24415 |
| 44940 | 29685 | 47561 | 57821 | 32278 | 52798 | 55419 | 46801 |
| 28613 | 32144 | 52664 | 59698 | 40759 | 54883 | 59617 | 40692 |
| 45822 | 54693 | 28586 | 31151 | 44845 | 47480 | 56390 | 61548 |
| 44750 | 30391 | 48267 | 58527 | 54218 | 46944 | 28532 | 32049 |
| 53017 | 58259 | 31954 | 52474 | 59984 | 48213 | 55060 | 31518 |
| 52150 | 40435 | 46041 | 54503 | 31437 | 44655 | 48186 | 58670 |
| 54123 | 44521 | 39932 | 54952 | 61986 | 31859 | 47781 | 52827 |
| 55630 | 58097 | 46564 | 24501 | 29631 | 52637 | 59671 | 54870 |
| 31356 | 59604 | 55953 | 46747 | 54736 | 28559 | 31194 | 44888 |
| 47453 | 58956 | 62473 | 59563 | 30658 | 40638 | 51178 | 53743 |
| 46917 | 44007 | 47538 | 56364 | 61606 | 24311 | 52447 | 59509 |
| 56096 | 46890 | 54641 | 28478 | 31099 | 52179 | 43001 | 28397 |
| 31928 | 59930 | 30563 | 48159 | 58699 | 54110 | 16372 | 44508 |
| 40857 | 47891 | 54925 | 61959 | 32070 | 47824 | 52590 | 58308 |
| 61825 | 55906 | 32281 | 52913 | 55716 | 58043 | 46510 | 28154 |
| 23551 | 44413 | 54844 | 31414 | 59550 | 30183 | 40667 | 47729 |
| 51151 | 54682 | 58213 | 61744 | 44946 | 47511 | 56393 | 59014 |
| 61635 | 30632 | 60672 | 56069 | 46863 | 28507 | 55526 | 46796 |
| 31901 | 59455 | 30550 | 40810 | 51070 | 54587 | 31633 | 52153 |
| 44851 | 54520 | 58919 | 61554 | 44784 | 47349 | 58785 | 54196 |
| 16318 | 30442 | 60482 | 55879 | 46701 | 32044 | 47770 | 53124 |
| 55745 | 58254 | 46539 | 28127 | 63496 | 54873 | 31443 | 51963 |
| 40430 | 47940 | 59152 | 61717 | 44471 | 58595 | 54006 | 30605 |
| 47675 | 53029 | 55664 | 58159 | 46458 | 31854 | 44024 | 52934 |
| 56451 | 58092 | 61609 | 24552 | 31586 | 59722 | 40783 | 46053 |
| 28593 | 55948 | 48646 | 54493 | 58962 | 61527 | 44757 | 30524 |
| 48512 | 58772 | 54225 | 16347 | 30415 | 52839 | 56370 | 61976 |
| 32073 | 44730 | 47295 | 52705 | 57835 | 38910 | 60456 | 55853 |
| 46759 | 54636 | 28403 | 31206 | 52174 | 55691 | 44900 | 48417 |
| 58677 | 30334 | 48322 | 58582 | 54931 | 31417 | 30200 | 47886 |
| 53072 | 55637 | 58202 | 46431 | 43997 | 59017 | 61596 | 24525 |
| 31559 | 52079 | 55610 | 46992 | 32388 | 52908 | 55529 | 59942 |
| 48227 | 58487 | 55074 | 59808 | 30553 | 40869 | 45999 | 51185 |
| 27643 | 47724 | 56343 | 58936 | 61501 | 24444 | 44703 | 29686 |
| 47562 | 52692 | 57822 | 54171 | 46897 | 32293 | 60429 | 55896 |
| 46802 | 28614 | 32131 | 52651 | 60161 | 48404 | 62528 | 59618 |
| 40679 | 54694 | 31628 | 30173 | 44846 | 47467 | 52597 | 57727 |
| 48296 | 58556 | 54009 | 46707 | 28519 | 32050 | 53018 | 55583 |
| 58288 | 46517 | 31969 | 52937 | 55516 | 59971 | 48214 | 55047 |
| 31533 | 59781 | 40912 | 46042 | 54980 | 31438 | 48649 | 58909 |
| 61768 | 44522 | 30611 | 39919 | 51131 | 32336 | 47782 | 52856 |
| 55421 | 58098 | 46327 | 24502 | 52638 | 59700 | 40817 | 45947 |
| 54885 | 31343 | 59591 | 55954 | 46776 | 54723 | 28588 | 31209 |
| 44875 | 47454 | 62474 | 60040 | 30449 | 48269 | 58585 | 54220 |
| 46918 | 32023 | 48001 | 52543 | 58261 | 31956 | 52476 | 59510 |
| 55859 | 54642 | 31576 | 52208 | 40437 | 43002 | 45567 | 28398 |
| 31915 | 59945 | 48188 | 58728 | 54125 | 16359 | 44495 | 40858 |
| 47920 | 54926 | 61988 | 31861 | 47811 | 52829 | 56584 | 58071 |
| 61826 | 24531 | 29689 | 59729 | 32282 | 52914 | 55479 | 46749 |
| 28617 | 31196 | 44414 | 40763 | 54831 | 59565 | 30660 | 40696 |
| 47730 | 51180 | 54697 | 58214 | 61731 | 44961 | 47540 | 56394 |
| 61664 | 30395 | 60435 | 56070 | 46892 | 54615 | 28536 | 31101 |
| 52181 | 42975 | 31902 | 59932 | 30565 | 48217 | 58701 | 55064 |
| 31634 | 52154 | 40383 | 47893 | 54507 | 62017 | 44771 | 47350 |
| 58786 | 54183 | 55908 | 46702 | 31807 | 47785 | 52887 | 55746 |
| 58045 | 46568 | 28156 | 24505 | 31539 | 59675 | 54874 | 31472 |
| 59608 | 40669 | 47703 | 54684 | 59139 | 61718 | 44948 | 47569 |
| 59072 | 61637 | 30606 | 53030 | 55651 | 46921 | 28509 | 44011 |
| 56480 | 61610 | 24315 | 59513 | 40812 | 46054 | 54589 | 28594 |
| 31159 | 52127 | 44853 | 54494 | 58977 | 61556 | 44758 | 30511 |
| 48275 | 58759 | 54226 | 16376 | 30444 | 60484 | 56833 | 61963 |

| | | | | | | | |
|---|---|---|---|---|---|---|---|
| 32074 | 47772 | 52706 | 58312 | 46541 | 55854 | 54399 | 31445 |
| 51965 | 55720 | 44663 | 48418 | 58678 | 54131 | 44529 | 58597 |
| 54960 | 31418 | 30187 | 47677 | 53059 | 55638 | 58217 | 46460 |
| 43998 | 47515 | 56453 | 59018 | 61583 | 24526 | 31588 | 59724 |
| 56073 | 46979 | 28567 | 55530 | 48704 | 58964 | 62481 | 59571 |
| 30554 | 40870 | 51186 | 53751 | 16349 | 43903 | 56372 | 58923 |
| 61502 | 24431 | 44732 | 47353 | 52679 | 57837 | 54200 | 46898 |
| 32294 | 60430 | 55883 | 46817 | 28405 | 32160 | 53128 | 55693 |
| 60162 | 48391 | 58707 | 48324 | 54933 | 31391 | 30174 | 47944 |
| 52598 | 58204 | 61721 | 44475 | 58543 | 54010 | 32513 | 53033 |
| 55612 | 58275 | 46518 | 31970 | 52938 | 55503 | 60000 | 48229 |
| 55076 | 31534 | 59782 | 30079 | 40899 | 46057 | 51159 | 27645 |
| 48650 | 56401 | 58910 | 61531 | 44761 | 30640 | 47564 | 58776 |
| 54173 | 46871 | 32323 | 52843 | 55422 | 46804 | 32133 | 52653 |
| 59687 | 40818 | 54886 | 59620 | 55969 | 46763 | 54752 | 28351 |
| 31210 | 44904 | 47469 | 58681 | 30450 | 48270 | 58586 | 53983 |
| 46709 | 32052 | 48002 | 53020 | 55641 | 58262 | 46547 | 31943 |
| 52463 | 59973 | 63504 | 55105 | 31563 | 52195 | 40438 | 46044 |
| 32392 | 59946 | 48175 | 58491 | 54126 | 44524 | 30613 | 40873 |
| 47907 | 51133 | 58167 | 31862 | 47840 | 52830 | 56347 | 58100 |
| 61617 | 24560 | 29690 | 52696 | 59730 | 40791 | 45949 | 32297 |
| 60545 | 55956 | 46750 | 54725 | 28618 | 31183 | 44877 | 48408 |
| 62476 | 59566 | 30423 | 40683 | 50943 | 54698 | 62208 | 32081 |
| 44962 | 47527 | 52601 | 57843 | 60464 | 55861 | 46655 | 54644 |
| 28523 | 31102 | 52182 | 55699 | 43004 | 46521 | 31917 | 59919 |
| 30566 | 48218 | 58702 | 55051 | 31649 | 59785 | 40860 | 47894 |
| 54984 | 62018 | 47813 | 59025 | 61828 | 24533 | 29663 | 52087 |
| 32284 | 47786 | 52916 | 55537 | 58046 | 46331 | 28143 | 24506 |
| 59704 | 40765 | 46007 | 54889 | 31459 | 59595 | 40670 | 47732 |
| 54671 | 59168 | 61733 | 44935 | 47570 | 56396 | 61638 | 30397 |
| 60437 | 56128 | 46922 | 28510 | 32027 | 52659 | 58265 | 31960 |
| 59514 | 40575 | 54590 | 31636 | 52156 | 40441 | 44854 | 47475 |
| 54509 | 58978 | 61543 | 44773 | 48304 | 58788 | 54241 | 16363 |
| 26623 | 56834 | 61992 | 31865 | 47759 | 52945 | 55748 | 58075 |
| 46542 | 24479 | 31541 | 59677 | 54876 | 31446 | 51966 | 55483 |
| 48657 | 59141 | 61776 | 44530 | 39927 | 58598 | 54947 | 30664 |
| 47678 | 53088 | 55653 | 58218 | 46447 | 44013 | 47544 | 56454 |
| 61612 | 24317 | 31351 | 59487 | 56074 | 47008 | 54619 | 28596 |
| 31217 | 52185 | 44883 | 58951 | 62482 | 60048 | 30569 | 48277 |
| 58817 | 54228 | 16350 | 47897 | 56359 | 61965 | 32076 | 44719 |
| 47354 | 52708 | 57838 | 54187 | 55912 | 46818 | 28406 | 31923 |
| 52891 | 55694 | 59953 | 48420 | 58736 | 54133 | 16255 | 44503 |
| 54934 | 31420 | 30189 | 47707 | 53061 | 56592 | 58191 | 61722 |
| 44952 | 47517 | 59020 | 61641 | 32514 | 53034 | 55599 | 46981 |
| 28625 | 55532 | 48230 | 54839 | 59573 | 30556 | 40928 | 46058 |
| 51188 | 54705 | 27646 | 31163 | 44857 | 56402 | 58925 | 61560 |
| 44762 | 30627 | 47327 | 58763 | 54174 | 46900 | 32352 | 60488 |
| 55885 | 46791 | 32134 | 52654 | 60164 | 48449 | 58709 | 55970 |
| 54515 | 31449 | 44667 | 47470 | 58682 | 54079 | 44477 | 58601 |
| 54012 | 46710 | 32039 | 47793 | 53007 | 55642 | 58277 | 46576 |
| 31972 | 52940 | 56457 | 59974 | 63491 | 55106 | 31592 | 59840 |
| 40901 | 46031 | 28571 | 48652 | 58968 | 61533 | 44287 | 30614 |
| 40874 | 51134 | 53755 | 46929 | 32325 | 44019 | 52845 | 56376 |
| 58087 | 61618 | 24547 | 52683 | 59745 | 40820 | 45950 | 32298 |
| 60546 | 55943 | 46765 | 54726 | 28409 | 31212 | 44878 | 30519 |
| 48395 | 58655 | 30452 | 48328 | 58588 | 54937 | 61971 | 32082 |
| 48004 | 52602 | 58320 | 46549 | 60451 | 55862 | 54631 | 31565 |
| 52197 | 55728 | 42991 | 46522 | 31918 | 59948 | 48233 | 58493 |
| 55080 | 31650 | 59786 | 30195 | 40847 | 47909 | 51163 | 58225 |
| 47814 | 56349 | 59026 | 61591 | 24534 | 29692 | 59732 | 56081 |
| 46875 | 32271 | 52903 | 55538 | 46808 | 28620 | 32137 | 59691 |
| 40766 | 54890 | 59624 | 40685 | 47719 | 54700 | 58931 | 61734 |
| 24439 | 44964 | 47585 | 52575 | 57845 | 30398 | 60438 | 55891 |
| 46713 | 28525 | 32056 | 53136 | 55701 | 58266 | 46495 | 31947 |
| 59977 | 48220 | 55053 | 31623 | 52143 | 40442 | 47952 | 54510 |
| 62020 | 44774 | 48291 | 58551 | 54242 | 30617 | 53041 | 58171 |
| 31866 | 47788 | 52946 | 55511 | 58104 | 46333 | 24508 | 31542 |

59678 40795 46065 54863 31461 59597 55960 48658
54729 59142 61763 44993 47572 62592 30427 52851
55654 46924 32029 44014 47531 52661 57791 24318
59516 55865 46771 54648 28583 31218 52186 40415
44912 47477 58980 62497 60035 30570 48278 58818
54215 16365 47898 56836 61966 31839 47817 52471
58077 61832 24537 31571 52091 32400 52920 55485
59954 48183 58723 54134 44532 40881 46011 54949
31407 30190 47736 53062 56579 58220 61737 44939
47518 56512 61642 32305 60441 56076 46982 54621
28626 31191 51711 44885 62484 59574 30543 40691 51175
54706 31640 44858 47423 56417 58926 61547 44777
47356 58792 54189 46887 28531 55886 46820 31925
52893 55752 59927 48450 58710 55059 31545 59793
54992 31450 47709 59145 61724 44478 39931 58602
53999 32516 47794 53036 55657 58278 46563 28151
56458 63520 54897 31355 59603 40902 46060 54679
28600 31165 44831 56404 58955 61534 44764 30629
48281 58765 54232 46930 32326 52846 56363 62081
32192 52712 59746 40807 55972 46766 54517 28410
30975 44669 48424 58684 54137 16371 30439 44507
58575 54938 62000 32097 47767 53065 55644 58307
46550 60928 63493 55108 31566 52198 55715 46985
28573 48234 58494 54843 59577 30672 40876 47910
51192 53757 58226 46455 44021 56350 59041 61620
24549 29679 52685 59719 56082 46904 32300 60548
56001 46795 28383 32138 60168 30577 48397 58713
40686 54463 61973 32084 44727 47586 52604 57846
54195 60453 55920 46714 28526 32043 53123 55702
58281 46524 31976 59978 48207 55054 31652 59788
30197 40905 47939 51165 58199 48768 59028 61649
30618 53042 55607 46877 32329 43967 52961 55540
58091 46334 24495 59693 40824 46066 54892 31462
59598 55947 48673 54730 58933 61792 44994 30523
47559 58771 30456 60496 55893 46687 32030 48008
52662 58268 46553 31949 59503 55866 54635 31681
52201 40444 44899 47478 62498 60064 48293 58609
54244 16366 30143 47913 53015 58173 31868 47818
52948 56465 58078 61595 24538 31600 59736 40797
46039 32387 52907 55486 48660 59200 61765 44519
40882 54950 30429 47723 52853 56608 57983 61738
24443 44968 47533 52691 57849 32306 60442 55839
46773 54622 28641 31220 52188 55705 44886 48403
62471 60037 30572 48336 58820 55169 31627 47900
56418 62024 44778 47343 58555 54190 24063 31573
52093 42999 31926 52894 55515 59956 48241 58725
55088 31546 59794 40855 46013 54979 31465 47710
56581 59146 61711 44941 47576 61644 32279 52799
55658 47040 28628 32145 52665 59699 54898 59632
40693 45823 54708 28587 31166 44860 47481 56391
58984 61549 44751 30630 48282 58766 54219 46945
28533 56840 62082 31955 52475 59985 48452 55061
31519 52151 54518 31452 44670 48187 58671 54138
44536 39933 58604 54953 61987 32098 47796 53066
55631 58336 46565 56460 63494 54871 31357 59605
56192 46986 54737 28574 31195 44889 58957 62488
59578 30659 40639 51179 53758 46932 44022 47539
56365 59042 61607 24550 52686 59748 56097 46891
28479 56002 46824 28412 31929 59931 30578 48398
58714 54111 16373 44509 54940 61974 32071 47825
52591 58309 61840 60454 55907 32520 53152 55717
58282 46511 28155 48236 54845 31415 59551 30198
40906 47968 51166 54683 58228 61745 44947 56408
59015 61650 30633 60673 56084 46878 32330 52962
55527 46797 32140 59694 30551 40811 51071 55976
48674 54521 58934 61555 44785 47588 58800 54197
16319 30443 60483 55894 46716 32045 47771 53125

55760 58255 46554 31950 59980 63497 55112 31682
52202 40431 47941 59153 48294 58610 54007 30620
47914 53044 55665 58174 46459 31855 44025 52935
56466 58093 61624 24553 31587 59723 40798 46068
32416 60552 55949 48647 54732 58963 61766 44996
30525 48513 58773 30430 52854 56371 61977 32088
44731 47534 52720 57850 38911 60457 55868 46774
54637 28642 31207 52175 55706 44901 48432 62500
60038 30335 48323 58583 55170 31656 30201 47887
53073 58203 47820 59032 61597 24540 31574 52094
55611 46993 32389 52909 55544 59943 48242 58726
55075 59809 40884 46014 55008 31466 47725 56582
58937 61740 24445 44942 29687 47563 52693 57823
32308 60444 55897 46803 28615 32146 52666 60176
48405 62529 59619 40694 54695 31629 44847 47482
56420 61550 44780 48297 58557 54248 46946 28534
32051 53019 58289 31984 52952 55517 59986 48215
55062 31548 59796 40913 46043 54981 31439 48664
59148 61769 44523 39934 54954 32337 47783 52857
55660 58099 46566 24503 52639 59701 54900 31358
59606 55955 46777 54738 28589 31224 44890 47455
58958 62475 60041 30688 48284 58824 54221 46919
48016 56366 62084 31957 52477 59511 56098 54643
31577 52209 43003 28399 31930 59960 48189 58729
54140 16374 44510 40859 47921 54927 61989 32100
47826 53068 56585 58310 61827 63552 32283 52915
55718 46988 28632 31197 44415 54846 59580 30661
40697 47731 51181 54712 58215 61746 44976 47541
56395 59044 61665 30634 60674 56071 46893 28537
56004 46798 31903 59933 30580 48456 58716 55065
31635 52155 54522 62032 44786 47351 58787 54198
60512 55909 46703 32046 47800 53126 55747 58284
46569 28157 63498 54875 31473 59609 40908 47942
54685 59154 61719 44949 59073 61652 30607 53031
55666 46936 32332 44026 52964 56481 58094 61611
24554 59752 40813 46055 28595 55950 48676 54495
58992 61557 44759 30526 48514 58774 54227 16377
30445 60485 56848 61978 32075 47773 52707 58313
46556 60458 55855 54638 31684 52204 55721 44902
48419 58679 48352 58612 54961 31419 30202 47916
53074 55639 58232 46461 43999 56468 59019 61598
24527 31589 59725 56088 46994 32390 52910 55531
48705 58965 62720 59810 30555 40871 51187 47726
56373 58938 61503 24446 44733 47592 52694 57852
54201 46899 32295 60431 55898 46832 28644 32161
53129 55708 60163 48406 62530 60096 48325 55172
31630 30175 47945 52599 58205 48298 58558 54011
32528 53048 55613 58290 46519 31971 52939 55518
60001 48244 55077 31535 59783 40914 46072 54982
31468 48651 56640 58911 61770 45000 30641 47565
58777 32338 52858 55423 46805 32148 52668 59702
40819 54887 59621 55984 46778 54753 28590 31211
44905 47484 62504 60042 30451 48271 58587 54222
46948 32053 48003 53021 58263 31958 52478 59988
63505 55120 31578 52210 40439 46045 32393 59947
48190 58730 54127 44525 40888 47922 54956 61990
31863 47841 52831 56586 58101 61856 24561 29691
52697 59731 32312 60560 55957 46751 54740 28619
31198 44892 48409 62477 59567 30662 40698 51182
54699 62209 44963 47542 56424 61666 60465 56100
46894 54645 28538 31103 52183 43005 31932 59934
30567 48219 58703 55066 31664 59800 40861 47895
54985 62019 47828 59264 61829 55910 32285 47787
52917 55776 58047 46570 28158 24507 59705 54904
31474 59610 40671 47733 54686 59169 61748 44950
47571 56397 59074 61639 30636 60676 56129 46923
28511 56482 62088 31961 59515 40814 54591 31637

| | | | | | | | |
|---|---|---|---|---|---|---|---|
| 52157 | 44855 | 54524 | 58979 | 61558 | 44788 | 48305 | 58789 |
| 54256 | 16378 | 30446 | 60486 | 56835 | 61993 | 32104 | 47774 |
| 53184 | 55749 | 58314 | 46543 | 63500 | 54877 | 31447 | 51967 |
| 55722 | 48896 | 59156 | 61777 | 44531 | 58599 | 54962 | 30665 |
| 47679 | 53089 | 55668 | 58219 | 46462 | 44028 | 47545 | 56455 |
| 59048 | 61613 | 24556 | 31590 | 59726 | 56075 | 47009 | 28597 |
| 56008 | 48706 | 58966 | 62483 | 60049 | 30584 | 48516 | 58832 |
| 54229 | 16351 | 56374 | 61980 | 32077 | 44734 | 47355 | 52709 |
| 57839 | 54202 | 60460 | 55913 | 46819 | 28407 | 32162 | 53130 |
| 55695 | 60192 | 48421 | 58737 | 48326 | 54935 | 31421 | 30204 |
| 47946 | 53076 | 56593 | 58206 | 61723 | 44953 | 59021 | 61656 |
| 32515 | 53035 | 55614 | 46996 | 32448 | 52968 | 55533 | 60002 |
| 48231 | 55078 | 59812 | 30557 | 40929 | 46059 | 51189 | 27647 |
| 48680 | 56403 | 58940 | 61561 | 44763 | 30642 | 47566 | 58778 |
| 54175 | 46901 | 32353 | 60489 | 55900 | 46806 | 32135 | 52655 |
| 60165 | 48464 | 62532 | 59622 | 55971 | 54754 | 31688 | 44906 |
| 47471 | 58683 | 48300 | 58616 | 54013 | 46711 | 32054 | 48032 |
| 53022 | 55643 | 58292 | 46577 | 31973 | 52941 | 56472 | 59975 |
| 63506 | 55107 | 31593 | 59841 | 40916 | 46046 | 32394 | 48653 |
| 58969 | 61772 | 44526 | 30615 | 40875 | 51135 | 32340 | 47842 |
| 52860 | 56377 | 58102 | 61619 | 24562 | 52698 | 59760 | 40821 |
| 45951 | 32299 | 60547 | 55958 | 46780 | 54727 | 28648 | 31213 |
| 44879 | 48410 | 62478 | 60044 | 30453 | 48329 | 58589 | 55176 |
| 62210 | 32083 | 48005 | 52603 | 58321 | 60466 | 55863 | 54646 |
| 31580 | 52212 | 55729 | 43006 | 46523 | 31919 | 59949 | 48248 |
| 58732 | 55081 | 31651 | 59787 | 40862 | 47924 | 54986 | 62048 |
| 47815 | 56588 | 59027 | 61830 | 24535 | 29693 | 59733 | 32286 |
| 52918 | 55539 | 46809 | 28621 | 32152 | 59706 | 40767 | 54891 |
| 59625 | 40700 | 47734 | 54701 | 59170 | 61735 | 44965 | 47600 |
| 56398 | 61668 | 30399 | 60439 | 56130 | 46952 | 28540 | 32057 |
| 53137 | 58267 | 31962 | 59992 | 48221 | 55068 | 31638 | 52158 |
| 40443 | 47953 | 54511 | 62021 | 44775 | 48306 | 58790 | 54243 |
| 56864 | 61994 | 31867 | 47789 | 52947 | 55750 | 58105 | 46572 |
| 24509 | 31543 | 59679 | 54878 | 31476 | 59612 | 55961 | 48659 |
| 54744 | 59143 | 61778 | 45008 | 47573 | 59076 | 62593 | 30666 |
| 53090 | 55655 | 46925 | 44015 | 47546 | 56484 | 61614 | 24319 |
| 59517 | 56104 | 47010 | 54649 | 28598 | 31219 | 52187 | 44913 |
| 58981 | 62512 | 60050 | 30571 | 48279 | 58819 | 54230 | 16380 |
| 47899 | 56837 | 61967 | 32078 | 47832 | 52710 | 58316 | 61833 |
| 55914 | 32401 | 52921 | 55724 | 59955 | 48422 | 58738 | 54135 |
| 44533 | 54964 | 31422 | 30191 | 47737 | 53063 | 56594 | 58221 |
| 61752 | 44954 | 47519 | 56513 | 59022 | 61643 | 32544 | 60680 |
| 56077 | 46983 | 28627 | 55534 | 48708 | 62485 | 59575 | 30558 |
| 40930 | 51190 | 54707 | 31641 | 44859 | 56432 | 58927 | 61562 |
| 44792 | 47357 | 58793 | 54204 | 46902 | 32354 | 60490 | 55887 |
| 46821 | 32164 | 53132 | 55753 | 60166 | 48451 | 58711 | 63616 |
| 54993 | 31451 | 47948 | 59160 | 61725 | 44479 | 58603 | 54014 |
| 32517 | 47795 | 53037 | 55672 | 58279 | 46578 | 31974 | 52942 |
| 56459 | 60004 | 63521 | 55136 | 31594 | 59842 | 40903 | 46061 |
| 28601 | 48654 | 56405 | 58970 | 61535 | 44765 | 30644 | 48520 |
| 58780 | 54233 | 46931 | 32327 | 52847 | 56378 | 62096 | 32193 |
| 52713 | 59747 | 40822 | 60576 | 55973 | 46767 | 54756 | 28411 |
| 31214 | 44908 | 48425 | 58685 | 30454 | 48330 | 58590 | 54939 |
| 62001 | 32112 | 48006 | 53080 | 55645 | 58322 | 46551 | 60929 |
| 63508 | 55109 | 31567 | 52199 | 55730 | 47000 | 32396 | 59950 |
| 48235 | 58495 | 55082 | 59816 | 30673 | 40877 | 47911 | 51193 |
| 58227 | 47844 | 56351 | 59056 | 61621 | 24564 | 29694 | 52700 |
| 59734 | 56083 | 46905 | 32301 | 60549 | 56016 | 46810 | 28622 |
| 32139 | 60169 | 48412 | 62536 | 59626 | 40687 | 54702 | 62212 |
| 32085 | 44966 | 47587 | 52605 | 57847 | 60468 | 55921 | 46715 |
| 28527 | 32058 | 53138 | 55703 | 58296 | 46525 | 31977 | 59979 |
| 48222 | 55055 | 31653 | 59789 | 40920 | 47954 | 54988 | 62022 |
| 48769 | 59029 | 61888 | 30619 | 53043 | 32344 | 47790 | 52976 |
| 55541 | 58106 | 46335 | 24510 | 59708 | 40825 | 46067 | 54893 |
| 31463 | 59599 | 55962 | 48688 | 54731 | 59172 | 61793 | 44995 |
| 47574 | 62594 | 30457 | 60497 | 56132 | 46926 | 32031 | 48009 |
| 52663 | 58269 | 31964 | 59518 | 55867 | 54650 | 31696 | 52216 |

| | | | | | | | |
|---|---|---|---|---|---|---|---|
| 40445 | 44914 | 47479 | 58982 | 62499 | 60065 | 48308 | 58848 |
| 54245 | 16367 | 47928 | 56838 | 61996 | 31869 | 47819 | 52949 |
| 56704 | 58079 | 61834 | 24539 | 31601 | 59737 | 32402 | 52922 |
| 55487 | 48661 | 59201 | 61780 | 44534 | 40883 | 54951 | 30668 |
| 47738 | 53092 | 56609 | 58222 | 61739 | 44969 | 47548 | 56514 |
| 61672 | 32307 | 60443 | 56078 | 47012 | 54623 | 28656 | 31221 |
| 52189 | 44887 | 62486 | 60052 | 30573 | 48337 | 58821 | 55184 |
| 31642 | 47901 | 56419 | 62025 | 44779 | 47358 | 58794 | 54191 |
| 55916 | 46822 | 31927 | 52895 | 55754 | 59957 | 48480 | 58740 |
| 55089 | 31547 | 59795 | 54994 | 31480 | 47711 | 56596 | 59147 |
| 61726 | 44956 | 47577 | 59080 | 61645 | 32518 | 53038 | 55659 |
| 47041 | 28629 | 56488 | 63522 | 54899 | 59633 | 40932 | 46062 |
| 54709 | 28602 | 31167 | 44861 | 56406 | 58985 | 61564 | 44766 |
| 30631 | 48283 | 58767 | 54234 | 46960 | 32356 | 60492 | 56841 |
| 62083 | 32194 | 52714 | 60224 | 48453 | 55974 | 54519 | 31453 |
| 44671 | 48426 | 58686 | 54139 | 44537 | 58605 | 54968 | 62002 |
| 32099 | 47797 | 53067 | 55646 | 58337 | 46580 | 56461 | 60930 |
| 63495 | 55110 | 31596 | 59844 | 56193 | 46987 | 28575 | 48712 |
| 58972 | 62489 | 59579 | 30674 | 40878 | 51194 | 53759 | 46933 |
| 44023 | 56380 | 59043 | 61622 | 24551 | 52687 | 59749 | 56112 |
| 46906 | 32302 | 60550 | 56003 | 46825 | 28413 | 32168 | 60170 |
| 30579 | 48399 | 58715 | 48332 | 54941 | 61975 | 32086 | 48064 |
| 52606 | 58324 | 61841 | 60455 | 55922 | 32521 | 53153 | 55732 |
| 58283 | 46526 | 31978 | 60008 | 48237 | 55084 | 31654 | 59790 |
| 30199 | 40907 | 47969 | 51167 | 58229 | 48770 | 56409 | 59030 |
| 61651 | 30648 | 60688 | 56085 | 46879 | 32331 | 52963 | 55542 |
| 46812 | 32141 | 59695 | 40826 | 54894 | 59628 | 55977 | 48675 |
| 54760 | 58935 | 61794 | 45024 | 47589 | 58801 | 30458 | 60498 |
| 55895 | 46717 | 32060 | 48010 | 53140 | 55761 | 58270 | 46555 |
| 31951 | 59981 | 63512 | 55113 | 31683 | 52203 | 40446 | 47956 |
| 62976 | 60066 | 48295 | 58611 | 54246 | 30621 | 47915 | 53045 |
| 58175 | 31870 | 47848 | 52950 | 56467 | 58108 | 61625 | 24568 |
| 31602 | 59738 | 40799 | 46069 | 32417 | 60553 | 55964 | 48662 |
| 54733 | 59202 | 61767 | 44997 | 48528 | 62596 | 30431 | 52855 |
| 56610 | 62216 | 32089 | 44970 | 47535 | 52721 | 57851 | 60472 |
| 55869 | 46775 | 54652 | 28643 | 31222 | 52190 | 55707 | 44916 |
| 48433 | 62501 | 60039 | 30574 | 48338 | 58822 | 55171 | 31657 |
| 47902 | 56896 | 62026 | 47821 | 59033 | 61836 | 24541 | 31575 |
| 52095 | 32404 | 52924 | 55545 | 59958 | 48243 | 58727 | 55090 |
| 59824 | 40885 | 46015 | 55009 | 31467 | 47740 | 56583 | 59176 |
| 61741 | 44943 | 47578 | 56516 | 61646 | 32309 | 60445 | 56136 |
| 47042 | 28630 | 32147 | 52667 | 60177 | 62544 | 59634 | 40695 |
| 54710 | 31644 | 44862 | 47483 | 56421 | 58986 | 61551 | 44781 |
| 48312 | 58796 | 54249 | 46947 | 28535 | 56842 | 62112 | 31985 |
| 52953 | 55756 | 59987 | 48454 | 55063 | 31549 | 59797 | 54996 |
| 31454 | 48665 | 59149 | 61784 | 44538 | 39935 | 58606 | 54955 |
| 32576 | 47798 | 53096 | 55661 | 58338 | 46567 | 56462 | 63524 |
| 54901 | 31359 | 59607 | 56194 | 47016 | 54739 | 28604 | 31225 |
| 44891 | 58959 | 62490 | 60056 | 30689 | 48285 | 58825 | 54236 |
| 46934 | 48017 | 56367 | 62085 | 32196 | 52716 | 59750 | 56099 |
| 56032 | 46826 | 28414 | 31931 | 59961 | 48428 | 58744 | 54141 |
| 16375 | 44511 | 54942 | 62004 | 32101 | 47827 | 53069 | 56600 |
| 58311 | 61842 | 60932 | 63553 | 32522 | 53154 | 55719 | 46989 |
| 28633 | 48238 | 54847 | 59581 | 30676 | 40936 | 47970 | 51196 |
| 54713 | 58230 | 61747 | 44977 | 56410 | 59045 | 61680 | 30635 |
| 60675 | 56086 | 46908 | 32360 | 60608 | 56005 | 46799 | 32142 |
| 60172 | 30581 | 48457 | 58717 | 55978 | 54523 | 62033 | 44787 |
| 47590 | 58802 | 54199 | 60513 | 55924 | 46718 | 32047 | 47801 |
| 53127 | 55762 | 58285 | 46584 | 31980 | 59982 | 63499 | 55114 |
| 31712 | 59848 | 40909 | 47943 | 59155 | 48772 | 59088 | 61653 |
| 30622 | 53046 | 55667 | 46937 | 32333 | 44027 | 52965 | 56496 |
| 58095 | 61626 | 24555 | 59753 | 40828 | 46070 | 32418 | 60554 |
| 55951 | 48677 | 54734 | 58993 | 61796 | 44998 | 30527 | 48515 |
| 58775 | 30460 | 60500 | 56849 | 61979 | 32090 | 48012 | 52722 |
| 58328 | 46557 | 60459 | 55870 | 54639 | 31685 | 52205 | 55736 |
| 44903 | 48434 | 62502 | 60068 | 48353 | 58613 | 55200 | 31658 |
| 30203 | 47917 | 53075 | 58233 | 47822 | 56469 | 59034 | 61599 |

| | | | | | | | |
|---|---|---|---|---|---|---|---|
| 24542 | 31604 | 59740 | 56089 | 46995 | 32391 | 52911 | 55546 |
| 48720 | 59204 | 62721 | 59811 | 40886 | 55010 | 47727 | 56612 |
| 58939 | 61742 | 24447 | 44972 | 47593 | 52695 | 57853 | 32310 |
| 60446 | 55899 | 46833 | 28645 | 32176 | 53144 | 55709 | 60178 |
| 48407 | 62531 | 60097 | 48340 | 55173 | 31631 | 47960 | 56422 |
| 62028 | 44782 | 48299 | 58559 | 54250 | 32529 | 53049 | 58291 |
| 31986 | 52954 | 55519 | 60016 | 48245 | 55092 | 31550 | 59798 |
| 40915 | 46073 | 54983 | 31469 | 48666 | 56641 | 59150 | 61771 |
| 45001 | 47580 | 62600 | 32339 | 52859 | 55662 | 47044 | 32149 |
| 52669 | 59703 | 54902 | 59636 | 55985 | 46779 | 54768 | 28591 |
| 31226 | 44920 | 47485 | 58988 | 62505 | 60043 | 30690 | 48286 |
| 58826 | 54223 | 46949 | 48018 | 56844 | 62086 | 31959 | 52479 |
| 59989 | 63744 | 55121 | 31579 | 52211 | 32408 | 59962 | 48191 |
| 58731 | 54142 | 44540 | 40889 | 47923 | 54957 | 61991 | 32102 |
| 47856 | 53070 | 56587 | 58340 | 61857 | 56520 | 63554 | 32313 |
| 60561 | 56196 | 46990 | 54741 | 28634 | 31199 | 44893 | 62492 |
| 59582 | 30663 | 40699 | 51183 | 54714 | 62224 | 44978 | 47543 |
| 56425 | 59046 | 61667 | 60704 | 56101 | 46895 | 28539 | 56006 |
| 46828 | 31933 | 59935 | 30582 | 48458 | 58718 | 55067 | 31665 |
| 59801 | 55000 | 62034 | 47829 | 59265 | 61844 | 60514 | 55911 |
| 32524 | 47802 | 53156 | 55777 | 58286 | 46571 | 28159 | 63528 |
| 54905 | 31475 | 59611 | 40910 | 47972 | 54687 | 59184 | 61749 |
| 44951 | 56412 | 59075 | 61654 | 30637 | 60677 | 56144 | 46938 |
| 32334 | 52966 | 56483 | 62089 | 32200 | 59754 | 40815 | 55980 |
| 48678 | 54525 | 58994 | 61559 | 44789 | 48544 | 58804 | 54257 |
| 16379 | 30447 | 60487 | 56850 | 62008 | 32105 | 47775 | 53185 |
| 55764 | 58315 | 46558 | 60936 | 63501 | 55116 | 31686 | 52206 |
| 55723 | 48897 | 59157 | 48354 | 58614 | 54963 | 30680 | 47918 |
| 53104 | 55669 | 58234 | 46463 | 44029 | 56470 | 59049 | 61628 |
| 24557 | 31591 | 59727 | 56090 | 47024 | 32420 | 60556 | 56009 |
| 48707 | 58967 | 62722 | 60288 | 30585 | 48517 | 58833 | 56375 |
| 61981 | 32092 | 44735 | 47594 | 52724 | 57854 | 54203 | 60461 |
| 55928 | 46834 | 28646 | 32163 | 53131 | 55710 | 60193 | 48436 |
| 62560 | 60098 | 48327 | 55174 | 31660 | 30205 | 47947 | 53077 |
| 58207 | 48776 | 59036 | 61657 | 32530 | 53050 | 55615 | 46997 |
| 32449 | 52969 | 55548 | 60003 | 48246 | 55079 | 59813 | 40944 |
| 46074 | 55012 | 31470 | 48681 | 56642 | 58941 | 61800 | 45002 |
| 30643 | 47567 | 58779 | 32368 | 60504 | 55901 | 46807 | 32150 |
| 52670 | 60180 | 48465 | 62533 | 59623 | 55986 | 54755 | 31689 |
| 44907 | 47486 | 62506 | 60072 | 48301 | 58617 | 54252 | 46950 |
| 32055 | 48033 | 53023 | 58293 | 31988 | 52956 | 56473 | 59990 |
| 63507 | 55122 | 31608 | 59856 | 40917 | 46047 | 32395 | 48668 |
| 59208 | 61773 | 44527 | 40890 | 54958 | 32341 | 47843 | 52861 |
| 56616 | 58103 | 61858 | 24563 | 52699 | 59761 | 32314 | 60562 |
| 55959 | 46781 | 54742 | 28649 | 31228 | 44894 | 48411 | 62479 |
| 60045 | 30692 | 48344 | 58828 | 55177 | 62211 | 48020 | 56426 |
| 62144 | 60467 | 56102 | 54647 | 31581 | 52213 | 43007 | 31934 |
| 59964 | 48249 | 58733 | 55096 | 31666 | 59802 | 40863 | 47925 |
| 54987 | 62049 | 47830 | 56589 | 59266 | 61831 | 63556 | 32287 |
| 52919 | 55778 | 47048 | 28636 | 32153 | 59707 | 54906 | 59640 |
| 40701 | 47735 | 54716 | 59171 | 61750 | 44980 | 47601 | 56399 |
| 59104 | 61669 | 30638 | 60678 | 56131 | 46953 | 28541 | 56960 |
| 62090 | 31963 | 59993 | 48460 | 55069 | 31639 | 52159 | 54526 |
| 62036 | 44790 | 48307 | 58791 | 54258 | 60516 | 56865 | 61995 |
| 32106 | 47804 | 53186 | 55751 | 58344 | 46573 | 63502 | 54879 |
| 31477 | 59613 | 56200 | 48898 | 54745 | 59158 | 61779 | 45009 |
| 59077 | 62608 | 30667 | 53091 | 55670 | 46940 | 44030 | 47547 |
| 56485 | 59050 | 61615 | 24558 | 59756 | 56105 | 47011 | 28599 |
| 56010 | 48736 | 58996 | 62513 | 60051 | 30586 | 48518 | 58834 |
| 54231 | 16381 | 56852 | 61982 | 32079 | 47833 | 52711 | 58317 |
| 61848 | 60462 | 55915 | 32640 | 53160 | 55725 | 60194 | 48423 |
| 58739 | 48356 | 54965 | 31423 | 30206 | 47976 | 53078 | 56595 |
| 58236 | 61753 | 44955 | 56528 | 59023 | 61658 | 32545 | 60681 |
| 56092 | 46998 | 32450 | 52970 | 55535 | 48709 | 62724 | 59814 |
| 30559 | 40931 | 51191 | 48682 | 56433 | 58942 | 61563 | 44793 |
| 47596 | 58808 | 54205 | 46903 | 32355 | 60491 | 55902 | 46836 |
| 32165 | 53133 | 55768 | 60167 | 48466 | 62534 | 60100 | 63617 |

| | | | | | | | |
|---|---|---|---|---|---|---|---|
| 55232 | 31690 | 47949 | 59161 | 48302 | 58618 | 54015 | 32532 |
| 48034 | 53052 | 55673 | 58294 | 46579 | 31975 | 52943 | 56474 |
| 60005 | 63536 | 55137 | 31595 | 59843 | 40918 | 46076 | 32424 |
| 48655 | 56644 | 58971 | 61774 | 45004 | 30645 | 48521 | 58781 |
| 32342 | 52862 | 56379 | 62097 | 32208 | 52728 | 59762 | 40823 |
| 60577 | 55988 | 46782 | 54757 | 28650 | 31215 | 44909 | 48440 |
| 62508 | 60046 | 30455 | 48331 | 58591 | 55178 | 62240 | 32113 |
| 48007 | 53081 | 58323 | 60944 | 63509 | 55124 | 31582 | 52214 |
| 55731 | 47001 | 32397 | 59951 | 48250 | 58734 | 55083 | 59817 |
| 40892 | 47926 | 55016 | 62050 | 47845 | 56590 | 59057 | 61860 |
| 24565 | 29695 | 52701 | 59735 | 32316 | 60564 | 56017 | 46811 |
| 28623 | 32154 | 60184 | 48413 | 62537 | 59627 | 40702 | 54703 |
| 62213 | 44967 | 47602 | 56428 | 61670 | 60469 | 56160 | 46954 |
| 28542 | 32059 | 53139 | 58297 | 31992 | 59994 | 48223 | 55070 |
| 31668 | 59804 | 40921 | 47955 | 54989 | 62023 | 48784 | 59268 |
| 61889 | 56866 | 32345 | 47791 | 52977 | 55780 | 58107 | 46574 |
| 24511 | 59709 | 54908 | 31478 | 59614 | 55963 | 48689 | 54746 |
| 59173 | 61808 | 45010 | 47575 | 59078 | 62595 | 30696 | 60736 |
| 56133 | 46927 | 48024 | 56486 | 62092 | 31965 | 59519 | 56106 |
| 54651 | 31697 | 52217 | 44915 | 58983 | 62514 | 60080 | 48309 |
| 58849 | 54260 | 16382 | 47929 | 56839 | 61997 | 32108 | 47834 |
| 53188 | 56705 | 58318 | 61835 | 63560 | 32403 | 52923 | 55726 |
| 48900 | 59216 | 61781 | 44535 | 54966 | 30669 | 47739 | 53093 |
| 56624 | 58223 | 61754 | 44984 | 47549 | 56515 | 59052 | 61673 |
| 32546 | 60682 | 56079 | 47013 | 28657 | 56012 | 48710 | 62487 |
| 60053 | 30588 | 48576 | 58836 | 55185 | 31643 | 56434 | 62040 |
| 44794 | 47359 | 58795 | 54206 | 60520 | 55917 | 46823 | 32166 |
| 53134 | 55755 | 60196 | 48481 | 58741 | 63618 | 54995 | 31481 |
| 47950 | 56597 | 59162 | 61727 | 44957 | 59081 | 61660 | 32519 |
| 53039 | 55674 | 47056 | 32452 | 52972 | 56489 | 60006 | 63523 |
| 55138 | 59872 | 40933 | 46063 | 28603 | 48684 | 56407 | 59000 |
| 61565 | 44767 | 30646 | 48522 | 58782 | 54235 | 46961 | 32357 |
| 60493 | 56856 | 62098 | 32195 | 52715 | 60225 | 48468 | 60578 |
| 55975 | 54758 | 31692 | 44910 | 48427 | 58687 | 48360 | 58620 |
| 54969 | 62003 | 32114 | 48036 | 53082 | 55647 | 58352 | 46581 |
| 56476 | 60931 | 63510 | 55111 | 31597 | 59845 | 56208 | 47002 |
| 32398 | 48713 | 58973 | 62728 | 59818 | 30675 | 40879 | 51195 |
| 47846 | 56381 | 59058 | 61623 | 24566 | 52702 | 59764 | 56113 |
| 46907 | 32303 | 60551 | 56018 | 46840 | 28652 | 32169 | 60171 |
| 48414 | 62538 | 60104 | 48333 | 55180 | 62214 | 32087 | 48065 |
| 52607 | 58325 | 60470 | 55923 | 32536 | 53168 | 55733 | 58298 |
| 46527 | 31979 | 60009 | 48252 | 55085 | 31655 | 59791 | 40922 |
| 47984 | 54990 | 62052 | 48771 | 56648 | 59031 | 61890 | 30649 |
| 60689 | 32346 | 52978 | 55543 | 46813 | 32156 | 59710 | 40827 |
| 54895 | 59629 | 55992 | 48690 | 54761 | 59174 | 61795 | 45025 |
| 47604 | 62624 | 30459 | 60499 | 56134 | 46956 | 32061 | 48011 |
| 53141 | 58271 | 31966 | 59996 | 63513 | 55128 | 31698 | 52218 |
| 40447 | 47957 | 62977 | 60067 | 48310 | 58850 | 54247 | 47930 |
| 56868 | 61998 | 31871 | 47849 | 52951 | 56706 | 58109 | 61864 |
| 24569 | 31603 | 59739 | 32432 | 60568 | 55965 | 48663 | 54748 |
| 59203 | 61782 | 45012 | 48529 | 62597 | 30670 | 53094 | 56611 |
| 62217 | 44971 | 47550 | 56544 | 61674 | 60473 | 56108 | 47014 |
| 54653 | 28658 | 31223 | 52191 | 44917 | 62516 | 60054 | 30575 |
| 48339 | 58823 | 55186 | 31672 | 47903 | 56897 | 62027 | 47836 |
| 59272 | 61837 | 55918 | 32405 | 52925 | 55784 | 59959 | 48482 |
| 58742 | 55091 | 59825 | 55024 | 31482 | 47741 | 56598 | 59177 |
| 61756 | 44958 | 47579 | 56517 | 59082 | 61647 | 32548 | 60684 |
| 56137 | 47043 | 28631 | 56490 | 64000 | 62545 | 59635 | 40934 |
| 54711 | 31645 | 44863 | 56436 | 58987 | 61566 | 44796 | 48313 |
| 58797 | 54264 | 46962 | 32358 | 60494 | 56843 | 62113 | 32224 |
| 53192 | 55757 | 60226 | 48455 | 63620 | 54997 | 31455 | 48904 |
| 59164 | 61785 | 44539 | 58607 | 54970 | 32577 | 47799 | 53097 |
| 55676 | 58339 | 46582 | 56463 | 60960 | 63525 | 55140 | 31598 |
| 59846 | 56195 | 47017 | 28605 | 48714 | 58974 | 62491 | 60057 |
| 30704 | 48524 | 58840 | 54237 | 46935 | 56382 | 62100 | 32197 |
| 52717 | 59751 | 56114 | 60580 | 56033 | 46827 | 28415 | 32170 |
| 60200 | 48429 | 58745 | 48334 | 54943 | 62005 | 32116 | 48066 |

| | | | | | | | |
|---|---|---|---|---|---|---|---|
| 53084 | 56601 | 58326 | 61843 | 60933 | 63568 | 32523 | 53155 |
| 55734 | 47004 | 32456 | 60010 | 48239 | 55086 | 59820 | 30677 |
| 40937 | 47971 | 51197 | 58231 | 48800 | 56411 | 59060 | 61681 |
| 30650 | 60690 | 56087 | 46909 | 32361 | 60609 | 56020 | 46814 |
| 32143 | 60173 | 48472 | 62540 | 59630 | 55979 | 54762 | 62272 |
| 45026 | 47591 | 58803 | 60528 | 55925 | 46719 | 32062 | 48040 |
| 53142 | 55763 | 58300 | 46585 | 31981 | 59983 | 63514 | 55115 |
| 31713 | 59849 | 40924 | 47958 | 62978 | 48773 | 59089 | 61892 |
| 30623 | 53047 | 32348 | 47850 | 52980 | 56497 | 58110 | 61627 |
| 24570 | 59768 | 40829 | 46071 | 32419 | 60555 | 55966 | 48692 |
| 54735 | 59232 | 61797 | 44999 | 48530 | 62598 | 30461 | 60501 |
| 57088 | 62218 | 32091 | 48013 | 52723 | 58329 | 60474 | 55871 |
| 54654 | 31700 | 52220 | 55737 | 44918 | 48435 | 62503 | 60069 |
| 48368 | 58852 | 55201 | 31659 | 47932 | 56898 | 62056 | 47823 |
| 56708 | 59035 | 61838 | 24543 | 31605 | 59741 | 32406 | 52926 |
| 55547 | 48721 | 59205 | 62736 | 59826 | 40887 | 55011 | 47742 |
| 56613 | 59178 | 61743 | 44973 | 47608 | 56518 | 61676 | 32311 |
| 60447 | 56138 | 47072 | 28660 | 32177 | 53145 | 60179 | 62546 |
| 60112 | 48341 | 55188 | 31646 | 47961 | 56423 | 62029 | 44783 |
| 48314 | 58798 | 54251 | 56872 | 62114 | 31987 | 52955 | 55758 |
| 60017 | 48484 | 55093 | 31551 | 59799 | 54998 | 31484 | 48667 |
| 56656 | 59151 | 61786 | 45016 | 47581 | 59084 | 62601 | 32578 |
| 53098 | 55663 | 47045 | 56492 | 63526 | 54903 | 59637 | 56224 |
| 47018 | 54769 | 28606 | 31227 | 44921 | 58989 | 62520 | 60058 |
| 30691 | 48287 | 58827 | 54238 | 46964 | 48019 | 56845 | 62087 |
| 32198 | 52718 | 60228 | 63745 | 56034 | 32409 | 59963 | 48430 |
| 58746 | 54143 | 44541 | 54972 | 62006 | 32103 | 47857 | 53071 |
| 56602 | 58341 | 61872 | 56521 | 60934 | 63555 | 32552 | 60800 |
| 56197 | 46991 | 28635 | 48716 | 62493 | 59583 | 30678 | 40938 |
| 51198 | 54715 | 62225 | 44979 | 56440 | 59047 | 61682 | 60705 |
| 56116 | 46910 | 32362 | 60610 | 56007 | 46829 | 32172 | 60174 |
| 30583 | 48459 | 58719 | 63624 | 55001 | 62035 | 48068 | 59280 |
| 61845 | 60515 | 55926 | 32525 | 47803 | 53157 | 55792 | 58287 |
| 46586 | 31982 | 60012 | 63529 | 55144 | 31714 | 59850 | 40911 |
| 47973 | 59185 | 48774 | 56413 | 59090 | 61655 | 30652 | 60692 |
| 56145 | 46939 | 32335 | 52967 | 56498 | 62104 | 32201 | 59755 |
| 40830 | 60584 | 55981 | 48679 | 54764 | 58995 | 61798 | 45028 |
| 48545 | 58805 | 30462 | 60502 | 56851 | 62009 | 32120 | 48014 |
| 53200 | 55765 | 58330 | 46559 | 60937 | 63516 | 55117 | 31687 |
| 52207 | 55738 | 48912 | 62980 | 60070 | 48355 | 58615 | 55202 |
| 30681 | 47919 | 53105 | 58235 | 47852 | 56471 | 59064 | 61629 |
| 24572 | 31606 | 59742 | 56091 | 47025 | 32421 | 60557 | 56024 |
| 48722 | 59206 | 62723 | 60289 | 48532 | 62656 | 56614 | 62220 |
| 32093 | 44974 | 47595 | 52725 | 57855 | 60476 | 55929 | 46835 |
| 28647 | 32178 | 53146 | 55711 | 60208 | 48437 | 62561 | 60099 |
| 48342 | 55175 | 31661 | 47962 | 56900 | 62030 | 48777 | 59037 |
| 61896 | 32531 | 53051 | 32464 | 52984 | 55549 | 60018 | 48247 |
| 55094 | 59828 | 40945 | 46075 | 55013 | 31471 | 48696 | 56643 |
| 59180 | 61801 | 45003 | 47582 | 62602 | 32369 | 60505 | 56140 |
| 47046 | 32151 | 52671 | 60181 | 62548 | 59638 | 55987 | 54770 |
| 31704 | 44922 | 47487 | 58990 | 62507 | 60073 | 48316 | 58856 |
| 54253 | 46951 | 48048 | 56846 | 62116 | 31989 | 52957 | 56712 |
| 59991 | 63746 | 55123 | 31609 | 59857 | 32410 | 48669 | 59209 |
| 61788 | 44542 | 40891 | 54959 | 32580 | 47858 | 53100 | 56617 |
| 58342 | 61859 | 56522 | 63584 | 32315 | 60563 | 56198 | 47020 |
| 54743 | 28664 | 31229 | 44895 | 62494 | 60060 | 30693 | 48345 |
| 58829 | 55192 | 62226 | 48021 | 56427 | 62145 | 60706 | 56103 |
| 56036 | 46830 | 31935 | 59965 | 48488 | 58748 | 55097 | 31667 |
| 59803 | 55002 | 62064 | 47831 | 56604 | 59267 | 61846 | 60992 |
| 63557 | 32526 | 53158 | 55779 | 47049 | 28637 | 63530 | 54907 |
| 59641 | 40940 | 47974 | 54717 | 59186 | 61751 | 44981 | 56414 |
| 59105 | 61684 | 30639 | 60679 | 56146 | 46968 | 32364 | 60612 |
| 56961 | 62091 | 32202 | 60232 | 48461 | 55982 | 54527 | 62037 |
| 44791 | 48546 | 58806 | 54259 | 60517 | 56880 | 62010 | 32107 |
| 47805 | 53187 | 55766 | 58345 | 46588 | 60938 | 63503 | 55118 |
| 31716 | 59852 | 56201 | 48899 | 59159 | 48832 | 59092 | 62609 |
| 30682 | 53106 | 55671 | 46941 | 44031 | 56500 | 59051 | 61630 |

| | | | | | | | |
|---|---|---|---|---|---|---|---|
| 24559 | 59757 | 56120 | 47026 | 32422 | 60558 | 56011 | 48737 |
| 58997 | 62752 | 60290 | 30587 | 48519 | 58835 | 56853 | 61983 |
| 32094 | 48072 | 52726 | 58332 | 61849 | 60463 | 55930 | 32641 |
| 53161 | 55740 | 60195 | 48438 | 62562 | 60128 | 48357 | 55204 |
| 31662 | 30207 | 47977 | 53079 | 58237 | 48778 | 56529 | 59038 |
| 61659 | 32560 | 60696 | 56093 | 46999 | 32451 | 52971 | 55550 |
| 48724 | 62725 | 59815 | 40946 | 55014 | 48683 | 56672 | 58943 |
| 61802 | 45032 | 47597 | 58809 | 32370 | 60506 | 55903 | 46837 |
| 32180 | 53148 | 55769 | 60182 | 48467 | 62535 | 60101 | 63632 |
| 55233 | 31691 | 47964 | 62984 | 60074 | 48303 | 58619 | 54254 |
| 32533 | 48035 | 53053 | 58295 | 31990 | 52958 | 56475 | 60020 |
| 63537 | 55152 | 31610 | 59858 | 40919 | 46077 | 32425 | 48670 |
| 56645 | 59210 | 61775 | 45005 | 48536 | 62604 | 32343 | 52863 |
| 56618 | 62336 | 32209 | 52729 | 59763 | 60592 | 55989 | 46783 |
| 54772 | 28651 | 31230 | 44924 | 48441 | 62509 | 60047 | 30694 |
| 48346 | 58830 | 55179 | 62241 | 48022 | 56904 | 62146 | 60945 |
| 63748 | 55125 | 31583 | 52215 | 32412 | 59966 | 48251 | 58735 |
| 55098 | 59832 | 40893 | 47927 | 55017 | 62051 | 47860 | 56591 |
| 59296 | 61861 | 56524 | 63558 | 32317 | 60565 | 56256 | 47050 |
| 28638 | 32155 | 60185 | 62552 | 59642 | 40703 | 54718 | 62228 |
| 44982 | 47603 | 56429 | 59106 | 61671 | 60708 | 56161 | 46955 |
| 28543 | 56962 | 62120 | 31993 | 59995 | 48462 | 55071 | 31669 |
| 59805 | 55004 | 62038 | 48785 | 59269 | 61904 | 60518 | 56867 |
| 32584 | 47806 | 53216 | 55781 | 58346 | 46575 | 63532 | 54909 |
| 31479 | 59615 | 56202 | 48928 | 54747 | 59188 | 61809 | 45011 |
| 59079 | 62610 | 30697 | 60737 | 56148 | 46942 | 48025 | 56487 |
| 62093 | 32204 | 59758 | 56107 | 56040 | 48738 | 58998 | 62515 |
| 60081 | 48548 | 58864 | 54261 | 16383 | 56854 | 62012 | 32109 |
| 47835 | 53189 | 56720 | 58319 | 61850 | 60940 | 63561 | 32642 |
| 53162 | 55727 | 48901 | 59217 | 48358 | 54967 | 30684 | 47978 |
| 53108 | 56625 | 58238 | 61755 | 44985 | 56530 | 59053 | 61688 |
| 32547 | 60683 | 56094 | 47028 | 32480 | 60616 | 56013 | 48711 |
| 62726 | 60292 | 30589 | 48577 | 58837 | 56435 | 62041 | 44795 |
| 47598 | 58810 | 54207 | 60521 | 55932 | 46838 | 32167 | 53135 |
| 55770 | 60197 | 48496 | 62564 | 60102 | 63619 | 55234 | 31720 |
| 47951 | 59163 | 48780 | 59096 | 61661 | 32534 | 53054 | 55675 |
| 47057 | 32453 | 52973 | 56504 | 60007 | 63538 | 55139 | 59873 |
| 40948 | 46078 | 32426 | 48685 | 56646 | 59001 | 61804 | 45006 |
| 30647 | 48523 | 58783 | 32372 | 60508 | 56857 | 62099 | 32210 |
| 52730 | 60240 | 48469 | 60579 | 55990 | 54759 | 31693 | 44911 |
| 48442 | 62510 | 60076 | 48361 | 58621 | 55208 | 62242 | 32115 |
| 48037 | 53083 | 58353 | 56477 | 60946 | 63511 | 55126 | 31612 |
| 59860 | 56209 | 47003 | 32399 | 48728 | 59212 | 62729 | 59819 |
| 40894 | 55018 | 47847 | 56620 | 59059 | 61862 | 24567 | 52703 |
| 59765 | 32318 | 60566 | 56019 | 46841 | 28653 | 32184 | 60186 |
| 48415 | 62539 | 60105 | 48348 | 55181 | 62215 | 48080 | 56430 |
| 62148 | 60471 | 56162 | 32537 | 53169 | 58299 | 31994 | 60024 |
| 48253 | 55100 | 31670 | 59806 | 40923 | 47985 | 54991 | 62053 |
| 48786 | 56649 | 59270 | 61891 | 64512 | 32347 | 52979 | 55782 |
| 47052 | 32157 | 59711 | 54910 | 59644 | 55993 | 48691 | 54776 |
| 59175 | 61810 | 45040 | 47605 | 59108 | 62625 | 30698 | 60738 |
| 56135 | 46957 | 48026 | 56964 | 62094 | 31967 | 59997 | 63752 |
| 55129 | 31699 | 52219 | 62992 | 60082 | 48311 | 58851 | 54262 |
| 47931 | 56869 | 61999 | 32110 | 47864 | 53190 | 56707 | 58348 |
| 61865 | 63562 | 32433 | 60569 | 56204 | 48902 | 54749 | 59218 |
| 61783 | 45013 | 62612 | 30671 | 53095 | 56626 | 62232 | 44986 |
| 47551 | 56545 | 59054 | 61675 | 60712 | 56109 | 47015 | 28659 |
| 56014 | 48740 | 62517 | 60055 | 30590 | 48578 | 58838 | 55187 |
| 31673 | 56912 | 62042 | 47837 | 59273 | 61852 | 60522 | 55919 |
| 32644 | 53164 | 55785 | 60198 | 48483 | 58743 | 63648 | 55025 |
| 31483 | 47980 | 56599 | 59192 | 61757 | 44959 | 56532 | 59083 |
| 61662 | 32549 | 60685 | 56152 | 47058 | 32454 | 52974 | 56491 |
| 64001 | 62784 | 59874 | 40935 | 48686 | 56437 | 59002 | 61567 |
| 44797 | 48552 | 58812 | 54265 | 46963 | 32359 | 60495 | 56858 |
| 62128 | 32225 | 53193 | 55772 | 60227 | 48470 | 61056 | 63621 |
| 55236 | 31694 | 48905 | 59165 | 48362 | 58622 | 54971 | 32592 |
| 48038 | 53112 | 55677 | 58354 | 46583 | 56478 | 60961 | 63540 |

55141 31599 59847 56210 47032 32428 48715 58975
62730 60296 30705 48525 58841 56383 62101 32212
52732 59766 56115 60581 56048 46842 28654 32171
60201 48444 62568 60106 48335 55182 62244 32117
48067 53085 58327 60948 63569 32538 53170 55735
47005 32457 60011 48254 55087 59821 40952 47986
55020 62054 48801 56650 59061 61920 30651 60691
32376 60624 56021 46815 32158 60188 48473 62541
59631 55994 54763 62273 45027 47606 62626 60529
56164 46958 32063 48041 53143 58301 31996 59998
63515 55130 31728 59864 40925 47959 62979 48788
59328 61893 56870 32349 47851 52981 56736 58111
61866 24571 59769 32434 60570 55967 48693 54750
59233 61812 45014 48531 62599 30700 60740 57089
62219 48028 56546 62152 60475 56110 54655 31701
52221 44919 62518 60084 48369 58853 55216 31674
47933 56899 62057 47838 56709 59274 61839 63564
32407 52927 55786 48960 59220 62737 59827 55026
47743 56628 59179 61758 44988 47609 56519 59112
61677 32550 60686 56139 47073 28661 56968 64002
62547 60113 48580 55189 31647 56438 62044 44798
48315 58799 54266 60524 56873 62115 32226 53194
55759 60256 48485 63622 54999 31485 48906 56657
59166 61787 45017 59085 62616 32579 53099 55678
47060 56493 60962 63527 55142 59876 56225 47019
28607 48744 59004 62521 60059 30706 48526 58842
54239 46965 56860 62102 32199 52719 60229 63760
60582 56035 32648 60202 48431 58747 48364 54973
62007 32118 48096 53086 56603 58356 61873 56536
60935 63570 32553 60801 56212 47006 32458 48717
62732 59822 30679 40939 51199 48802 56441 59062
61683 60720 56117 46911 32363 60611 56022 46844 32173
60175 48474 62542 60108 63625 55240 62274 48069
59281 60530 55927 32540 48042 53172 55793 58302
46587 31983 60013 63544 55145 31715 59851 40926
47988 63008 48775 56652 59091 61894 30653 60693
32350 52982 56499 62105 32216 59770 40831 60585
55996 48694 54765 59234 61799 45029 48560 62628
30463 60503 57090 62248 32121 48015 53201 58331
60952 63517 55132 31702 52222 55739 48913 62981
60071 48370 58854 55203 47934 56928 62058 47853
56710 59065 61868 24573 31607 59743 32436 60572
56025 48723 59207 62738 60304 48533 62657 56615
62221 44975 47610 56548 61678 60477 56168 47074
28662 32179 53147 60209 62576 60114 48343 55190
31676 47963 56901 62031 48792 59276 61897 56874
32465 52985 55788 60019 48486 55095 59829 55028
31486 48697 56658 59181 61816 45018 47583 59086
62603 32608 60744 56141 47047 56494 64004 62549
59639 56226 54771 31705 44923 58991 62522 60088
48317 58857 54268 46966 48049 56847 62117 32228
53196 56713 60230 63747 63680 32411 48908 59224
61789 44543 54974 32581 47859 53101 56632 58343
61874 56523 60964 63585 32554 60802 56199 47021
28665 48718 62495 60061 30708 48584 58844 55193
62227 56442 62160 60707 56118 60640 56037 46831
32174 60204 48489 58749 63626 55003 62065 48070
56605 59282 61847 60993 63572 32527 53159 55794
47064 32460 60014 63531 55146 59880 40941 47975
59187 48804 56415 59120 61685 30654 60694 56147
46969 32365 60613 56976 62106 32203 60233 48476
60586 55983 54766 62276 45030 48547 58807 60532
56881 62011 32122 48044 53202 55767 58360 46589
60939 63518 55119 31717 59853 56216 48914 62982
48833 59093 62848 30683 53107 47854 56501 59066
61631 24574 59772 56121 47027 32423 60559 56026
48752 59236 62753 60291 48534 62658 57092 62222

32095 48073 52727 58333 60478 55931 32656 53176
55741 60210 48439 62563 60129 48372 55205 31663
47992 56902 62060 48779 56768 59039 61898 32561
60697 32466 52986 55551 48725 62740 59830 40947
55015 48698 56673 59182 61803 45033 47612 62632
32371 60507 56142 47076 32181 53149 60183 62550
60116 63633 55248 31706 47965 62985 60075 48318
58858 54255 48050 56876 62118 31991 52959 56714
60021 63776 55153 31611 59859 32440 48671 56660
59211 61790 45020 48537 62605 32582 53102 56619
62337 56552 63586 60593 56228 47022 54773 28666
31231 44925 62524 60062 30695 48347 58831 55194
62256 48023 56905 62147 61184 63749 56038 32413
59967 48490 58750 55099 59833 55032 62066 47861
56606 59297 61876 56525 60994 63559 32556 60804
56257 47051 28639 64008 62553 59643 40942 54719
62229 44983 56444 59107 61686 60709 56176 46970
32366 60614 56963 62121 32232 60234 48463 63628
55005 62039 49024 59284 61905 60519 56882 32585
47807 53217 55796 58347 46590 60968 63533 55148
31718 59854 56203 48929 59189 48834 59094 62611
30712 60752 56149 46943 56502 62108 32205 59759
56122 60588 56041 48739 58999 62754 60320 48549
58865 56855 62013 32124 48074 53204 56721 58334
61851 60941 63576 32643 53163 55742 48916 63040
60130 48359 55206 30685 47979 53109 58239 48808
56531 59068 61689 32562 60698 56095 47029 32481
60617 56028 48726 62727 60293 48592 62660 56674
62280 45034 47599 58811 60536 55933 46839 32182
53150 55771 60212 48497 62565 60103 63634 55235
31721 47966 62986 48781 59097 61900 32535 53055
32468 52988 56505 60022 63539 55154 59888 40949
46079 32427 48700 56647 59240 61805 45007 48538
62606 32373 60509 57096 62338 32211 52731 60241
60594 55991 54774 31708 44926 48443 62511 60077
48376 58860 55209 62243 48052 56906 62176 56716
60947 63750 55127 31613 59861 32414 48729 59213
62744 59834 40895 55019 47862 56621 59298 61863
56526 63588 32319 60567 56258 47080 28668 32185
60187 62554 60120 48349 55196 62230 48081 56431
62149 60710 56163 56992 62122 31995 60025 48492
55101 31671 59807 55006 62068 48787 56664 59271
61906 60996 64513 32586 53218 55783 47053 63534
54911 59645 56232 48930 54777 59190 61811 45041
59109 62640 30699 60739 56150 46972 48027 56965
62095 32206 60236 63753 56042 62993 60083 48550
58866 54263 56884 62014 32111 47865 53191 56722
58349 61880 60942 63563 32672 60808 56205 48903
59219 48836 62613 30686 53110 56627 62233 44987
56560 59055 61690 60713 56124 47030 32482 60618
56015 48741 62756 60294 30591 48579 58839 56913
62043 48076 59288 61853 60523 55934 32645 53165
55800 60199 48498 62566 60132 63649 55264 31722
47981 59193 48782 56533 59098 61663 32564 60700
56153 47059 32455 52975 56506 64016 62785 59875
40950 48687 56676 59003 61806 45036 48553 58813
32374 60510 56859 62129 32240 53208 55773 60242
48471 61057 63636 55237 31695 48920 62988 60078
48363 58623 55210 32593 48039 53113 58355 56479
60976 63541 55156 31614 59862 56211 47033 32429
48730 59214 62731 60297 48540 62664 56622 62340
32213 52733 59767 60596 56049 46843 28655 32186
60216 48445 62569 60107 48350 55183 62245 48082
56908 62150 60949 63808 32539 53171 32472 60026
48255 55102 59836 40953 47987 55021 62055 48816
56651 59300 61921 64514 32377 60625 56260 47054
32159 60189 62556 59646 55995 54778 62288 45042

| | | | | | | | |
|---|---|---|---|---|---|---|---|
| 47607 | 59110 | 62627 | 60768 | 56165 | 46959 | 48056 | 56966 |
| 62124 | 31997 | 59999 | 63754 | 55131 | 31729 | 59865 | 62994 |
| 48789 | 59329 | 61908 | 56871 | 32588 | 47866 | 53220 | 56737 |
| 58350 | 61867 | 63592 | 32435 | 60571 | 56206 | 48932 | 54751 |
| 59248 | 61813 | 45015 | 62614 | 30701 | 60741 | 57104 | 62234 |
| 48029 | 56547 | 62153 | 60714 | 56111 | 56044 | 48742 | 62519 |
| 60085 | 48608 | 58868 | 55217 | 31675 | 56914 | 62072 | 47839 |
| 56724 | 59275 | 61854 | 61000 | 63565 | 32646 | 53166 | 55787 |
| 48961 | 59221 | 63650 | 55027 | 47982 | 56629 | 59194 | 61759 |
| 44989 | 56534 | 59113 | 61692 | 32551 | 60687 | 56154 | 47088 |
| 32484 | 60620 | 56969 | 64003 | 62786 | 60352 | 48581 | 56439 |
| 62045 | 44799 | 48554 | 58814 | 54267 | 60525 | 56888 | 62130 |
| 32227 | 53195 | 55774 | 60257 | 48500 | 61058 | 63623 | 55238 |
| 31724 | 48907 | 59167 | 48840 | 59100 | 62617 | 32594 | 53114 |
| 55679 | 47061 | 56508 | 60963 | 63542 | 55143 | 59877 | 56240 |
| 47034 | 32430 | 48745 | 59005 | 62760 | 60298 | 30707 | 48527 |
| 58843 | 56861 | 62103 | 32214 | 52734 | 60244 | 63761 | 60583 |
| 56050 | 32649 | 60203 | 48446 | 62570 | 60136 | 48365 | 55212 |
| 62246 | 32119 | 48097 | 53087 | 58357 | 56537 | 60950 | 63571 |
| 32568 | 60816 | 56213 | 47007 | 32459 | 48732 | 62733 | 59823 |
| 40954 | 55022 | 48803 | 56680 | 59063 | 61922 | 60721 | 32378 |
| 60626 | 56023 | 46845 | 32188 | 60190 | 48475 | 62543 | 60109 |
| 63640 | 55241 | 62275 | 48084 | 63104 | 60531 | 56166 | 32541 |
| 48043 | 53173 | 58303 | 31998 | 60028 | 63545 | 55160 | 31730 |
| 59866 | 40927 | 47989 | 63009 | 48790 | 56653 | 59330 | 61895 |
| 64516 | 32351 | 52983 | 56738 | 62344 | 32217 | 59771 | 60600 |
| 55997 | 48695 | 54780 | 59235 | 61814 | 45044 | 48561 | 62629 |
| 30702 | 60742 | 57091 | 62249 | 48030 | 57024 | 62154 | 60953 |
| 63756 | 55133 | 31703 | 52223 | 62996 | 60086 | 48371 | 58855 |
| 55218 | 47935 | 56929 | 62059 | 47868 | 56711 | 59304 | 61869 |
| 63566 | 32437 | 60573 | 56264 | 48962 | 59222 | 62739 | 60305 |
| 62672 | 56630 | 62236 | 44990 | 47611 | 56549 | 59114 | 61679 |
| 60716 | 56169 | 47075 | 28663 | 56970 | 64032 | 62577 | 60115 |
| 48582 | 55191 | 31677 | 56916 | 62046 | 48793 | 59277 | 61912 |
| 60526 | 56875 | 32704 | 53224 | 55789 | 60258 | 48487 | 63652 |
| 55029 | 31487 | 48936 | 56659 | 59196 | 61817 | 45019 | 59087 |
| 62618 | 32609 | 60745 | 56156 | 47062 | 56495 | 64005 | 62788 |
| 59878 | 56227 | 48746 | 59006 | 62523 | 60089 | 48556 | 58872 |
| 54269 | 46967 | 56862 | 62132 | 32229 | 53197 | 56728 | 60231 |
| 63762 | 61060 | 63681 | 32650 | 48909 | 59225 | 48366 | 54975 |
| 32596 | 48098 | 53116 | 56633 | 58358 | 61875 | 56538 | 60965 |
| 63600 | 32555 | 60803 | 56214 | 47036 | 32488 | 48719 | 62734 |
| 60300 | 30709 | 48585 | 58845 | 56443 | 62161 | 60722 | 56119 |
| 60641 | 56052 | 46846 | 32175 | 60205 | 48504 | 62572 | 60110 |
| 63627 | 55242 | 62304 | 48071 | 59283 | 61008 | 63573 | 32542 |
| 53174 | 55795 | 47065 | 32461 | 60015 | 63546 | 55147 | 59881 |
| 40956 | 47990 | 63010 | 48805 | 56654 | 59121 | 61924 | 30655 |
| 60695 | 32380 | 60628 | 56977 | 62107 | 32218 | 60248 | 48477 |
| 60587 | 55998 | 54767 | 62277 | 45031 | 48562 | 62630 | 60533 |
| 57120 | 62250 | 32123 | 48045 | 53203 | 58361 | 60954 | 63519 |
| 55134 | 31732 | 59868 | 56217 | 48915 | 62983 | 48848 | 59332 |
| 62849 | 56930 | 47855 | 56740 | 59067 | 61870 | 24575 | 59773 |
| 32438 | 60574 | 56027 | 48753 | 59237 | 62768 | 60306 | 48535 |
| 62659 | 57093 | 62223 | 48088 | 56550 | 62156 | 60479 | 56170 |
| 32657 | 53177 | 60211 | 62578 | 60144 | 48373 | 55220 | 31678 |
| 47993 | 56903 | 62061 | 48794 | 56769 | 59278 | 61899 | 64520 |
| 32467 | 52987 | 55790 | 48964 | 62741 | 59831 | 55030 | 48699 |
| 56688 | 59183 | 61818 | 45048 | 47613 | 59116 | 62633 | 32610 |
| 60746 | 56143 | 47077 | 56972 | 64006 | 62551 | 60117 | 63872 |
| 55249 | 31707 | 63000 | 60090 | 48319 | 58859 | 54270 | 48051 |
| 56877 | 62119 | 32230 | 53198 | 56715 | 60260 | 63777 | 63682 |
| 32441 | 48910 | 56661 | 59226 | 61791 | 45021 | 62620 | 32583 |
| 53103 | 56634 | 62352 | 56553 | 60966 | 63587 | 60832 | 56229 |
| 47023 | 28667 | 48748 | 62525 | 60063 | 30710 | 48586 | 58846 |
| 55195 | 62257 | 56920 | 62162 | 61185 | 63764 | 60642 | 56039 |
| 32652 | 60206 | 48491 | 58751 | 63656 | 55033 | 62067 | 48100 |
| 56607 | 59312 | 61877 | 56540 | 60995 | 63574 | 32557 | 60805 |

| | | | | | | | |
|---|---|---|---|---|---|---|---|
| 56272 | 47066 | 32462 | 64009 | 62792 | 59882 | 40943 | 48806 |
| 56445 | 59122 | 61687 | 60724 | 56177 | 46971 | 32367 | 60615 |
| 56978 | 62136 | 32233 | 60235 | 48478 | 61064 | 63629 | 55244 |
| 62278 | 49025 | 59285 | 60534 | 56883 | 32600 | 48046 | 53232 |
| 55797 | 58362 | 46591 | 60969 | 63548 | 55149 | 31719 | 59855 |
| 56218 | 48944 | 63012 | 48835 | 59095 | 62850 | 30713 | 60753 |
| 56503 | 62109 | 32220 | 59774 | 56123 | 60589 | 56056 | 48754 |
| 59238 | 62755 | 60321 | 48564 | 62688 | 57094 | 62252 | 32125 |
| 48075 | 53205 | 58335 | 60956 | 63577 | 32658 | 53178 | 55743 |
| 48917 | 63041 | 60131 | 48374 | 55207 | 47994 | 56932 | 62062 |
| 48809 | 56770 | 59069 | 61928 | 32563 | 60699 | 32496 | 60632 |
| 56029 | 48727 | 62742 | 60308 | 48593 | 62661 | 56675 | 62281 |
| 45035 | 47614 | 62634 | 60537 | 56172 | 47078 | 32183 | 53151 |
| 60213 | 62580 | 60118 | 63635 | 55250 | 31736 | 47967 | 62987 |
| 48796 | 59336 | 61901 | 56878 | 32469 | 52989 | 56744 | 60023 |
| 63778 | 55155 | 59889 | 32442 | 48701 | 56662 | 59241 | 61820 |
| 45022 | 48539 | 62607 | 32612 | 60748 | 57097 | 62339 | 56554 |
| 64064 | 60595 | 56230 | 54775 | 31709 | 44927 | 62526 | 60092 |
| 48377 | 58861 | 55224 | 62258 | 48053 | 56907 | 62177 | 56717 |
| 61186 | 63751 | 63684 | 32415 | 48968 | 59228 | 62745 | 59835 |
| 55034 | 47863 | 56636 | 59299 | 61878 | 56527 | 61024 | 63589 |
| 32558 | 60806 | 56259 | 47081 | 28669 | 64010 | 62555 | 60121 |
| 48588 | 55197 | 62231 | 56446 | 62164 | 60711 | 56178 | 60644 |
| 56993 | 62123 | 32234 | 60264 | 48493 | 63630 | 55007 | 62069 |
| 49026 | 56665 | 59286 | 61907 | 60997 | 64528 | 32587 | 53219 |
| 55798 | 47068 | 60970 | 63535 | 55150 | 59884 | 56233 | 48931 |
| 59191 | 48864 | 59124 | 62641 | 30714 | 60754 | 56151 | 46973 |
| 56980 | 62110 | 32207 | 60237 | 63768 | 60590 | 56043 | 63232 |
| 60322 | 48551 | 58867 | 56885 | 62015 | 32126 | 48104 | 53206 |
| 56723 | 58364 | 61881 | 60943 | 63578 | 32673 | 60809 | 56220 |
| 48918 | 63042 | 48837 | 62852 | 30687 | 53111 | 48810 | 56561 |
| 59070 | 61691 | 60728 | 56125 | 47031 | 32483 | 60619 | 56030 |
| 48756 | 62757 | 60295 | 48594 | 62662 | 57152 | 62282 | 48077 |
| 59289 | 60538 | 55935 | 32660 | 53180 | 55801 | 60214 | 48499 |
| 62567 | 60133 | 63664 | 55265 | 31723 | 47996 | 63016 | 48783 |
| 56772 | 59099 | 61902 | 32565 | 60701 | 32470 | 52990 | 56507 |
| 64017 | 62800 | 59890 | 40951 | 48702 | 56677 | 59242 | 61807 |
| 45037 | 48568 | 62636 | 32375 | 60511 | 57098 | 62368 | 32241 |
| 53209 | 60243 | 61072 | 63637 | 55252 | 31710 | 48921 | 62989 |
| 60079 | 48378 | 58862 | 55211 | 48054 | 56936 | 62178 | 56718 |
| 60977 | 63780 | 55157 | 31615 | 59863 | 32444 | 48731 | 59215 |
| 62746 | 60312 | 48541 | 62665 | 56623 | 62341 | 56556 | 63590 |
| 60597 | 56288 | 47082 | 28670 | 32187 | 60217 | 62584 | 60122 |
| 48351 | 55198 | 62260 | 48083 | 56909 | 62151 | 61188 | 63809 |
| 56994 | 32473 | 60027 | 48494 | 55103 | 59837 | 55036 | 62070 |
| 48817 | 56666 | 59301 | 61936 | 60998 | 64515 | 32616 | 60864 |
| 56261 | 47055 | 64012 | 62557 | 59647 | 56234 | 54779 | 62289 |
| 45043 | 59111 | 62642 | 60769 | 56180 | 46974 | 48057 | 56967 |
| 62125 | 32236 | 60238 | 63755 | 63688 | 62995 | 49028 | 59344 |
| 61909 | 56886 | 32589 | 47867 | 53221 | 56752 | 58351 | 61882 |
| 60972 | 63593 | 32674 | 60810 | 56207 | 48933 | 59249 | 48838 |
| 62615 | 30716 | 60756 | 57105 | 62235 | 56562 | 62168 | 60715 |
| 56126 | 60648 | 56045 | 48743 | 62758 | 60324 | 48609 | 58869 |
| 56915 | 62073 | 48078 | 56725 | 59290 | 61855 | 61001 | 63580 |
| 32647 | 53167 | 55802 | 48976 | 63044 | 60134 | 63651 | 55266 |
| 47983 | 59195 | 48812 | 56535 | 59128 | 61693 | 32566 | 60702 |
| 56155 | 47089 | 32485 | 60621 | 56984 | 64018 | 62787 | 60353 |
| 48596 | 56678 | 62284 | 45038 | 48555 | 58815 | 60540 | 56889 |
| 62131 | 32242 | 53210 | 55775 | 60272 | 48501 | 61059 | 63638 |
| 55239 | 31725 | 48922 | 62990 | 48841 | 59101 | 62856 | 32595 |
| 53115 | 56509 | 60978 | 63543 | 55158 | 59892 | 56241 | 47035 |
| 32431 | 48760 | 59244 | 62761 | 60299 | 48542 | 62666 | 57100 |
| 62342 | 32215 | 52735 | 60245 | 60598 | 56051 | 32664 | 60218 |
| 48447 | 62571 | 60137 | 48380 | 55213 | 62247 | 48112 | 56910 |
| 62180 | 56776 | 60951 | 63810 | 32569 | 60817 | 32474 | 48733 |
| 62748 | 59838 | 40955 | 55023 | 48818 | 56681 | 59302 | 61923 |
| 64544 | 32379 | 60627 | 56262 | 47084 | 32189 | 60191 | 62558 |

60124 63641 55256 62290 48085 63105 60770 56167
48058 56996 62126 31999 60029 63784 55161 31731
59867 63024 48791 56668 59331 61910 64517 32590
53222 56739 62345 63594 60601 56236 48934 54781
59250 61815 45045 62644 30703 60743 57106 62264
48031 57025 62155 61192 63757 56046 62997 60087
48610 58870 55219 56944 62074 47869 56726 59305
61884 61002 63567 32676 60812 56265 48963 59223
64128 62673 56631 62237 44991 56564 59115 61694
60717 56184 47090 32486 60622 56971 64033 62816
60354 48583 56917 62047 49032 59292 61913 60527
56890 32705 53225 55804 60259 48502 61088 63653
55268 31726 48937 59197 48842 59102 62619 32624
60760 56157 47063 56510 64020 62789 59879 56242
48747 59007 62762 60328 48557 58873 56863 62133
32244 53212 56729 60246 63763 61061 63696 32651
48924 63048 60138 48367 55214 32597 48099 53117
58359 56539 60980 63601 32570 60818 56215 47037
32489 48734 62735 60301 48600 62668 56682 62400
60723 60656 56053 46847 32190 60220 48505 62573
60111 63642 55243 62305 48086 63106 61009 63812
32543 53175 32476 60030 63547 55162 59896 40957
47991 63011 48820 56655 59360 61925 64518 32381
60629 57216 62346 32219 60249 60602 55999 54782
62292 45046 48563 62631 60772 57121 62251 48060
57026 62184 60955 63758 55135 31733 59869 62998
48849 59333 62864 56931 47870 56741 59306 61871
63596 32439 60575 56266 48992 59252 62769 60307
62674 57108 62238 48089 56551 62157 60718 56171
57000 64034 62579 60145 48612 55221 31679 56918
62076 48795 56784 59279 61914 61004 64521 32706
53226 55791 48965 63654 55031 48938 56689 59198
61819 45049 59117 62648 32611 60747 56158 47092
56973 64007 62790 60356 63873 63001 60091 48558
58874 54271 56892 62134 32231 53199 56730 60261
63792 61062 63683 32680 48911 59227 48844 62621
32598 53118 56635 62353 56568 60967 63602 60833
56244 47038 32490 48749 62764 60302 30711 48587
58847 56921 62163 61200 63765 60643 56054 32653
60207 48506 62574 60140 63657 55272 62306 48101
59313 56541 61010 63575 32572 60820 56273 47067
32463 64024 62793 59883 40958 48807 56684 59123
61926 60725 32382 60630 56979 62137 32248 60250
48479 61065 63644 55245 62279 49040 63108 60535
57122 32601 48047 53233 58363 60984 63549 55164
31734 59870 56219 48945 63013 48850 59334 62851
64576 56742 62348 32221 59775 60604 56057 48755
59239 62770 60336 48565 62689 57095 62253 48090
57028 62158 60957 63816 32659 53179 63056 60146
48375 55222 47995 56933 62063 48824 56771 59308
61929 64522 32497 60633 56268 48966 62743 60309
62676 56690 62296 45050 47615 59118 62635 60776
56173 47079 56974 64036 62581 60119 63874 55251
31737 63002 48797 59337 61916 56879 32708 53228
56745 60262 63779 63712 32443 48940 56663 59256
61821 45023 62622 32613 60749 57112 62354 56555
64065 60834 56231 48750 62527 60093 48616 58876
55225 62259 56922 62192 56732 61187 63766 61120
63685 32654 48969 59229 63658 55035 48102 56637
59314 61879 56542 61025 63604 32559 60807 56274
47096 32492 64011 62794 60360 48589 56447 62165
60726 56179 60645 57008 62138 32235 60265 48508
61066 63631 55246 62308 49027 59287 61012 64529
32602 53234 55799 47069 60971 63550 55151 59885
56248 48946 63014 48865 59125 62880 30715 60755
56981 62111 32222 60252 63769 60591 56058 63233
60323 48566 62690 57124 62254 32127 48105 53207

58365 60958 63579 32688 60824 56221 48919 63043
48852 62853 56934 48811 56800 59071 61930 60729
32498 60634 56031 48757 62772 60310 48595 62663
57153 62283 48092 63112 60539 56174 32661 53181
60215 62582 60148 63665 55280 31738 47997 63017
48798 56773 59338 61903 64524 32471 52991 56746
64256 62801 59891 48703 56692 59243 61822 45052
48569 62637 32614 60750 57099 62369 57032 64066
61073 63876 55253 31711 63004 60094 48379 58863
55226 48055 56937 62179 56719 61216 63781 63686
32445 48970 59230 62747 60313 62680 56638 62356
56557 61026 63591 60836 56289 47083 28671 64040
62585 60123 48590 55199 62261 56924 62166 61189
63824 60646 56995 32712 60266 48495 63660 55037
62071 49056 56667 59316 61937 60999 64530 32617
60865 56276 47070 64013 62796 59886 56235 48866
59126 62643 60784 56181 46975 56982 62140 32237
60239 63770 61068 63689 63234 49029 59345 56887
32604 48106 53236 56753 58366 61883 60973 63608
32675 60811 56222 48948 63072 48839 62854 30717
60757 56563 62169 60730 56127 60649 56060 48758
62759 60325 48624 62692 57154 62312 48079 59291
61016 63581 32662 53182 55803 48977 63045 60135
63666 55267 47998 63018 48813 56774 59129 61932
32567 60703 32500 60636 56985 64019 62802 60368
48597 56679 62285 45039 48570 62638 60541 57128
62370 32243 53211 60273 61074 63639 55254 31740
48923 62991 48856 59340 62857 56938 56748 60979
63782 55159 59893 32446 48761 59245 62776 60314
48543 62667 57101 62343 56558 64068 60599 56290
32665 60219 62586 60152 48381 55228 62262 48113
56911 62181 56777 61190 63811 64640 32475 48972 62749
59839 55038 48819 56696 59303 61938 61028 64545
32618 60866 56263 47085 64014 62559 60125 63880
55257 62291 63120 60771 56182 48059 56997 62127
32238 60268 63785 63690 63025 49030 56669 59346
61911 64532 32591 53223 56754 62360 60974 63595
60840 56237 48935 59251 48868 62645 30718 60758
57107 62265 57040 62170 61193 63772 60650 56047
63236 60326 48611 58871 56945 62075 48108 56727
59320 61885 61003 63582 32677 60813 56280 48978
63046 64129 62912 48814 56565 59130 61695 60732
56185 47091 32487 60623 56986 64048 62817 60355
48598 57156 62286 49033 59293 60542 56891 32720
53240 55805 60274 48503 61089 63668 55269 31727
48952 63020 48843 59103 62858 32625 60761 56511
64021 62804 59894 56243 48762 59246 62763 60329
48572 62696 57102 62372 32245 53213 60247 61076
63697 32666 48925 63049 60139 48382 55215 48114
56940 62182 56778 60981 63840 32571 60819 32504
48735 62750 60316 48601 62669 56683 62401 64546
60657 56292 47086 32191 60221 62588 60126 63643
55258 62320 48087 63107 61248 63813 56998 32477
60031 63786 55163 59897 63026 48821 56670 59361
61940 64519 32620 60868 57217 62347 64072 60603
56238 54783 62293 45047 62646 60773 57136 62266
48061 57027 62185 61194 63759 63692 62999 49088
59348 62865 56946 47871 56756 59307 61886 61032
63597 32678 60814 56267 48993 59253 64130 62675
57109 62239 56566 62172 60719 56186 60652 57001
64035 62818 60384 48613 56919 62077 49034 56785
59294 61915 61005 64536 32707 53227 55806 48980
61090 63655 55270 48939 59199 48872 59132 62649
32626 60762 56159 47093 56988 64022 62791 60357
63888 63240 60330 48559 58875 56893 62135 32246
53214 56731 60276 63793 61063 63698 32681 48926
63050 48845 62860 32599 53119 56569 60982 63603

60848 56245 47039 32491 48764 62765 60303 48602
62670 57160 62402 61201 60658 56055 32668 60222
48507 62575 60141 63672 55273 62307 48116 63136
56780 61011 63814 32573 60821 32478 64025 62808
59898 40959 48822 56685 59362 61927 64548 32383
60631 57218 62376 32249 60251 61080 63645 55260
62294 49041 63109 60774 57123 48062 57056 62186
60985 63788 55165 31735 59871 63028 48851 59335
62866 64577 56743 62349 63598 60605 56296 48994
59254 62771 60337 62704 57110 62268 48091 57029
62159 61196 63817 57002 63057 60147 48614 55223
56948 62078 48825 56786 59309 61944 61006 64523
32736 60872 56269 48967 64132 62677 56691 62297
45051 59119 62650 60777 56188 47094 56975 64037
62820 60358 63875 63003 49036 59352 61917 56894
32709 53229 56760 60263 63794 61092 63713 32682
48941 59257 48846 62623 32628 60764 57113 62355
56570 64080 60835 56246 48751 62766 60332 48617
58877 56923 62193 56733 61202 63767 61121 63700
32655 48984 63052 60142 63659 55274 48103 59315
56543 61040 63605 32574 60822 56275 47097 32493
64026 62795 60361 48604 56686 62404 60727 60660
57009 62139 32250 60280 48509 61067 63646 55247
62309 49042 63110 61013 64768 32603 53235 60986
63551 55166 59900 56249 48947 63015 48880 59364
62881 64578 57220 62350 32223 60253 60606 56059
63248 60338 48567 62691 57125 62255 48120 57030
62188 60959 63818 32689 60825 63058 48853 62868
56935 48826 56801 59310 61931 64552 32499 60635
56270 48996 62773 60311 62678 57168 62298 48093
63113 60778 56175 57004 64038 62583 60149 63904
55281 31739 63032 48799 56788 59339 61918 64525
32710 53230 56747 64257 63714 48942 56693 59258
61823 45053 62652 32615 60751 57114 62384 57033
64067 61312 63877 63005 60095 48618 58878 55227
56952 62194 56734 61217 63796 61122 63687 32684
48971 59231 64136 62681 56639 62357 56572 61027
63606 60837 56304 47098 32494 64041 62824 60362
48591 56925 62167 61204 63825 60647 57010 32713
60267 48510 61096 63661 55276 62310 49057 59317
61014 64531 32632 60880 56277 47071 64028 62797
59887 56250 48867 59127 62882 60785 56983 62141
32252 60254 63771 61069 63704 63235 49044 63168
57126 32605 48107 53237 58367 60988 63609 32690
60826 56223 48949 63073 48854 62855 64580 56802
62408 60731 60664 56061 48759 62774 60340 48625
62693 57155 62313 48094 63114 61017 63820 32663
53183 63060 60150 63667 55282 47999 63019 48828
56775 59368 61933 64526 32501 60637 57224 64258
62803 60369 56694 62300 45054 48571 62639 60780
57129 62371 57034 64096 61075 63878 55255 31741
63006 48857 59341 62872 56939 56749 61218 63783
63716 32447 49000 59260 62777 60315 62682 57116
62358 56559 64069 60838 56291 64042 62587 60153
48620 55229 62263 56926 62196 56792 61191 63826
61124 64641 32714 48973 63662 55039 49058 56697
59318 61939 61029 64560 32619 60867 56278 47100
64015 62798 60364 63881 63121 60786 56183 57012
62142 32239 60269 63800 61070 63691 63264 49031
59347 64533 32606 53238 56755 62361 60975 63610
60841 56252 48950 63074 48869 62884 30719 60759
57041 62171 61208 63773 60651 56062 63237 60327
48626 62694 57184 62314 48109 59321 61018 63583
32692 60828 56281 48979 63047 64144 62913 48815
56804 59131 61934 60733 32502 60638 56987 64049
62832 60370 48599 57157 62287 49048 63116 60543
57130 32721 53241 60275 61104 63669 55284 31742

48953 63021 48858 59342 62859 64584 56750 64260
62805 59895 48763 59247 62778 60344 48573 62697
57103 62373 57036 64070 61077 63936 32667 63064
60154 48383 55230 48115 56941 62183 56779 61220
63841 64642 32505 48974 62751 60317 62684 56698
62416 61030 64547 60896 56293 47087 64044 62589
60127 63882 55259 62321 63122 61249 63828 56999
32716 60270 63787 63720 63027 49060 56671 59376
61941 64534 32621 60869 57232 62362 64073 60842
56239 48870 62647 60788 57137 62267 57042 62200
61195 63774 61128 63693 63238 49089 59349 56947 48110
56757 59322 61887 61033 63612 32679 60815 56282
49008 63076 64131 62914 56567 62173 60734 56187
60653 57016 64050 62819 60385 48628 57158 62316
49035 59295 61020 64537 32722 53242 55807 48981
61091 63670 55271 48954 63022 48873 59133 62888
32627 60763 56989 64023 62806 60372 63889 63241
60331 48574 62698 57132 62374 32247 53215 60277
61078 63699 32696 48927 63051 48860 62861 56942
56808 60983 63842 60849 32506 48765 62780 60318
48603 62671 57161 62403 65024 60659 56294 32669
60223 62590 60156 63673 55288 62322 48117 63137
56781 61250 63815 64644 32479 64264 62809 59899
48823 56700 59363 61942 64549 32622 60870 57219
62377 64074 61081 63884 55261 62295 63124 60775
57138 48063 57057 62187 61224 63789 63694 63029
49090 59350 62867 64592 56758 62364 61034 63599
60844 56297 48995 59255 64160 62705 57111 62269
57044 62174 61197 63832 60654 57003 63296 60386
48615 56949 62079 49064 56787 59324 61945 61007
64538 32737 60873 56284 48982 64133 62916 48874
59134 62651 60792 56189 47095 56990 64052 62821
60359 63890 63242 49037 59353 56895 32724 53244
56761 60278 63795 61093 63728 32683 48956 63080
48847 62862 32629 60765 56571 64081 60850 56247
48766 62767 60333 48632 62700 57162 62432 61203
61136 63701 32670 48985 63053 60143 63674 55275
48118 63138 56782 61041 63844 32575 60823 32508
64027 62810 60376 48605 56687 62405 64550 60661
57248 62378 32251 60281 61082 63647 55262 62324
49043 63111 61252 64769 57058 60987 63790 55167
59901 63030 48881 59365 62896 64579 57221 62351
64076 60607 56298 63249 60339 62706 57140 62270
48121 57031 62189 61198 63819 64648 63059 49092
62869 56950 48827 56816 59311 61946 61036 64553
32738 60874 56271 48997 64134 62679 57169 62299
63128 60779 56190 57005 64039 62822 60388 63905
63033 49038 56789 59354 61919 64540 32711 53231
56762 64272 61094 63715 48943 59259 48876 62653
32630 60766 57115 62385 57048 64082 61313 63892
63244 60334 48619 58879 56953 62195 56735 61232
63797 61123 63702 32685 48986 63054 64137 62920
56573 61042 63607 60852 56305 47099 32495 64056
62825 60363 48606 57164 62406 61205 60662 57011
32728 60282 48511 61097 63676 55277 62311 49072
63140 61015 64770 32633 60881 64029 62812 59902
56251 48882 59366 62883 64608 57222 62380 32253
60255 61084 63705 63250 49045 63169 57127 48122
57060 62190 60989 63848 32691 60827 63088 48855
62870 64581 56803 62409 64554 60665 56300 48998
62775 60341 62708 57170 62328 48095 63115 61256
63821 57006 63061 60151 63906 55283 63034 48829
56790 59369 61948 64527 32740 60876 57225 64259
64192 56695 62301 45055 62654 60781 57144 62386
57035 64097 61314 63879 63007 49096 59356 62873
56954 56764 61219 63798 61152 63717 32686 49001
59261 64138 62683 57117 62359 56574 64084 60839

56306 64043 62826 60392 48621 56927 62197 56793
61206 63827 61125 64656 32715 48988 61098 63663
55278 49059 59319 61044 64561 32634 60882 56279
47101 64030 62799 60365 63896 63360 60787 57013
62143 32254 60284 63801 61071 63706 63265 49046
63170 64772 32607 53239 60990 63611 60856 56253
48951 63075 48884 62885 64582 57280 62410 61209
60666 56063 63252 60342 48627 62695 57185 62315
48124 63144 61019 63822 32693 60829 63062 64145
62928 48830 56805 59370 61935 64556 32503 60639
57226 64288 62833 60371 57172 62302 49049 63117
60782 57131 57064 64098 61105 63908 55285 31743
63036 48859 59343 62874 64585 56751 64261 63718
49002 59262 62779 60345 62712 57118 62388 57037
64071 61316 63937 63065 60155 48622 55231 56956
62198 56794 61221 63856 61126 64643 32744 48975
64140 62685 56699 62417 61031 64562 60897 56308
47102 64045 62828 60366 63883 63123 61264 63829
57014 32717 60271 63802 61100 63721 63266 49061
59377 64535 32636 60884 57233 62363 64088 60843
56254 48871 62886 60789 57043 62201 61210 63775
61129 63708 63239 49104 63172 57186 48111 59323 61048
63613 32694 60830 56283 49009 63077 64146 62915
56806 62412 60735 60668 57017 64051 62834 60400
48629 57159 62317 49050 63118 61021 64776 32723
53243 61106 63671 55286 48955 63023 48888 59372
62889 64586 57228 64262 62807 60373 63256 60346
48575 62699 57133 62375 57038 64100 61079 63938
32697 63066 48861 62876 56943 56809 61222 63843
64672 32507 49004 62781 60319 62686 57176 62418
65025 60898 56295 64046 62591 60157 63912 55289
62323 63152 56796 61251 63830 64645 32718 64265
63722 49062 56701 59378 61943 64564 32623 60871
57234 62392 64075 61320 63885 63125 60790 57139
57072 62202 61225 63804 61130 63695 63268 49091
59351 64593 56759 62365 61035 63614 60845 56312
49010 63078 64161 62944 57045 62175 61212 63833
60655 57018 63297 60387 48630 57188 62318 49065
59325 61022 64539 32752 60888 56285 48983 64148
62917 48875 59135 62890 60793 56991 64053 62836
60374 63891 63243 49052 63176 57134 32725 53245
60279 61108 63729 32698 48957 63081 48862 62863
64588 56810 64320 60851 48767 62782 60348 48633
62701 57163 62433 65026 61137 63940 32671 63068
60158 63675 55290 48119 63139 56783 61280 63845
64646 32509 64266 62811 60377 56702 62420 64551
60900 57249 62379 64104 61083 63886 55263 62325
63126 61253 64784 57059 61226 63791 63724 63031
49120 59380 62897 64594 57236 62366 64077 60846
56299 64162 62707 57141 62271 57046 62204 61199
63834 61132 64649 63298 49093 56951 49066 56817
59326 61947 61037 64568 32739 60875 56286 49012
64135 62918 63129 60794 56191 57020 64054 62823
60389 63920 63272 49039 59355 64541 32726 53246
56763 64273 61095 63730 48958 63082 48877 62892
32631 60767 57049 64083 61328 63893 63245 60335
48634 62702 57192 62434 61233 61138 63703 32700
48987 63055 64152 62921 56812 61043 63846 60853
32510 64057 62840 60378 48607 57165 62407 65028
60663 57250 32729 60283 61112 63677 55292 62326
49073 63141 61254 64771 64704 64268 62813 59903
48883 59367 62898 64609 57223 62381 64078 61085
63944 63251 63184 57142 48123 57061 62191 61228
63849 64650 63089 49094 62871 64596 56818 62424
61038 64555 60904 56301 48999 64164 62709 57171
62329 63130 61257 63836 57007 63300 60390 63907
63035 49068 56791 59384 61949 64542 32741 60877

57240 64274 64193 48878 62655 60796 57145 62387
57050 64112 61315 63894 63246 49097 59357 56955
56765 61234 63799 61153 63732 32687 49016 63084
64139 62922 56575 64085 60854 56307 64058 62827
60393 48636 57166 62436 61207 61140 64657 32730
48989 61099 63678 55279 49074 63142 61045 64800
32635 60883 64031 62814 60380 63897 63361 64610
57252 62382 32255 60285 61086 63707 63280 49047
63171 64773 57062 60991 63850 60857 63090 48885
62900 64583 57281 62411 65032 60667 56302 63253
60343 62710 57200 62330 48125 63145 61258 63823
64652 63063 64384 62929 48831 56820 59371 61950
64557 32742 60878 57227 64289 64194 57173 62303
63132 60783 57146 57065 64099 61344 63909 63037
49098 59358 62875 64600 56766 64276 61154 63719
49003 59263 64168 62713 57119 62389 57052 64086
61317 63952 63304 60394 48623 56957 62199 56795
61236 63857 61127 64658 32745 48990 64141 62924
61046 64563 60912 56309 47103 64060 62829 60367
63898 63362 61265 57015 32732 60286 63803 61101
63736 63267 49076 63200 64774 32637 60885 64089
60858 56255 48886 62887 64612 57282 62440 61211
61144 63709 63254 49105 63173 57187 48126 63146
61049 63852 32695 60831 63092 64147 62930 56807
62413 64558 60669 57256 64290 62835 60401 57174
62332 49051 63119 61260 64777 57066 61107 63910
55287 63038 48889 59373 62904 64587 57229 64263
64196 63257 60347 62714 57148 62390 57039 64101
61318 63939 63067 49100 62877 56958 56824 61223
63858 61156 64673 32746 49005 64142 62687 57177
62419 65040 60899 56310 64047 62830 60396 63913
63153 56797 61266 63831 64660 32719 64280 61102
63723 49063 59379 64565 32638 60886 57235 62393
64090 61321 63900 63364 60791 57073 62203 61240
63805 61131 63710 63269 49106 63174 64832 61050
63615 60860 56313 49011 63079 64176 62945 57284
62414 61213 60670 57019 63312 60402 48631 57189
62319 49080 63148 61023 64778 32753 60889 64149
62932 48890 59374 62891 64616 57230 64292 62837
60375 63258 49053 63177 57135 57068 64102 61109
63968 32699 63096 48863 62878 64589 56811 64321
64674 49006 62783 60349 62716 57178 62448 65027
61376 63941 63069 60159 63914 55291 63154 56798
61281 63860 64647 32748 64267 64200 56703 62421
64566 60901 57264 62394 64105 61322 63887 63127
61268 64785 57074 61227 63806 61160 63725 63270
49121 59381 64595 57237 62367 64092 60847 56314
64163 62946 57047 62205 61214 63835 61133 64664
63299 49108 57190 49067 59327 61052 64569 32754
60890 56287 49013 64150 62919 63368 60795 57021
64055 62838 60404 63921 63273 49054 63178 64780
32727 53247 61110 63731 48959 63083 48892 62893
64590 57288 64322 61329 63260 60350 48635 62703
57193 62435 65056 61139 63942 32701 63070 64153
62936 56813 61282 63847 64676 32511 64296 62841
60379 57180 62422 65029 60902 57251 64106 61113
63916 55293 62327 63156 61255 64786 64705 64269
63726 49122 59382 62899 64624 57238 62396 64079
61324 63945 63185 57143 57076 62206 61229 63864
61134 64651 63328 49095 64597 56819 62425 61039
64570 60905 56316 49014 64165 62948 63131 61272
63837 57022 63301 60391 63922 63274 49069 59385
64543 32756 60892 57241 64275 64208 48879 62894
60797 57051 64113 61330 63895 63247 49112 63180
57194 61235 61168 63733 32702 49017 63085 64154
62923 56814 64324 60855 64059 62842 60408 48637
57167 62437 65030 61141 64896 32731 61114 63679 55294

49075 63143 61284 64801 64706 64270 62815 60381
63376 64611 57253 62383 64108 61087 63946 63281
63186 64788 57063 61230 63851 64680 63091 49124
62901 64598 57296 62426 65033 60906 56303 64166
62711 57201 62331 63160 61259 63838 64653 63302
64385 49070 56821 59386 61951 64572 32743 60879
57242 64304 64195 63133 60798 57147 57080 64114
61345 63924 63276 49099 59359 64601 56767 64277
61155 63734 49018 63086 64169 62952 57053 64087
61332 63953 63305 60395 48638 57196 62438 61237
61142 64659 32760 48991 64156 62925 61047 64802
60913 64061 62844 60382 63899 63363 65088 57254
32733 60287 61116 63737 63282 49077 63201 64775
64708 64328 60859 48887 62902 64613 57283 62441
65034 61145 63948 63255 63188 57202 48127 63147
61288 63853 64654 63093 64386 62931 56822 62428
64559 60908 57257 64291 64224 57175 62333 63134
61261 64792 57067 61346 63911 63039 49128 59388
62905 64602 57244 64278 64197 64170 62715 57149
62391 57054 64116 61319 63954 63306 49101 56959
56825 61238 63859 61157 64688 32747 49020 64143
62926 65041 60914 56311 64062 62831 60397 63928
63392 61267 64661 32734 64281 61103 63738 49078
63202 64804 32639 60887 64091 61336 63901 63365
64614 57312 62442 61241 61146 63711 63284 49107
63175 64833 61051 63854 60861 63094 64177 62960
57285 62415 65036 60671 57258 63313 60403 57204
62334 49081 63149 61262 64779 64712 64388 62933
48891 59375 62906 64617 57231 64293 64198 63259
63192 57150 57069 64103 61348 63969 63097 49102
62879 64604 56826 64336 61158 64675 49007 64172
62717 57179 62449 65042 61377 63956 63308 60398
63915 63155 56799 61296 63861 64662 32749 64282
64201 64567 60916 57265 62395 64120 61323 63902
63366 61269 57075 61242 63807 61161 63740 63271
49136 63204 64834 64093 60862 56315 64178 62947
57286 62444 61215 61148 64665 63314 49109 57191
49082 63150 61053 64808 32755 60891 64151 62934
63369 64618 57260 64294 62839 60405 63288 49055
63179 64781 57070 61111 63970 63098 48893 62908 64591
57289 64323 65152 63261 60351 62718 57208 62450
65057 61378 63943 63071 64392 62937 56828 61283
63862 64677 32750 64297 64202 57181 62423 65044
60903 57266 64107 61352 63917 63157 61270 64787
64720 64284 61162 63727 49123 59383 64625 57239
62397 64094 61325 63960 63424 57077 62207 61244
63865 61135 64666 63329 49110 64836 61054 64571
60920 56317 49015 64180 62949 63370 61273 57023
63316 60406 63923 63275 49084 63208 64782 32757
60893 64209 48894 62895 64620 57290 64352 61331
63262 49113 63181 57195 65058 61169 63972 32703
63100 64155 62938 56815 64325 64678 64298 62843
60409 57182 62452 65031 61380 64897 61115 63918
55295 63158 61285 64816 64707 64271 64204 63377
64626 57268 62398 64109 61326 63947 63187 64789
57078 61231 63866 61164 64681 63330 49125 64599
57297 62427 65048 60907 56318 64167 62950 63161
61274 63839 64668 63303 64400 49071 59387 64573
32758 60894 57243 64305 64210 63372 60799 57081
64115 61360 63925 63277 49114 63182 64840 61170 63735
49019 63087 64184 62953 57292 64326 61333 63320
60410 48639 57197 62439 65060 61143 64898 32761
64157 62940 61286 64803 64736 64300 62845 60383
63378 65089 57255 64110 61117 63976 63283 63216 64790
64709 64329 64682 49126 62903 64628 57298 62456
65035 61384 63949 63189 57203 63162 61289 63868
64655 63332 64387 56823 62429 64574 60909 57272

64306 64225 63135 61276 64793 57082 61347 63926
63278 49129 59389 64603 57245 64279 64212 64171
62954 57055 64117 61334 63955 63307 49116 57198
61239 61172 64689 32762 49021 64158 62927 65280
60915 64063 62846 60412 63929 63393 65090 64900
32735 61118 63739 49079 63203 64805 64710 64330
61337 63380 64615 57313 62443 65064 61147 63950
63285 63190 64848 61290 63855 64684 63095 64416
62961 57300 62430 65037 60910 57259 64226 57205
62335 63164 61263 64794 64713 64389 49130 59390
62907 64632 57246 64308 64199 63193 57151 57084
64118 61349 63984 63336 49103 64605 56827 64337
61159 64690 49022 64173 62956 65043 61392 63957
63309 60399 63930 63394 61297 64663 32764 64283
64216 64806 60917 64121 61338 63903 63367 65092
57314 61243 61176 63741 63286 49137 63205 64835
64332 60863 64179 62962 57287 62445 65038 61149
64904 63315 57206 49083 63151 61292 64809 64714
64390 62935 63384 64619 57261 64295 64228 63289
63194 64796 57071 61350 63971 63099 49132 62909
64606 57304 64338 65153 64174 62719 57209 62451
65072 61379 63958 63310 64393 56829 61298 63863
64692 32751 64312 64203 65045 60918 57267 64122
61353 63932 63396 61271 64721 64285 61163 63742
49138 63206 64864 64095 61340 63961 63425 57316
62446 61245 61150 64667 63344 49111 64837 61055 64810
60921 64181 62964 63371 65096 57262 63317 60407
63290 49085 63209 64783 64716 64448 48895 62910
64621 57291 64353 65154 63263 63196 57210 65059
61408 63973 63101 64394 62939 56830 64340 64679
64299 64232 57183 62453 65046 61381 64912 61354
63919 63159 61300 64817 64722 64286 64205 64627
57269 62399 64124 61327 63962 63426 57079 61246
63867 61165 64696 63331 49140 64838 65049 60922
56319 64182 62951 63400 61275 64669 63318 64401
49086 63210 64812 32759 60895 64211 63373 64622
57320 64354 61361 63292 49115 63183 64841 61171
63974 63102 64185 62968 57293 64327 65156 63321
60411 57212 62454 65061 61382 64899 64396 62941
61287 64818 64737 64301 64206 63379 65104 57270
64111 61356 63977 63217 64791 64724 64344 61166 64683
49127 64629 57299 62457 65050 61385 63964 63428
63163 61304 63869 64670 63333 64402 64575 60924
57273 64307 64240 63374 61277 57083 61362 63927
63279 49144 63212 64842 64213 64186 62955 57294
64356 61335 63322 49117 57199 65062 61173 64928
32763 64159 62942 65281 64738 64302 62847 60413
63408 65091 64901 61119 63978 63218 64820 64711 64331
65160 63381 64630 57328 62458 65065 61386 63951
63191 64849 61291 63870 64685 63334 64417 57301
62431 65052 60911 57274 64227 63165 61278 64795
64728 64404 49131 59391 64633 57247 64309 64214
63432 57085 64119 61364 63985 63337 49118 64844 61174
64691 49023 64188 62957 65282 61393 63324 60414
63931 63395 65120 64902 32765 64217 64807 64740
64360 61339 63382 65093 57315 65066 61177 63980
63287 63220 64850 64333 64686 64418 62963 57302
62460 65039 61388 64905 57207 63166 61293 64824
64715 64391 63385 64634 57276 64310 64229 63195
64797 57086 61351 63986 63338 49133 64607 57305
64339 65168 64175 62958 65073 61394 63959 63311
64408 61299 64693 32766 64313 64218 65284 60919
64123 61368 63933 63397 65094 64960 61178 63743
49139 63207 64865 64334 61341 63440 57317 62447
65068 61151 64906 63345 64852 61294 64811 64744
64420 62965 63386 65097 57263 64230 63291 63224
64798 64717 64449 49134 62911 64636 57306 64368

| | | | | | | | |
|---|---|---|---|---|---|---|---|
| 65155 | 63197 | 57211 | 65074 | 61409 | 63988 | 63340 | 64395 |
| 56831 | 64341 | 64694 | 64314 | 64233 | 65047 | 61396 | 64913 |
| 61355 | 63934 | 63398 | 61301 | 64723 | 64287 | 64220 | 64866 |
| 64125 | 61342 | 63963 | 63427 | 57318 | 61247 | 61180 | 64697 |
| 63346 | 49141 | 64839 | 65288 | 60923 | 64183 | 62966 | 63401 |
| 65098 | 64908 | 63319 | 49087 | 63211 | 64813 | 64718 | 64450 |
| 63388 | 64623 | 57321 | 64355 | 65184 | 63293 | 63198 | 64856 |
| 61410 | 63975 | 63103 | 64424 | 62969 | 57308 | 64342 | 65157 |
| 64234 | 57213 | 62455 | 65076 | 61383 | 64914 | 64397 | 61302 |
| 64819 | 64752 | 64316 | 64207 | 65105 | 57271 | 64126 | 61357 |
| 63992 | 63456 | 64725 | 64345 | 61167 | 64698 | 49142 | 64868 |
| 65051 | 61400 | 63965 | 63429 | 63402 | 61305 | 64671 | 63348 |
| 64403 | 64814 | 60925 | 64241 | 63375 | 65100 | 57322 | 61363 |
| 63294 | 49145 | 63213 | 64843 | 64452 | 64187 | 62970 | 57295 |
| 64357 | 65158 | 63323 | 57214 | 65063 | 61412 | 64929 | 64398 |
| 62943 | 65296 | 64739 | 64303 | 64236 | 63409 | 65106 | 64916 |
| 61358 | 63979 | 63219 | 64821 | 64726 | 64346 | 65161 | 64631 |
| 57329 | 62459 | 65080 | 61387 | 63966 | 63430 | 61306 | 63871 |
| 64700 | 63335 | 64432 | 65053 | 60926 | 57275 | 64242 | 63404 |
| 61279 | 64729 | 64405 | 49146 | 63214 | 64872 | 64215 | 63433 |
| 57324 | 64358 | 61365 | 63352 | 49119 | 64845 | 61175 | 64930 |
| 64189 | 62972 | 65283 | 65216 | 63325 | 60415 | 63410 | 65121 |
| 64903 | 64456 | 64822 | 64741 | 64361 | 65162 | 63383 | 65108 |
| 57330 | 65067 | 61416 | 63981 | 63221 | 64851 | 64348 | 64687 |
| 64419 | 57303 | 62461 | 65054 | 61389 | 64920 | 63167 | 61308 |
| 64825 | 64730 | 64406 | 64635 | 57277 | 64311 | 64244 | 63434 |
| 57087 | 61366 | 63987 | 63339 | 49148 | 64846 | 65169 | 64190 |
| 62959 | 65312 | 61395 | 63326 | 64409 | 65122 | 64932 | 32767 |
| 64219 | 65285 | 64742 | 64362 | 61369 | 63412 | 65095 | 64961 |
| 61179 | 63982 | 63222 | 64880 | 64335 | 65164 | 63441 | 57332 |
| 62462 | 65069 | 61390 | 64907 | 64853 | 61295 | 64826 | 64745 |
| 64421 | 63387 | 65112 | 57278 | 64231 | 63225 | 64799 | 64732 |
| 64464 | 49135 | 64637 | 57307 | 64369 | 65170 | 63436 | 65075 |
| 61424 | 63989 | 63341 | 64410 | 64695 | 64315 | 64248 | 65286 |
| 61397 | 61370 | 63935 | 63399 | 65124 | 64962 | 64221 | 64867 |
| 64364 | 61343 | 63442 | 57319 | 65070 | 61181 | 64936 | 63347 |
| 64854 | 65289 | 64746 | 64422 | 62967 | 63416 | 65099 | 64909 |
| 63226 | 64828 | 64719 | 64451 | 63389 | 64638 | 57336 | 64370 |
| 65185 | 63199 | 64857 | 61411 | 63990 | 63342 | 64425 | 57309 |
| 64343 | 65172 | 64235 | 65077 | 61398 | 64915 | 64412 | 61303 |
| 64753 | 64317 | 64222 | 65344 | 64127 | 61372 | 63993 | 63457 |
| 64964 | 61182 | 64699 | 49143 | 64869 | 65290 | 61401 | 63444 |
| 63403 | 65128 | 64910 | 63349 | 64815 | 64748 | 64480 | 63390 |
| 65101 | 57323 | 65186 | 63295 | 63228 | 64858 | 64453 | 64426 |
| 62971 | 57310 | 64372 | 65159 | 57215 | 65078 | 61413 | 64944 |
| 64399 | 65297 | 64754 | 64318 | 64237 | 65107 | 64917 | 61359 |
| 63994 | 63458 | 64727 | 64347 | 65176 | 64870 | 65081 | 61402 |
| 63967 | 63431 | 61307 | 64701 | 63350 | 64433 | 65292 | 60927 |
| 64243 | 63405 | 65102 | 64968 | 49147 | 63215 | 64873 | 64454 |
| 63448 | 57325 | 64359 | 65188 | 63353 | 64860 | 61414 | 64931 |
| 64428 | 62973 | 65298 | 65217 | 64238 | 63411 | 65136 | 64918 |
| 64457 | 64823 | 64756 | 64376 | 65163 | 65109 | 57331 | 65082 |
| 61417 | 63996 | 63460 | 64349 | 64702 | 64434 | 65055 | 61404 |
| 64921 | 63406 | 61309 | 64731 | 64407 | 64874 | 64245 | 63435 |
| 57326 | 61367 | 63354 | 49149 | 64847 | 65408 | 64191 | 62974 |
| 65313 | 65218 | 63327 | 65123 | 64933 | 64458 | 65300 | 64743 |
| 64363 | 65192 | 63413 | 65110 | 64976 | 61418 | 63983 | 63223 |
| 64881 | 64350 | 65165 | 57333 | 62463 | 65084 | 61391 | 64922 |
| 61310 | 64827 | 64760 | 64436 | 65113 | 57279 | 64246 | 63464 |
| 64733 | 64465 | 49150 | 64876 | 65171 | 63437 | 65314 | 61425 |
| 63356 | 64411 | 64934 | 64249 | 65287 | 65220 | 61371 | 63414 |
| 65125 | 64963 | 64460 | 64882 | 64365 | 65166 | 63443 | 57334 |
| 65071 | 61420 | 64937 | 64855 | 65304 | 64747 | 64423 | 63417 |
| 65114 | 64924 | 63227 | 64829 | 64734 | 64466 | 64639 | 57337 |
| 64371 | 65200 | 63438 | 61426 | 63991 | 63343 | 64440 | 65173 |
| 64250 | 65316 | 61399 | 64413 | 65126 | 64992 | 64223 | 65345 |
| 64366 | 61373 | 63472 | 64965 | 61183 | 64938 | 64884 | 65291 |

| | | | | | | | |
|---|---|---|---|---|---|---|---|
| 65224 | 63445 | 63418 | 65129 | 64911 | 64830 | 64749 | 64481 |
| 63391 | 65116 | 57338 | 65187 | 63229 | 64859 | 64468 | 64427 |
| 57311 | 64373 | 65174 | 65079 | 61428 | 64945 | 64414 | 64755 |
| 64319 | 64252 | 65346 | 61374 | 63995 | 63459 | 64966 | 65177 |
| 64871 | 65320 | 61403 | 63446 | 65130 | 64940 | 63351 | 65293 |
| 64750 | 64482 | 63420 | 65103 | 64969 | 63230 | 64888 | 64455 |
| 63449 | 57340 | 64374 | 65189 | 64861 | 61415 | 64946 | 64429 |
| 65299 | 65232 | 64239 | 65137 | 64919 | 64472 | 64757 | 64377 |
| 65178 | 65348 | 65083 | 61432 | 63997 | 63461 | 64703 | 64435 |
| 65294 | 61405 | 63407 | 65132 | 64970 | 64875 | 64484 | 63450 |
| 57327 | 65190 | 63355 | 64862 | 65409 | 64430 | 62975 | 65328 |
| 65219 | 65138 | 64948 | 64459 | 65301 | 64758 | 64378 | 65193 |
| 65111 | 64977 | 61419 | 63998 | 63462 | 64351 | 65180 | 65085 |
| 61406 | 64923 | 61311 | 64761 | 64437 | 65352 | 64247 | 63465 |
| 64972 | 49151 | 64877 | 65410 | 63452 | 65315 | 65248 | 63357 |
| 64935 | 64488 | 65302 | 65221 | 65194 | 63415 | 65140 | 64978 |
| 64461 | 64883 | 64380 | 65167 | 57335 | 65086 | 61421 | 64952 |
| 65305 | 64762 | 64438 | 65115 | 64925 | 63466 | 64735 | 64467 |
| 64878 | 65201 | 63439 | 61427 | 63358 | 64441 | 65412 | 64251 |
| 65317 | 65222 | 65127 | 64993 | 64462 | 65360 | 64367 | 65196 |
| 63473 | 64980 | 61422 | 64939 | 64885 | 65306 | 65225 | 63419 |
| 65144 | 64926 | 64831 | 64764 | 64496 | 65117 | 57339 | 65202 |
| 63468 | 64469 | 64442 | 65175 | 65318 | 61429 | 64415 | 64994 |
| 64253 | 65347 | 61375 | 63474 | 64967 | 65416 | 64886 | 65321 |
| 65226 | 63447 | 65131 | 64941 | 65308 | 64751 | 64483 | 63421 |
| 65118 | 64984 | 63231 | 64889 | 64470 | 57341 | 64375 | 65204 |
| 61430 | 64947 | 64444 | 65233 | 64254 | 65376 | 64473 | 64996 |
| 65179 | 65349 | 65322 | 61433 | 63476 | 64942 | 65295 | 65228 |
| 63422 | 65133 | 64971 | 64890 | 64485 | 63451 | 57342 | 65191 |
| 64863 | 65424 | 64431 | 65329 | 65234 | 65139 | 64949 | 64474 |
| 64759 | 64379 | 65208 | 65350 | 61434 | 63999 | 63463 | 65181 |
| 65324 | 61407 | 65134 | 65000 | 65353 | 64486 | 63480 | 64973 |
| 64892 | 65411 | 63453 | 65330 | 65249 | 64950 | 64489 | 65303 |
| 65236 | 65195 | 65141 | 64979 | 64476 | 64381 | 65182 | 65087 |
| 61436 | 64953 | 64763 | 64439 | 65354 | 63467 | 64974 | 64879 |
| 65440 | 63454 | 65250 | 63359 | 65413 | 64490 | 65332 | 65223 |
| 65142 | 65008 | 64463 | 65361 | 64382 | 65197 | 64981 | 61423 |
| 64954 | 65307 | 65240 | 65145 | 64927 | 64765 | 64497 | 65356 |
| 65203 | 63469 | 64443 | 65414 | 65319 | 65252 | 64995 | 64492 |
| 65362 | 65198 | 63475 | 64982 | 65417 | 64887 | 65336 | 65227 |
| 65146 | 64956 | 65309 | 64766 | 64498 | 65119 | 64985 | 63470 |
| 64471 | 65205 | 61431 | 64445 | 65472 | 64255 | 65377 | 64997 |
| 65418 | 65364 | 65323 | 65256 | 63477 | 64943 | 65310 | 65229 |
| 63423 | 65148 | 64986 | 64891 | 64500 | 57343 | 65206 | 65425 |
| 64446 | 65235 | 65378 | 64475 | 64998 | 65209 | 65351 | 61435 |
| 63478 | 65420 | 65325 | 65230 | 65135 | 65001 | 65368 | 64487 |
| 63481 | 64988 | 64893 | 65426 | 65331 | 65264 | 64951 | 64504 |
| 65237 | 65210 | 65380 | 64477 | 65183 | 65326 | 61437 | 65002 |
| 65355 | 63482 | 64975 | 64894 | 65441 | 63455 | 65251 | 65428 |
| 64491 | 65333 | 65238 | 65143 | 65009 | 64478 | 64383 | 65212 |
| 61438 | 64955 | 65241 | 65384 | 65004 | 65357 | 65442 | 63484 |
| 65415 | 65334 | 65253 | 65010 | 64493 | 65363 | 65199 | 64983 |
| 65432 | 65337 | 65242 | 65147 | 64957 | 64767 | 64499 | 65358 |
| 63471 | 65444 | 65254 | 65473 | 64494 | 65392 | 65012 | 65419 |
| 65365 | 65338 | 65257 | 64958 | 65311 | 65244 | 65149 | 64987 |
| 64501 | 65207 | 64447 | 65474 | 65379 | 64999 | 65448 | 65366 |
| 65258 | 63479 | 65421 | 65340 | 65231 | 65150 | 65016 | 65369 |
| 64502 | 64989 | 65427 | 65265 | 64505 | 65476 | 65211 | 65381 |
| 65422 | 65327 | 65260 | 65003 | 65370 | 63483 | 64990 | 64895 |
| 65456 | 65266 | 65429 | 64506 | 65239 | 65382 | 64479 | 65213 |
| 61439 | 65480 | 65385 | 65005 | 65372 | 65443 | 63485 | 65430 |
| 65335 | 65268 | 65011 | 64508 | 65214 | 65433 | 65243 | 65386 |
| 65006 | 65359 | 63486 | 65445 | 65255 | 65488 | 64495 | 65393 |
| 65013 | 65434 | 65339 | 65272 | 64959 | 65245 | 65388 | 65446 |
| 65475 | 65394 | 65014 | 65449 | 65367 | 65259 | 65436 | 65341 |
| 65246 | 65151 | 65017 | 64503 | 65504 | 65477 | 65450 | 65396 |
| 65423 | 65342 | 65261 | 65018 | 65371 | 64991 | 65457 | 65267 |

64507 65478 65383 65452 65262 65481 65400 65020 65373 65458 65431 65269 64509 65215 65482 65387 65007 65374 63487 65460 65270 65489 64510 65435 65273 65484 65389 65447 65490 65395 65015 65464 65274 65437 65247 65390 65505 65492 65451 65397 65438 65343 65276 65019 65506 65479 65398 65453 65263 65496 65401 65021 65459 65508 65454 65483 65402 65022 65375 65461 65271 64511 65512 65485 65404 65462 65491 65465 65275 65486 65391 65520 65493 65466 65439 65277 65507 65494 65399 65468 65278 65497 65509 65455 65498 65403 65023 65510 65513 65500 65405 65463 65514 65487 65406 65521 65467 65516 65522 65495 65469 65279 65524 65470 65499 65511 65528 65501 65515 65502 65407 65517 65523 65518 65525 65471 65526 65529 65530 65503 65532 65519 65527 65531 65533 65534 65535}

In this embodiment of this application, the system stores a maximum mother code sequence (assuming that a length is N), and a mother code sequence in any code length (assuming that the code length is M, where M≤N) can be directly read from the maximum mother code sequence.

For example, when N=65536, any mother code sequence in code length of 16, 32, 64, 128, . . . , or 32768 can be directly read from the foregoing sequence #A.

Optionally, in this embodiment of this application, the maximum mother code sequence supported by the system may be stored in a compressed storage mode, to further reduce the storage overheads of the system.

It can be learned from a polar code polarization process that, polarized channels $$\frac{N}{2}, \frac{N}{2}+1, \frac{N}{2}+2, \ldots, N-1=2^n$$

−1 are a result of further polarization on polarized channels $$\left\{0, 1, 2, \ldots, \frac{N}{2}-1=2^{n-1}-1\right\},$$

and the two groups of polarized channels have same inner ordering. During storage, an ordering sequence of $$\left\{0, 1, 2, \ldots, \frac{N}{2}-1=2^{n-1}-1\right\}$$

may be stored, and for $$\left\{\frac{N}{2}, \frac{N}{2}+1, \frac{N}{2}+2, \ldots, N-1=2^n-1\right\},$$

only a difference with corresponding locations in $$\left\{0, 1, 2, \ldots, \frac{N}{2}-1=2^{n-1}-1\right\}$$

needs to be stored. The process is further broken down, so that an ordering sequence of a shorter polar code may be stored. For example, a sequence $$\left\{0, 1, 2, \ldots, \frac{N}{4}-1=2^{n-2}-1\right\}$$

is used as a base sequence, and for other polarized channels, a difference with corresponding locations in the base sequence is stored. For example, a difference between $$\left\{\frac{N}{4}, \frac{N}{4}+1, \frac{N}{4}+2, \ldots, 2^{n-1}-1\right\}$$

and corresponding locations in the base sequence is $$\frac{N}{4},$$

and a difference between $$\left\{\frac{N}{2}, \frac{N}{2}+1, \frac{N}{2}+2, \ldots, \frac{3N}{4}-1\right\}$$

and corresponding locations in the base sequence is $$\frac{N}{2}.$$

It can be learned that me differences are all integer multiples of a length of the base sequence.

Therefore, in this embodiment of this application, when the maximum mother code sequence supported by the system is stored, a base sequence may be first determined from the maximum mother code sequence, and for sequence numbers of rest polarized channels, an offset difference (in other words, an offset multiplier) of the sequence numbers with respect to those in the base sequence is stored.

The following describes a compressed storage process according to this embodiment of this application in detail.

First, a maximum mother code length that can be supported by a system is set to N ($N=2^n$, where n is a nonnegative integer). In this case, it can be learned from the foregoing polar coding method in this embodiment of this application that, the system needs to store only one maximum mother code sequence (which, for ease of differentiation, is denoted by a sequence $S_N$ in the following description). The sequence $S_N$ includes sequence numbers (indexes from 0 to N−1) of N polarized channels, and ordering of the sequence numbers of the N polarized channels is obtained based on ordering of reliabilities of the polarized channels.

201. Based on a length of the maximum mother code sequence and a preset rule, a quantity S of bits that need to be used to represent a sequence number in the maximum mother code sequence is calculated.

In this embodiment of this application, the preset rule may be understood as an equation $N=2^{2S-2}$ configured by the system.

Specifically, it can be learned from the foregoing equation that a value of S may be calculated based on a formula $$S=\left\lceil\frac{\log_2 N}{2}\right\rceil+1.$$

The symbol ⌈ ⌉ represents rounding up.

It should be understood that determining the value of S based on this equation is only used as an example. In this embodiment of this application, a manner how the value of S is determined is not limited. Any manner shall fall with the protection scope of this embodiment of this application, provided that a compressed storage mode is used so that a quantity of bits used when the sequence numbers of the polarized channels are stored is less than a quantity of bits used during direct storage are.

202. A maximum sequence length that is represented by (S−1) bits is calculated.

In this embodiment of this application, when the sequence number in the maximum mother code sequence is represented by S bits, one bit in the S bits needs to be reserved as an indication bit used to indicate a type of a sequence number stored at a current location. Therefore, the rest (S−1) bits in the S bits are used to indicate a value of the sequence number.

It should be understood that, the type of the sequence number herein means that the sequence number stored at the current location belongs to a base sequence or an offset sequence.

It can be understood that, the maximum sequence length that is represented by the (S−1) bits is $Q=2^{S-1}$.

203. A sequence obtained by successively sorting sequence numbers that are less than Q and that are in the maximum mother code sequence, is determined as a base sequence.

It should be noted that, for ordering of the sequence numbers in the base sequence, reference may be made to step 105.

204. Sequence numbers that are greater than or equal to the sequence number Q and that are in the maximum mother code sequence are grouped into $$\left(\frac{N-Q}{Q}\right)$$

offset sequences.

It should be understood that a quantity of sequence numbers included in each offset sequence is the same as a quantity of the sequence numbers included in the base sequence, ordering of a plurality of sequence numbers in each offset sequence is the same as ordering of the plurality of sequence numbers in the maximum mother code sequence, and there is a common offset multiplier for a plurality of sequence numbers in each offset sequence with respect to sequence numbers at corresponding locations in the base sequence.

205. Each sequence number in the base sequence is stored by using S bits, where the S bits include a first bit and a plurality of second bits.

Specifically, the first bit is used to indicate that the sequence number stored at the current location belongs to the base sequence, and the plurality of second bits are used to indicate a value of the sequence number stored at the current location.

206. A sequence number in the offset sequence is stored by using S bits, where the S bits include a third bit and a plurality of fourth bits.

Specifically, the third bit is used to indicate that the sequence number stored at the current location belongs to an offset sequence, and the plurality of fourth bits are used to indicate an offset multiplier of the sequence number stored at the current location with respect to a sequence number at a corresponding location in the base sequence. An sequence number in each offset sequence corresponds to an $i^{th}$ sequence number in the base sequence.

For ease of understanding, the following uses N=16 (meaning that the maximum mother code length supported by the system is 16) as an example to describe the foregoing compressed storage process.

First, it is assumed that reliabilities of 16 polarized channels are calculated and sorted in ascending order into a sequence $S_1$.

$S_1=\{0, 1, 2, 4, 8, 3, 5, 6, 9, 10, 12, 7, 11, 13, 14, 15\}$ (1) Calculate a quantity S of bits that need to be used to represent a sequence number in the maximum mother code sequence.

$$S=\left\lceil\frac{\log_2 16}{2}\right\rceil+1=3.$$

(2) Calculate a maximum sequence length Q that is represented by (3-1) bits.

$Q=2^{3-1}=4$.

(3), Obtain a base sequence (which, for ease of description, is denoted by $S_2$ in the following description) by successively reading sequence numbers that are less than Q from the sequence $S_1$.

It is easy to obtain that $S_2=\{0, 1, 2, 3\}$.

(4) Calculate a quantity of offset sequences.

$$\frac{N-Q}{Q}=\frac{16-4}{4}=3.$$

Specifically, sequence numbers of the rest polarized channels, other than the sequence numbers in the base sequence, are grouped into 3 offset sequences. Each offset sequence includes 4 sequence numbers, and the 4 sequence numbers in each offset sequence are in one-to-one correspondence with 4 sequence numbers in the base sequence. In addition, at corresponding locations, differences between sequence numbers in the offset sequence and sequence numbers in the base sequence are the same.

For example, the foregoing base sequence is $S_2=\{0\ 1\ 2\ 3\}$, the sequence numbers 4 to 15 are grouped in to 3 offset sequences, the sequence numbers 4 to 7 belong to an offset sequence 1, the sequence numbers 8 to 11 belong to an offset sequence 2, and sequence numbers 12 to 15 belong to an offset sequence 3.

It should be noted that, herein, that the sequence numbers 4 to 7 belong to the offset sequence 1 means that the sequence numbers 4, 5, 6, and 7 belong to a same offset sequence but does not represent ordering of the sequence numbers 4, 5, 6, and 7. The similar applies to the offset sequence 2 and the offset sequence 3, and details are not repeatedly described herein.

It should be understood that a same offset difference (or offset multiplier) exists for sequence numbers that belong to one offset sequence with respect to sequence numbers at corresponding locations in the base sequence.

For example, the sequence numbers in the offset sequence 1 are successively read from the sequence $S_1$, to obtain the offset sequence 1=$\{4\ 5\ 6\ 7\}$. Similarly, the offset sequence 2=$\{8\ 9\ 10\ 11\}$, and the offset sequence 3=$\{12\ 13\ 14\ 15\}$. Therefore, it can be learned that differences between a plurality of sequence numbers that belong to a same offset sequence and sequence numbers at corresponding locations in the base sequence are the same. A difference between the offset sequence 1 and the base sequence is 4 (an offset multiplier is 1), a difference between the offset sequence 2 and the base sequence is 8 (an offset multiplier is 2), and a difference between the offset sequence 3 and the base sequence is 12 (an offset multiplier is 3).

(5) Store the maximum mother code sequence by using 3 bits. The sequence numbers in the base sequence are stored directly, and for sequence numbers in an offset sequence, an offset multiplier of the offset sequence with respect to the base sequence is stored.

In this embodiment of this application, bits that are used to store each sequence number include a first portion and a second portion. The first portion is used to indicate whether a sequence number stored at a current location belongs to the base sequence or an offset sequence. If the first portion indicates that the sequence number stored at the current location belongs to the base sequence, the second portion is used to indicate a value of the sequence number stored at the current location. If the first portion indicates that the sequence number stored at the current location belongs to an offset sequence, the second portion is used to indicate an offset multiplier of the sequence number stored at the current location with respect to that in the base sequence.

Figure 3:
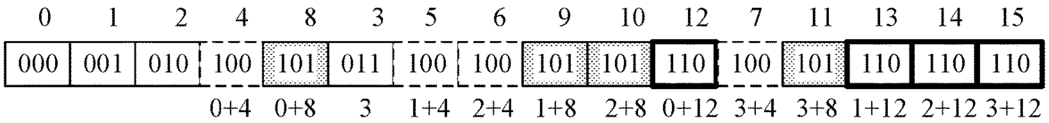
FIG. 3 is a storage form of a maximum mother code sequence according to an embodiment of this application.

FIG. 3 is a storage form of a maximum mother code sequence in a compressed storage mode according to an embodiment of this application. As shown in FIG. 3, each sequence number is stored by using 3 bits. The most significant 1 bit of each sequence number is used to indicate whether a sequence number stored at a current location belongs to the base sequence or an offset sequence. As an example but not a limitation, in this embodiment of this application, “0” is used to indicate that the sequence number stored at the current location belongs to the base sequence, and “1” is used to indicate that the sequence number stored at the current location belongs to an offset sequence. Therefore, the first bits of sequence numbers 1, 2, and 3 are 0s, and the first bits of the rest sequence numbers are all 1s.

Further, when the first bit indicates that the sequence number stored at the current location belongs to the base sequence, the rest bits are used to indicate a value of the sequence number stored at the current location. The last 2 bits are directly read as a sequence number of a polarized channel.

For example, the last 2 bits of the sequence numbers 0, 1, 2, and 3 are 00, 01, 10, and 11, respectively. This means that the sequence numbers of polarized channels are 0, 1, 2, and 3, respectively.

When the first bit indicates that the sequence number stored at the current location belongs to an offset sequence, the rest bits are used to indicate an offset multiplier of the sequence number stored at the current location with respect to that in the base sequence. Therefore, for a $k^{th}$ sequence number whose most significant bit is 1 and whose offset multiplier is y, the value of the sequence number stored at the current location is the $k^{th}$ sequence number in the base sequence+(the offset multiplier y×a length of the base sequence).

For example, when a sequence number 5 is stored, the most significant bit is stored as 1 and is used to indicate that the sequence number 5 belongs to an offset sequence. The last 2 bits are necessarily stored as 00 and are used to indicate that an offset multiplier of the sequence number (that is, the sequence number 5) stored at the current location with respect to that in the base sequence is 1. For another example, when a sequence number 9 is stored, the most significant bit is stored as 1, and the last 2 bits are stored as 01 and are used to indicate that an offset multiplier is 2.

Figure 4:
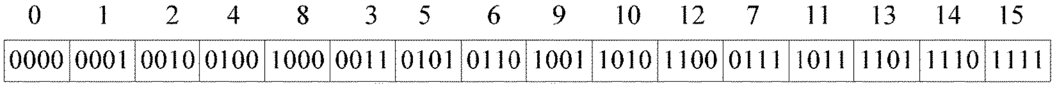
FIG. 4 is a schematic diagram of storing a maximum mother code sequence in a direct storage mode.

FIG. 4 is a schematic diagram of storing a maximum mother code sequence in a direct storage mode. As shown in FIG. 4, using N=16 as an example, if the direct storage mode is used, 4 bits are required to represent a sequence number of each polarized channel. Sequence numbers 0 to 15 are represented by “0000” to “1111”, respectively.

Figure 5:
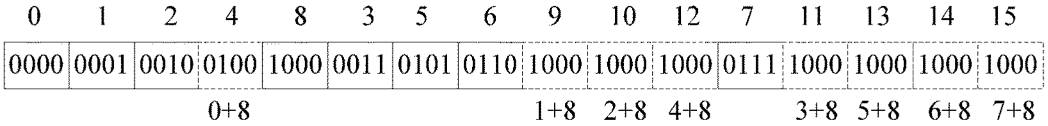
FIG. 5 is another storage form of a maximum mother code sequence according to an embodiment of this application.

FIG. 5 is another storage form of a maximum mother code sequence in a compressed storage mode according to an embodiment of this application. In FIG. 5, {0 1 2, . . . , 7} is selected as a base sequence, and an offset difference of sequence numbers of the rest polarized channels with respect to those in the base sequence is 8; therefore, an offset multiplier is 1. In this case, a length of a maximum sequence in the base sequence is 8, and therefore 3 bits need to be used for representation. The offset multiplier of the sequence numbers of the rest polarized channels with respect to those in the base sequence is 1, and therefore only one bit needs to be used for representation. To ensure consistency with the quantity of bits that are used in the base sequence to represent a value of a sequence number, 3 bits are also used when an offset multiplier of sequence numbers 8 to 15 is stored. With one indication bit added, in this case, a quantity of bits used when the maximum mother code sequence is stored is 4.

It should be understood that, the lengths of the base sequences selected in FIG. 5 and FIG. 3 are different. The quantity of bits used when the maximum mother code sequence is stored in FIG. 5 and that used in the direct storage mode are both 4, and the quantity of bits is not reduced. In this case, the length of the base sequence may further be shortened, so as to enlarge a range of the offset multiplier. Therefore, when the length of the base sequence is shortened to 4, the storage form of the maximum mother code sequence shown in FIG. 3 may be obtained.

Therefore, when the maximum code length sequence is stored in the compressed storage mode, referring to the foregoing steps 201 to 206, the quantity of bits that are used can be minimal. Compared with the prior art, this can further reduce storage overheads of a system on the basis that the storage overheads are reduced by storing only one sequence (that is, the maximum mother code sequence).

Table 6 shows a result of comparison between storage space occupied by direct storage and that occupied by compressed storage.

TABLE 6

| Maximum Mother | Direct Storage | Compressed Storage | | |
|---|---|---|---|---|
| Code Length (N) | Quantity of bits used | Quantity of bits used | Base sequence range | Space saved |
| 256 | 8 | 5 | 0~15 | 37.5% |
| 512 | 9 | 6 | 0~31 | 33.3% |
| 1024 | 10 | 6 | 0~31 | 40% |
| 2048 | 11 | 7 | 0~63 | 36.4% |
| 4096 | 12 | 7 | 0~63 | 41.7% |
| 8192 | 13 | 8 | 0~127 | 38.5% |
| 16384 | 14 | 8 | 0~127 | 42.9% |
| 32768 | 15 | 9 | 0~255 | 40% |
| 65536 | 16 | 9 | 0~255 | 43.75% |
| 131072 | 17 | 10 | 0~511 | 41.2% |
| 262144 | 18 | 10 | 0~511 | 44.4% |
| 524288 | 19 | 11 | 0~1023 | 42.1% |
| 1048576 | 20 | 11 | 0~1023 | 45% |

It can be learned from Table 6 that, when the maximum mother code sequence is stored, the compressed storage mode can save 40% storage space in comparison with the direct storage mode.

Figure 6:
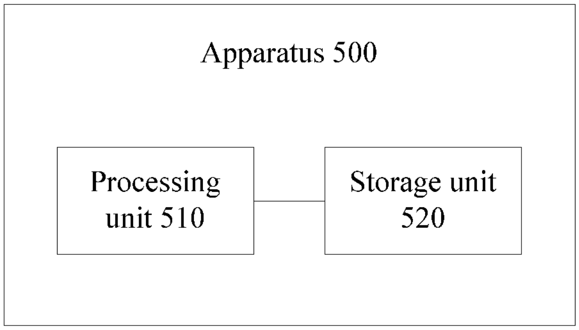
FIG. 6 is a schematic block diagram of a polar coding apparatus according to an embodiment of this application.
Figure 7:
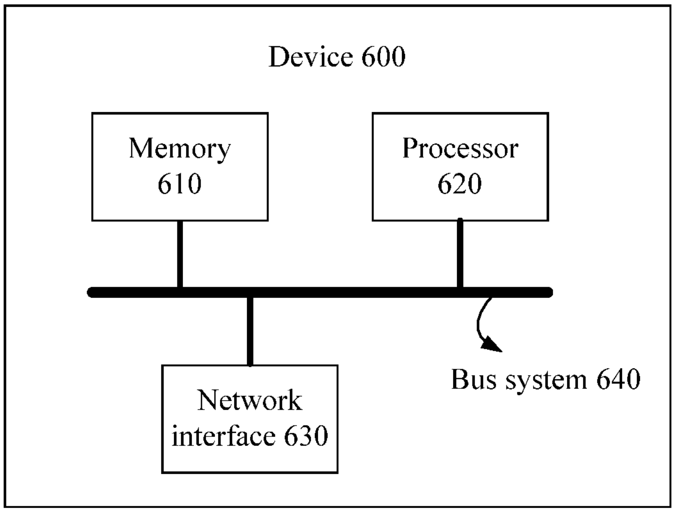
FIG. 7 is a schematic structural diagram of a polar coding device according to an embodiment of this application.

With reference to FIG. 1 to FIG. 5, the foregoing describes in detail the polar coding method according to the embodiments of this application. With reference to FIG. 6 and FIG. 7, the following describes a polar coding apparatus and a polar coding device according to the embodiments of this application.

FIG. 6 is a schematic block diagram of a polar coding apparatus 500 according to an embodiment of this application. As shown in FIG. 6, the apparatus 500 includes a processing unit 510 and a storage unit 520.

The processing unit 510 is configured to obtain reliability metrics of N polarized channels, where $N=2^n$, and n and N are positive integers.

The processing unit 510 is further configured to sort sequence numbers of the N polarized channels in ascending order or descending order of the metrics, to obtain a maximum mother code sequence. The maximum mother code sequence is characterized in that, if a first sequence whose code length is Z is read from the maximum mother code sequence, ordering, in the first sequence, of Z sequence numbers included in the first sequence is the same as ordering, in the maximum mother code sequence, of the Z sequence numbers, where $Z=2^z$, $z\leq n$, and z is a positive integer.

The storage unit 520 is configured to store the maximum mother code sequence.

The units in the apparatus 500 in this embodiment of this application and the foregoing operations or functions are intended to implement corresponding procedures in the method 100. For brevity, details are not repeatedly described herein.

Optionally, the apparatus 500 may be a chip or an integrated circuit.

In a possible design, when some or all functions of the apparatus 500 are implemented by using software, the apparatus 500 may be provided with a chip (or a chip system). The chip includes a memory and a processor. The memory is configured to store a computer program, and the processor is configured to execute the computer program stored in the memory. When the computer program is executed, the apparatus 500 can perform the polar coding method described in the foregoing embodiments.

The computer program may also be referred to as computer program code, program code, or the like.

In a possible design, when some or all functions of the apparatus 500 are implemented by using hardware, the apparatus 500 may be an integrated circuit. The integrated circuit may include:

an input interface circuit, configured to obtain to-be-coded bits;

a logic circuit, configured to read, from the maximum mother code sequence, a mother code sequence in a required length, to perform polar coding on the to-be-coded bits; and an output interface circuit, configured to output a sequence resulting from the polar coding.

In this embodiment of this application, only the maximum mother code sequence that can be supported by a system needs to be stored, and during polar code coding, the mother code sequence in the length required to perform polar coding is read from the maximum mother code sequence, so that storage overheads of the system can be reduced.

FIG. 7 is a schematic structural diagram of a polar coding device 600 according to an embodiment of this application. As shown in FIG. 7, the device 600 includes a memory 610, a processor 620, and a network interface 630. The memory 610, the processor 620, and the network interface 630 may be connected to each other by using a bus system 640. The memory 610 is configured to store an instruction, and the processor 620 is configured to execute the instruction stored in the memory 620, to control the network interface 630 to send or receive a signal.

The processor 620 is configured to obtain reliability metrics of N polarized channels, where $N=2^n$, and n and N are positive integers.

The processor 620 is further configured to sort sequence numbers of the N polarized channels in ascending order or descending order of the metrics, to obtain a maximum mother code sequence. The maximum mother code sequence is characterized in that, if a first sequence whose code length is Z is read from the maximum mother code sequence, ordering, in the first sequence, of Z sequence numbers included in the first sequence is the same as ordering, in the maximum mother code sequence, of the Z sequence numbers, where $Z=2^z$, $z\leq n$, and z is a positive integer.

The memory 610 is configured to store the maximum mother code sequence.

The units in the polar coding device 600 in this embodiment of this application and the foregoing operations or functions are intended to implement corresponding procedures in the method 100. For brevity, details are not repeatedly described herein. In this embodiment of this application, only the maximum mother code sequence that can be supported by a system needs to be stored, and during polar code coding, a mother code sequence in a length required to perform polar coding is read from the maximum mother code sequence, so that storage overheads of the system can be reduced.

It should be understood that, in this embodiment of this application, the processor 620 may be a central processing unit (central processing unit, CPU), or may be another general purpose processor, a digital signal processor (Digital Signal Processor, DSP), an application-specific integrated circuit (Application-Specific Integrated Circuit, ASIC), a field programmable gate array (Field Programmable Gate Array, FPGA) or another programmable logic device, a discrete gate or transistor logic device, a discrete hardware component, or the like. The general purpose processor may be a microprocessor or the processor may be any normal processor, or the like.

The memory 610 may include a read-only memory and a random access memory, and provides an instruction and data to the processor 620. Apart of the memory 610 may further include a non-volatile random access memory. For example, the memory 610 may further store device type information.

In addition to a data bus, the bus system 640 may include a power bus, a control bus, a status signal bus, and the like. However, for clear description, various buses are marked as the bus system 640 in the figure.

The network interface 630 may be a wired interface, such as a fiber distributed data interface (Fiber Distributed Data Interface, FDDI) or a gigabit Ethernet (Gigabit Ethernet, GE) interface. The network interface 630 may alternatively be a wireless interface.

During implementation, the steps of the foregoing methods may be implemented by using an integrated logic circuit of hardware in the processor 620, or by using a software instruction. The steps of the polar coding method disclosed with reference to the embodiments of this application may be directly performed by a hardware processor, or may be performed by using a combination of hardware in the processor and a software module. The software module may be in a random access memory, a flash memory, a read-only memory, a programmable read-only memory or an electrical erasable programmable memory, a register, or another mature storage medium in the art. The storage medium is located in the memory 610, and the processor 620 reads information from the memory 610 and implements, in combination with hardware of the processor 620, the steps of the foregoing methods. To avoid repetition, no detailed description is given herein again.

The units in the polar coding device 600 in this embodiment of this application and the foregoing operations or functions are intended to implement corresponding procedures in the method 100. For brevity, details are not repeatedly described herein.

In this embodiment of this application, only the maximum mother code sequence that can be supported by the system needs to be stored, and during polar code coding, the mother code sequence in the length required to perform polar coding is read from the maximum mother code sequence, so that storage overheads of the system are reduced.

It should be understood that values of sequence numbers of the foregoing processes do not mean execution sequences in the embodiments of this application. The execution sequences of the processes should be determined based on functions and internal logic of the processes, and should not be construed as any limitation on the implementation processes of the embodiments of this application.

A person of ordinary skill in the art may be aware that the units and algorithm steps in the examples described with reference to the embodiments disclosed in this specification may be implemented by electronic hardware or a combination of computer software and electronic hardware. Whether the functions are performed by hardware or software depends on particular applications and design constraint conditions of the technical solutions. A person skilled in the art may use a different method to implement the described functions for each particular application, but it should not be considered that the implementation goes beyond the scope of this application.

It may be clearly understood by a person skilled in the art that, for the purpose of convenient and brief description, for a detailed working process of the foregoing system, apparatus, and unit, reference may be made to a corresponding process in the foregoing method embodiments, and details are not repeatedly described herein.

In the several embodiments provided in this application, it should be understood that the disclosed system, apparatus, and method may be implemented in other manners. For example, the described apparatus embodiments are merely examples. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be indirect couplings or communication connections through some interfaces, apparatuses, or units, and may be in electronic, mechanical, or other forms.

The units described as separate parts may or may not be physically separate. Parts displayed as units may or may not be physical units, and may be located in one location or distributed on a plurality of network units. Some or all of the units may be selected depending on actual requirements to achieve the objectives of the solutions of the embodiments.

In addition, functional units in the embodiments of this application may be integrated into one processing unit, or each of the units may exist alone physically, or two or more units are integrated into one unit.

When implemented in the form of a software functional unit and sold or used as an independent product, the functions may be stored in a computer readable storage medium. Based on such an understanding, the technical solutions of this application essentially, or the part contributing to the prior art, or some of the technical solutions may be implemented in a form of a software product. The computer software product is stored in a storage medium, and includes several instructions for instructing a computer device (which may be a personal computer, a server, a network device, or the like) to perform all or some of the steps of the methods described in the embodiments of this application. The foregoing storage medium includes: any medium that can store program code, such as a USB flash drive, a removable hard disk, a read-only memory (Read-Only Memory, ROM), a random access memory (Random Access Memory, RAM), a magnetic disk, or an optical disc.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A computer-implemented polar coding method, comprising:

obtaining to-be-coded bits;

obtaining a second sequence, from a maximum mother code sequence, based on a length M of a target polar code, wherein the second sequence is used as a mother code sequence when coding into the target polar code is performed, the second sequence comprises L sequence numbers, ordering of the L sequence numbers in the second sequence is the same as ordering of the L sequence numbers in the maximum mother code sequence, wherein the maximum mother code sequence is obtained by sorting N sequence numbers of N polarized channels in ascending order or descending order of reliability metrics, wherein L and N are integer power of 2, M is smaller than or equal to L, L is smaller than or equal to N;

performing polar coding on the to-be-coded bits based on the second sequence.

2. The method according claim 1, wherein the obtaining the second sequence from the maximum mother code sequence comprises:

obtaining the second sequence by reading, from the maximum mother code sequence, sequence numbers that are less than L.

3. The method according claim 1, wherein the maximum mother code sequence is pre-stored.

4. The method according to claim 1, wherein the second sequence for polar coding is pre-stored.

5. The method according to claim 1, wherein the method further comprising:

obtaining the reliability metrics of the N polarized channels according to the following formula:

$$W_i = \sum_{j=0}^{n-1} B_j * 2^{\frac{1}{4} \cdot j}, 0 \le i \le N-1,$$

where $N=2^n$, n is a positive integer, $i=B_{n-1} B_{n-2} \ldots B_0$, $B_{n-1} B_{n-2} \ldots B_0$ is a binary representation of i, $B_{n-1}$ is the most significant bit, $B_0$ is the least significant bit, $B_j \in \{0,1\}$, and $W_i$ is used to represent a reliability of an $i^{th}$ polarized channel.

6. A device for polar coding, comprising:

a memory storing instructions;

a processor in communication with the memory and configured to execute the instructions to perform:

obtaining to-be-coded bits;

obtaining a second sequence, from a maximum mother code sequence, based on a length M of a target polar code, wherein the second sequence is used as a mother code sequence when coding into the target polar code is performed, the second sequence comprises L sequence numbers, ordering of the L sequence numbers in the second sequence is the same as ordering of the L sequence numbers in the maximum mother code sequence, wherein the maximum mother code sequence is obtained by sorting N sequence numbers of N polarized channels in ascending order or descending order of reliability metrics, wherein L and N are integer power of 2, M is smaller than or equal to L, L is smaller than or equal to N;

performing polar coding on the to-be-coded bits based on the second sequence.

7. The device according claim 6, wherein the obtaining the second sequence from the maximum mother code sequence comprises:

obtaining the second sequence by reading, from the maximum mother code sequence, sequence numbers that are less than L.

8. The device according claim 6, wherein the maximum mother code sequence is pre-stored.

9. An apparatus comprising an integrated circuit, wherein the integrated circuit includes:

an input interface circuit, configured to obtain to-be-coded bits;

a logic circuit, configured to obtain a second sequence, from a maximum mother code sequence based on a length M of a target polar code, and polar coding on the to-be-coded bits based on the second sequence obtained; wherein the second sequence is used as a mother code sequence when coding into the target polar code is performed, the second sequence comprises L sequence numbers, ordering of the L sequence numbers in the sequence is the same as ordering of the L sequence numbers in the maximum mother code sequence, wherein the maximum mother code sequence is obtained by sorting N sequence numbers of N polarized channels in ascending order or descending order of reliability metrics, wherein L and N are integer power of 2, M is smaller than or equal to L, L is smaller than or equal to N; and an output interface circuit, configured to output a sequence resulting from the polar coding.

10. The apparatus according claim 9, wherein the second sequence for polar coding is obtained by reading, from the maximum mother code sequence, sequence numbers that are less than L, wherein L is a length of a mother code for the target polar.

11. The apparatus according claim 9, wherein the maximum mother code sequence is pre-stored.

\* \* \* \* \*